US009748492B2

(12) United States Patent
Ito et al.

(10) Patent No.: US 9,748,492 B2
(45) Date of Patent: Aug. 29, 2017

(54) ORGANIC ELECTROLUMINESCENT DEVICE

(71) Applicant: IDEMITSU KOSAN CO., LTD., Chiyoda-ku (JP)

(72) Inventors: Hirokatsu Ito, Chiba (JP); Takeshi Ikeda, Chiba (JP)

(73) Assignee: IDEMITSU KOSAN CO., LTD., Chiyoda-ku (JP)

( * ) Notice: Subject to any disclaimer, the term of this patent is extended or adjusted under 35 U.S.C. 154(b) by 805 days.

(21) Appl. No.: 14/069,808

(22) Filed: Nov. 1, 2013

(65) Prior Publication Data

US 2014/0131681 A1 May 15, 2014

(30) Foreign Application Priority Data

Nov. 2, 2012 (JP) ................................ 2012-243076

(51) Int. Cl.
*H01L 51/50* (2006.01)
*H01L 51/00* (2006.01)

(52) U.S. Cl.
CPC ........ *H01L 51/006* (2013.01); *H01L 51/0054* (2013.01); *H01L 51/0061* (2013.01); *H01L 51/0073* (2013.01); *H01L 51/0055* (2013.01); *H01L 51/0058* (2013.01); *H01L 51/5056* (2013.01)

(58) Field of Classification Search
None
See application file for complete search history.

(56) References Cited

U.S. PATENT DOCUMENTS 6,476,265 B1 11/2002 Spreitzer et al.
6,849,348 B2 2/2005 Zheng et al.
7,241,513 B2 7/2007 Suzuki et al.
7,250,519 B2 7/2007 Stossel et al.
7,273,953 B2 9/2007 Kubo et al.
7,338,721 B2 3/2008 Suzuki et al.
7,348,071 B2 3/2008 Zheng et al.
7,482,490 B2 1/2009 Nishiyama et al.
(Continued)

FOREIGN PATENT DOCUMENTS

CN 100454608 1/2009
CN 102082232 6/2011
CN 102459149 A 5/2012
CN 103187531 A 7/2013
CN 103730589 A 4/2014
CN 103730590 A 4/2014
CN 104768929 A 7/2015
(Continued)

OTHER PUBLICATIONS

International Search Report issued Dec. 17, 2013 in PCT/JP2013/079632.

(Continued)

*Primary Examiner* — Gregory Clark
(74) *Attorney, Agent, or Firm* — Oblon, McClelland, Maier & Neustadt, L.L.P.

(57) ABSTRACT

Provided are an amine compound having a benzofluorene structure and further having a dibenzofuran structure and/or a dibenzothiophene structure, and an organic electroluminescent device containing a cathode, an anode and an organic thin film layer intervening between the cathode and anode, the organic thin film layer comprising one layer or plural layers comprising at least an emitting layer, at least one layer of the organic thin film layer comprising the aforementioned amine compound solely or as a component of a mixture.

23 Claims, 1 Drawing Sheet

(56) References Cited

U.S. PATENT DOCUMENTS

| | | | | |
|---|---|---|---|---|
| 7,507,485 | B2 | 3/2009 | Oh et al. | |
| 8,330,153 | B2 | 12/2012 | Ooishi et al. | |
| 8,465,848 | B2 | 6/2013 | Smith | |
| 2003/0118866 | A1 | 6/2003 | Oh et al. | |
| 2003/0201415 | A1* | 10/2003 | Hoag | C09K 11/06 251/40 |
| 2004/0131880 | A1 | 7/2004 | Zheng et al. | |
| 2004/0131881 | A1 | 7/2004 | Zheng et al. | |
| 2004/0241496 | A1 | 12/2004 | Zheng et al. | |
| 2004/0253389 | A1 | 12/2004 | Suzuki et al. | |
| 2005/0054854 | A1 | 3/2005 | Stossel et al. | |
| 2005/0236974 | A1 | 10/2005 | Suzuki et al. | |
| 2006/0063027 | A1 | 3/2006 | Vestweber et al. | |
| 2006/0069287 | A1 | 3/2006 | Kubo et al. | |
| 2008/0160347 | A1 | 7/2008 | Wang et al. | |
| 2008/0160348 | A1* | 7/2008 | Smith | C07C 211/61 428/704 |
| 2008/0194878 | A1 | 8/2008 | Nishiyama et al. | |
| 2009/0053557 | A1* | 2/2009 | Spindler | H01L 51/0058 428/690 |
| 2009/0184312 | A1 | 7/2009 | Nishiyama et al. | |
| 2009/0267491 | A1 | 10/2009 | Takashima et al. | |
| 2010/0032658 | A1 | 2/2010 | Lee et al. | |
| 2010/0314615 | A1 | 12/2010 | Mizuki et al. | |
| 2011/0175072 | A1 | 7/2011 | Ooishi et al. | |
| 2012/0080585 | A1 | 4/2012 | Fukuzaki et al. | |
| 2012/0091885 | A1 | 4/2012 | Kim et al. | |
| 2012/0112169 | A1 | 5/2012 | Mizuki et al. | |
| 2012/0112177 | A1 | 5/2012 | Ishikawa et al. | |
| 2012/0146014 | A1 | 6/2012 | Kato | |
| 2012/0157678 | A1 | 6/2012 | He et al. | |
| 2012/0211701 | A1 | 8/2012 | Spreitzer et al. | |
| 2012/0248426 | A1 | 10/2012 | Kato | |
| 2012/0267617 | A1 | 10/2012 | Kaiser et al. | |
| 2012/0326141 | A1 | 12/2012 | Pflumm et al. | |
| 2013/0063023 | A1 | 3/2013 | Pan et al. | |
| 2013/0122276 | A1 | 5/2013 | Nomura et al. | |
| 2013/0153878 | A1 | 6/2013 | Mizuki et al. | |
| 2014/0054559 | A1 | 2/2014 | Kim et al. | |
| 2014/0061602 | A1 | 3/2014 | Kato et al. | |

FOREIGN PATENT DOCUMENTS

| | | | | |
|---|---|---|---|---|
| EP | 1 578 887 | A2 | 9/2005 | |
| EP | 2 576 723 | | 4/2013 | |
| GB | 2 388 370 | | 11/2003 | |
| JP | 2001-515879 | | 9/2001 | |
| JP | 3269300 | | 1/2002 | |
| JP | 2006-511939 | | 4/2006 | |
| JP | 3947326 | | 4/2007 | |
| JP | 3998495 | | 8/2007 | |
| JP | 2008-016827 | | 1/2008 | |
| JP | 4065552 | | 1/2008 | |
| JP | 4129558 | | 5/2008 | |
| JP | 4250012 | | 1/2009 | |
| JP | WO 2010/004887 | A1 | 1/2010 | |
| JP | 2010-059147 | | 3/2010 | |
| JP | 2010-519732 | | 6/2010 | |
| JP | 4524186 | | 6/2010 | |
| JP | 4585750 | | 9/2010 | |
| JP | 4619656 | | 11/2010 | |
| JP | 2011-020952 | | 2/2011 | |
| JP | 2011-219461 | | 4/2011 | |
| JP | 2011-151116 | | 8/2011 | |
| JP | 4825925 | | 9/2011 | |
| JP | 4897222 | | 1/2012 | |
| JP | 2012-204794 | | 2/2012 | |
| JP | 2012-510988 | | 5/2012 | |
| JP | 5023683 | | 6/2012 | |
| JP | 2012-522041 | | 9/2012 | |
| JP | 2012-522042 | | 9/2012 | |
| JP | 5079231 | | 9/2012 | |
| JP | 5115061 | | 10/2012 | |
| JP | 2012-224618 | | 11/2012 | |
| JP | 5145717 | | 12/2012 | |
| JP | 5162913 | | 12/2012 | |
| JP | 2013-018717 | | 1/2013 | |
| JP | 2013-041893 | | 2/2013 | |
| JP | 2013-505591 | | 2/2013 | |
| JP | 2013-509363 | | 3/2013 | |
| JP | 2013-522864 | | 6/2013 | |
| JP | 2013-191649 | A | 9/2013 | |
| JP | 2013-227401 | A | 11/2013 | |
| JP | 2013-241579 | A | 12/2013 | |
| JP | 2013-256655 | A | 12/2013 | |
| JP | 2014-045101 | A | 3/2014 | |
| JP | 2014-45101 | A | 3/2014 | |
| JP | 2014-082479 | A | 5/2014 | |
| JP | 2014-82479 | A | 5/2014 | |
| KR | 10-1166458 | | 2/2007 | |
| KR | 10-2010-0112903 | A | 10/2010 | |
| KR | 10 2010112903 | | 10/2010 | |
| KR | 10-2010-0123172 | A | 11/2010 | |
| KR | 10 1070223 | | 11/2010 | |
| KR | 2011-121270 | | 11/2011 | |
| KR | 2011-0121270 | A | 11/2011 | |
| KR | 10-1251451 | B1 | 4/2013 | |
| KR | 10-2013-0098226 | A | 9/2013 | |
| KR | 10-2013-0098227 | A | 9/2013 | |
| KR | 10-2013-0098228 | A | 9/2013 | |
| KR | 10-2013-0106255 | A | 9/2013 | |
| KR | 10-2013-0118811 | A | 10/2013 | |
| KR | 2013118811 | * | 10/2013 | C09K 11/06 |
| KR | 10-2014-0043035 | A | 4/2014 | |
| KR | 10-2014-0055925 | A | 5/2014 | |
| TW | 2011-05609 | | 2/2011 | |
| TW | 2011-05611 | | 2/2011 | |
| TW | 2011-05775 | | 2/2011 | |
| TW | 2011-14880 | | 5/2011 | |
| TW | 2012-13501 | | 4/2012 | |
| WO | WO 2004/061047 | A2 | 7/2004 | |
| WO | WO 2007/119800 | A1 | 10/2007 | |
| WO | WO 2009/084512 | A1 | 7/2009 | |
| WO | 2010/064871 | | 6/2010 | |
| WO | 2010110554 | A2 | 9/2010 | |
| WO | 2010/114253 | | 10/2010 | |
| WO | 2010/114256 | | 10/2010 | |
| WO | 2010/114262 | | 10/2010 | |
| WO | WO 2010/122810 | A1 | 10/2010 | |
| WO | 2010/151006 | A1 | 12/2010 | |
| WO | WO 2011/021520 | A1 | 2/2011 | |
| WO | WO 2011/059099 | A1 | 5/2011 | |
| WO | 2012/015265 | A1 | 2/2012 | |
| WO | WO 2012 015265 | * | 2/2012 | C07D 333/76 |
| WO | WO 2012/026780 | A1 | 3/2012 | |
| WO | 2012-082560 | | 6/2012 | |
| WO | 2012137741 | | 10/2012 | |
| WO | 2013-021907 | | 2/2013 | |
| WO | WO 2013/109027 | A1 | 7/2013 | |
| WO | WO 2013/187007 | A1 | 12/2013 | |
| WO | WO 2014/015937 | A1 | 1/2014 | |
| WO | WO 2014/015938 | A1 | 1/2014 | |
| WO | WO 2014/034793 | A1 | 3/2014 | |
| WO | WO 2014/034795 | A1 | 3/2014 | |
| WO | WO 2014/034864 | A1 | 3/2014 | |
| WO | WO 2014/034869 | A1 | 3/2014 | |
| WO | WO 2014/037077 | A1 | 3/2014 | |
| WO | WO 2014/051244 | A1 | 4/2014 | |
| WO | WO 2014/056565 | A1 | 4/2014 | |
| WO | WO 2014/065391 | A1 | 5/2014 | |
| WO | WO 2014/067614 | A1 | 5/2014 | |

OTHER PUBLICATIONS

Combined Office Action and Search Report issued May 17, 2016 in Chinese Patent Application No. 201380057101.6 (with English translation of category of cited documents).

* cited by examiner

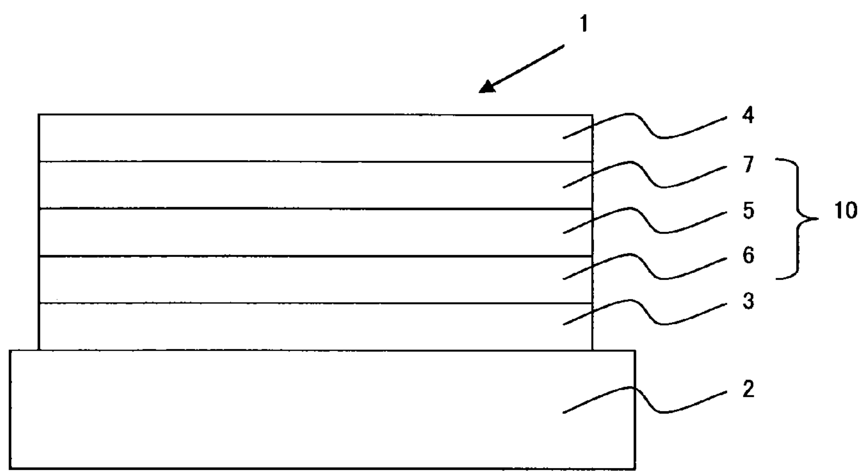
1
4
7
5
6
3
2
10

ORGANIC ELECTROLUMINESCENT DEVICE

CROSS-REFERENCE TO RELATED APPLICATION

This application is based upon and claims the benefit of priority from the prior Japanese Patent Application No. 2012-243076, filed on Nov. 2, 2012; the entire contents of which are incorporated herein by reference.

BACKGROUND OF THE INVENTION

Field

The present invention relates to an organic electroluminescent device.

Related Art

An organic electroluminescent device (which may be hereinafter referred to as an organic EL device) is generally constituted by an anode, a cathode, and at least one layer of an organic thin film layer that intervenes between the anode and the cathode. On application of a voltage to the electrodes, electrons and holes are injected to the light emitting region from the cathode and the anode, respectively, and the electrons and the holes thus injected are recombined to form an excited state in the light emitting region. The device emits light on returning the excited state to the ground state.

An organic EL device provides various colors for the emitted light by using various light emitting materials in the emitting layer, and accordingly is being actively studied for practical applications, such as a display device. In particular, light emitting materials for the three primary colors, i.e., red, green and blue, are most actively developed, and earnest studies therefor are being made for enhancing the characteristics thereof.

One of the largest problems in an organic EL device is the achievement of both the high luminous efficiency and the low driving voltage. One of the known measures for providing a light emitting device having a high efficiency is to provide an emitting layer by doping several percents of a doping material to a host material. The host material is required to have a high carrier mobility, uniform film forming property and the like, and the doping material is required to have a high fluorescent quantum yield, uniform dispersibility and the like.

As these materials for the emitting layer, benzofluorene compounds are described, for example, in Patent Literatures 1 to 5.

Patent Literature 1: WO 07/148,660

Patent Literature 2: WO 08/062,636

Patent Literature 3: US-A-2007-0215889

Patent Literature 4: JP-A-2005-290000

Patent Literature 5: WO 2011/021520

However, the present inventors have found that the improvement in prolongation of the service life time is still insufficient even when the benzofluorene compounds described in Patent Literatures 1 to 5 are used, and further improvements are being demanded.

SUMMARY OF THE INVENTION

As a result of earnest investigations made by the present inventors, they have found the use of an amine compound that has a benzofluorene structure and further has a dibenzofuran structure and/or a dibenzothiophene structure.

According to one aspect of the present invention, an amine compound represented by the following formula (1) is provided:

$$B\text{-}(\text{-}A)_n \qquad (1)$$

wherein in the formula (1), n represents an integer of from 1 to 4;

B represents a structure represented by the following formula (2); and

A represents an amine moiety represented by the following formula (4), provided that when n is 2 or more, plural moieties represented by A may be the same as or different from each other, (2)

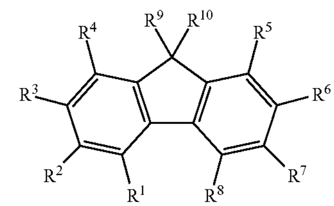

wherein in the formula (2), at least one combination among combinations of $R^1$ and $R^2$, $R^2$ and $R^3$, $R^3$ and $R^4$, $R^5$ and $R^6$, $R^6$ and $R^7$, and $R^7$ and $R^8$ represents a bond to a divalent group represented by the following formula (3); and $R^9$ and $R^{10}$ each independently represent a hydrogen atom, a substituted or unsubstituted alkyl group having from 1 to 20 carbon atoms, a substituted or unsubstituted alkylsilyl group having from 3 to 50 carbon atoms, a substituted or unsubstituted arylsilyl group having from 6 to 50 ring carbon atoms, a substituted or unsubstituted aryl group having from 6 to 30 ring carbon atoms or a substituted or unsubstituted heteroaryl group having from 5 to 30 ring atoms, (3)

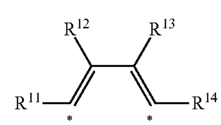

wherein in the formula (3),

* represents a bonding position to one combination in the formula (2), which shows a bond to the divalent group represented by the formula (3), in the formulae (2) and (3), n groups among $R^1$ to $R^8$ and $R^{11}$ to $R^{14}$ each represent a bond to the moiety represented by A; and the others of $R^1$ to $R^8$ and $R^{11}$ to $R^{14}$ than as described above each independently represent a hydrogen atom, a fluorine atom, a cyano group, a substituted or unsubstituted alkyl group having from 1 to 20 carbon atoms, a substituted or unsubstituted cycloalkyl group having from 3 to 20 ring carbon atoms, a substituted or unsubstituted alkoxy group having from 1 to 20 carbon atoms, a substituted or unsubstituted aryloxy group having from 6 to 30 ring carbon atoms, a substituted or unsubstituted alkylthio group having from 1 to 20 carbon atoms, a substituted or unsubstituted arylthio group having from 6 to 30 ring carbon atoms, a substituted or unsubstituted alkylsilyl group having from 3 to 50 carbon atoms, a substituted or unsubstituted arylsilyl group having from 6 to 50 ring carbon atoms, a substituted or unsubstituted aryl group having from 6 to 30 ring carbon atoms or a substituted or unsubstituted heteroaryl group having from 5 to 30 ring atoms,

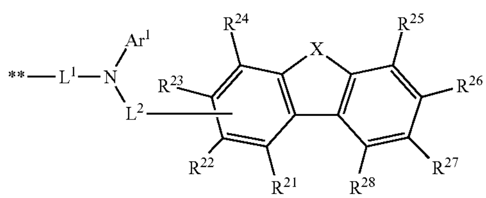

(4)

wherein in the formula (4), $Ar^1$ represents a substituted or unsubstituted aryl group having from 6 to 30 ring carbon atoms or a substituted or unsubstituted heteroaryl group having from 5 to 30 ring carbon atoms;

$L^1$ and $L^2$ each independently represent a single bond, an arylene group having from 6 to 30 ring carbon atoms, a heteroarylene group having from 5 to 30 ring atoms or a divalent linking group formed by bonding 2 to 4 of these groups;

any one among $R^{21}$ to $R^{28}$ represents a bond to the group represented by $L^2$, and the others thereof each independently represent a hydrogen atom, a fluorine atom, a cyano group, a substituted or unsubstituted alkyl group having from 1 to 20 carbon atoms, a substituted or unsubstituted cycloalkyl group having from 3 to 20 ring carbon atoms, a substituted or unsubstituted alkoxy group having from 1 to 20 carbon atoms, a substituted or unsubstituted aryloxy group having from 6 to 30 ring carbon atoms, a substituted or unsubstituted alkylthio group having from 1 to 20 carbon atoms, a substituted or unsubstituted arylthio group having from 6 to 30 ring carbon atoms, a substituted or unsubstituted alkylsilyl group having from 3 to 50 carbon atoms, a substituted or unsubstituted arylsilyl group having from 6 to 50 ring carbon atoms, a substituted or unsubstituted aryl group having from 6 to 30 ring carbon atoms or a substituted or unsubstituted heteroaryl group having from 5 to 30 ring atoms, or members of one or more combinations selected among combinations of $R^{21}$ and $R^{22}$, $R^{22}$ and $R^{23}$, $R^{23}$ and $R^{24}$, $R^{25}$ and $R^{26}$, $R^{26}$ and $R^{27}$, and $R^{27}$ and $R^{28}$ are bonded to each other to form a saturated or unsaturated ring structure;

X represents an oxygen atom or a sulfur atom; and

** represents a bonding position to the structure represented by B.

According to another aspect of the present invention, an organic electroluminescent device is provided that comprises a cathode, an anode and an organic thin film layer intervening between the cathode and anode, the organic thin film layer comprising one layer or plural layers comprising at least an emitting layer, at least one layer of the organic thin film layer comprising the aforementioned amine compound solely or as a component of a mixture.

BRIEF DESCRIPTION OF THE DRAWING

FIG. 1 is a schematic illustration showing an example of an organic electroluminescent device (which may be hereinafter referred to as an organic EL device) according to an embodiment of the present invention.

DESCRIPTION OF THE EMBODIMENTS

In the expression "a substituted or unsubstituted X group having from a to b carbon atoms" in the present invention, the language "from a to b carbon atoms" means the number of carbon atoms in the case where the X group is unsubstituted, and the number of carbon atoms of substituents where the X group is substituted is not contained therein.

The expression "hydrogen atom" in the present invention encompasses all the isotopes having different numbers of neutrons, i.e., a protium, a deuterium and a tritium.

The expression "substituted" in "substituted or unsubstituted" means that the group may have an arbitrary substituent, and the arbitrary substituent is preferably selected from the group consisting of an alkyl group having from 1 to 50 (preferably from 1 to 10, and more preferably from 1 to 5) carbon atoms; a cycloalkyl group having from 3 to 50 (preferably from 3 to 6, and more preferably 5 or 6) ring carbon atoms; an aryl group having from 6 to 50 (preferably from 6 to 24, and more preferably from 6 to 12) ring carbon atoms; an aralkyl group having from 1 to 50 (preferably from 1 to 10, and more preferably from 1 to 5) carbon atoms having an aryl group having from 6 to 50 (preferably from 6 to 24, and more preferably from 6 to 12) ring carbon atoms; an amino group; a mono- or dialkyl amino group having an alkyl group having from 1 to 50 (preferably from 1 to 10, and more preferably 1 to 5) carbon atoms; a mono- or diarylamino group having an aryl group having from 6 to 50 (preferably from 6 to 24, and more preferably from 6 to 12) ring carbon atoms; an alkoxy group having an alkyl group having from 1 to 50 (preferably from 1 to 10, and more preferably 1 to 5) carbon atoms; an aryloxy group having an aryl group having from 6 to 50 (preferably from 6 to 24, and more preferably from 6 to 12) ring carbon atoms; a mono-, di- or tri-substituted silyl group having a group selected from an alkyl group having from 1 to 50 (preferably from 1 to 10, and more preferably 1 to 5) carbon atoms and an aryl group having from 6 to 50 (preferably from 6 to 24, and more preferably from 6 to 12) ring carbon atoms; a heteroaryl group having from 5 to 50 (preferably from 5 to 24, and more preferably from 5 to 12) ring atoms and having from 1 to 5 (preferably from 1 to 3, and more preferably 1 or 2) hetero atom (such as a nitrogen atom, an oxygen atom and a sulfur atom); a haloalkyl group having from 1 to 50 (preferably from 1 to 10, and more preferably 1 to 5) carbon atoms; a halogen atom (such as a fluorine atom, a chlorine atom, a bromine atom and an iodine atom); a cyano group; and a nitro group.

Among the aforementioned substituents, a group selected from the group consisting of an alkyl group having from 1 to 5 carbon atoms, a cycloalkyl group having 5 or 6 carbon atoms, and an aryl group having from 6 to 12 ring carbon atoms is preferred.

The amine compound of the present invention is represented by the following formula (1).

$$B{-}(A)_n \tag{1}$$

In the formula (1), n represents an integer of from 1 to 4; B represents a structure represented by the following formula (2); and A represents an amine moiety represented by the following formula (4).

When n is 2 or more, plural moieties represented by A may be the same as or different from each other.

(2)

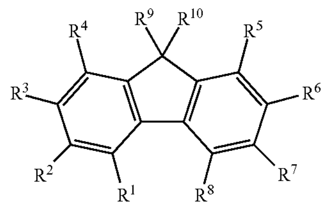

In the formula (2), at least one combination among combinations of $R^1$ and $R^2$, $R^2$ and $R^3$, $R^3$ and $R^4$, $R^5$ and $R^6$, $R^6$ and $R^7$, and $R^7$ and $R^8$ represents a bond to a divalent group represented by the following formula (3); and $R^9$ and $R^{10}$ each independently represent a hydrogen atom, a substituted or unsubstituted alkyl group having from 1 to 10 carbon atoms, a substituted or unsubstituted alkylsilyl group having from 3 to 50 carbon atoms, a substituted or unsubstituted arylsilyl group having from 6 to 50 ring carbon atoms, a substituted or unsubstituted aryl group having from 6 to 30 ring carbon atoms or a substituted or unsubstituted heteroaryl group having from 5 to 30 ring atoms. $R^9$ and $R^{10}$ each independently preferably represent a methyl group or a phenyl group.

(3)

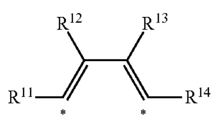

In the formula (3), * represents a bonding position to one combination in the formula (2), which shows a bond to the divalent group represented by the formula (3).

In the formulae (2) and (3), n group (s) among $R^1$ to $R^8$ and $R^{11}$ to $R^{14}$ each represent a bond to the moiety represented by A; and the others of $R^1$ to $R^8$ and $R^{11}$ to $R^{14}$ than as described above each independently represent a hydrogen atom, a fluorine atom, a cyano group, a substituted or unsubstituted alkyl group having from 1 to 20 carbon atoms, a substituted or unsubstituted cycloalkyl group having from 3 to 20 ring carbon atoms, a substituted or unsubstituted alkoxy group having from 1 to 20 carbon atoms, a substituted or unsubstituted aryloxy group having from 6 to 30 ring carbon atoms, a substituted or unsubstituted alkylthio group having from 1 to 20 carbon atoms, a substituted or unsubstituted arylthio group having from 6 to 30 ring carbon atoms, a substituted or unsubstituted alkylsilyl group having from 3 to 50 carbon atoms, a substituted or unsubstituted arylsilyl group having from 6 to 50 ring carbon atoms, a substituted or unsubstituted aryl group having from 6 to 30 ring carbon atoms or a substituted or unsubstituted heteroaryl group having from 5 to 30 ring atoms.

In the formula (1), B preferably represents any one of the following formulae (11) to (19).

(11)

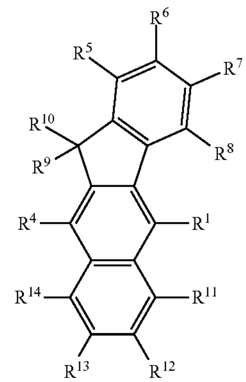

(12)

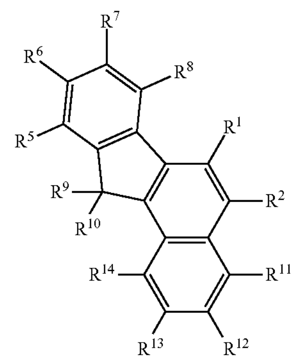

(13)

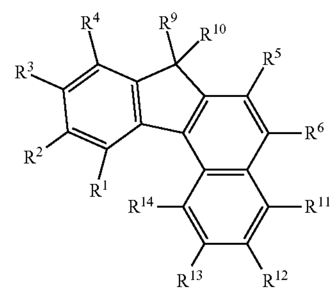

(14)

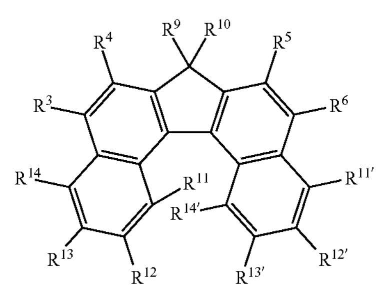

(15)

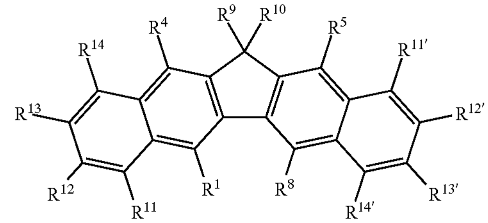

-continued
(16)
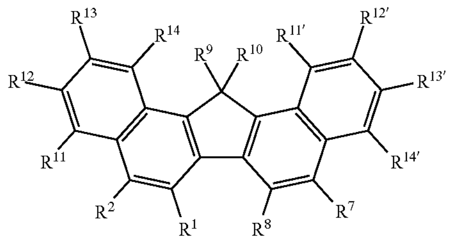
(17)
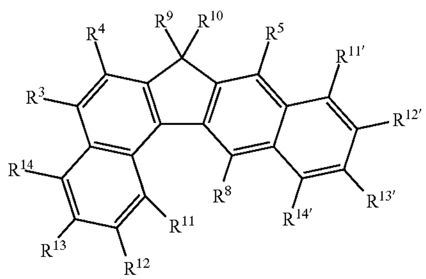
(18)
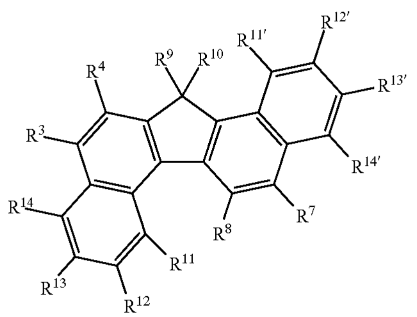
(19)
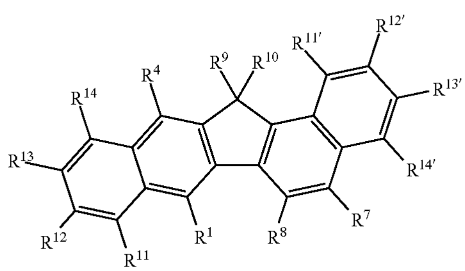
In the formulae (11) to (19), $R^1$ to $R^{14}$ are the same as in the formulae (2) and (3), and $R^{11'}$ to $R^{14'}$ have the same meanings as $R^{11}$ to $R^{14}$, respectively.
The structure B represented by the formulae (11) to (19) is preferably represented by the following formulae (20) to (45).
(20)
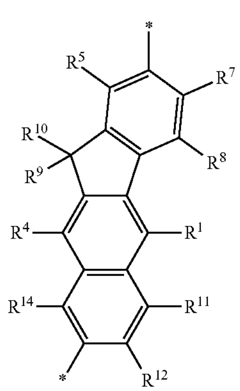
-continued
(21)
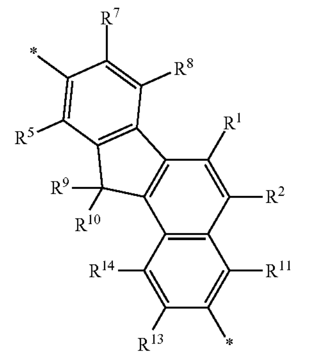
(22)
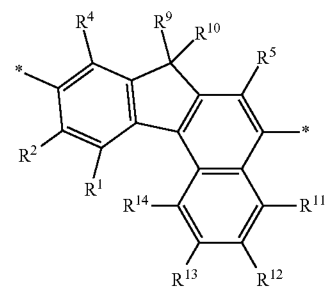
(23)
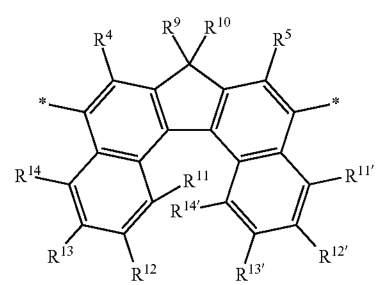
(24)
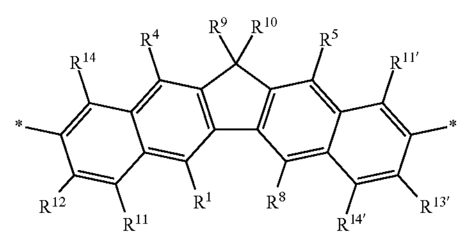
(25)
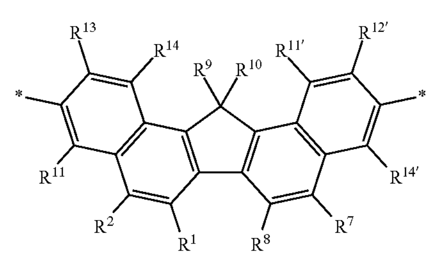

-continued
(26)
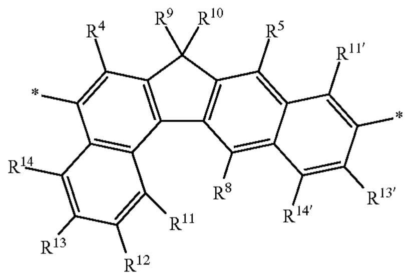
(27)
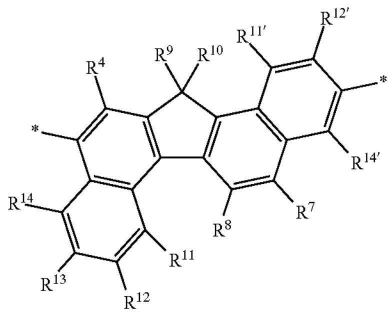
(28)
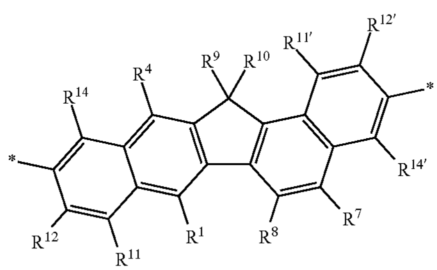
(29)
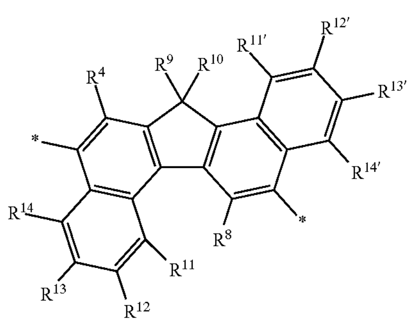
(30)
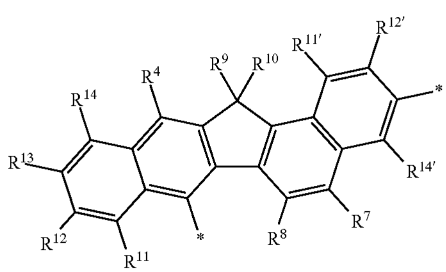
-continued
(31)
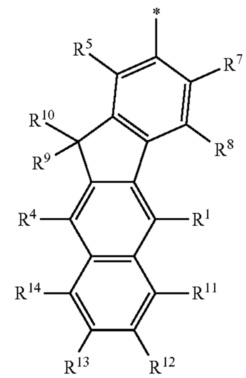
(32)
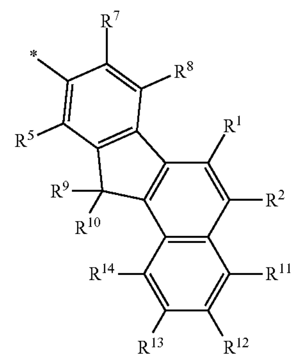
(33)
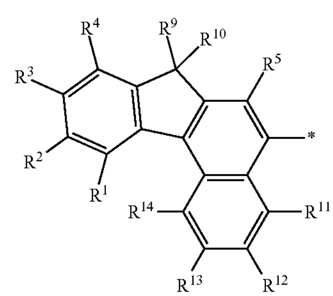
(34)
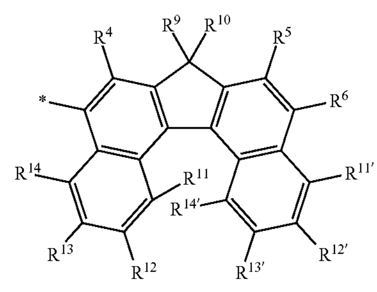
(35)
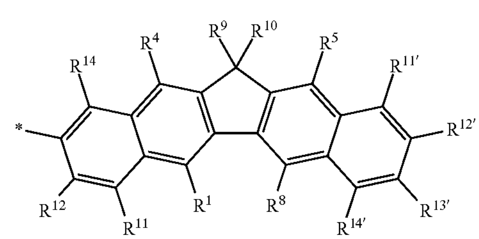

-continued
(36)
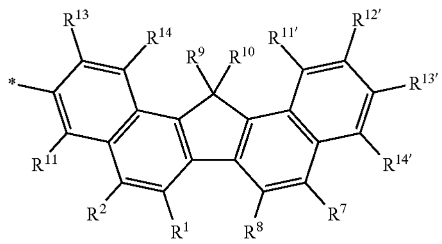
(37)
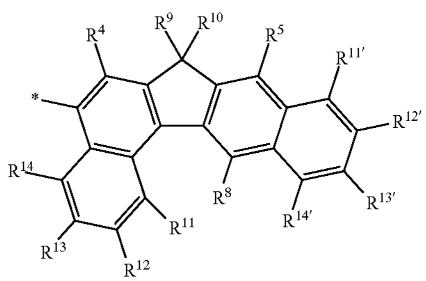
(38)
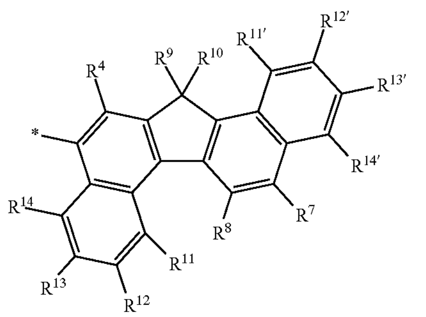
(39)
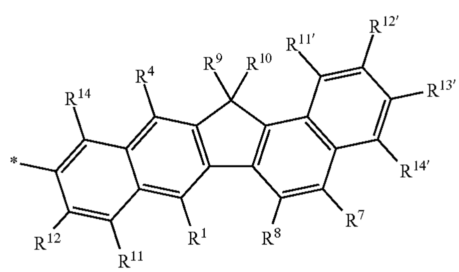
(40)
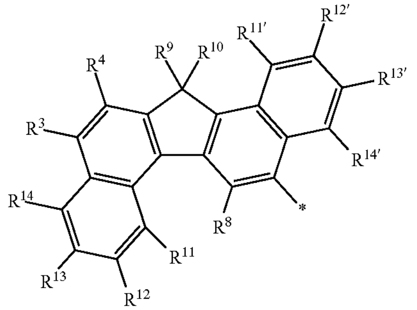
-continued
(41)
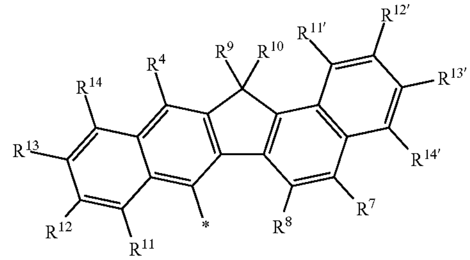
(42)
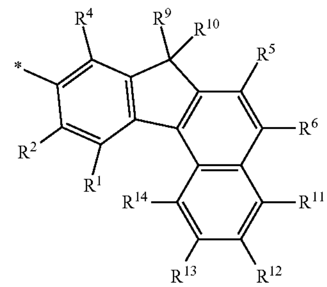
(43)
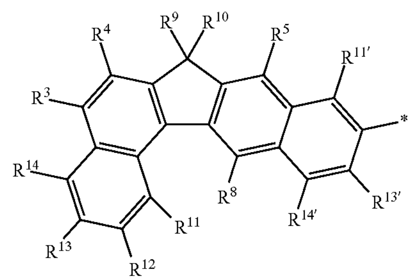
(44)
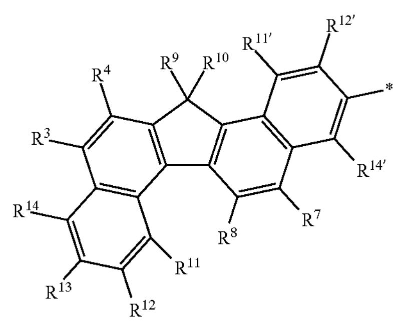
(45)
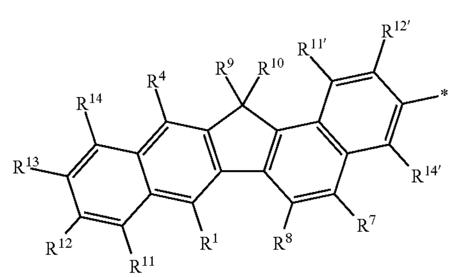
In the formulae (20) to (45), $R^1$ to $R^{14}$ and $R^{11'}$ to $R^{14'}$ are the same as in the formulae (11) to (19), and ** represents a bond to the moiety represented by A.

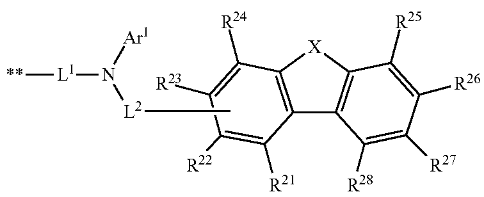

(4)

In the formula (4), $Ar^1$ represents a substituted or unsubstituted aryl group having from 6 to 30 ring carbon atoms or a substituted or unsubstituted heteroaryl group having from to 20 ring atoms;

$L^1$ and $L^2$ each independently represent a single bond, an arylene group having from 6 to 30 ring carbon atoms, a heteroarylene group having from 5 to 30 ring atoms or a divalent linking group formed by bonding 2 to 4 of these groups;

any one among $R^{21}$ to $R^{28}$ represents a bond to the group represented by $L^2$, and the others thereof each independently represent a hydrogen atom, a fluorine atom, a cyano group, a substituted or unsubstituted alkyl group having from 1 to 20 carbon atoms, a substituted or unsubstituted cycloalkyl group having from 3 to 20 ring carbon atoms, a substituted or unsubstituted alkoxy group having from 1 to 20 carbon atoms, a substituted or unsubstituted aryloxy group having from 6 to 30 ring carbon atoms, a substituted or unsubstituted alkylthio group having from 1 to 20 carbon atoms, a substituted or unsubstituted arylthio group having from 6 to 30 ring carbon atoms, a substituted or unsubstituted alkylsilyl group having from 3 to 50 carbon atoms, a substituted or unsubstituted arylsilyl group having from 6 to 50 ring carbon atoms, a substituted or unsubstituted aryl group having from 6 to 30 ring carbon atoms or a substituted or unsubstituted heteroaryl group having from 5 to 30 ring atoms, or members of one or more combinations selected among combinations of $R^{21}$ and $R^{22}$, $R^{22}$ and $R^{23}$, $R^{23}$ and $R^{24}$, $R^{25}$ and $R^{26}$, $R^{26}$ and $R^{27}$, and $R^{27}$ and $R^{28}$ are bonded to each other to form a saturated or unsaturated ring structure;

X represents an oxygen atom or a sulfur atom; and

** represents a bonding position to the structure represented by B.

The amine moiety represented by the formula (4) is preferably represented by the following formula (4-1) or (4-2).

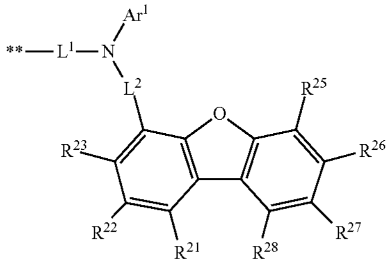

(4-1)

-continued

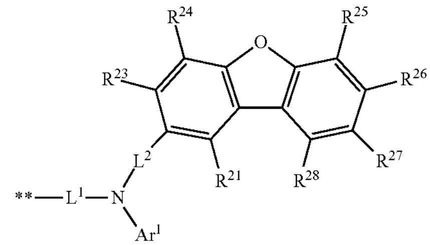

(4-2)

In the formulae (4-1) and (4-2), $R^{21}$ to $R^{28}$, $Ar^1$, $L^1$ and $L^2$ have the same meanings as in the formula (4).

The amine compound represented by the formula (1) of the present invention is preferably a compound having the amine moiety A represented by the formula (4-1) or (4-2) and the structure B represented by any one of the formulae (20) to (45), and is particularly preferably the compound further having n of 2.

In the formula (1), n is preferably 1 or 2, and more preferably 2.

In the formula (4), it is preferred that X is an oxygen atom, and $R^{22}$, $R^{24}$, $R^{25}$ or $R^{27}$ is a bond to $L^2$, and it is more preferred that $R^{24}$ or $R^{25}$ is a bond to $L^2$. In the case where $R^{24}$ or $R^{25}$ is a bond to $L^2$, emitted light having a shorter wavelength may be obtained, and an organic EL device using the compound as a material may emit light with high blue purity.

Examples of the alkyl group having from 1 to 20 (preferably from 1 to 10, and more preferably from 1 to 5) carbon atoms include a methyl group, an ethyl group, an n-propyl group, an isopropyl group, an n-butyl group, an isobutyl group, an s-butyl group, a t-butyl group, a pentyl group (including isomers), a hexyl group (including isomers), a heptyl group (including isomers), an octyl group (including isomers), a nonyl group (including isomers), a decyl group (including isomers), an undecyl group (including isomers) and a dodecyl group (including isomers), preferred examples thereof include a methyl group, an ethyl group, an n-propyl group, an isopropyl group, an n-butyl group, an isobutyl group, an s-butyl group, a t-butyl group and a pentyl group (including isomers), more preferred examples thereof include a methyl group, an ethyl group, an n-propyl group, an isopropyl group, an n-butyl group, an isobutyl group, an s-butyl group and a t-butyl group, and particularly preferred examples thereof include a methyl group, an ethyl group, an isopropyl group and a t-butyl group.

Examples of the cycloalkyl group having from 3 to 20 (preferably from 3 to 6, and more preferably 5 or 6) ring carbon atoms include a cyclopropyl group, a cyclobutyl group, a cyclopentyl group, a cyclohexyl group, a cycloheptyl group, a cyclooctyl group and an adamantyl group, and preferred examples thereof include a cyclopentyl group and a cyclohexyl group.

Examples of the alkylsilyl group having from 3 to 50 carbon atoms include a monoalkylsilyl group, a dialkylsilyl group and a trialkylsilyl group, and specific examples of the alkyl groups are the same as described for the alkyl group above.

Examples of the arylsilyl group having from 6 to 50 ring carbon atoms include a monoarylsilyl group, a diarylsilyl group and a triarylsilyl group, and specific examples of the aryl groups are the same as described for the aryl group described below.

Examples of the aryl group having from 6 to 30 (preferably from 6 to 24, and more preferably from 6 to 18) ring carbon atoms include a phenyl group, a naphthylphenyl group, a biphenylyl group, a terphenylyl group, a naphthyl group, an acenaphthylenyl group, an anthryl group, a benzoanthryl group, an aceanthryl group, a phenanthryl group, a benzo[c]phenanthryl group, a phenalenyl group, a fluorenyl group, a picenyl group, a pentaphenyl group, a pyrenyl group, a chrysenyl group, a benzo[g]chrysenyl group, an s-indacenyl group, an as-indacenyl group, a fluorantenyl group, a benzo[k]fluorantenyl group, a triphenylenyl group, a benzo[b]triphenylenyl group and a perylenyl group, preferred examples thereof include a phenyl group, a biphenylyl group, a terphenylyl group and a naphthyl group, more preferred examples thereof include a phenyl group, a biphenylyl group and a terphenylyl group, and particularly preferred examples thereof include a phenyl group.

Examples of the aryl group having a substituent include a phenylnaphthyl group, a naphtylphenyl group, a tolyl group, a xylyl group, a 9,9-dimethylfluorenyl group and a 9,9-diphenylfluorenyl group.

The heteroaryl group having from 5 to 30 (preferably from 6 to 24, and more preferably from 6 to 18) ring atoms has at least one, preferably from 1 to 5, hetero atom, such as a nitrogen atom, an oxygen atom and a sulfur atom. Examples of the heteroaryl group include a pyrrolyl group, a furyl group, a thienyl group, a pyridyl group, a pyridazinyl group, a pyrimidinyl group, a pyrazinyl group, a triazinyl group, an imidazolyl group, an oxazolyl group, a thiazolyl group, a pyrazolyl group, an isoxazolyl group, an isothiazolyl group, an oxadiazolyl group, a thiadiazolyl group, a triazolyl group, a tetrazolyl group, an indolyl group, an isoindolyl group, a benzofuranyl group, an isobenzofuranyl group, a benzothiophenyl group, an isobenzothiophenyl group, an indolizinyl group, a quinolizinyl group, a quinolyl group, an isoquinolyl group, a cinnolyl group, a phthalazinyl group, a quinazolinyl group, a quinoxalinyl group, a benzimidazolyl group, a benzoxazolyl group, a benzothiazolyl group, an indazolyl group, a benzisoxazolyl group, a benzisothiazolyl group, a dibenzofuranyl group, a dibenzothiophenyl group, a carbazolyl group, a phenanthridinyl group, an acridinyl group, a phenanthrolinyl group, a phenazinyl group, a phenothiazinyl group, a phenoxazinyl group and a xanthenyl group, preferred examples thereof include a furyl group, a thienyl group, a pyridyl group, a pyridazinyl group, a pyrimidinyl group, a pyrazinyl group, a triazinyl group, a benzofuranyl group, a benzothiophenyl group, a dibenzofuranyl group and a dibenzothiophenyl group, and more preferred examples thereof include a benzofuranyl group, a benzothiophenyl group, a dibenzofuranyl group and a dibenzothiophenyl group.

Specific examples of the amine compound represented by the formula (1) are shown below, but the amine compound is not limited to these compounds.

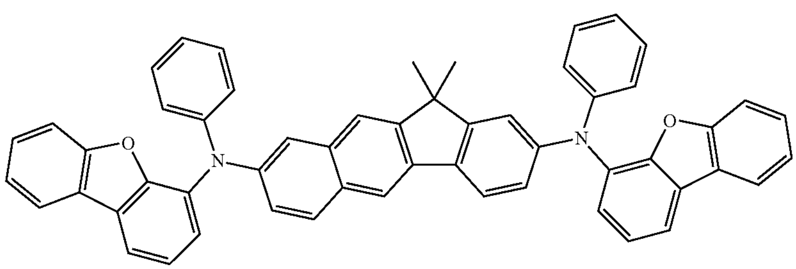

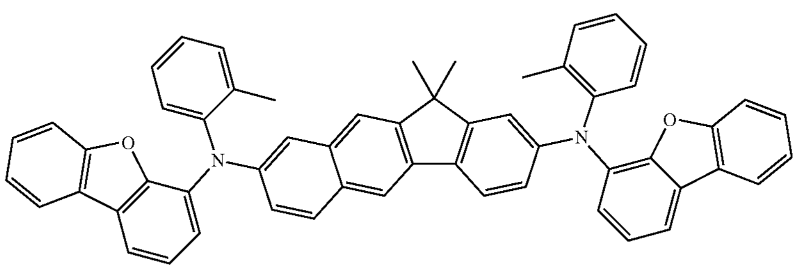

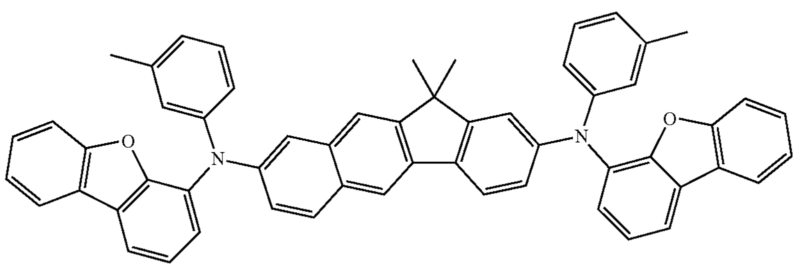

-continued
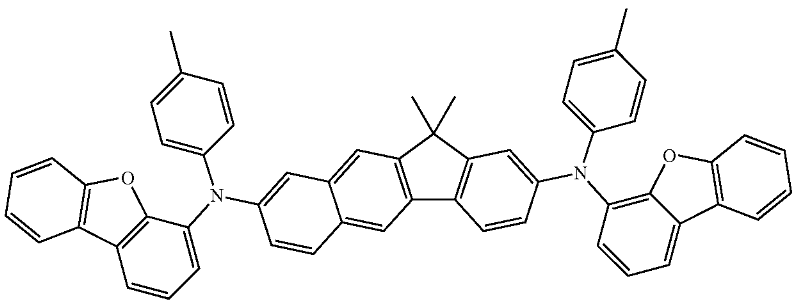
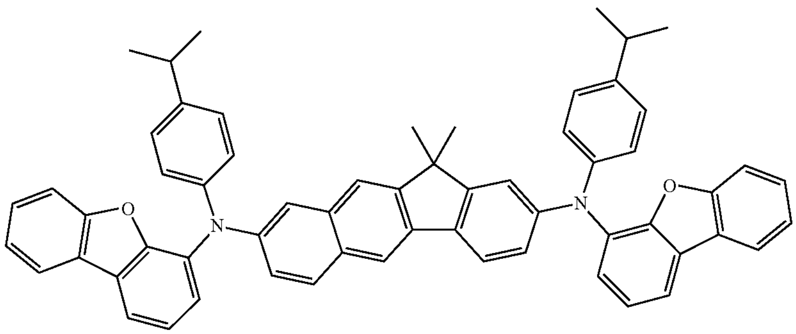
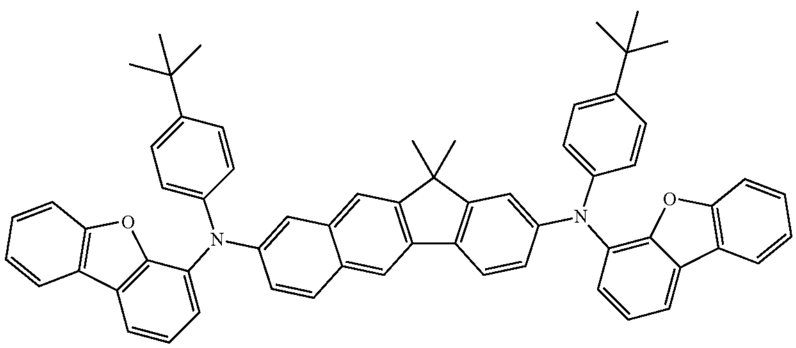
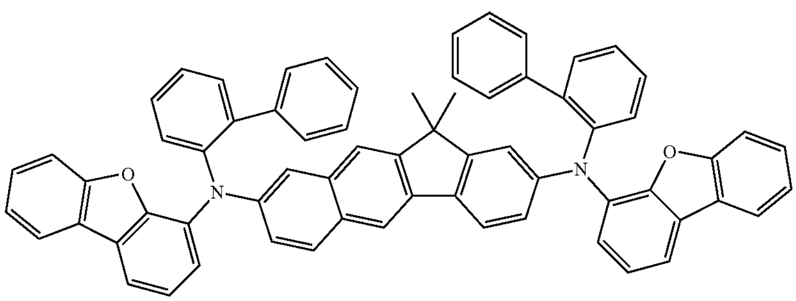
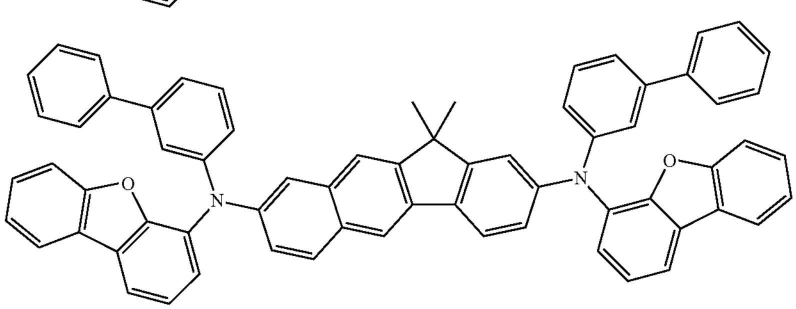

-continued
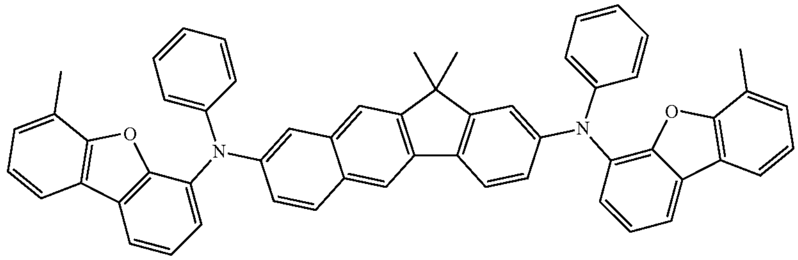
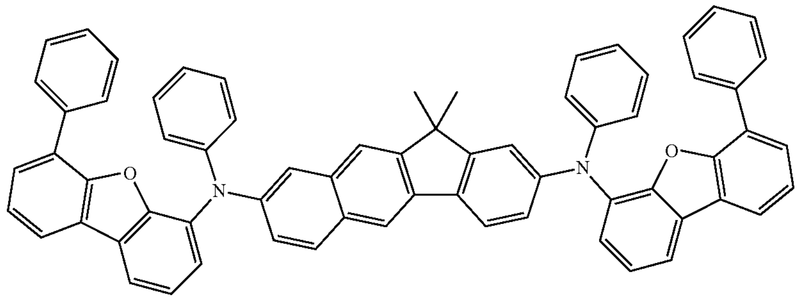
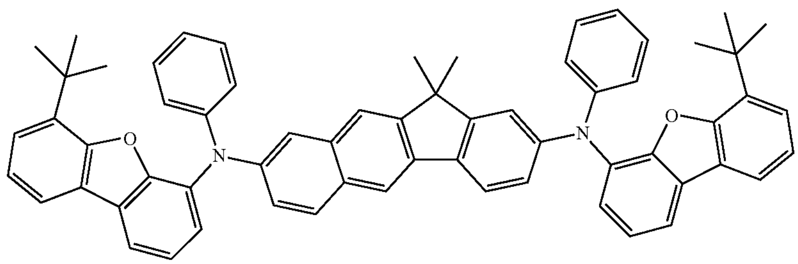
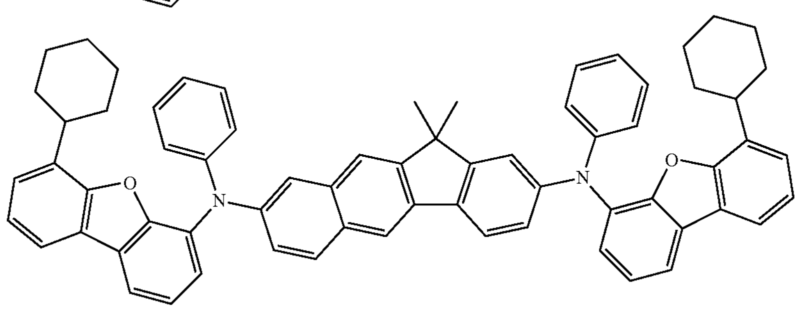
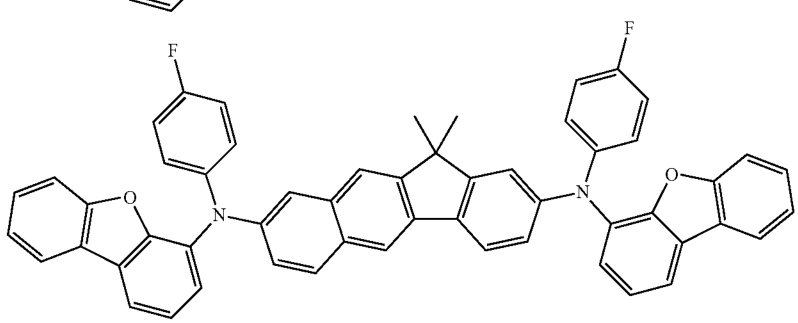
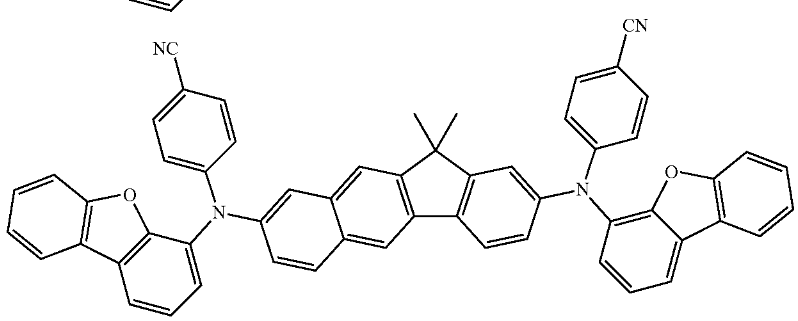

-continued
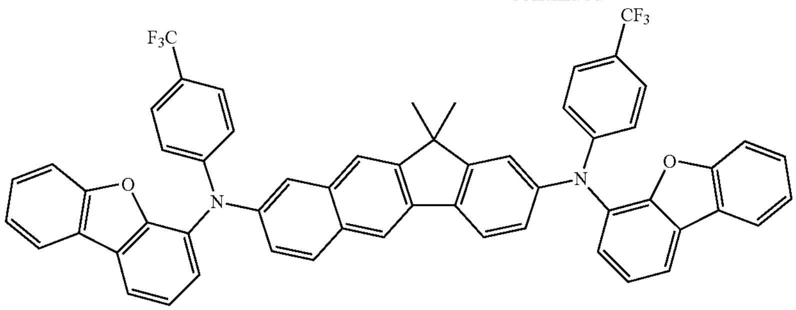
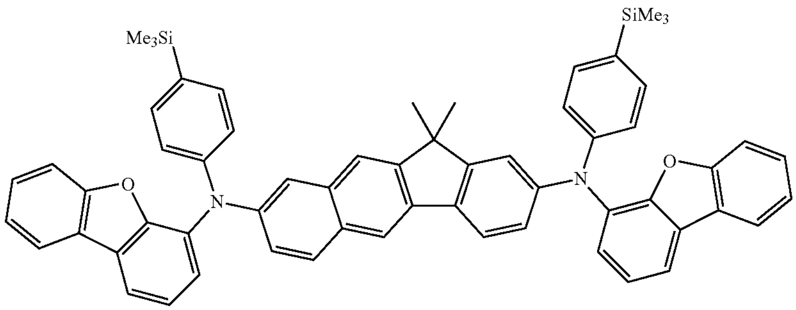
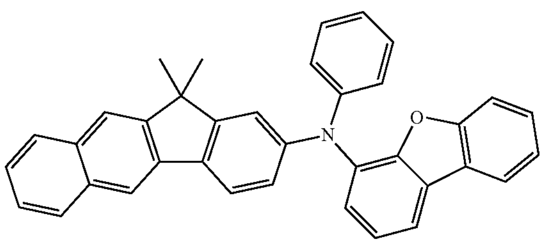
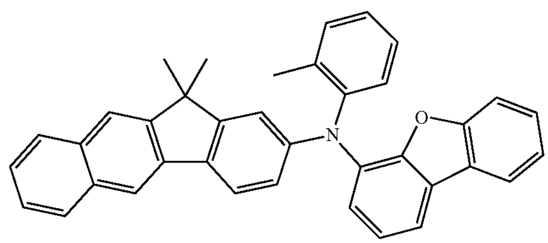
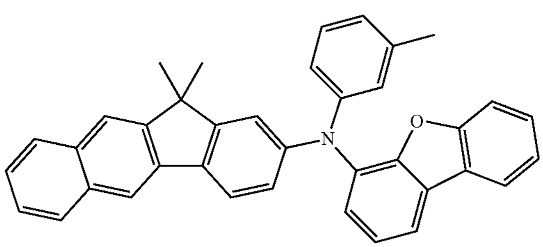
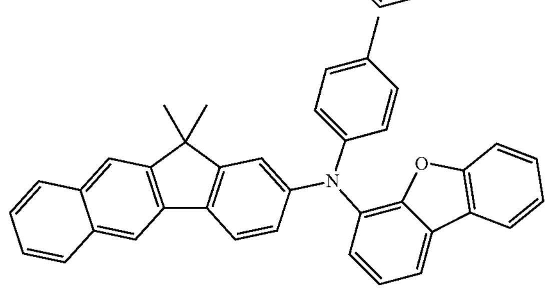
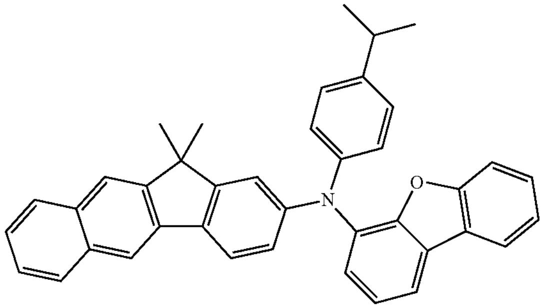
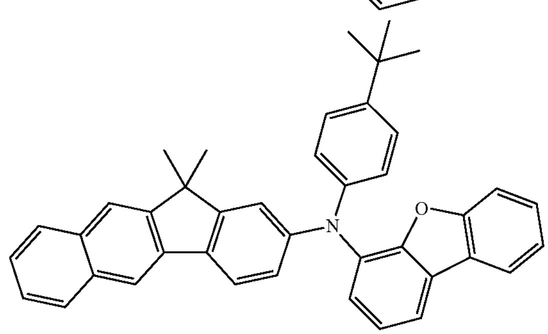
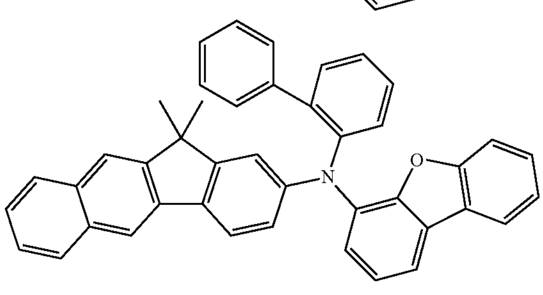
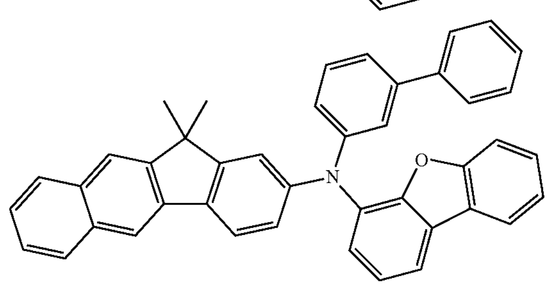

-continued
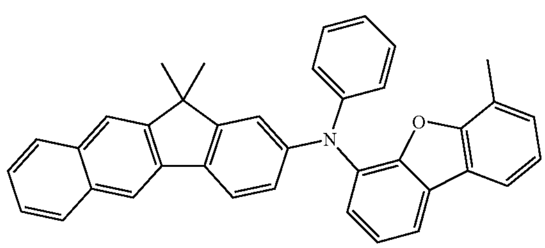
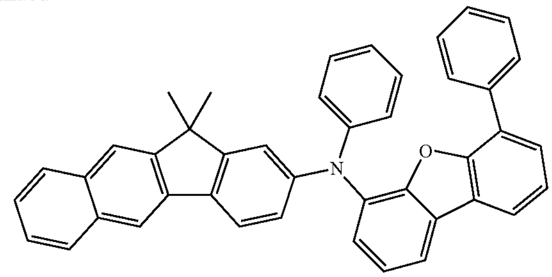
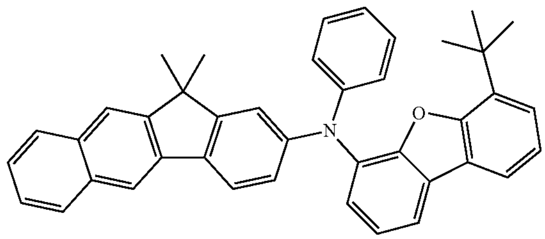
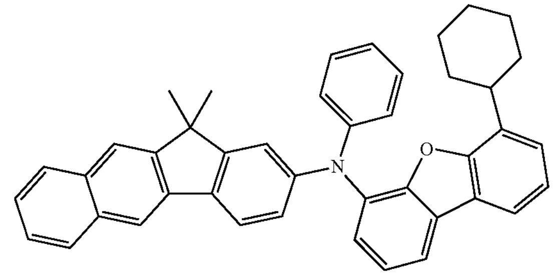
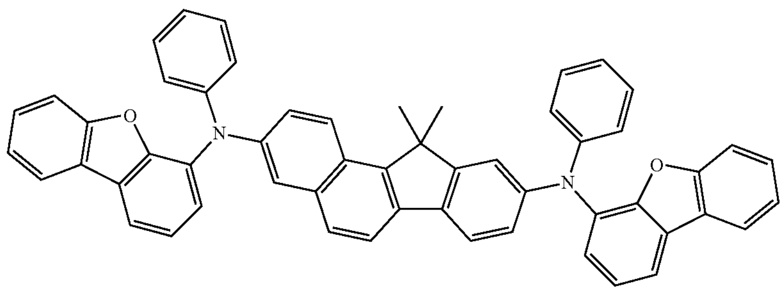
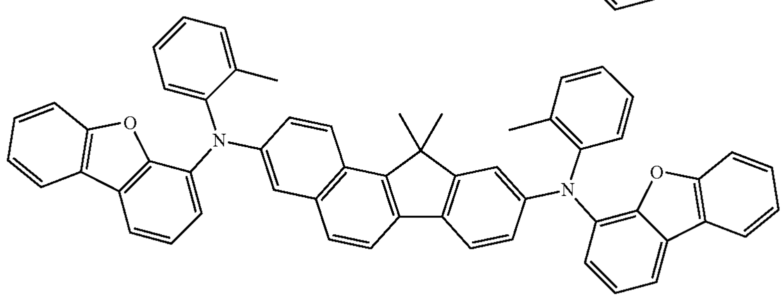
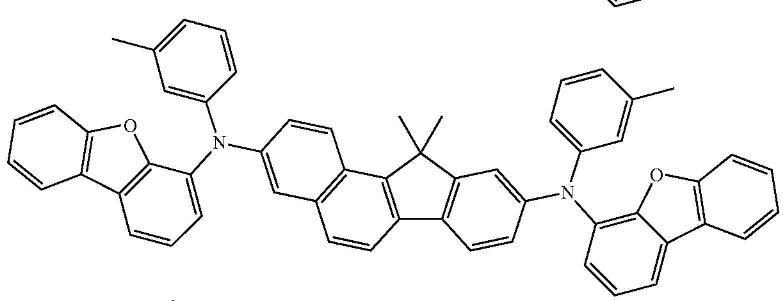
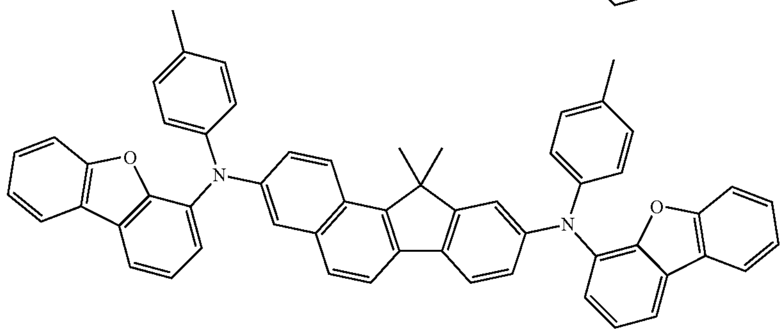

-continued
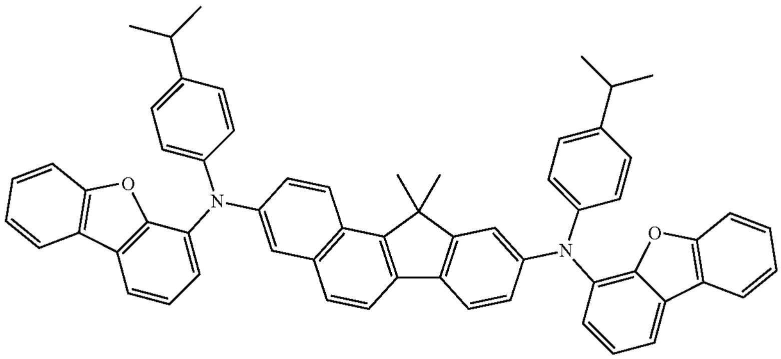
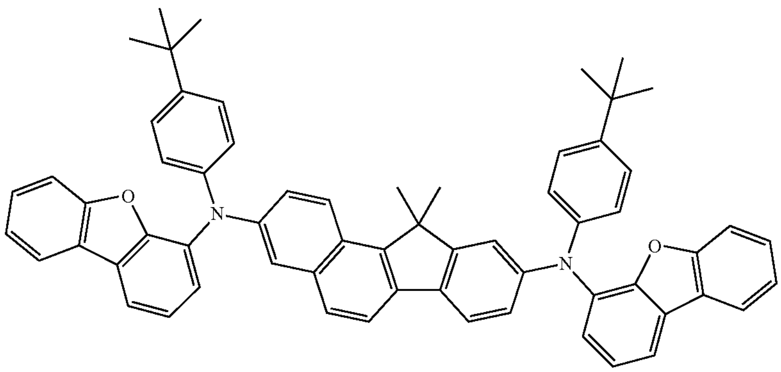
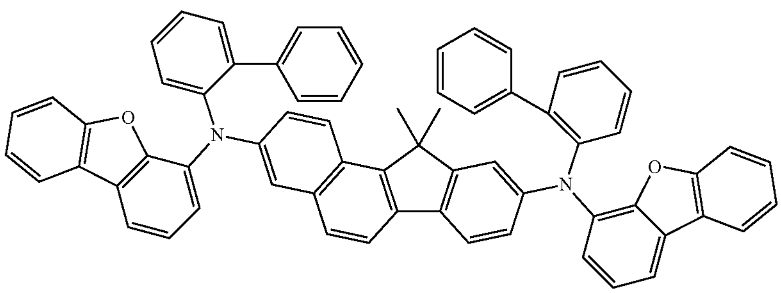
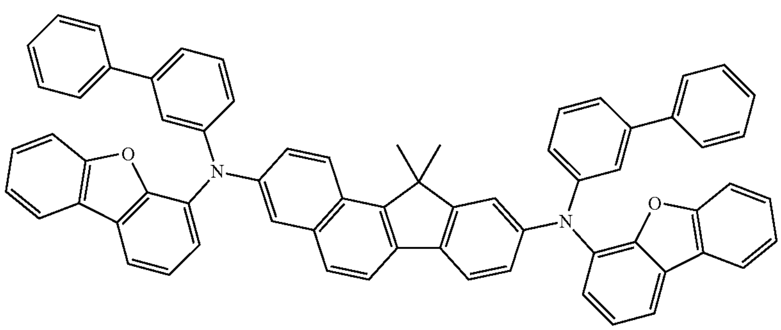
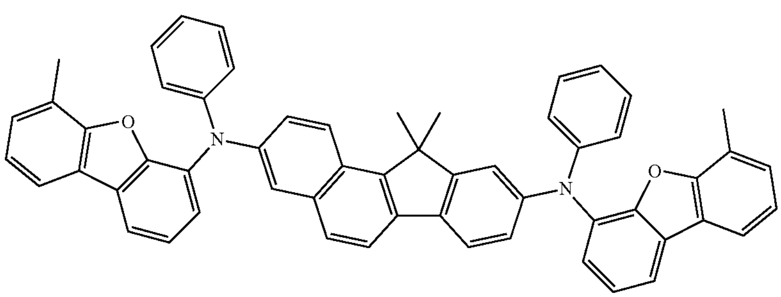

-continued
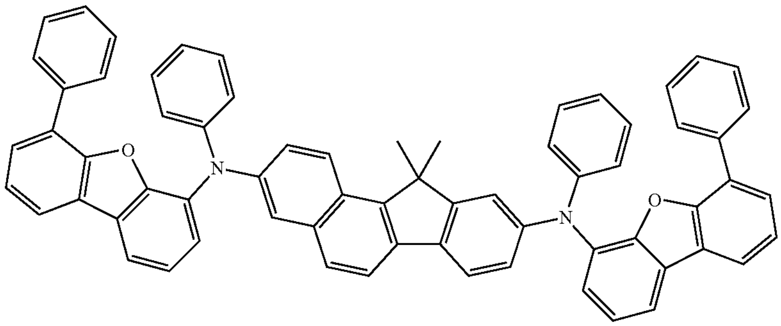
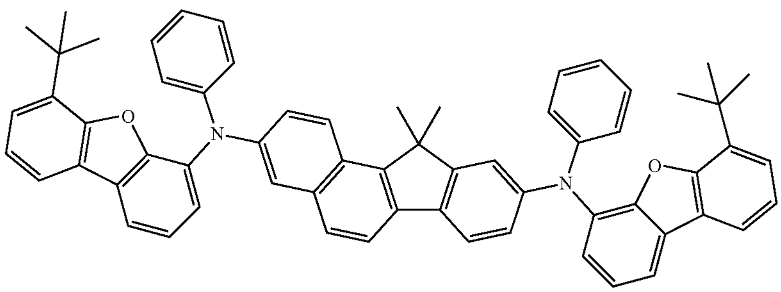
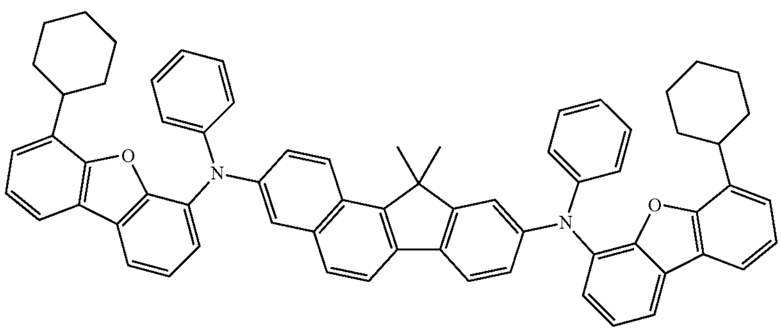
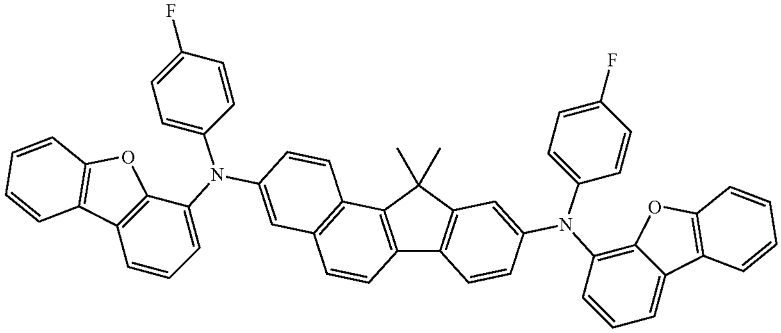
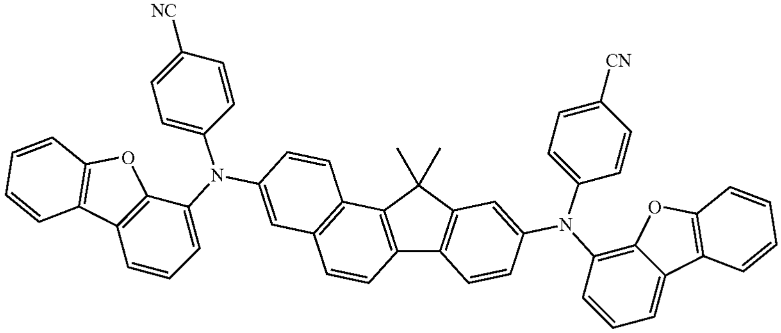

-continued
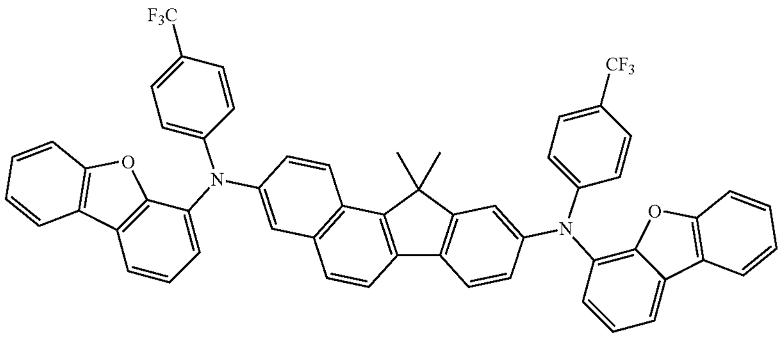
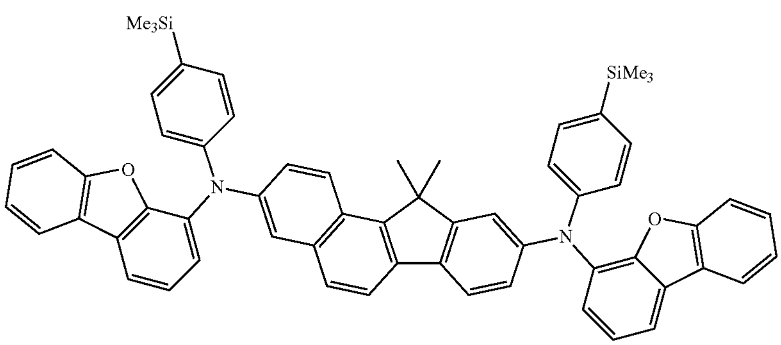
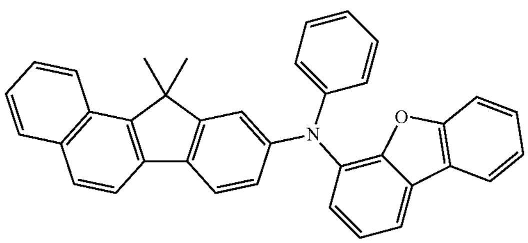
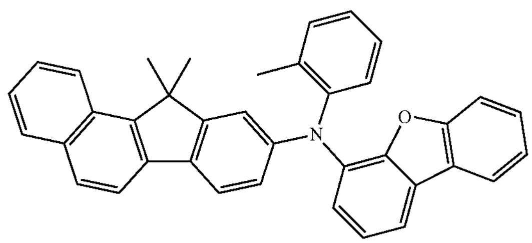
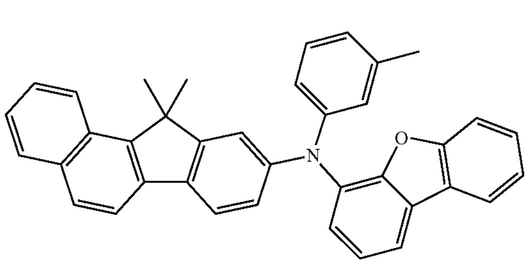
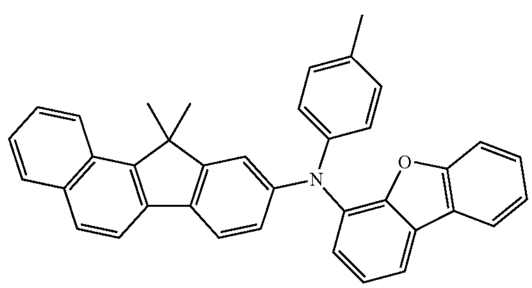
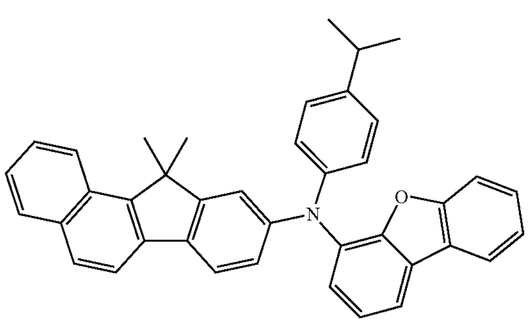
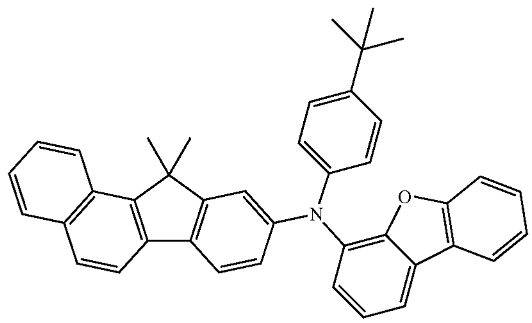

-continued
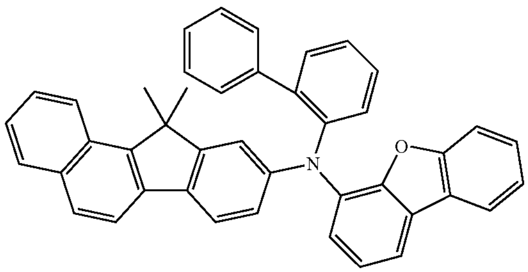
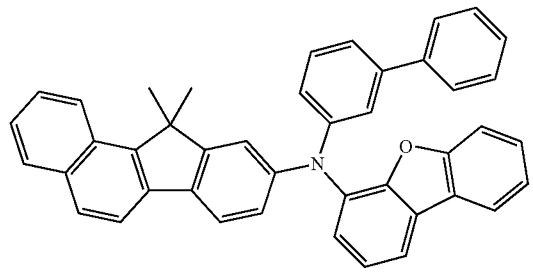
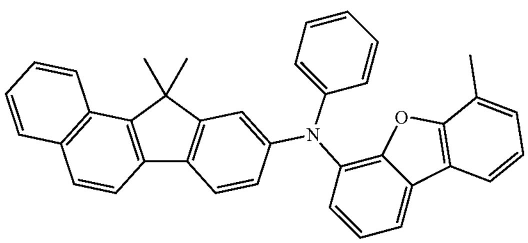
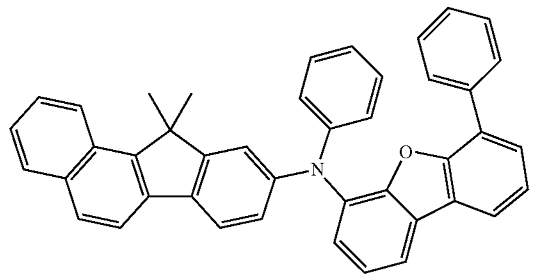
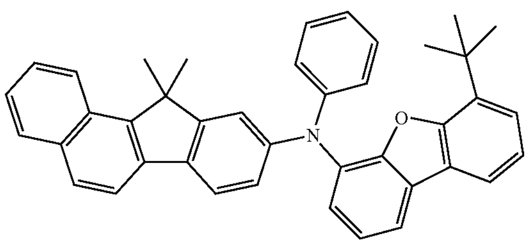
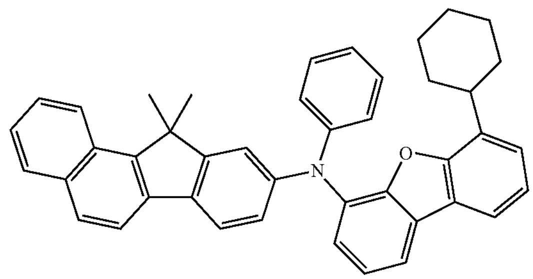
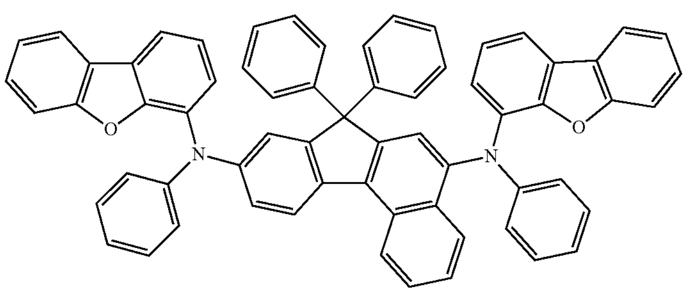
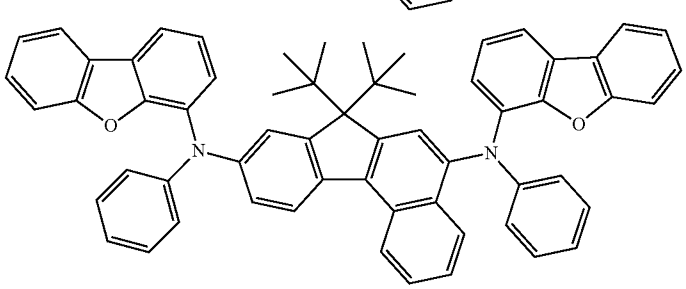
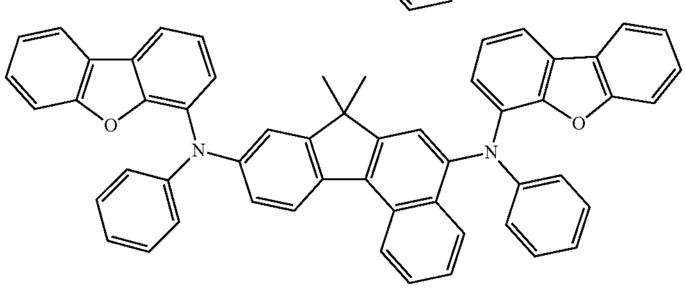

-continued
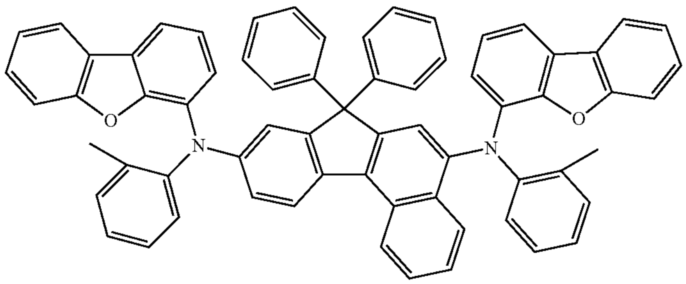
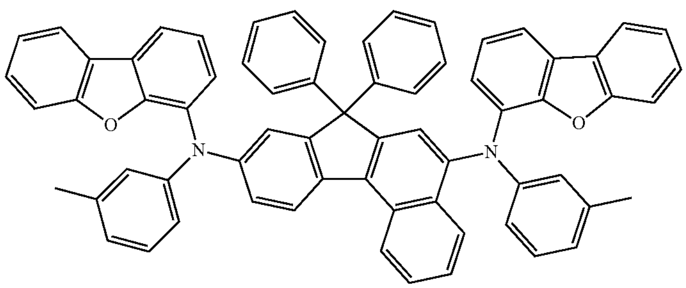
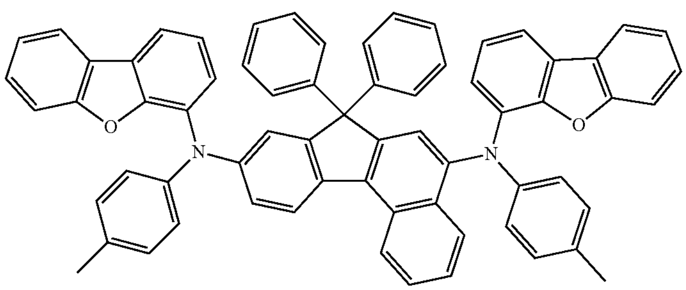
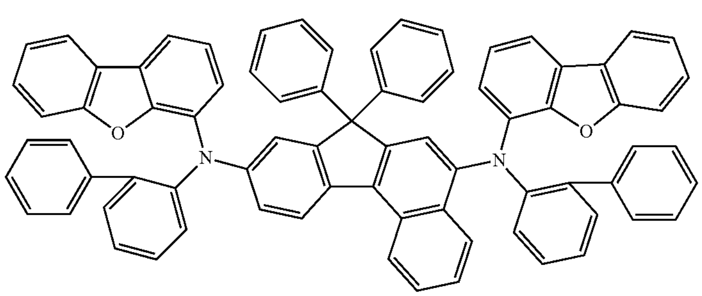
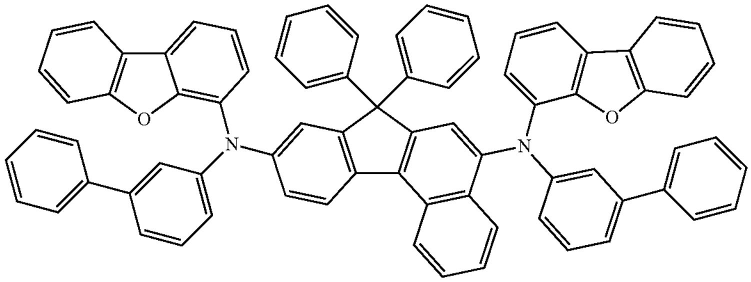

-continued
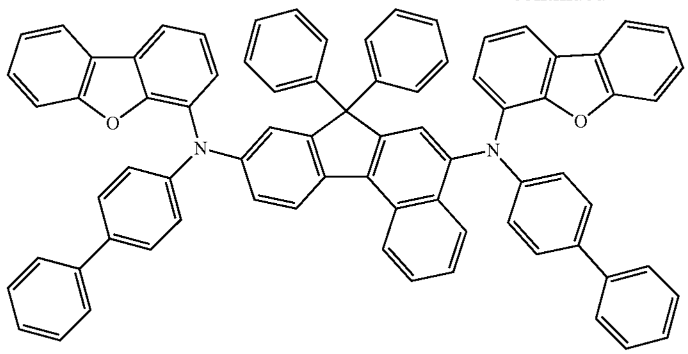
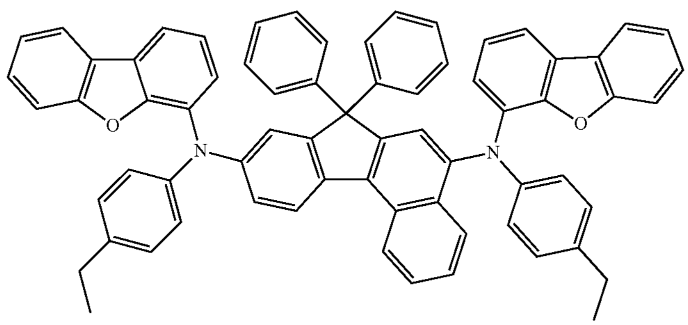
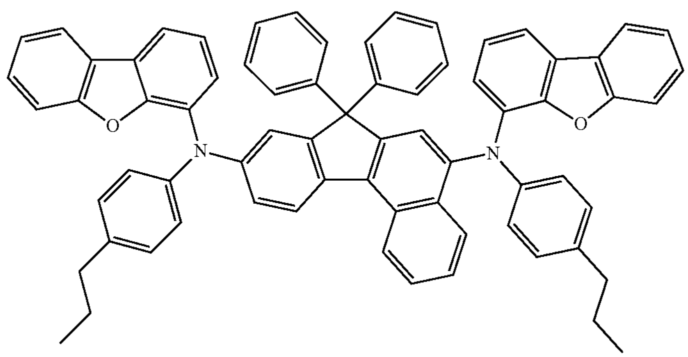
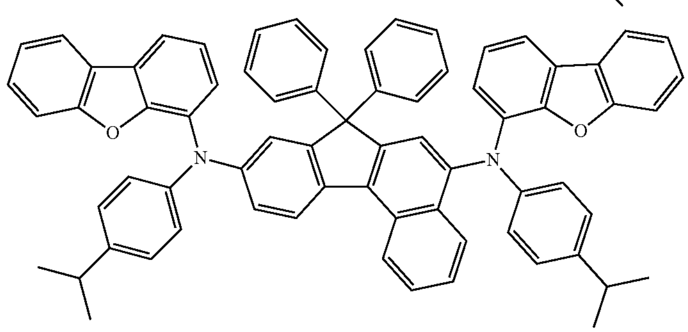
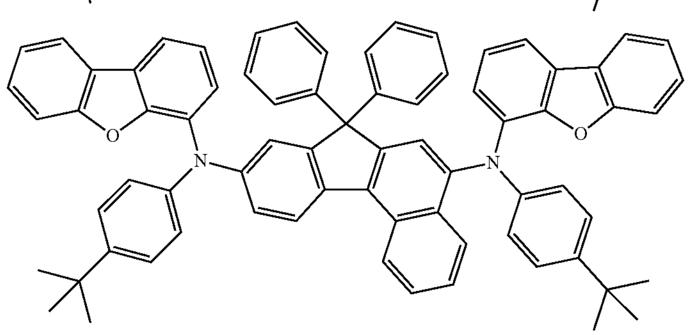

-continued
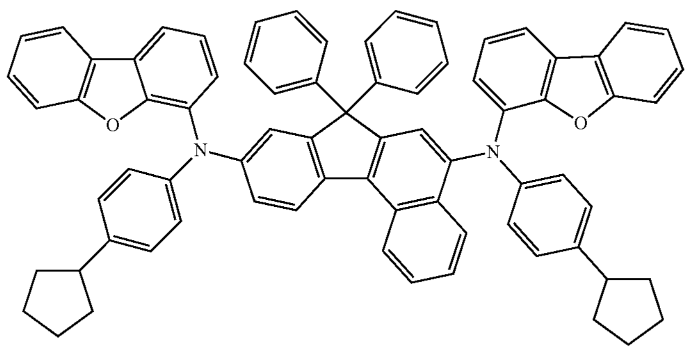
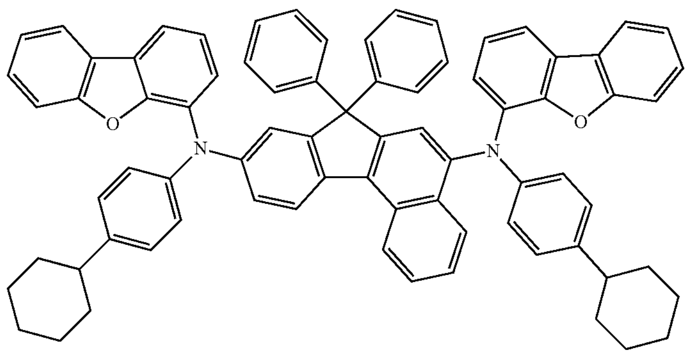
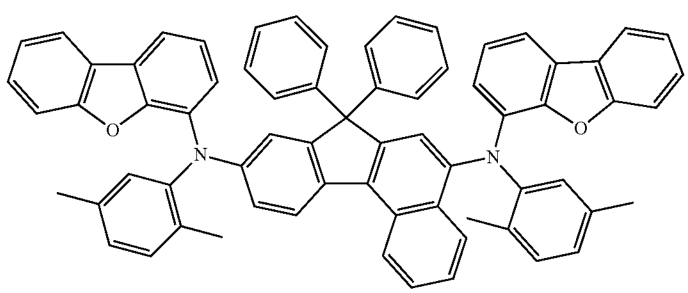
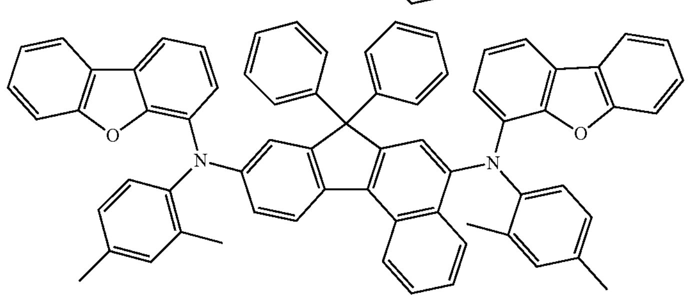
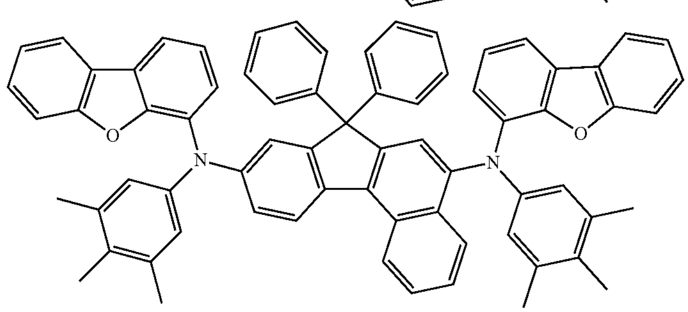

-continued
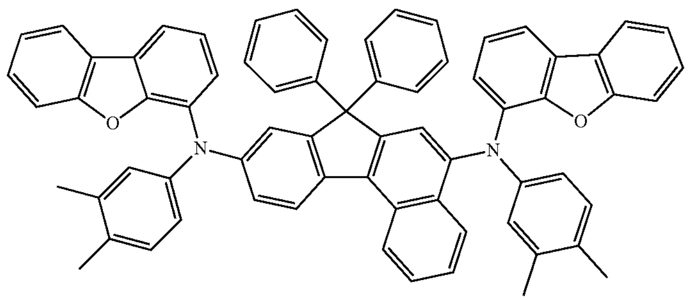
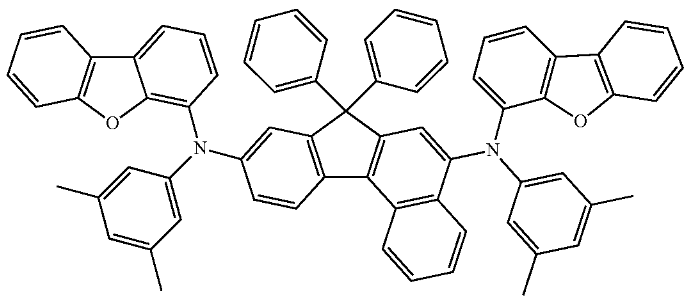
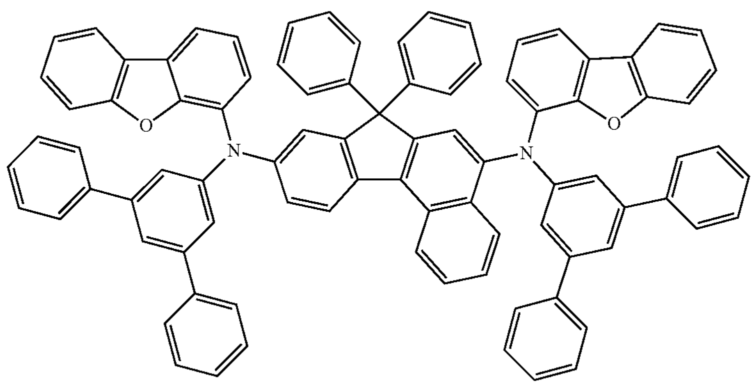
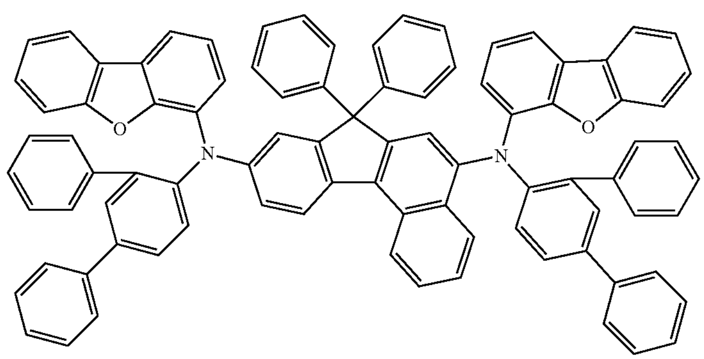
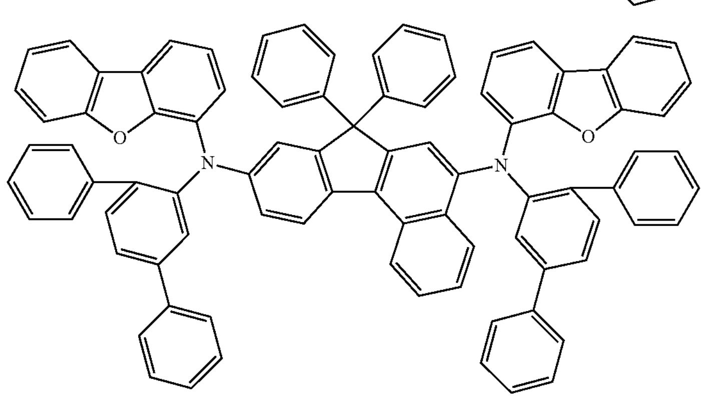

-continued
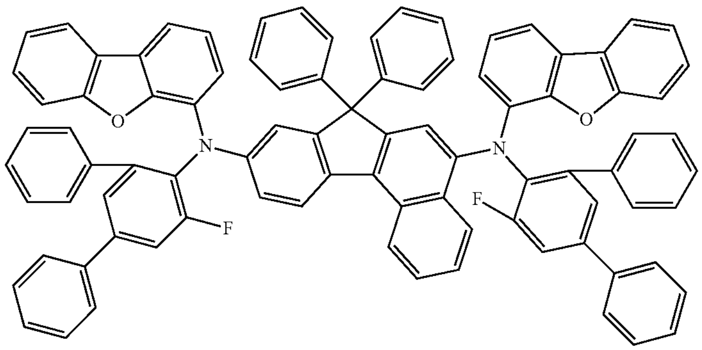
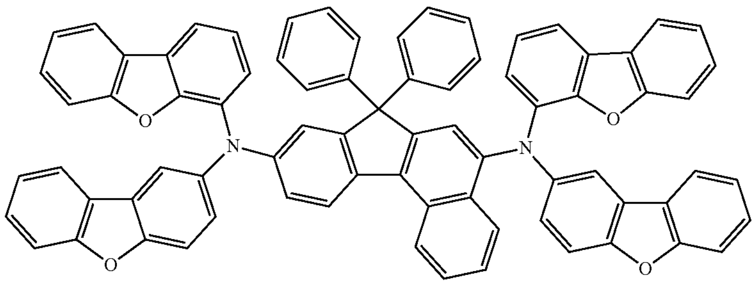
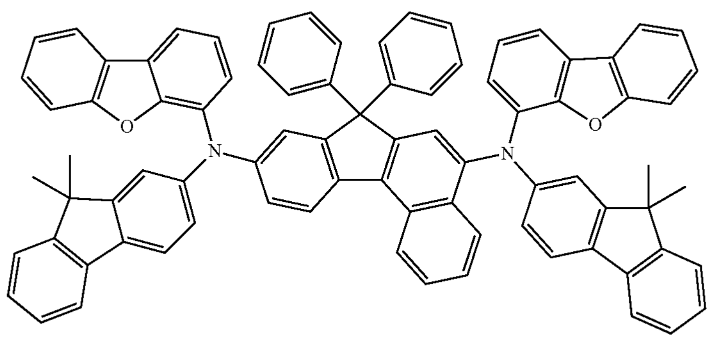
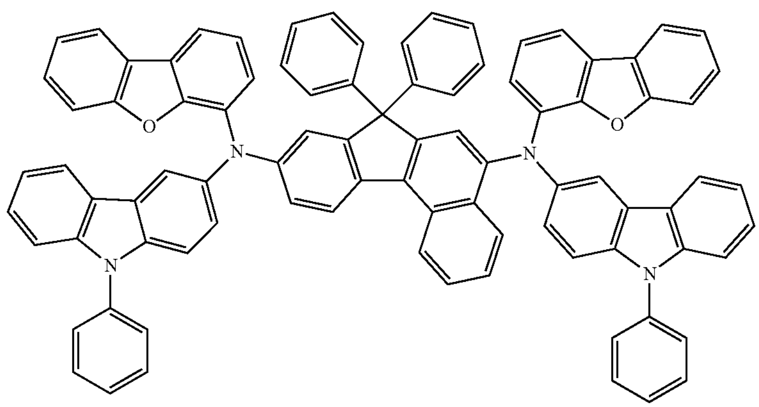
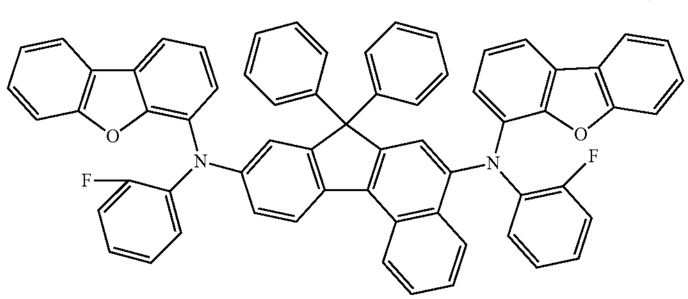

-continued
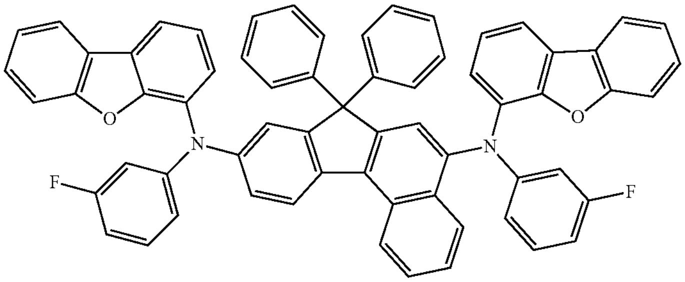
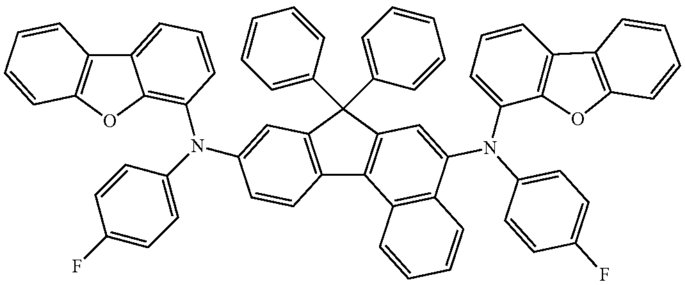
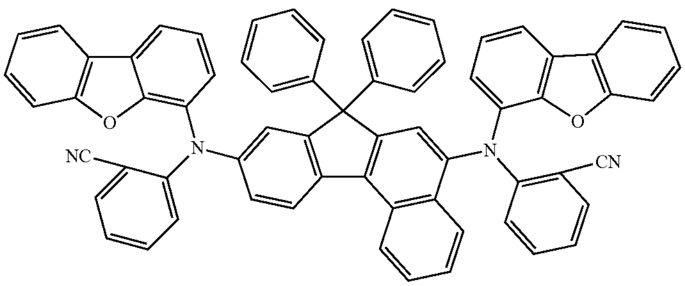
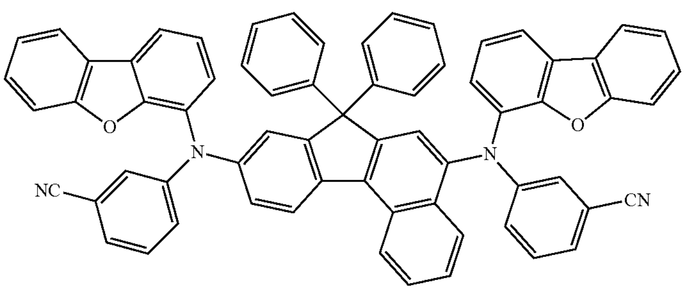
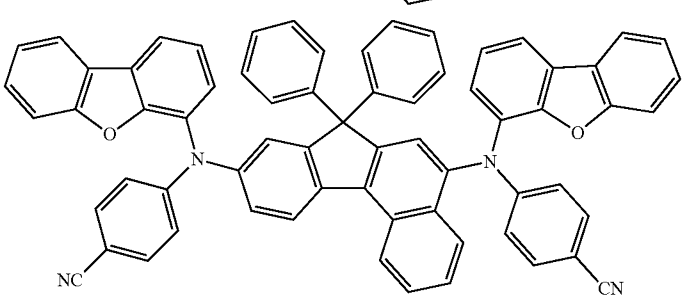
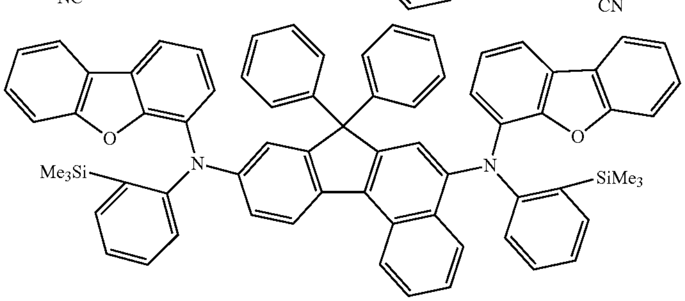

-continued
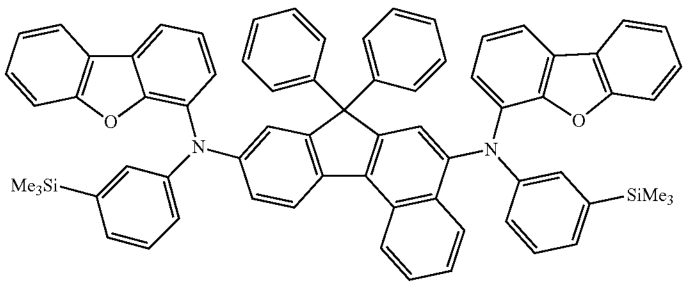
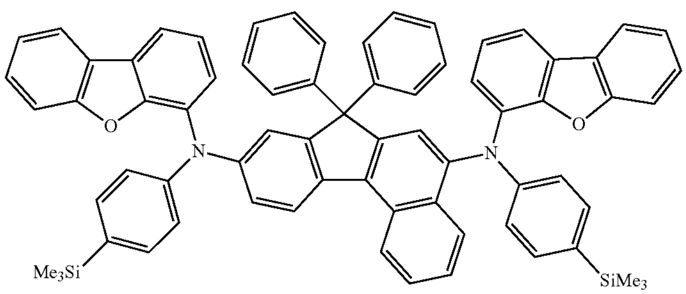
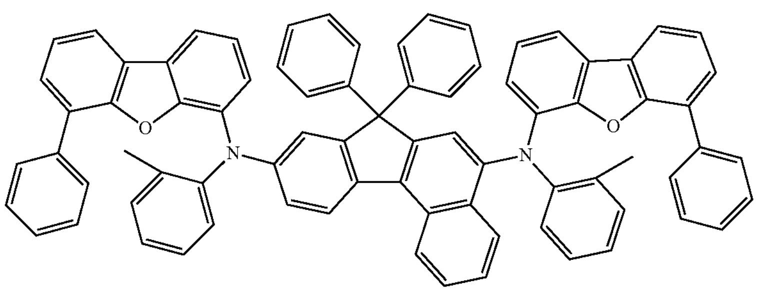
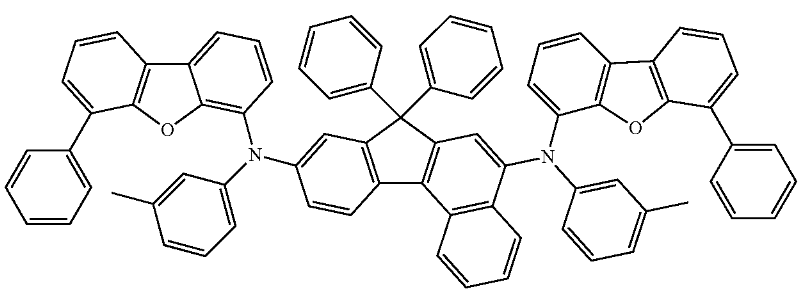
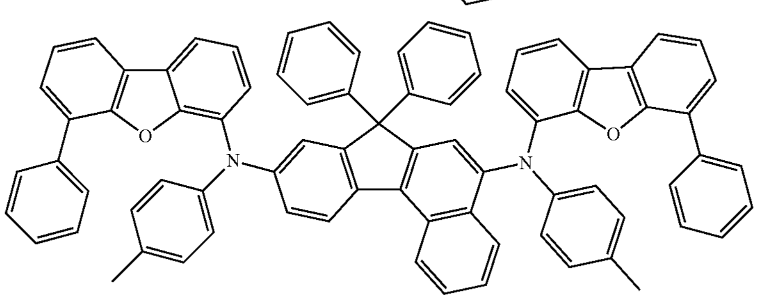

-continued
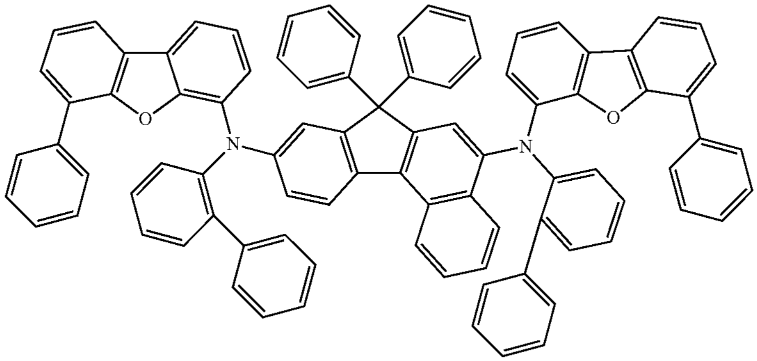
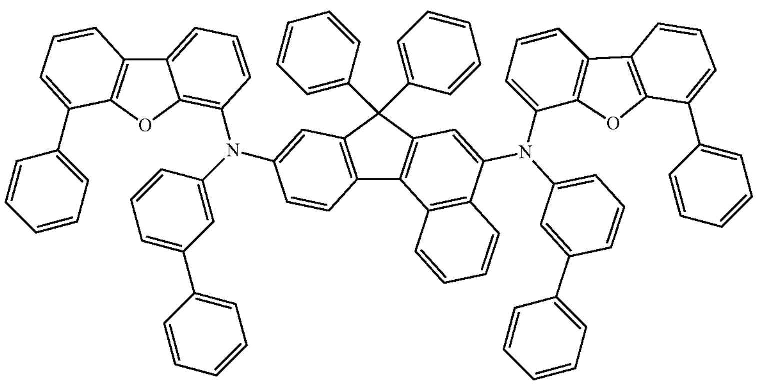
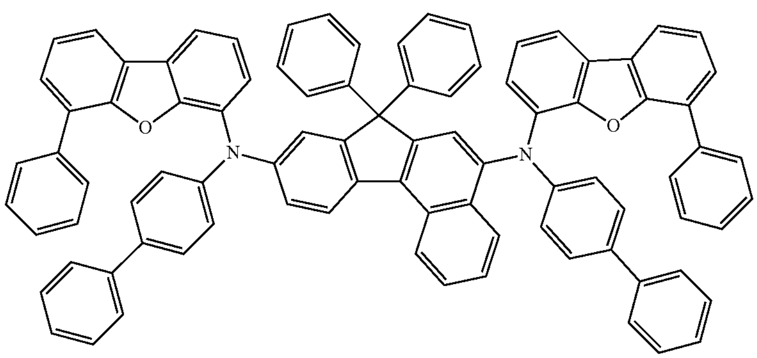
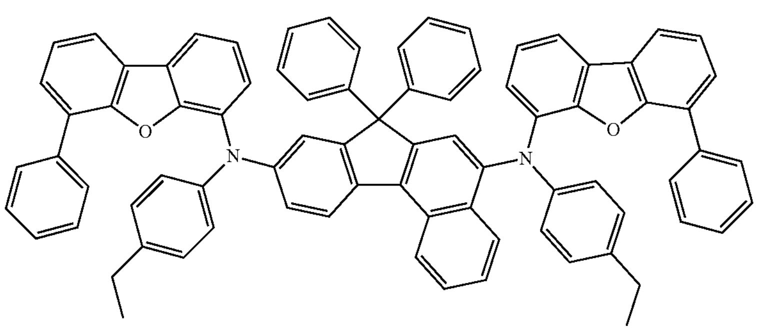

-continued
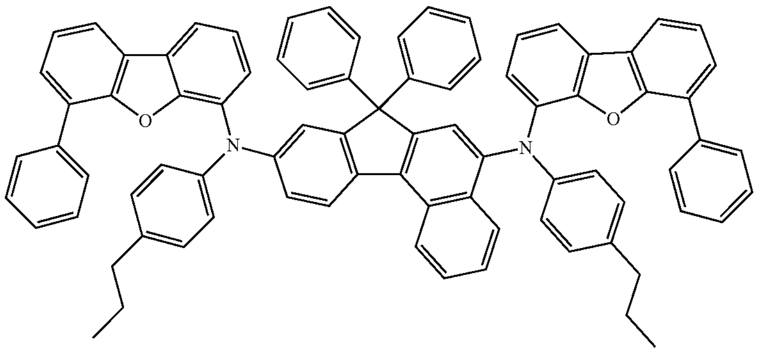
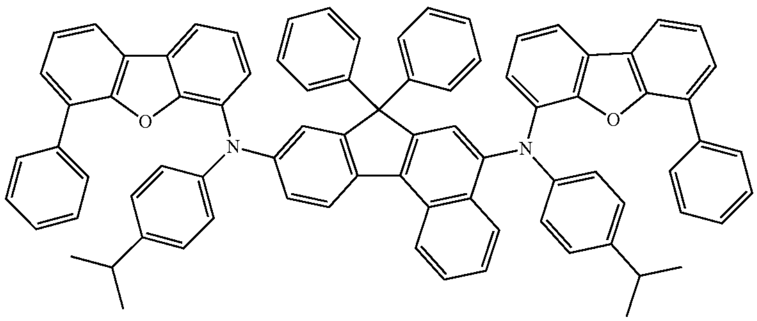
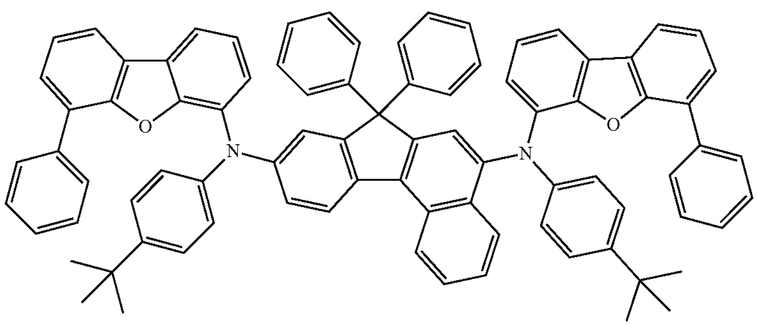
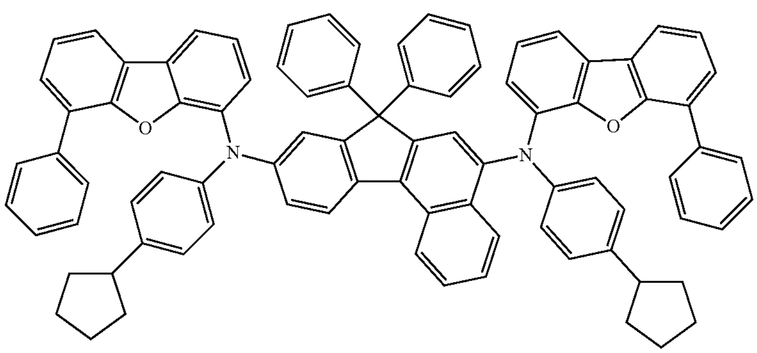
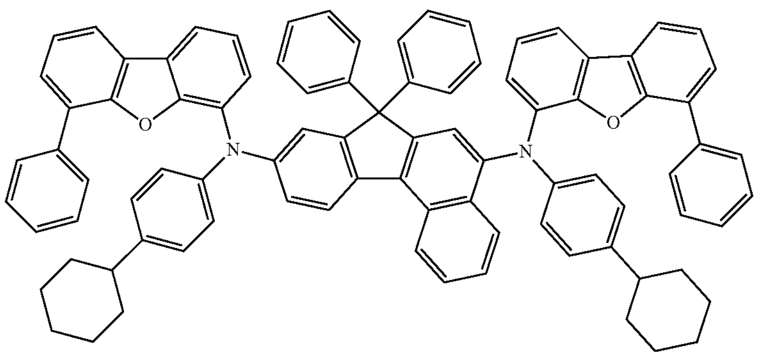

-continued
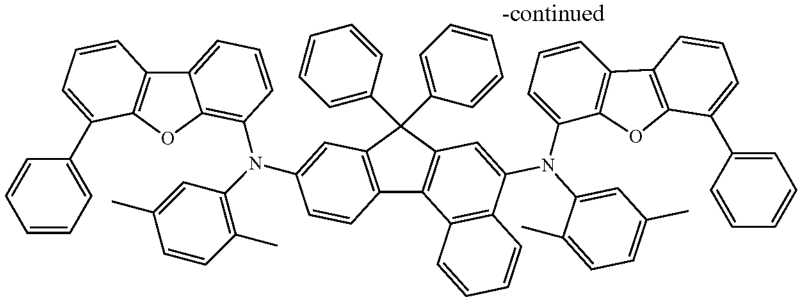
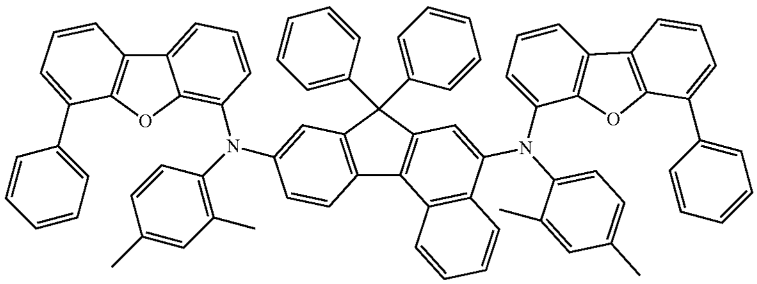
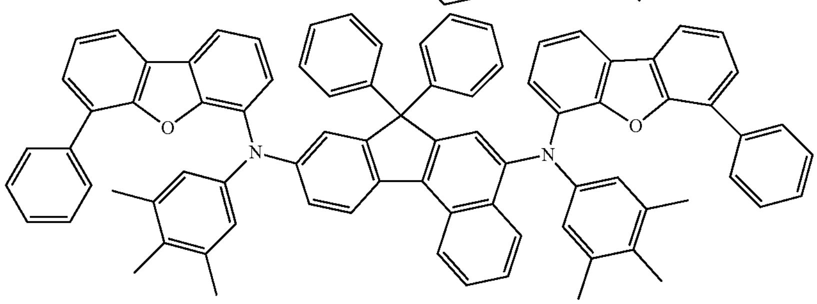
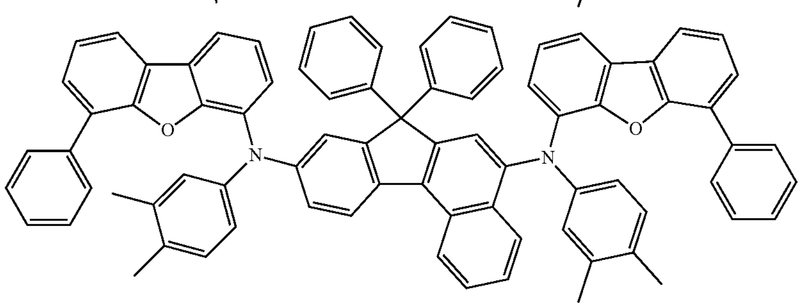
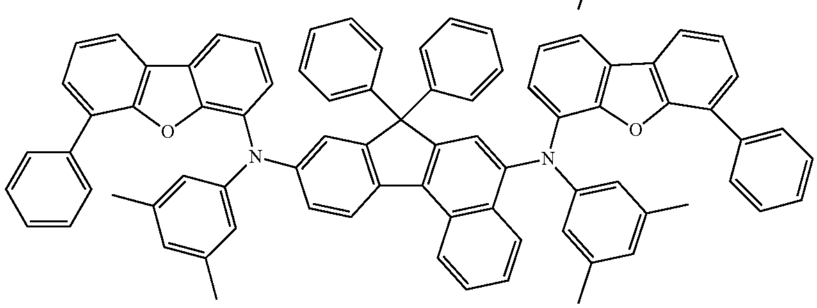
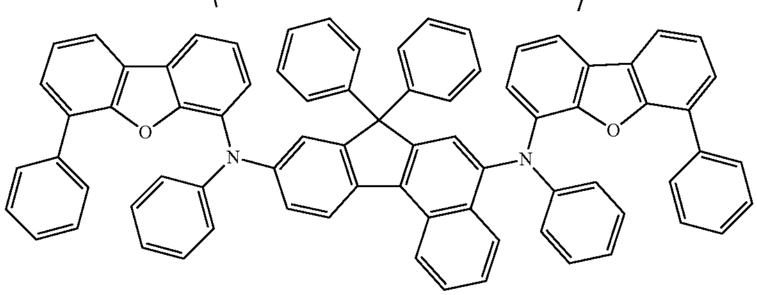

-continued
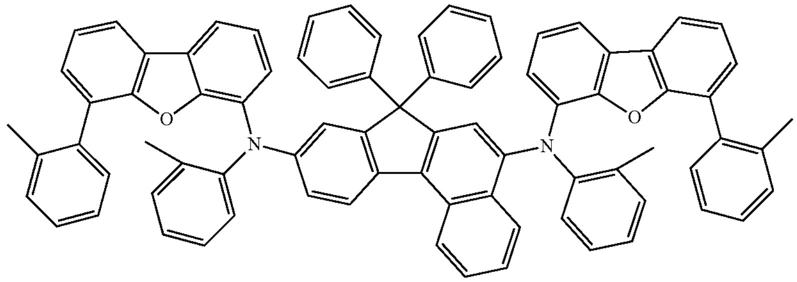
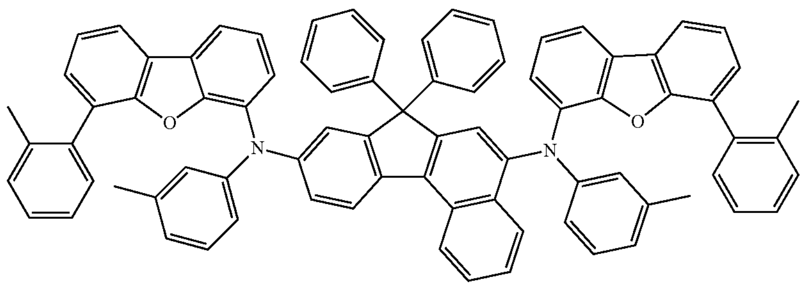
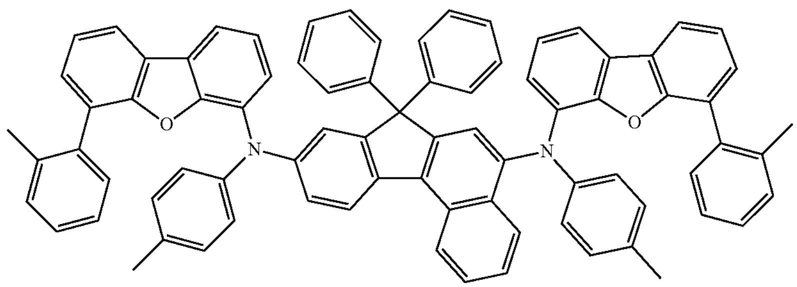
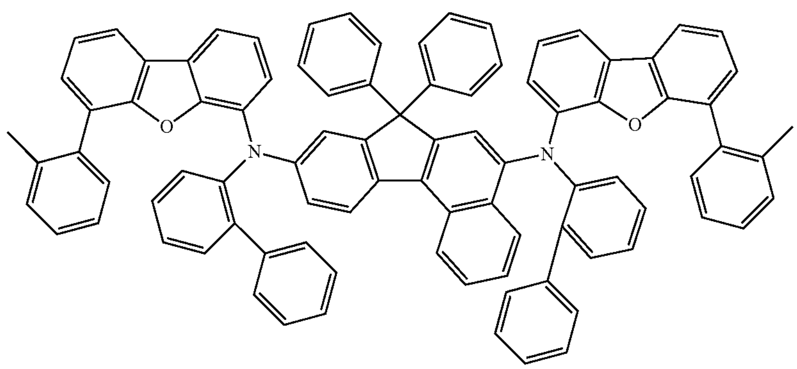
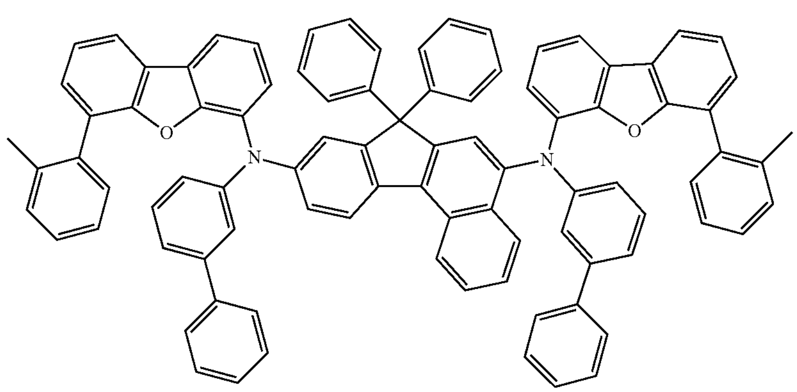

-continued
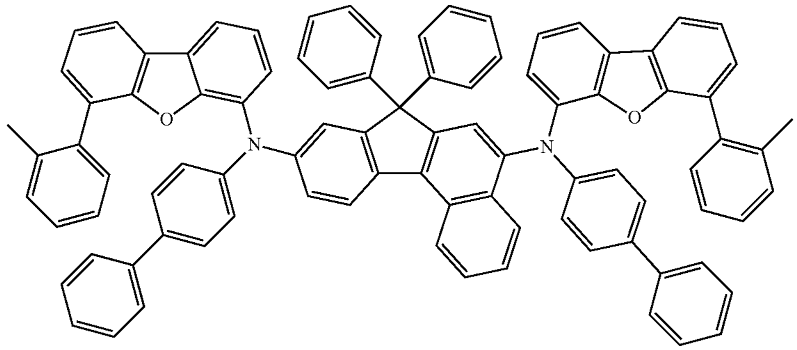
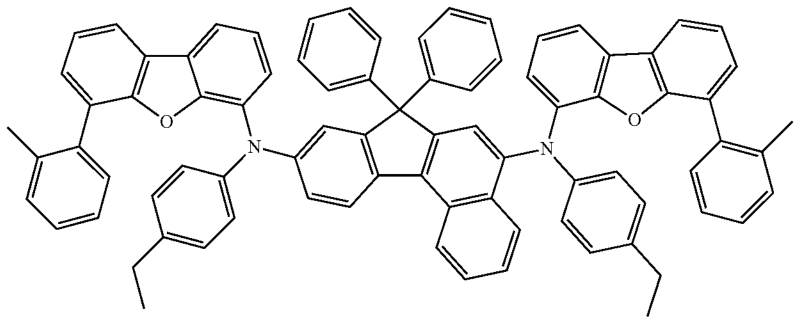
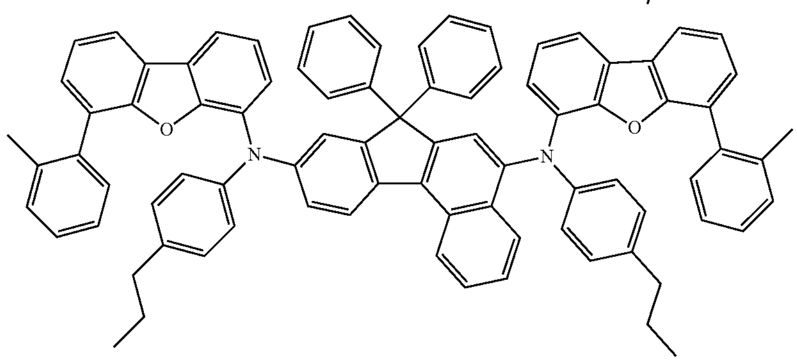
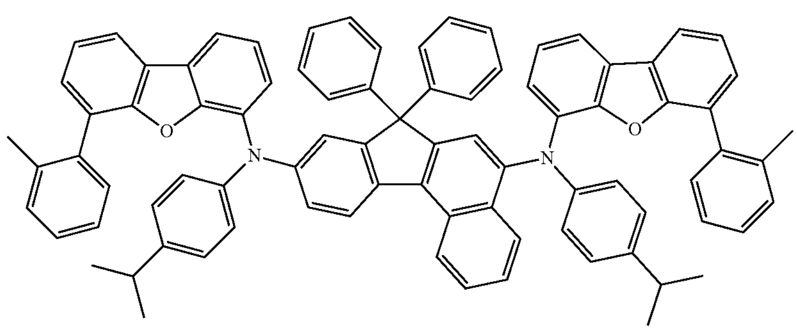
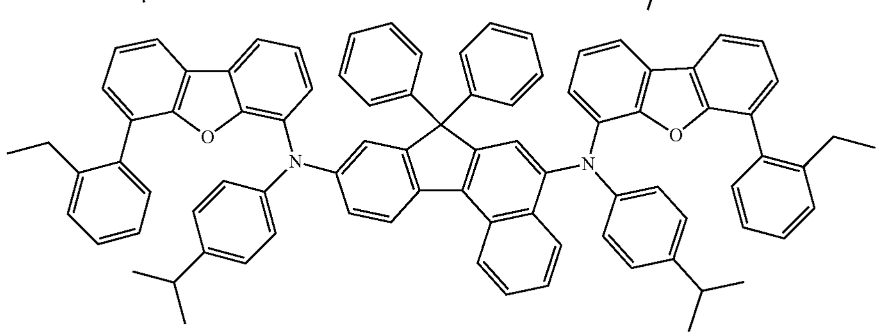

-continued
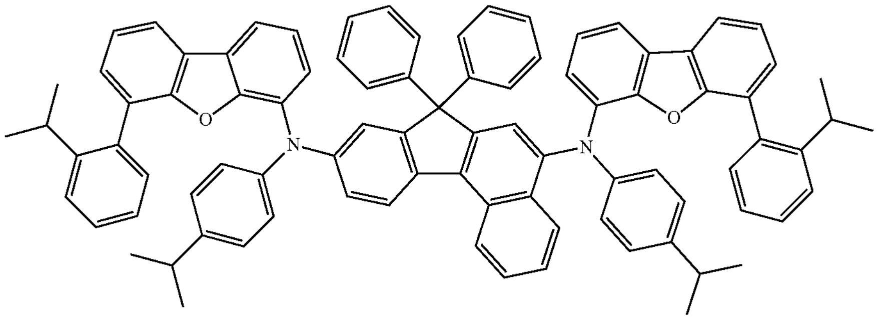
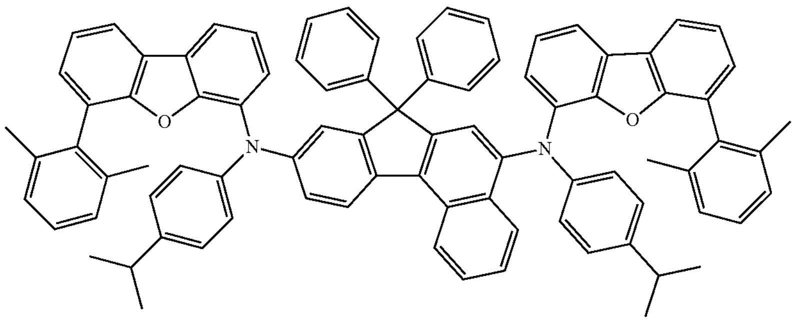
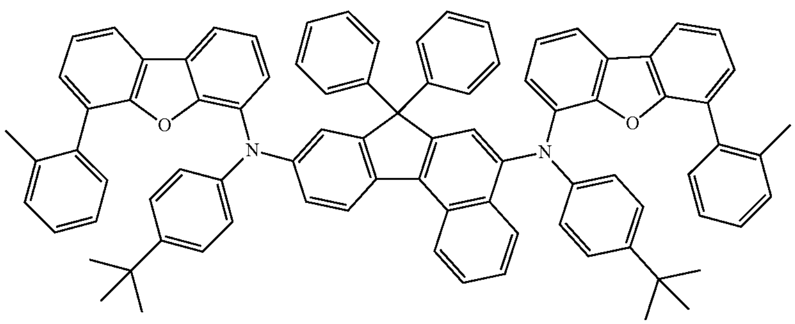
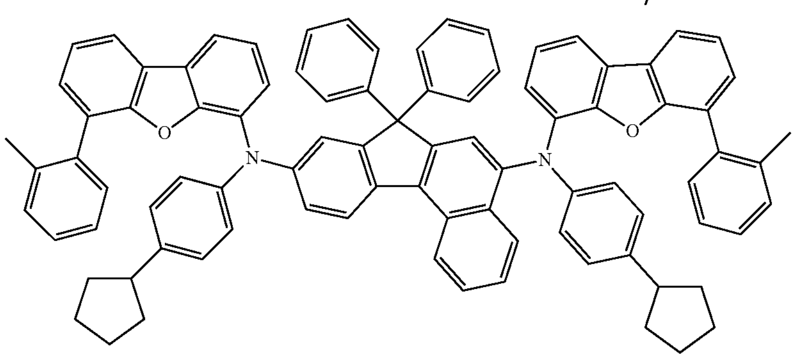
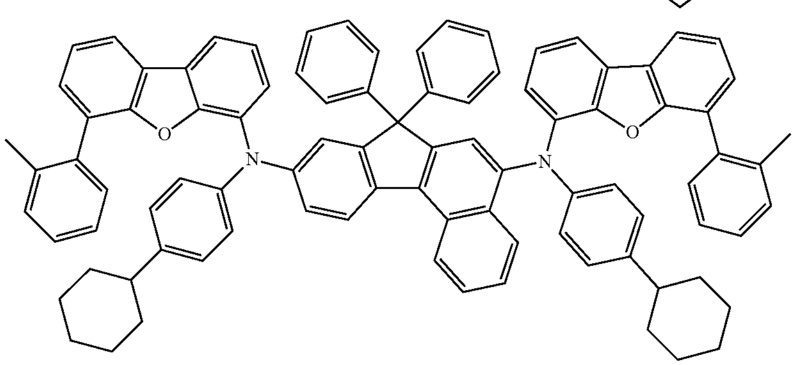

-continued
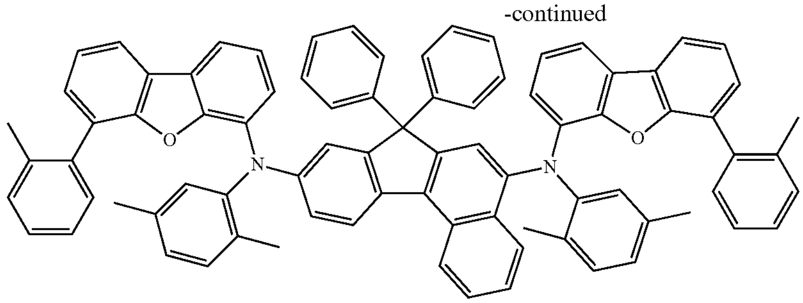
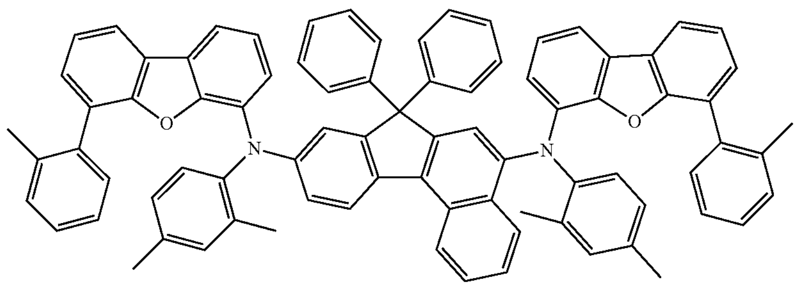
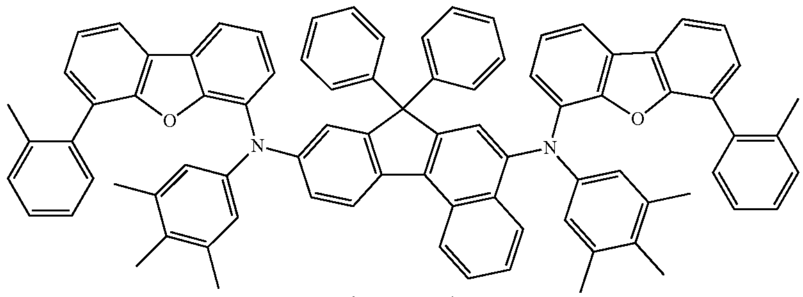
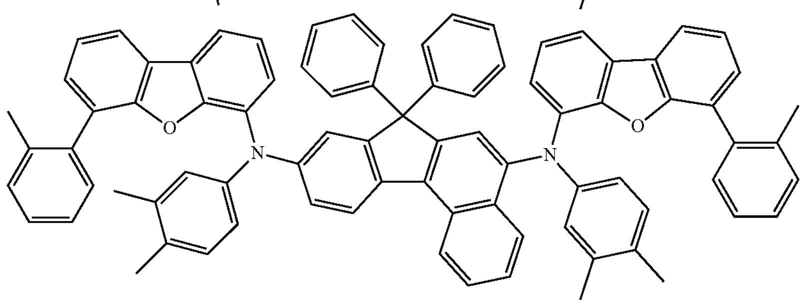
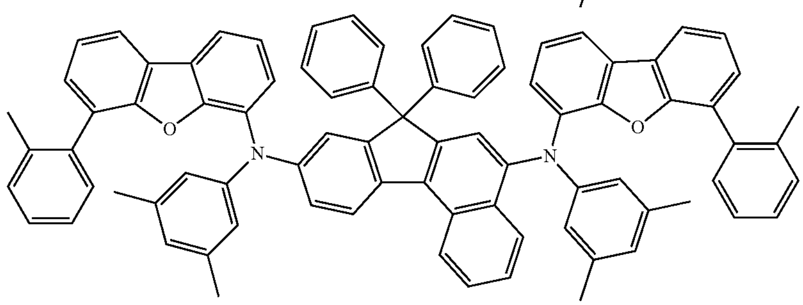
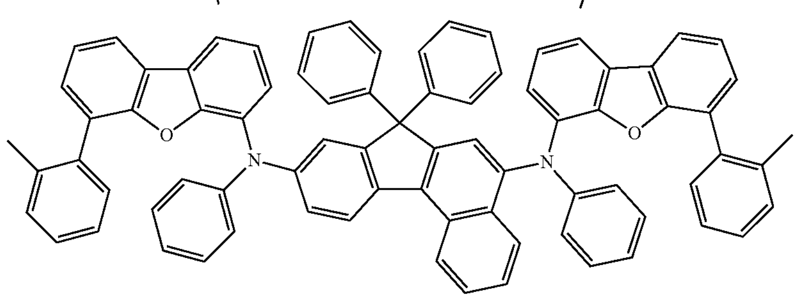

-continued
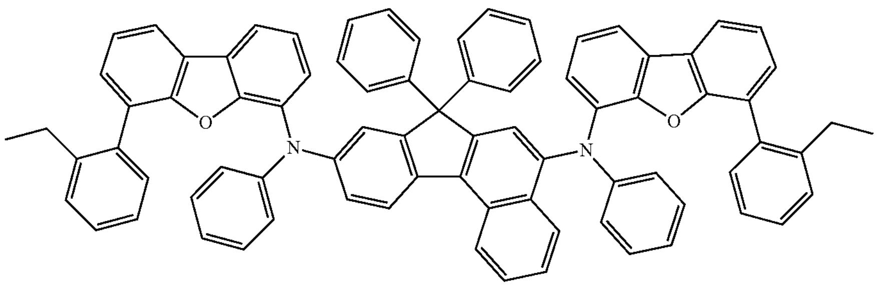
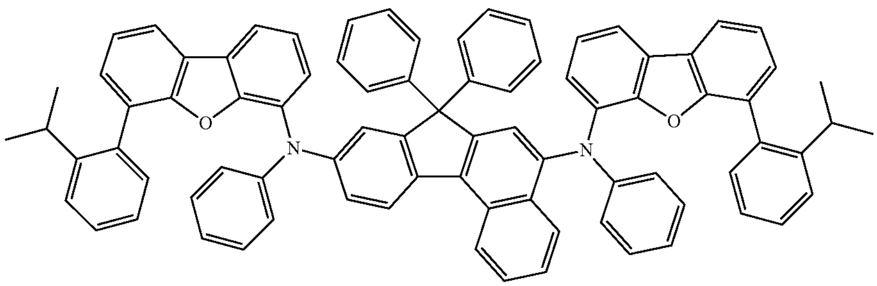
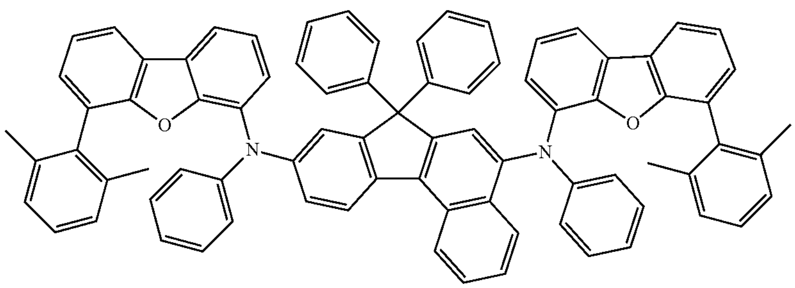
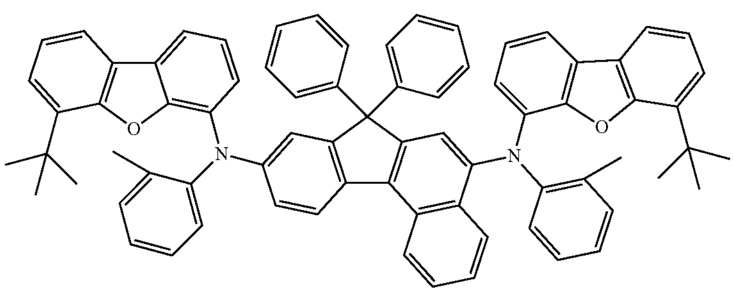
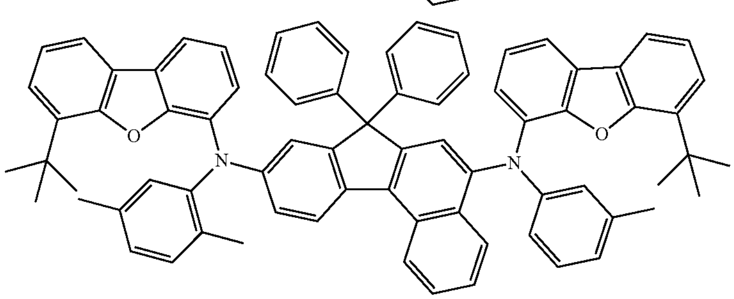
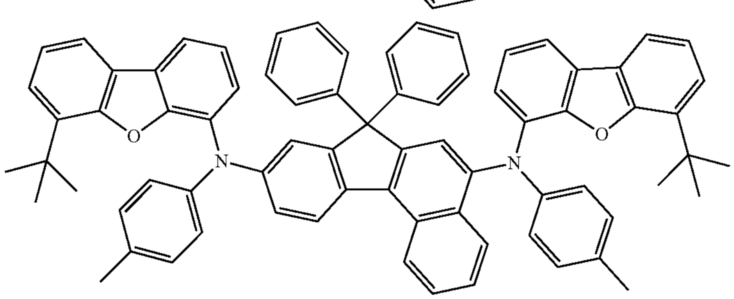

-continued
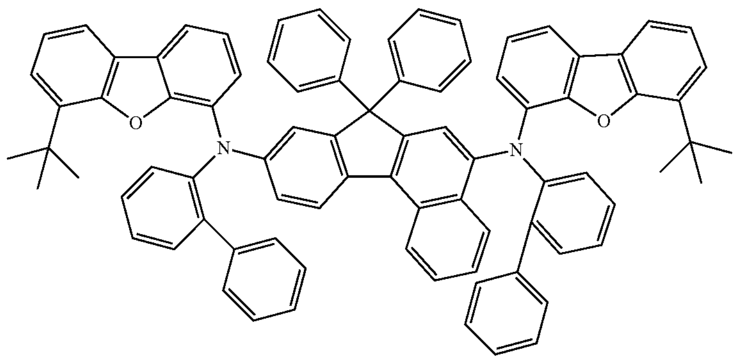
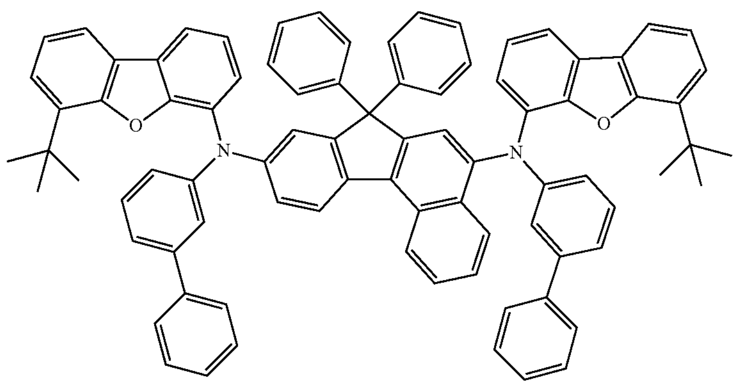
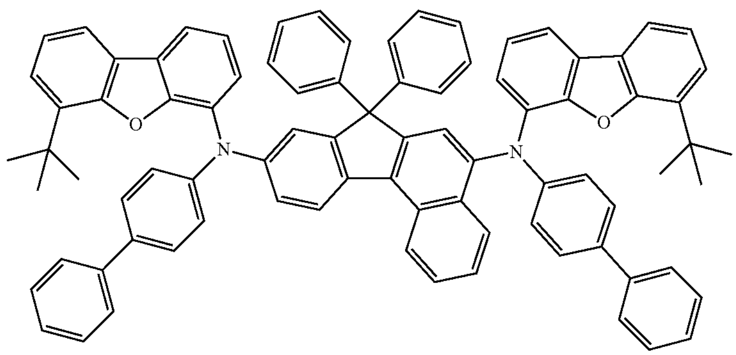
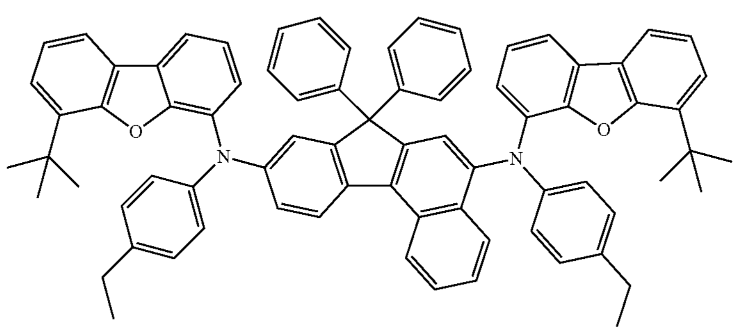

-continued
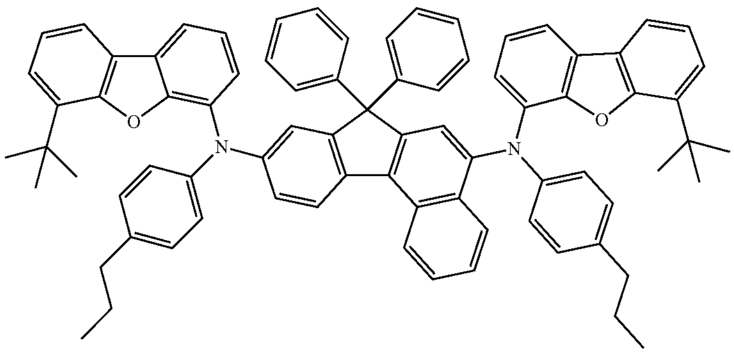
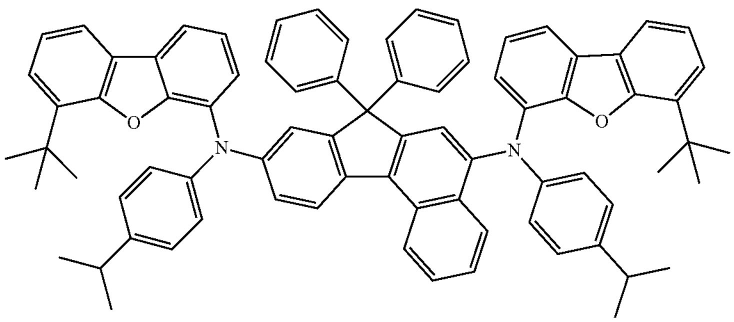
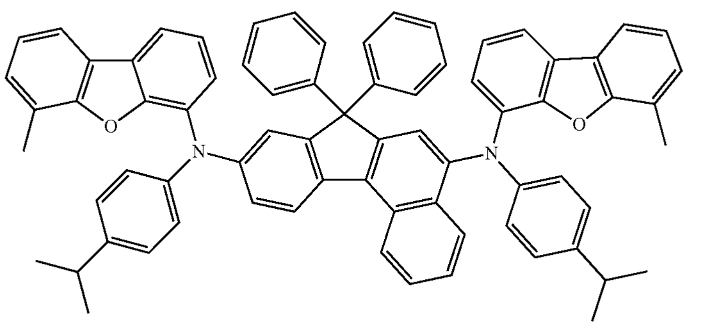
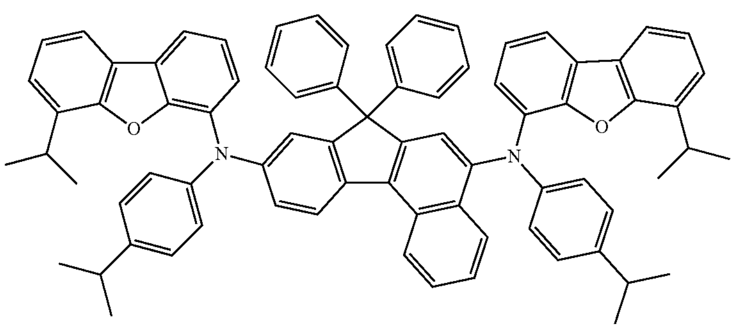
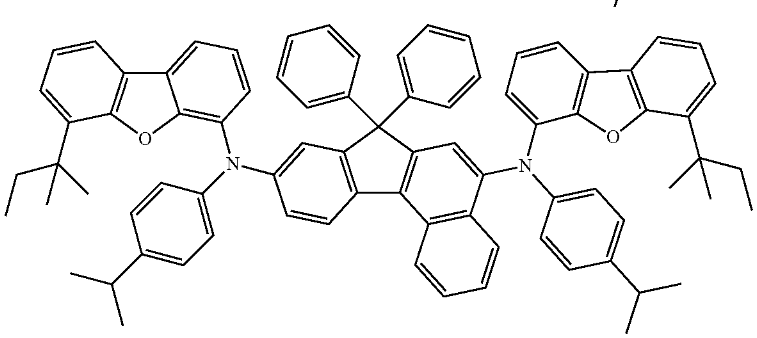

-continued
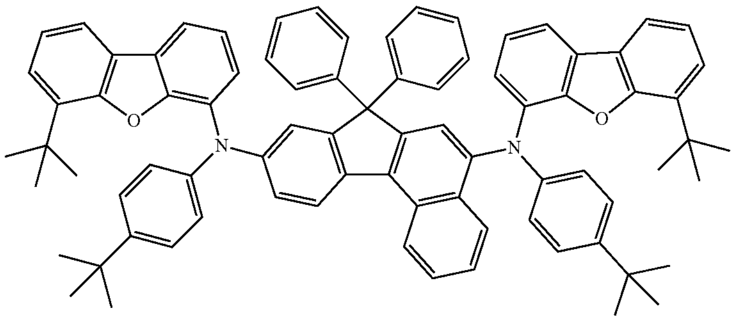
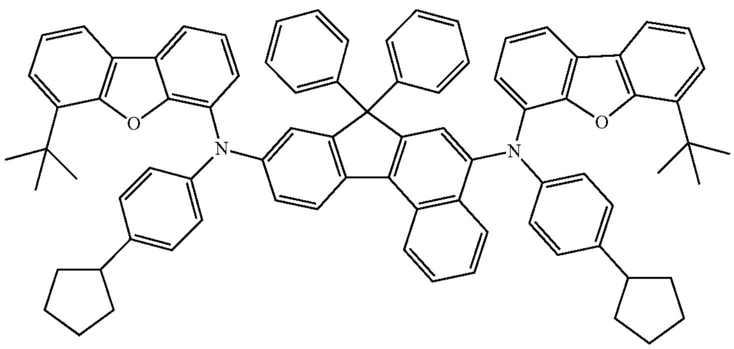
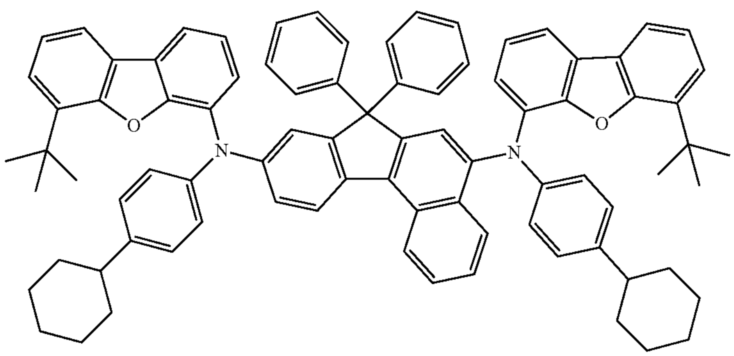
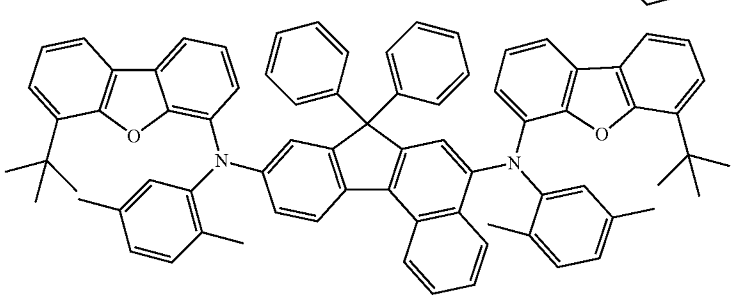
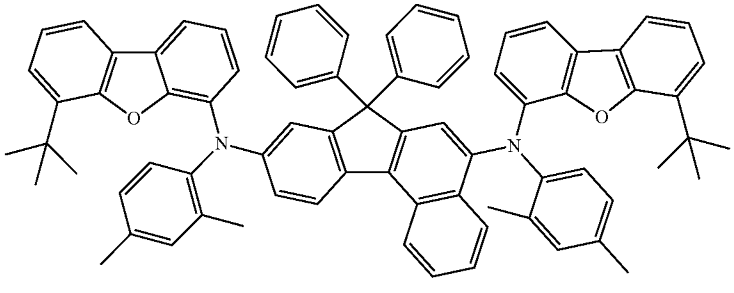

-continued
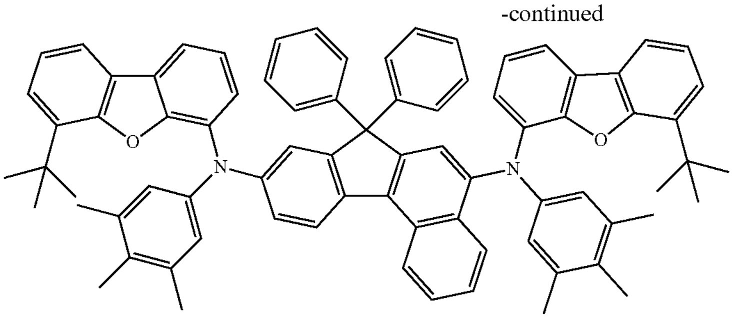
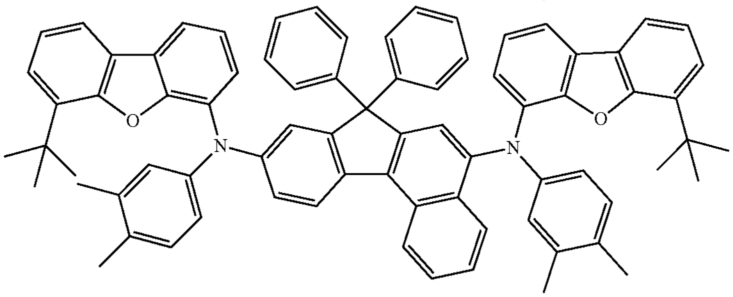
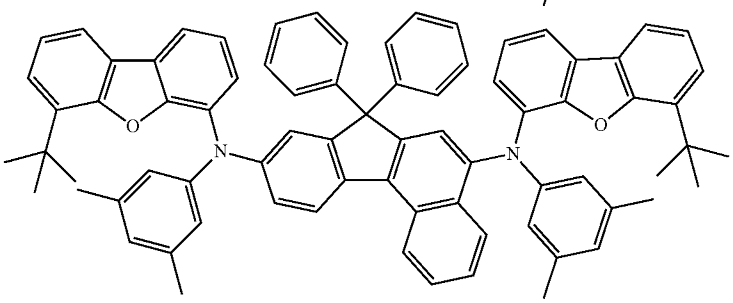
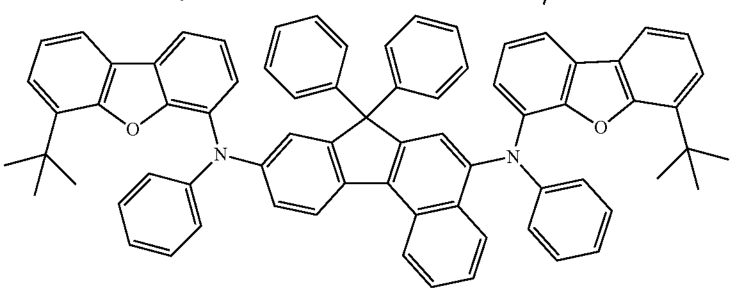
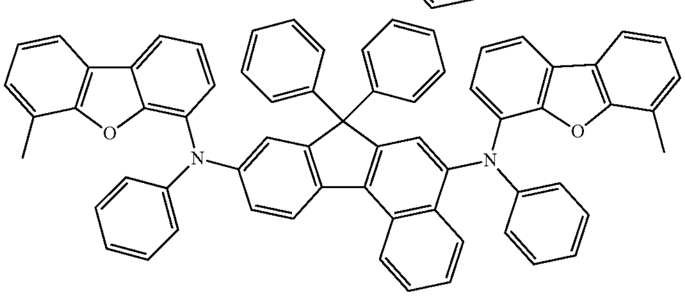
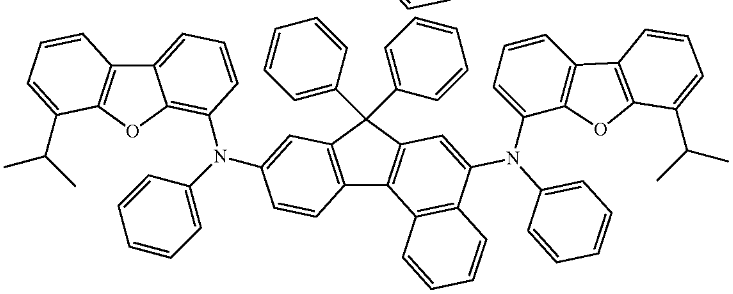

-continued
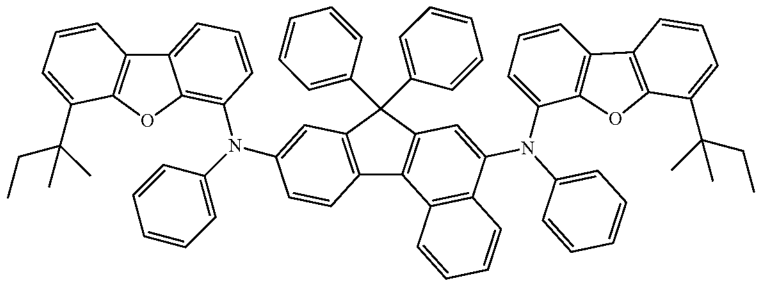
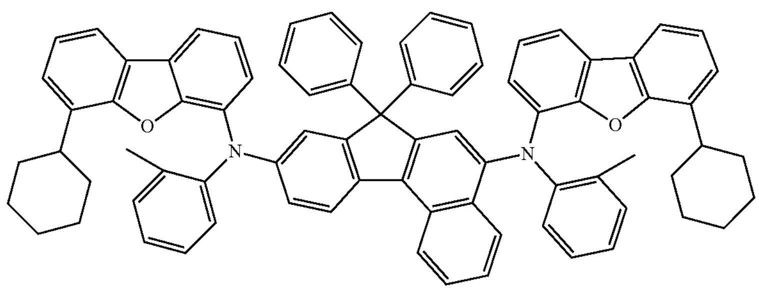
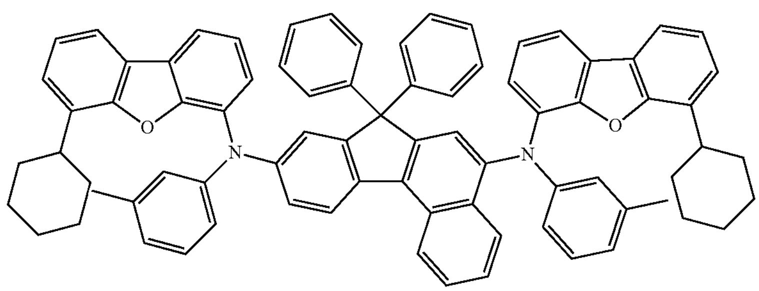
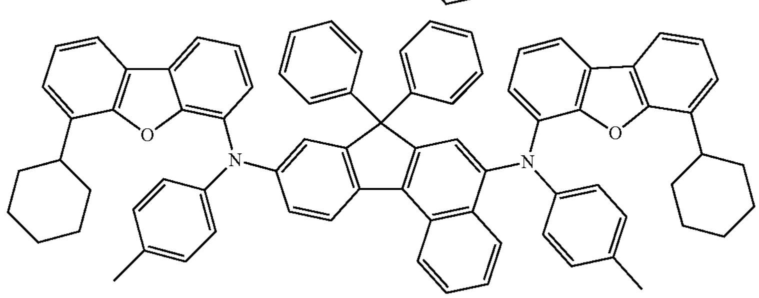
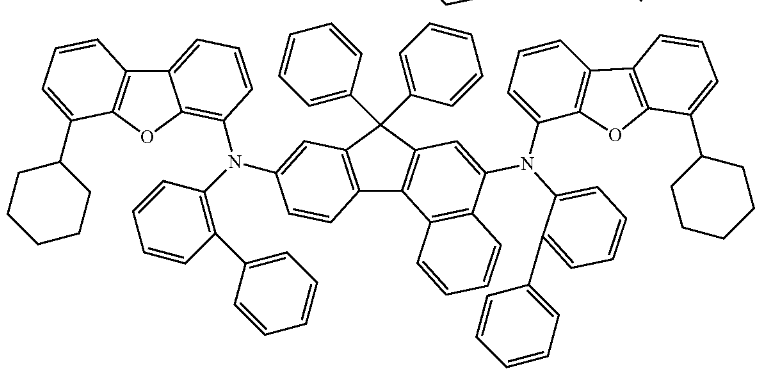

-continued
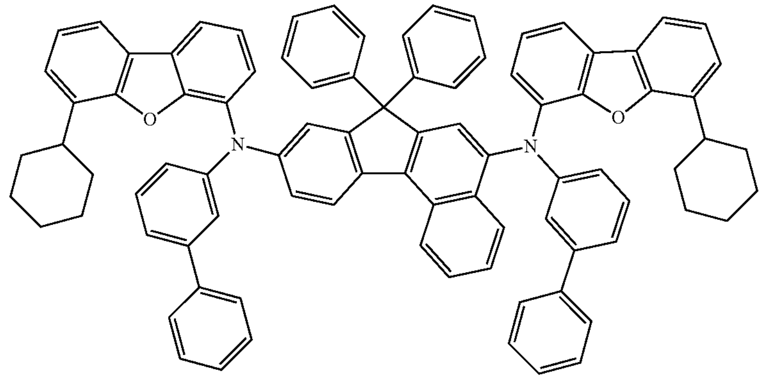
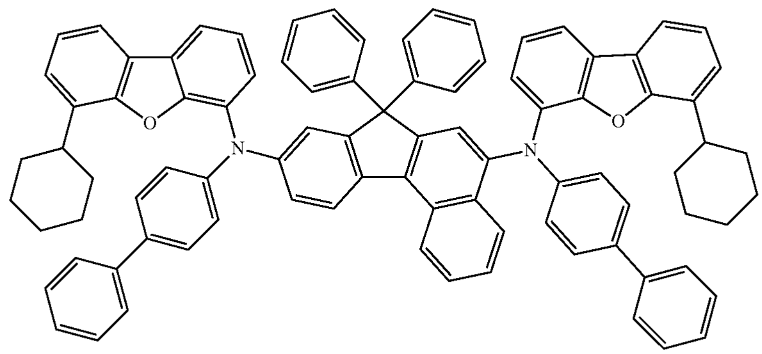
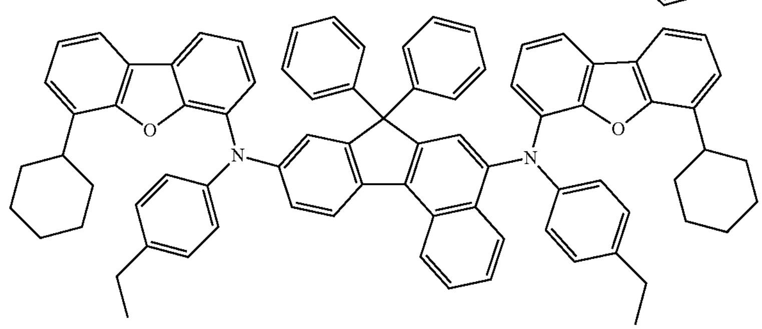
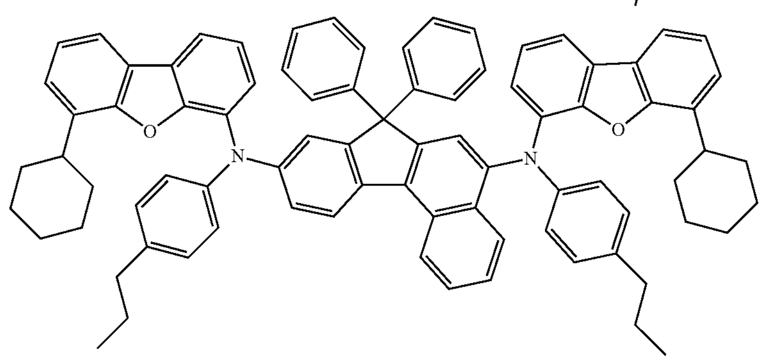
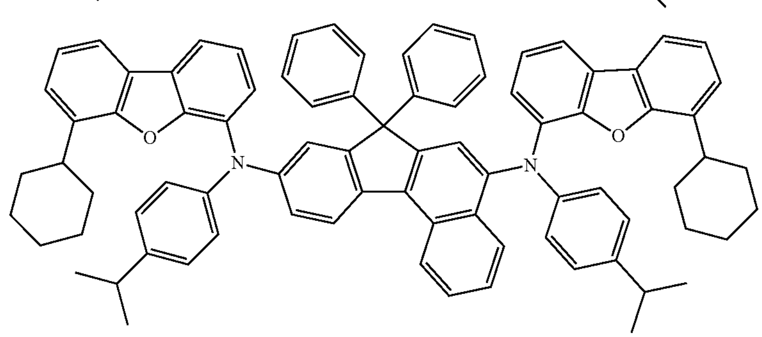

-continued
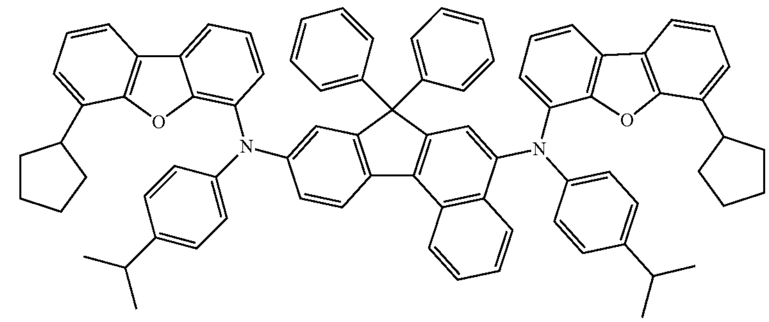
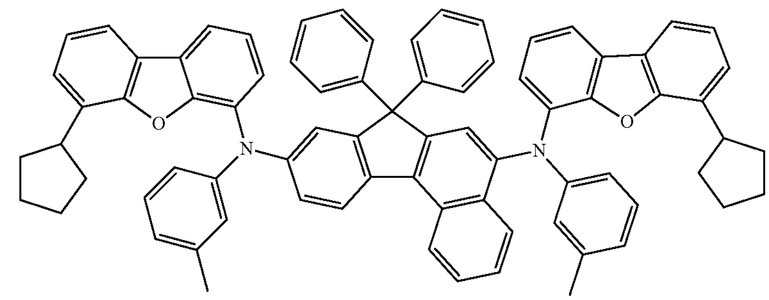
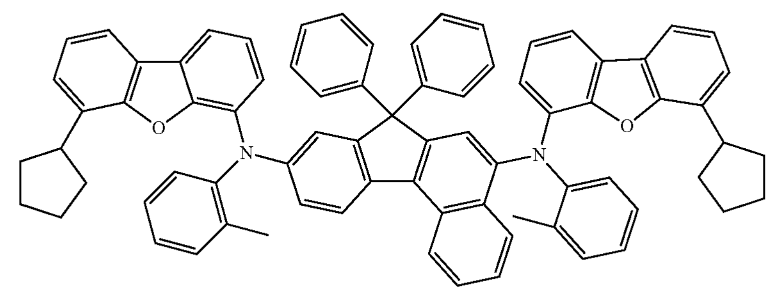
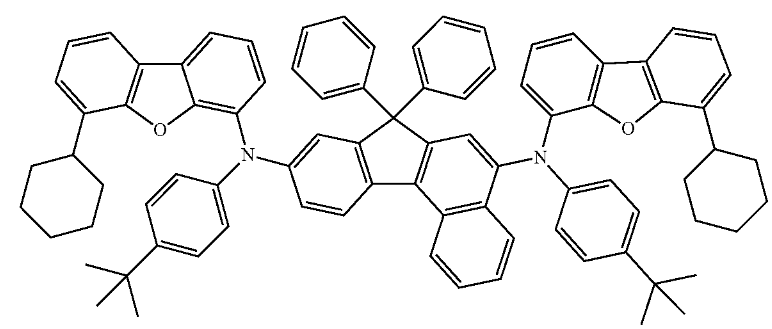
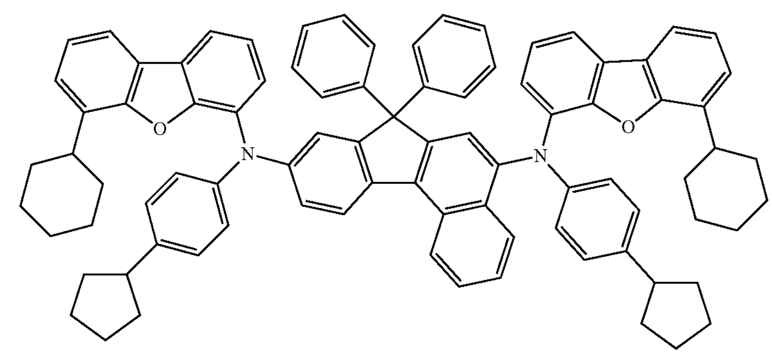

-continued
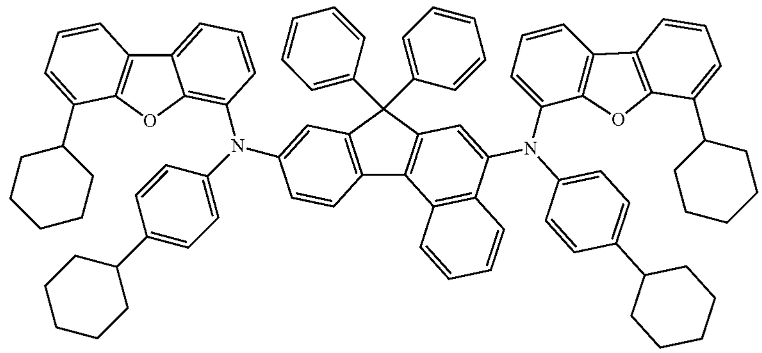
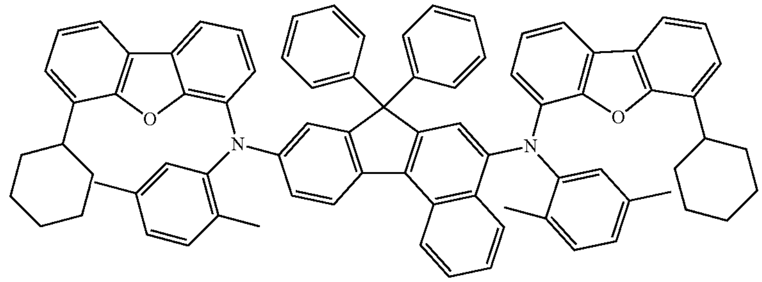
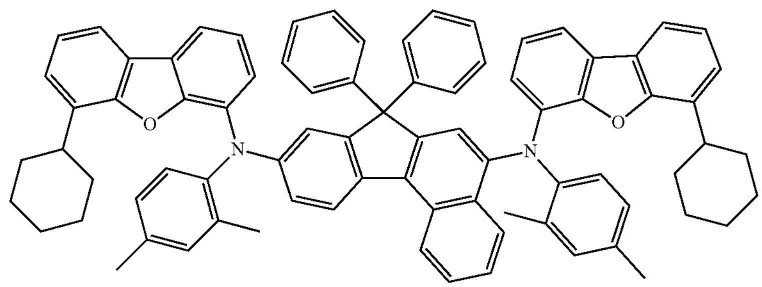
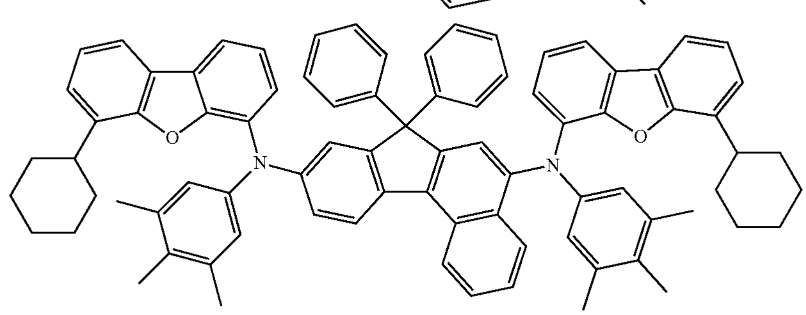
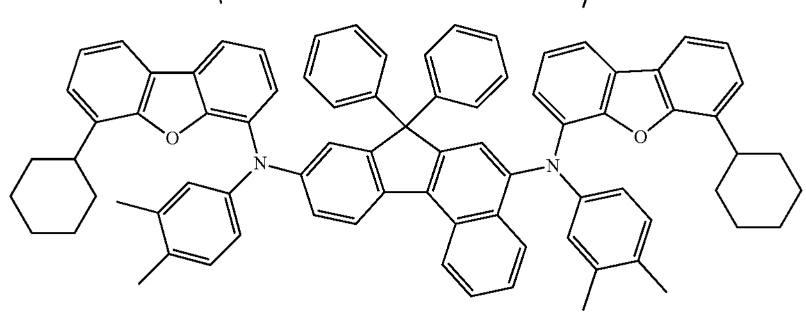

-continued
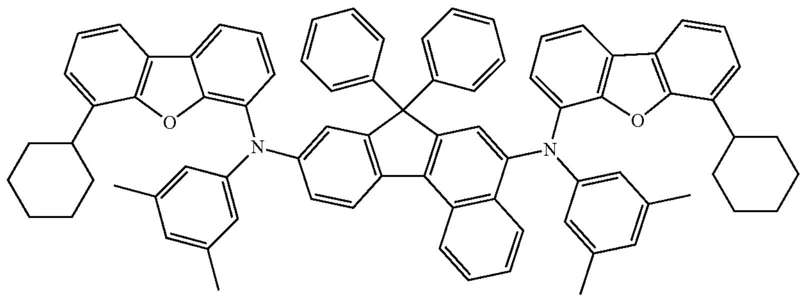
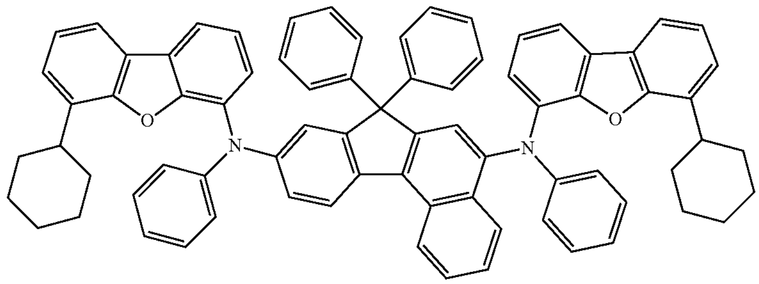
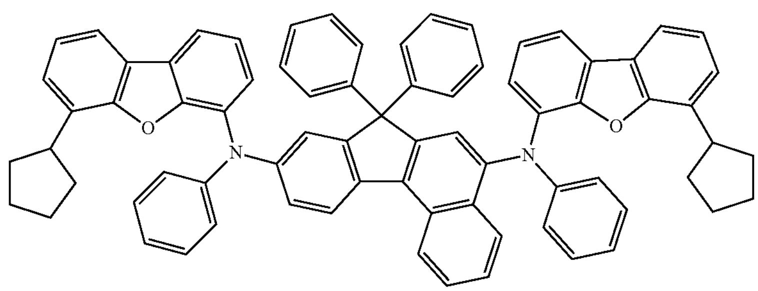
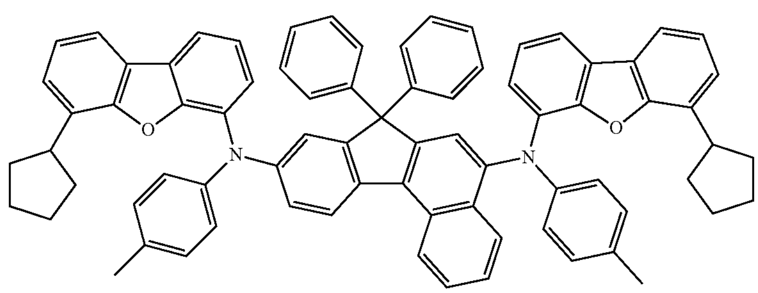
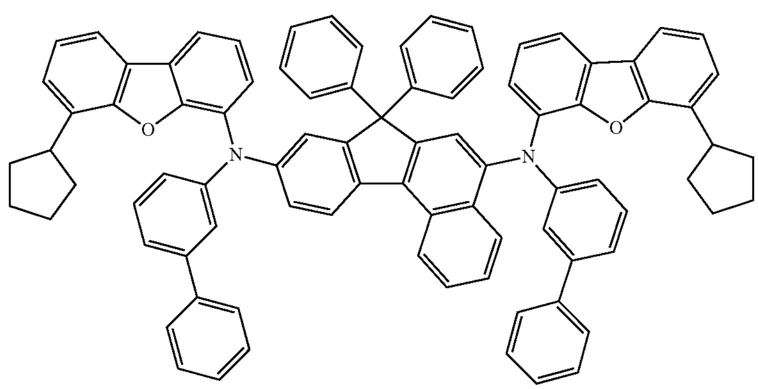

-continued
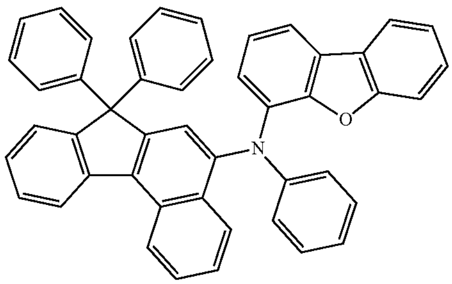
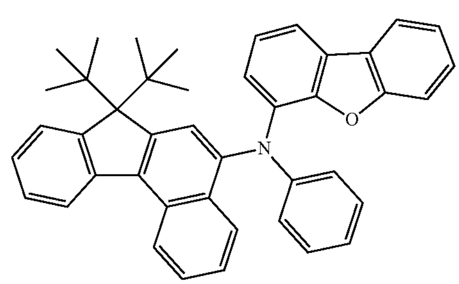
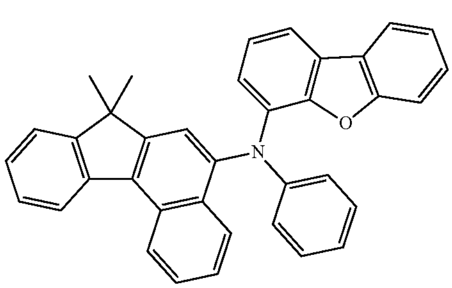
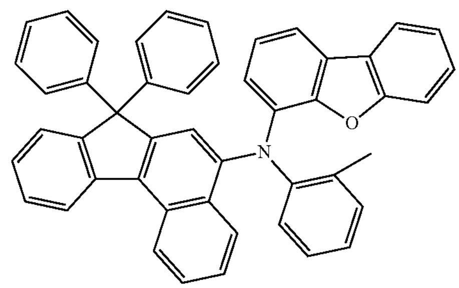
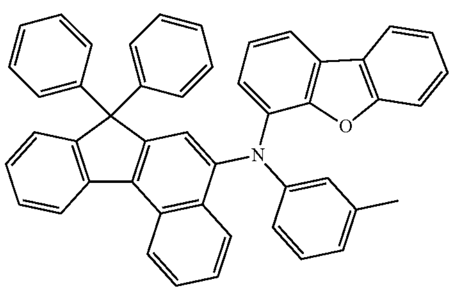
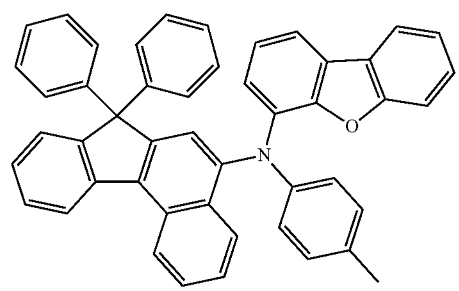
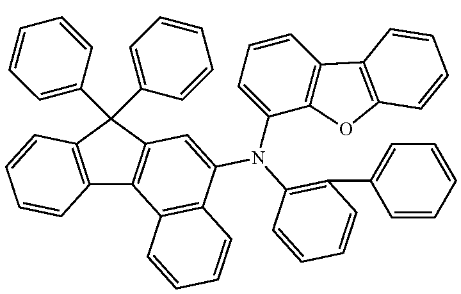
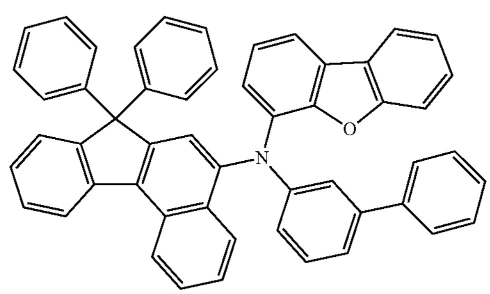
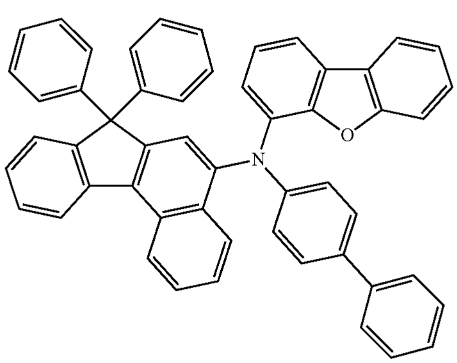
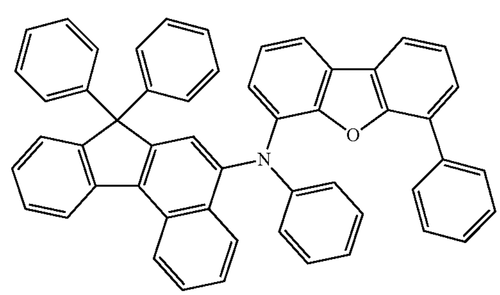

-continued
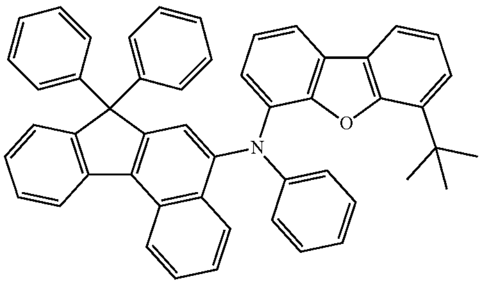
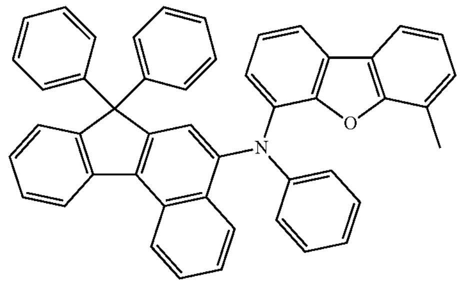
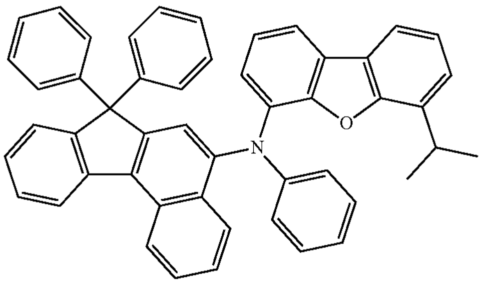
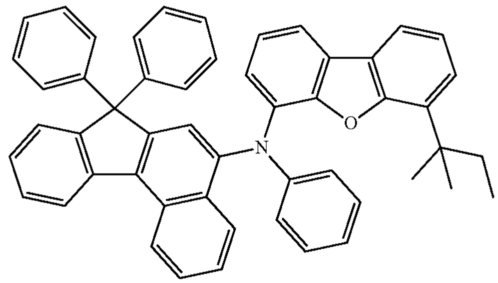
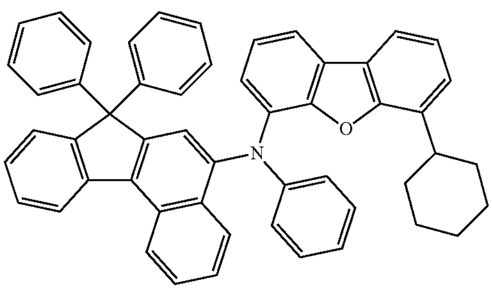
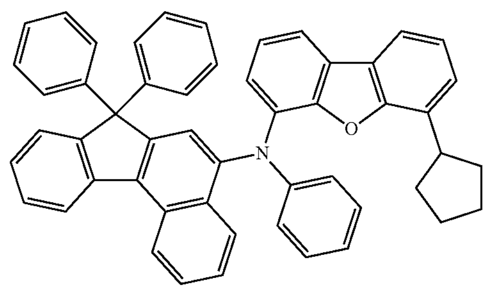
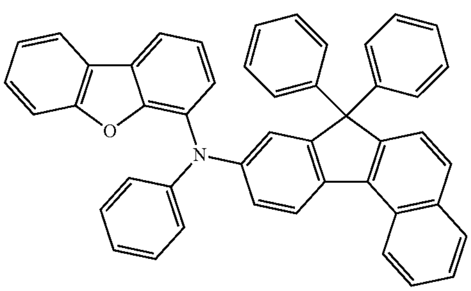
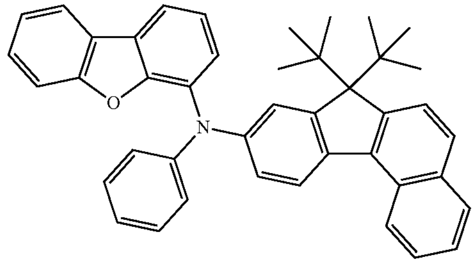
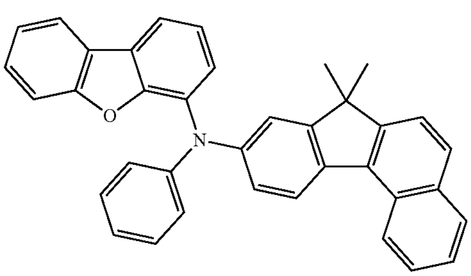
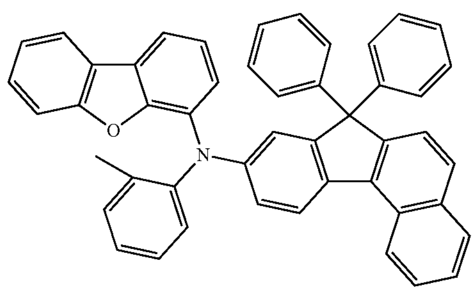
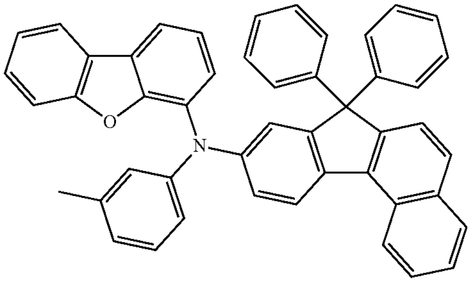
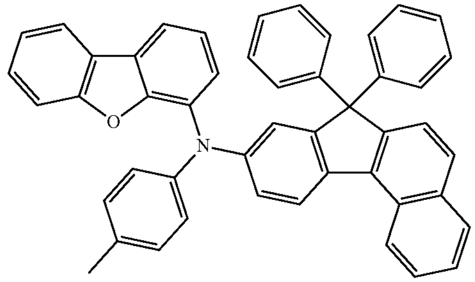

-continued
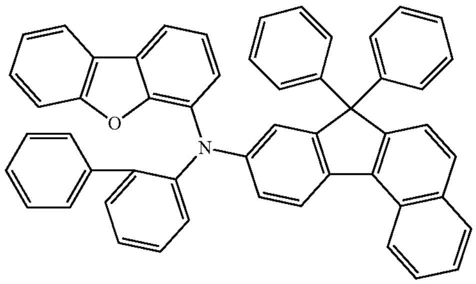
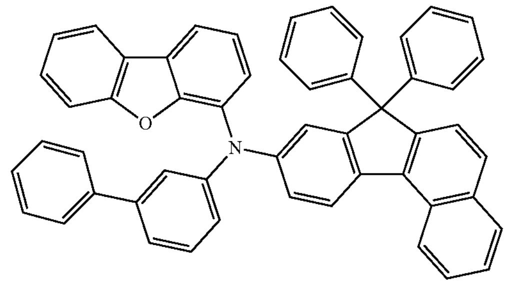
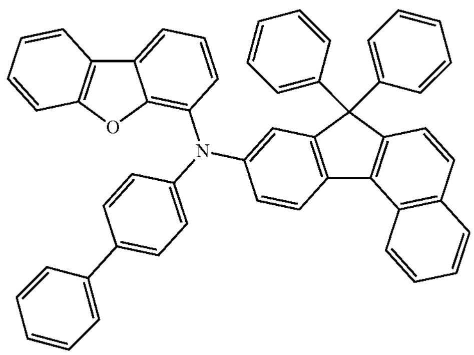
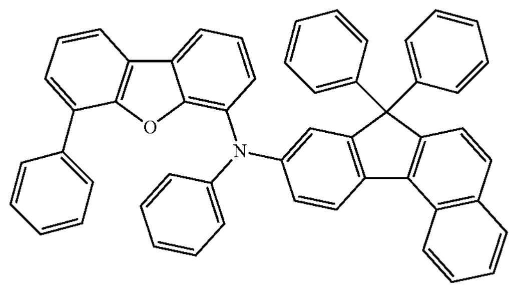
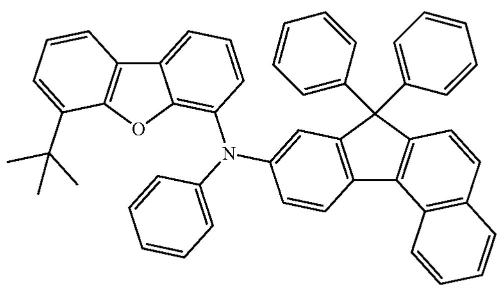
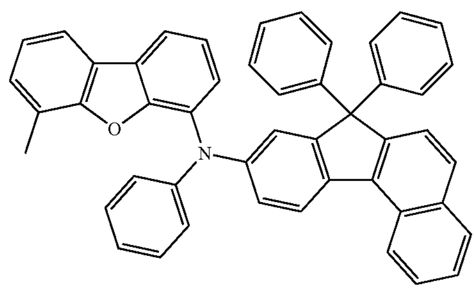
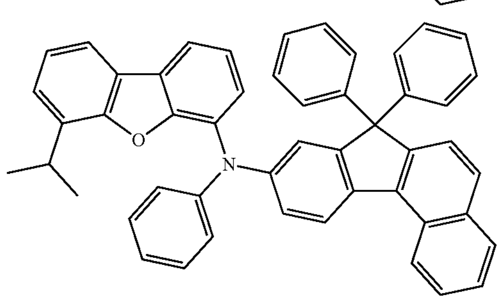
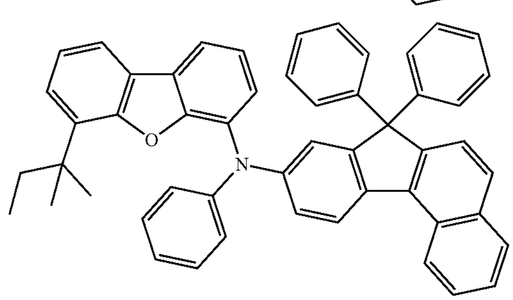
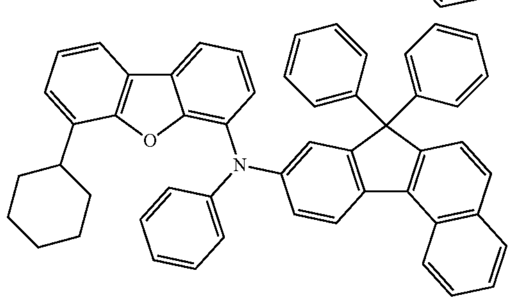
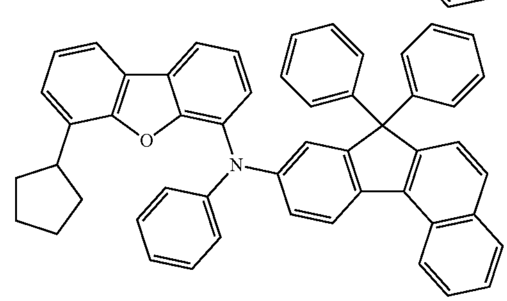

-continued
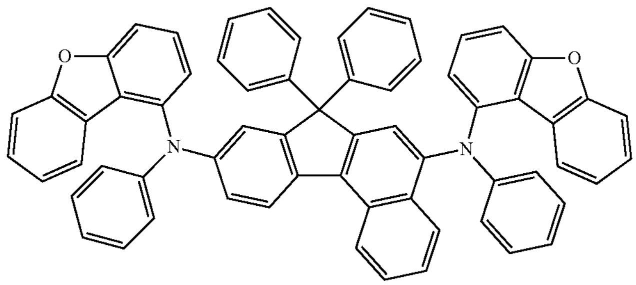
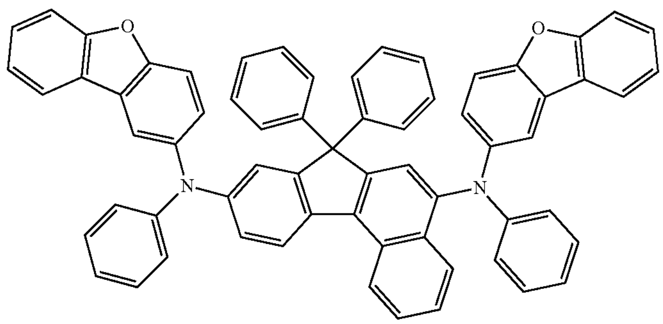
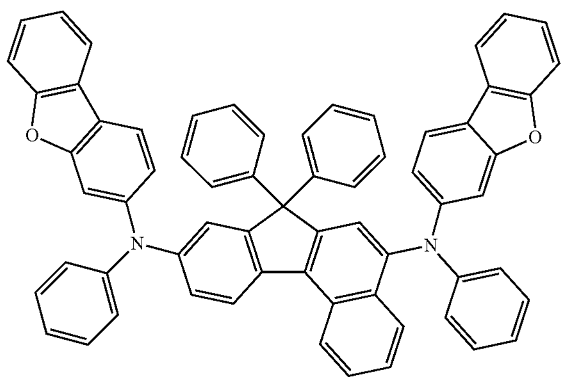
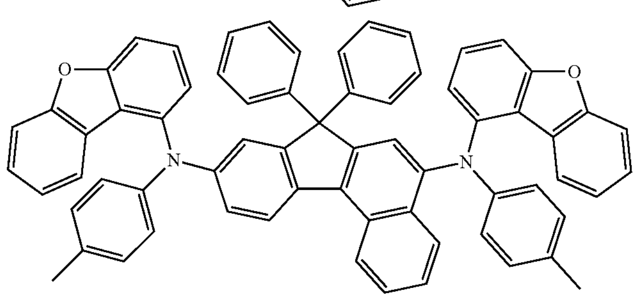
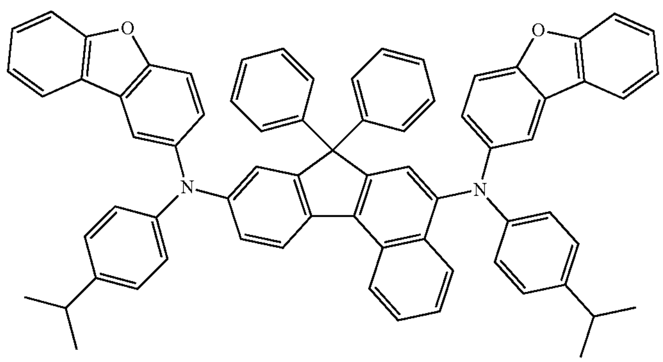

-continued
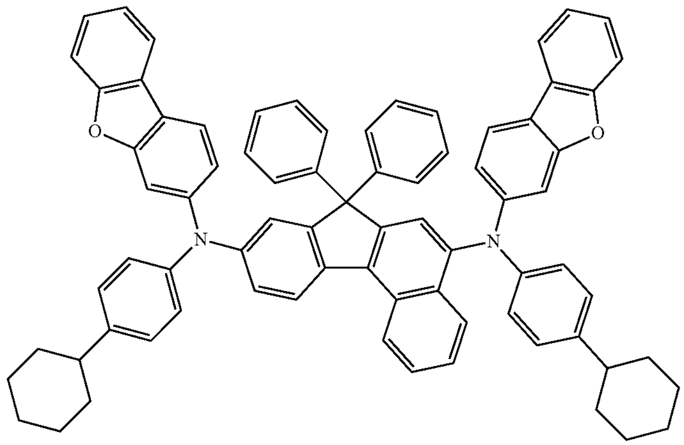
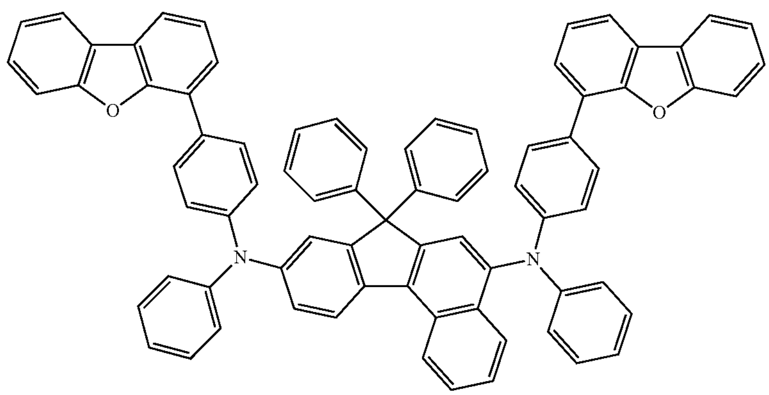
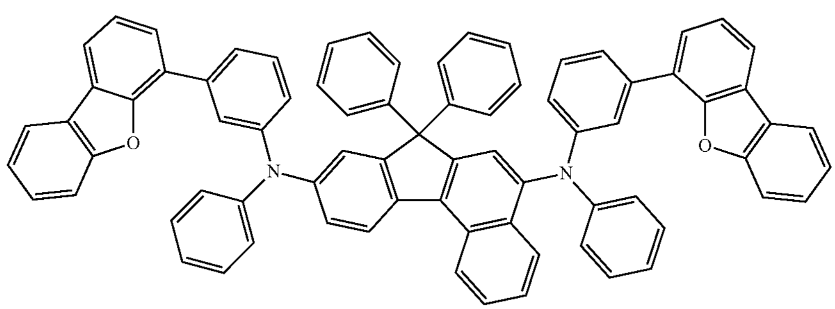
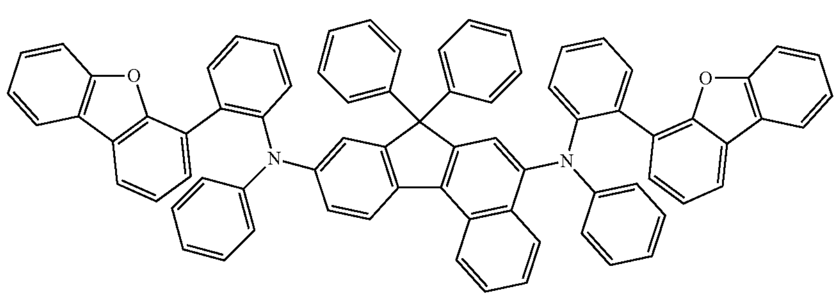

-continued
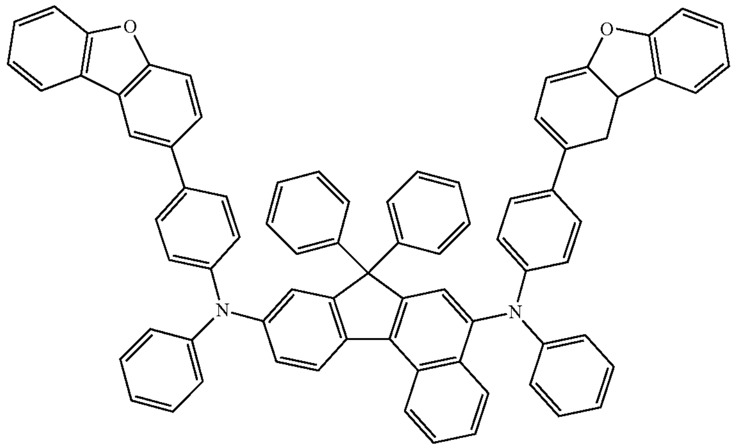
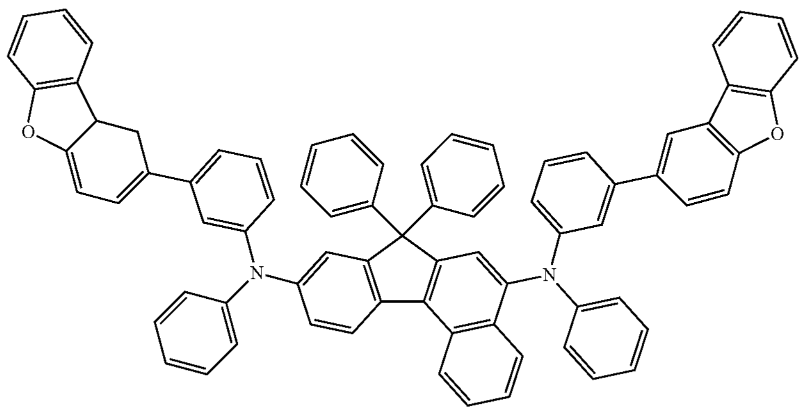
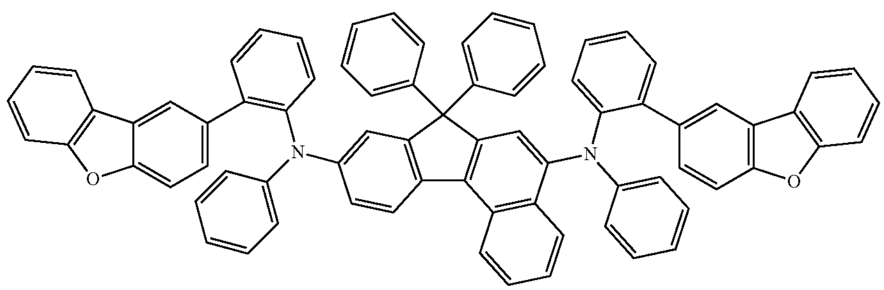
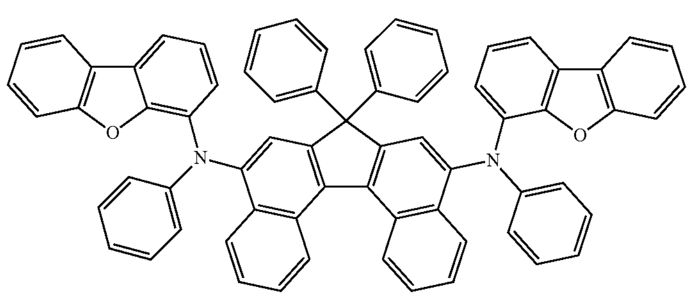
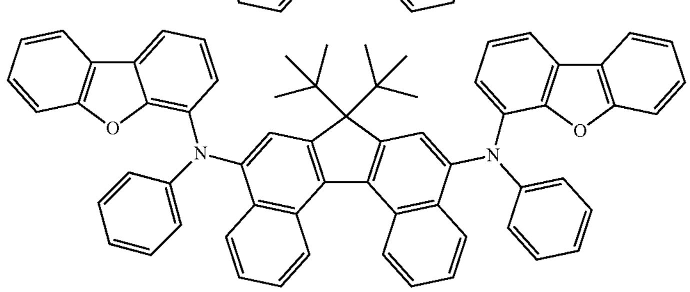

-continued
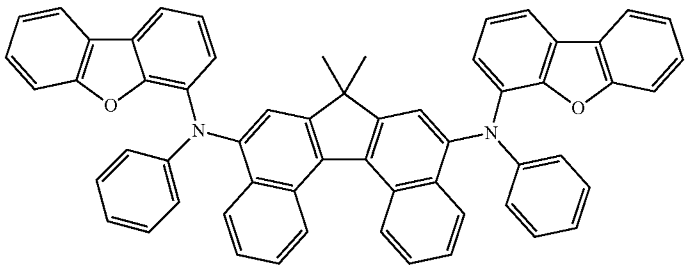
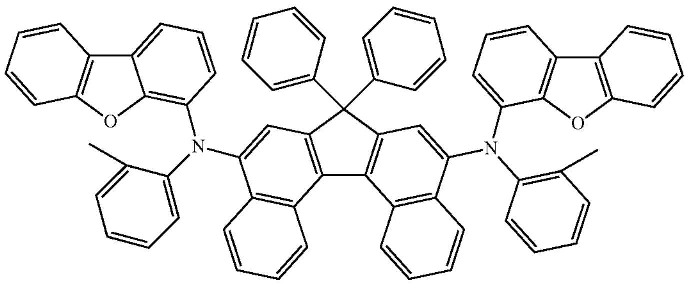
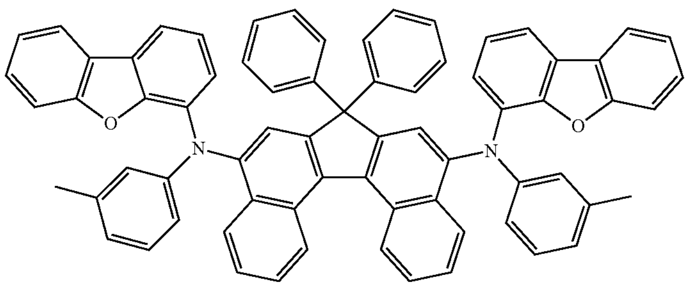
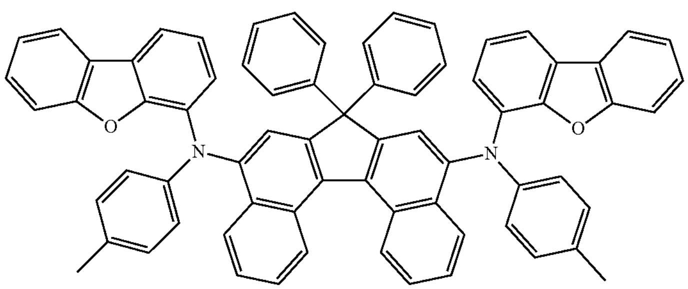
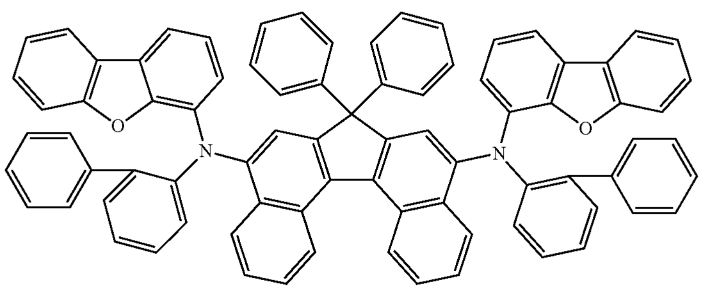
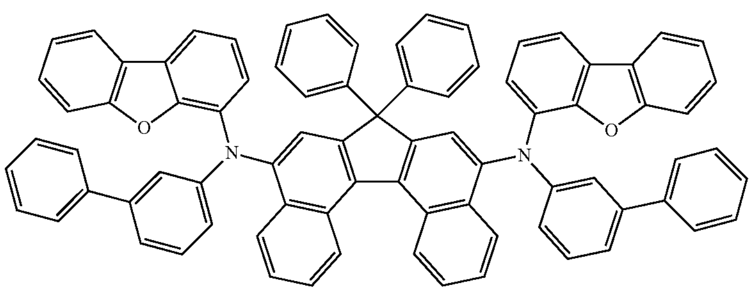

-continued
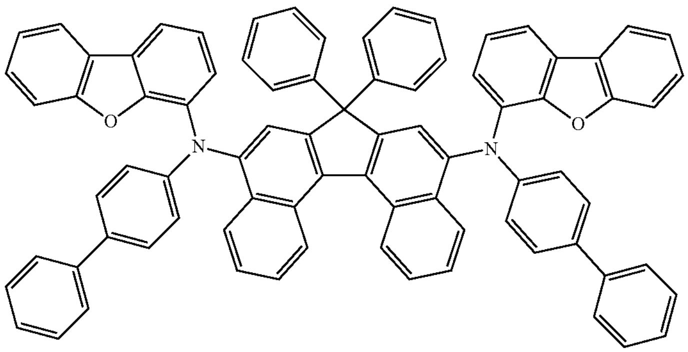
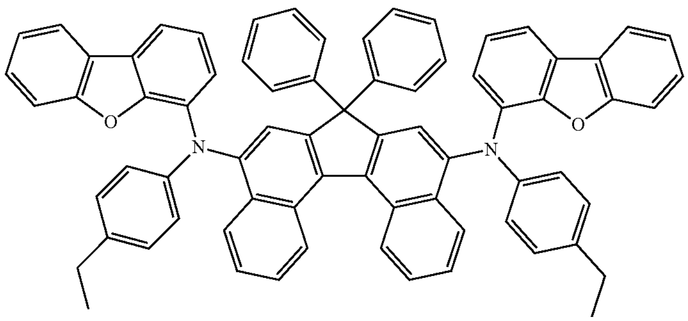
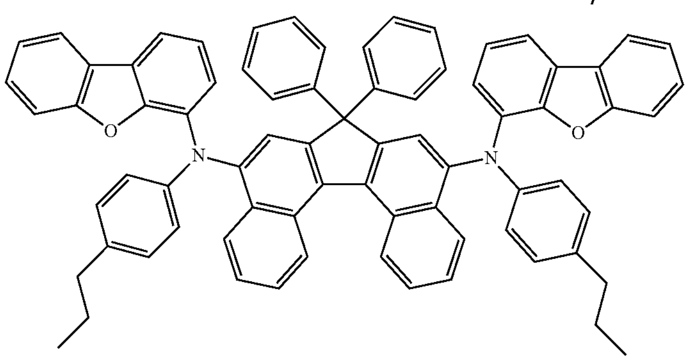
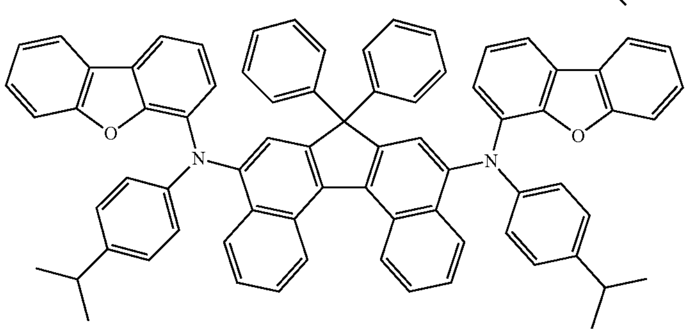
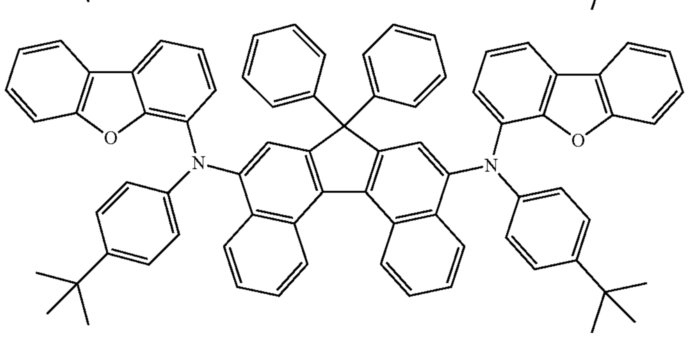

-continued
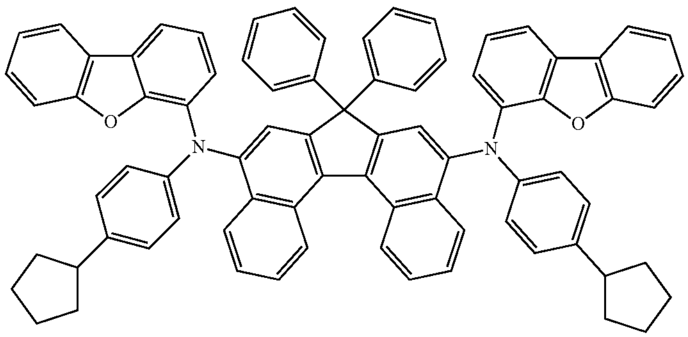
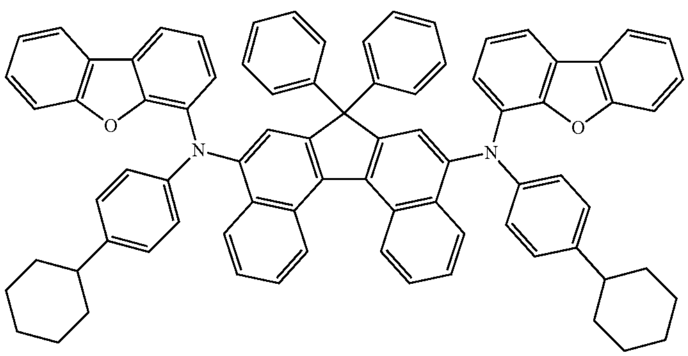
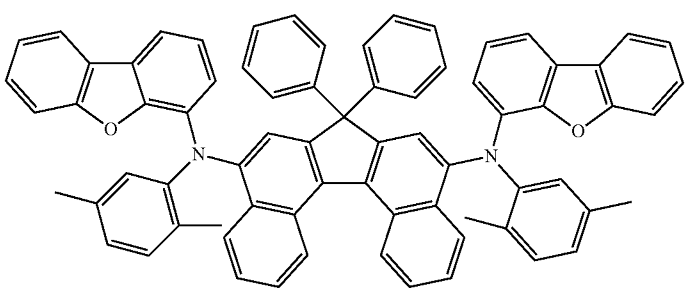
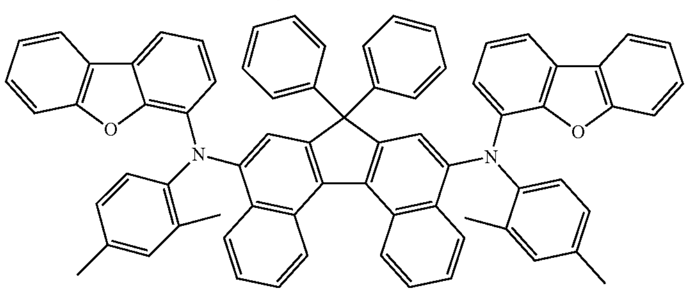
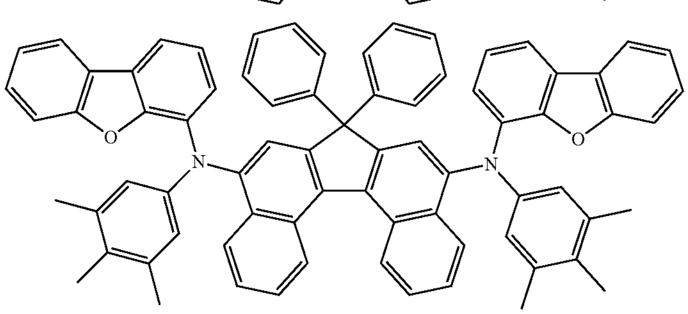

-continued
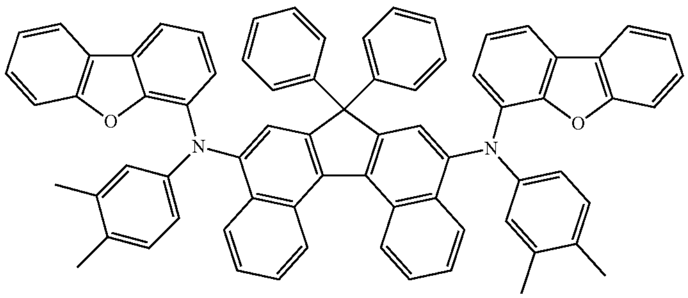
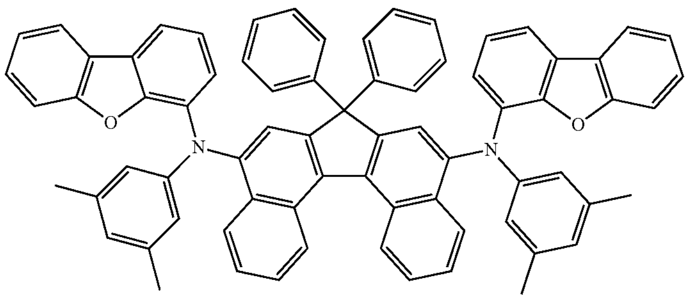
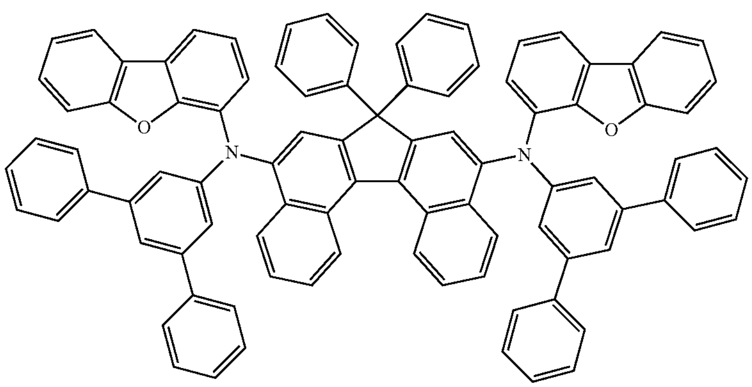
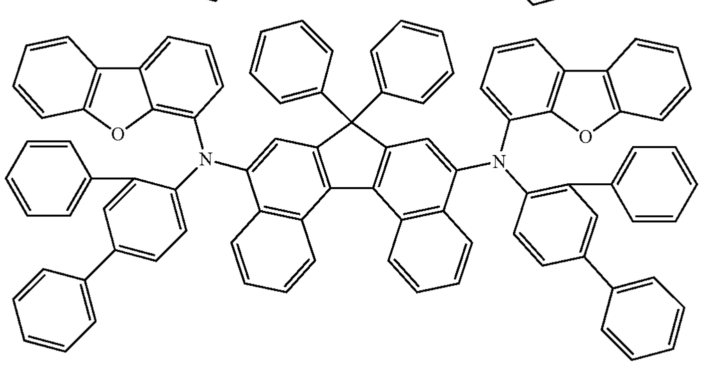
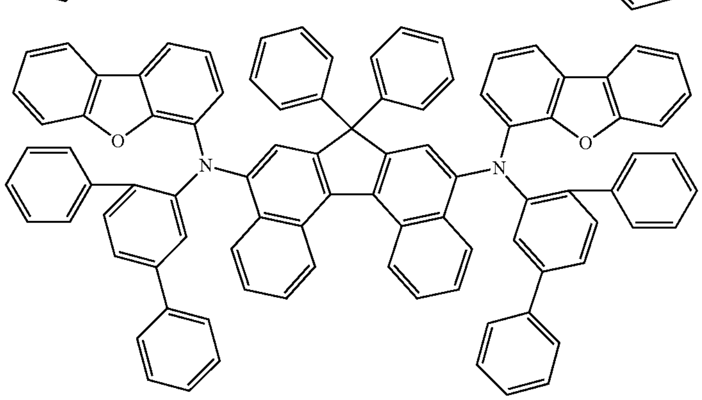

-continued
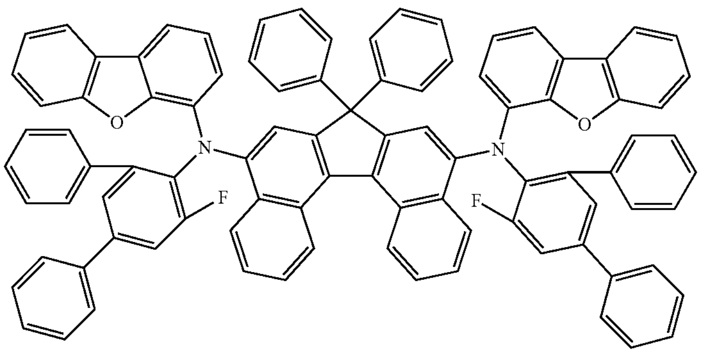
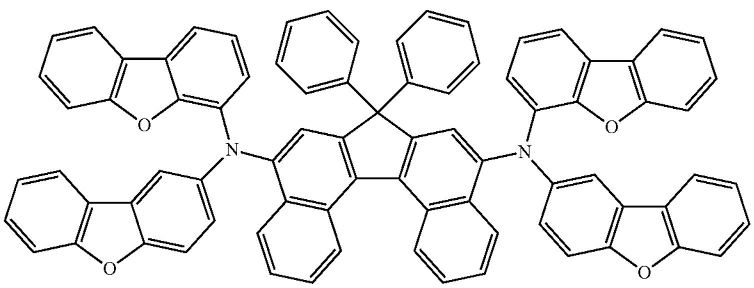
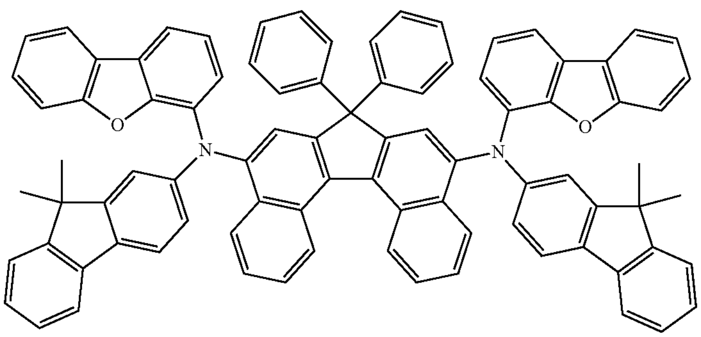
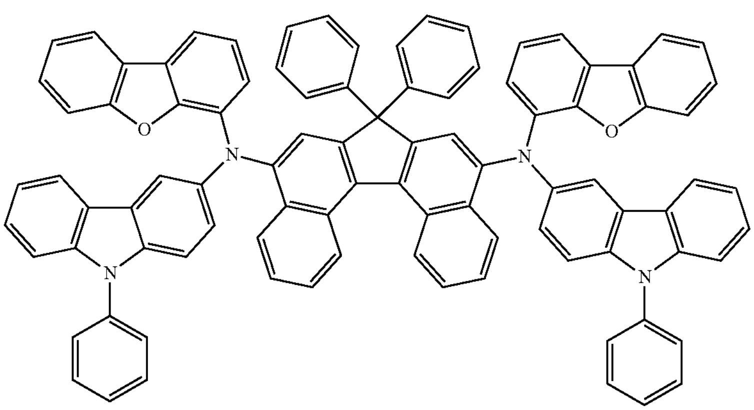
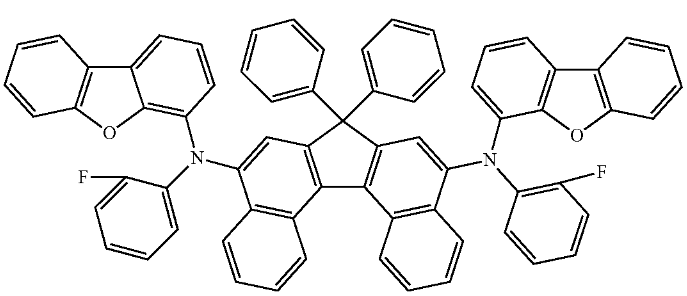

-continued
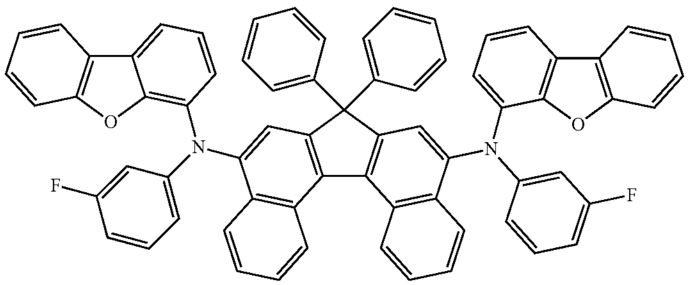
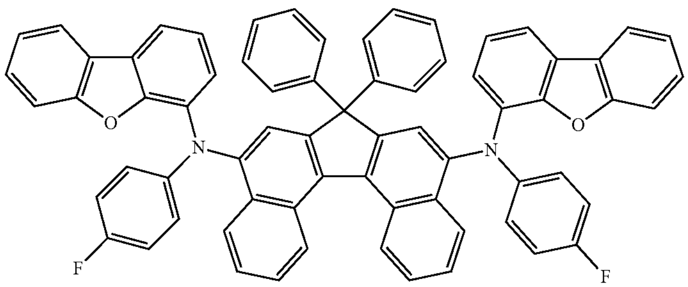
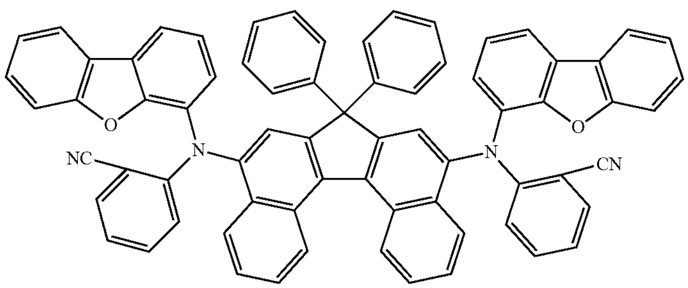
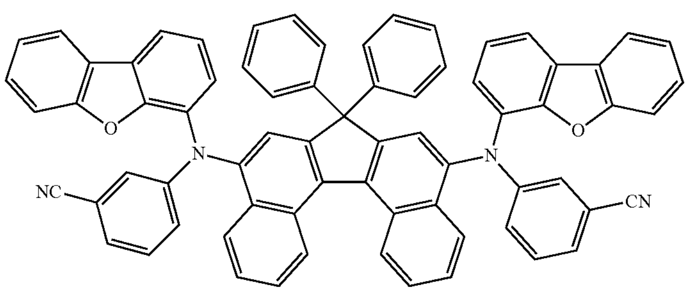
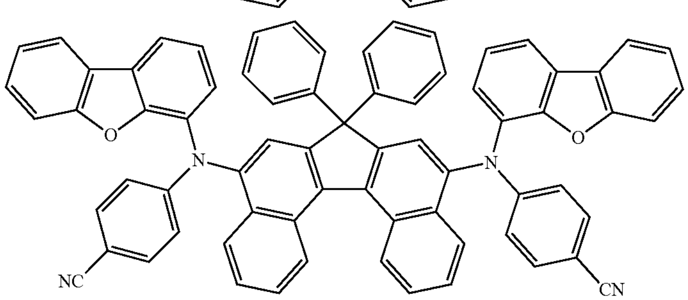
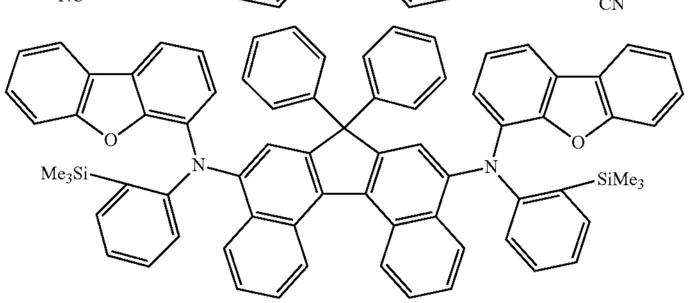

-continued
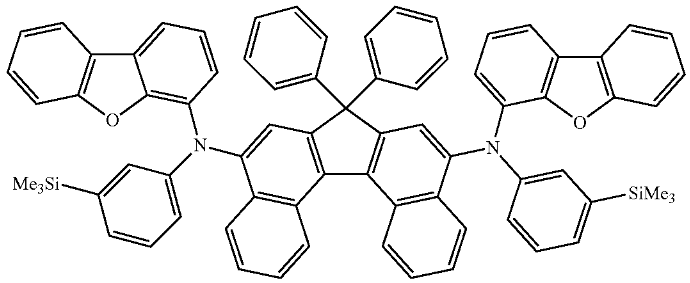
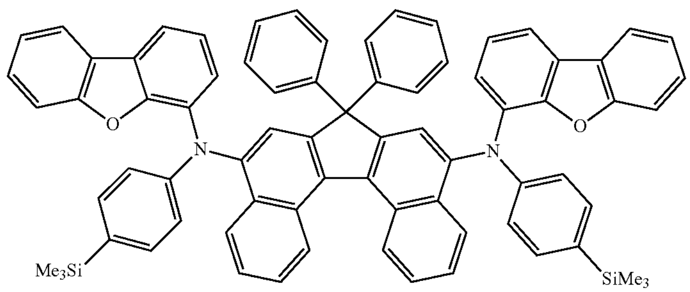
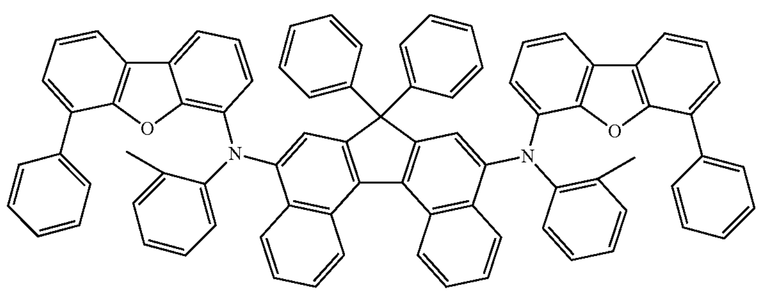
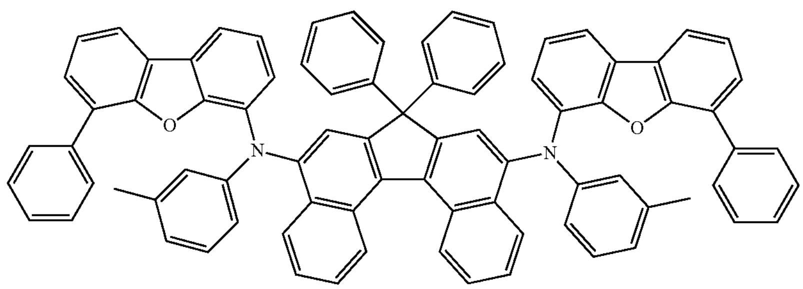
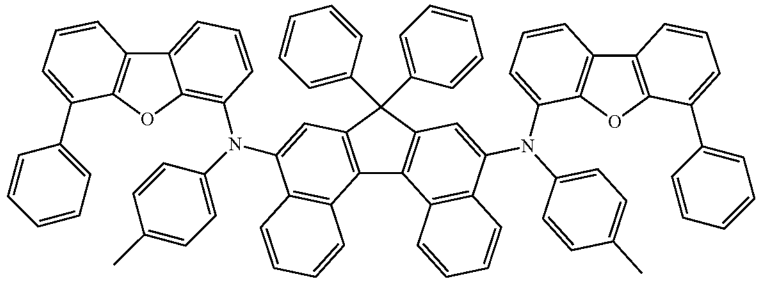

-continued
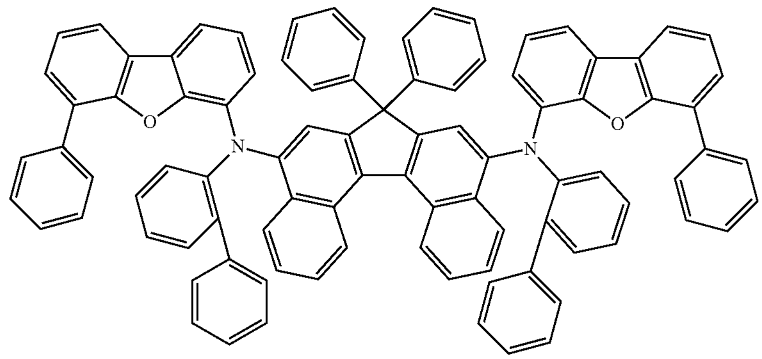
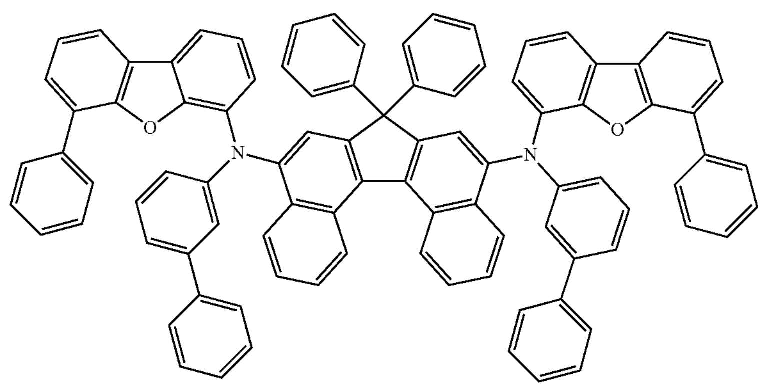
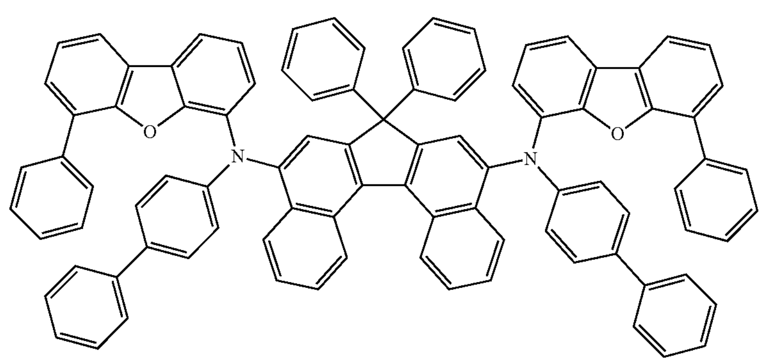
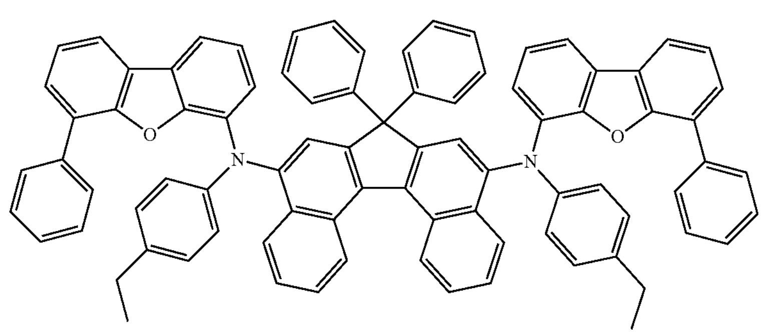

-continued
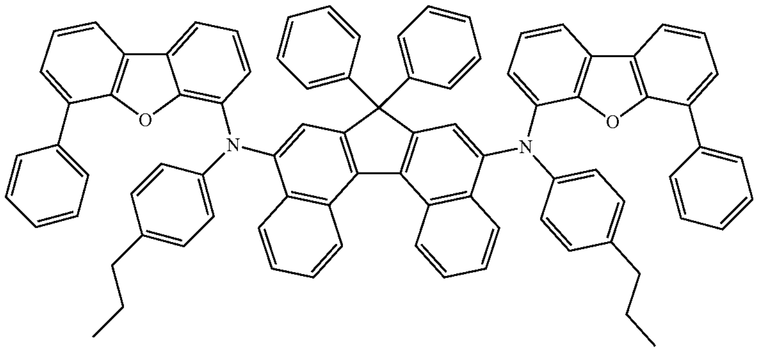
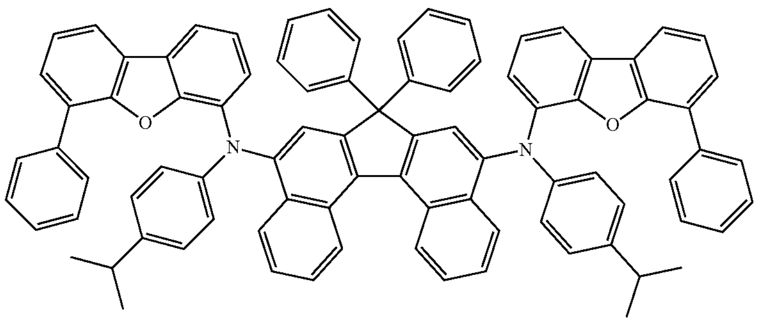
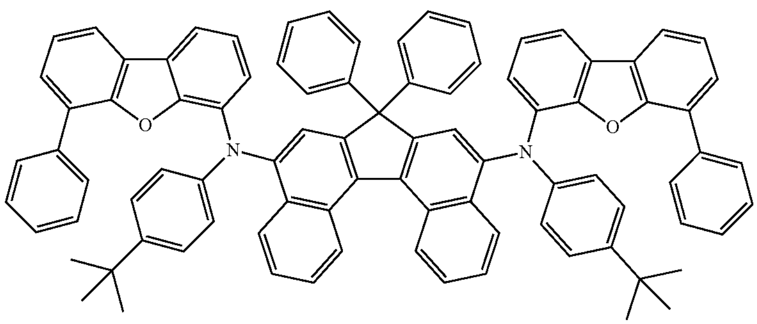
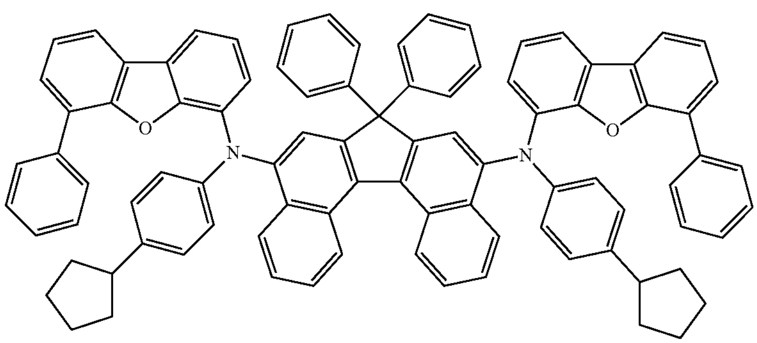
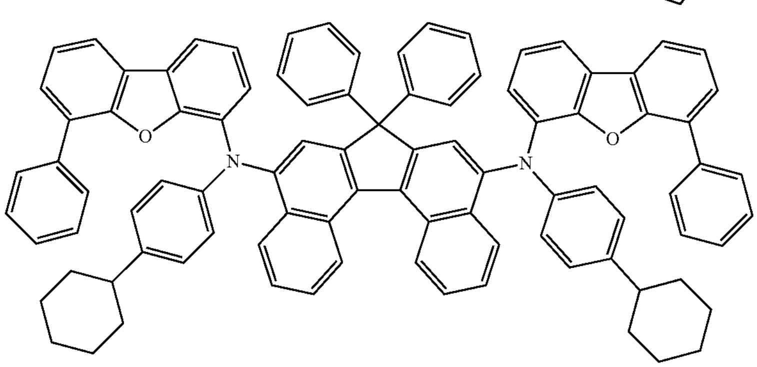

-continued
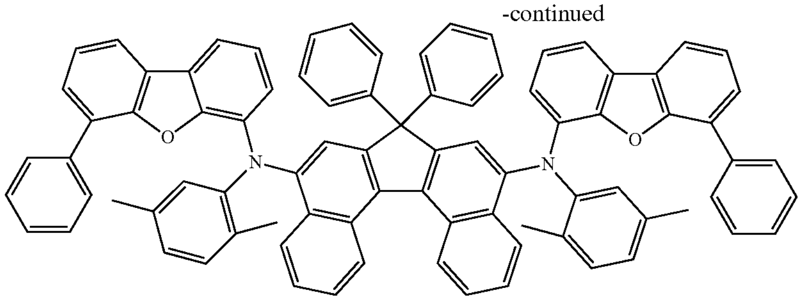
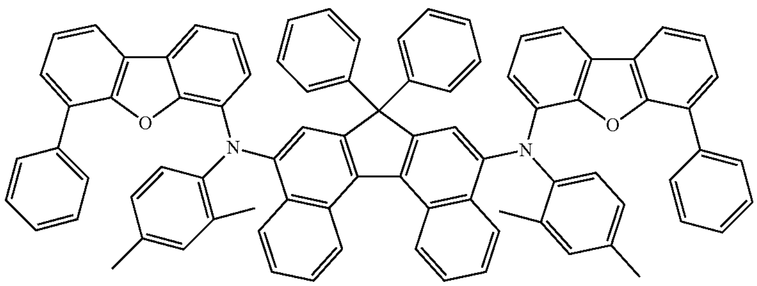
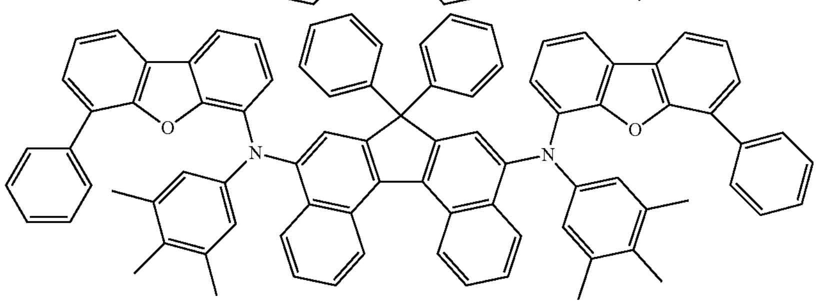
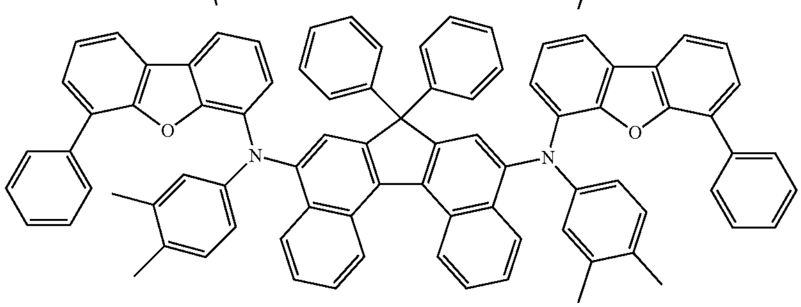
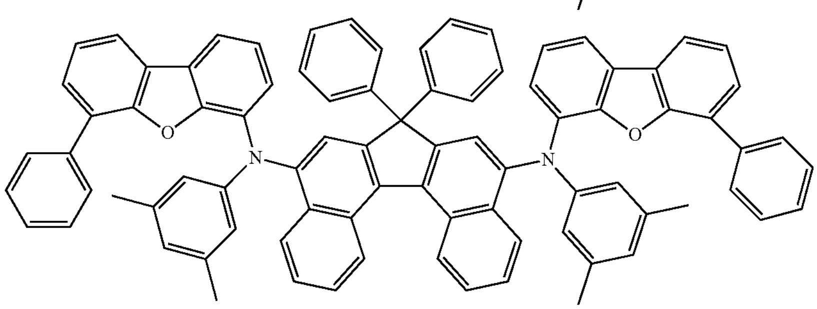
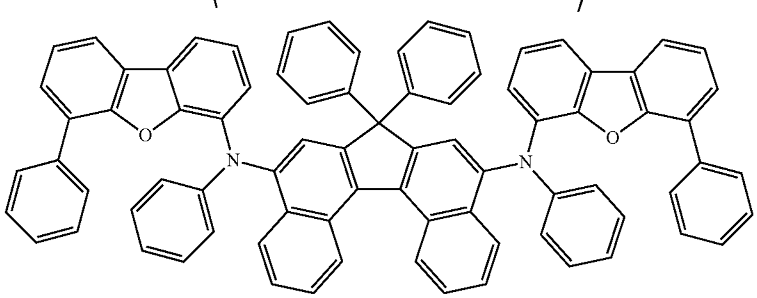

-continued
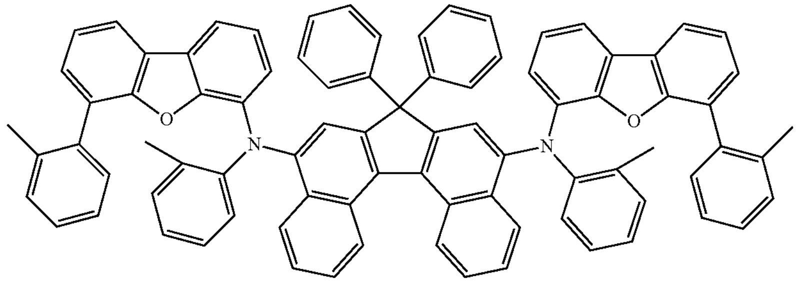
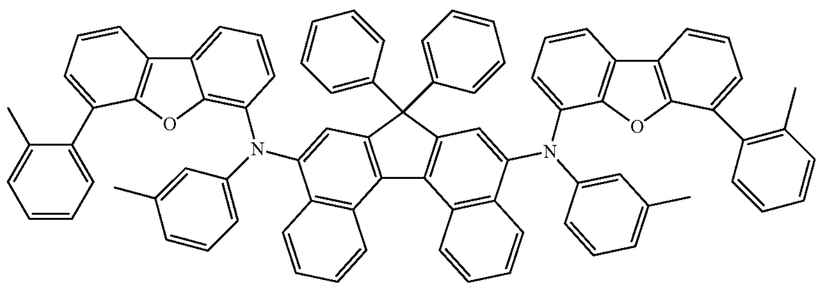
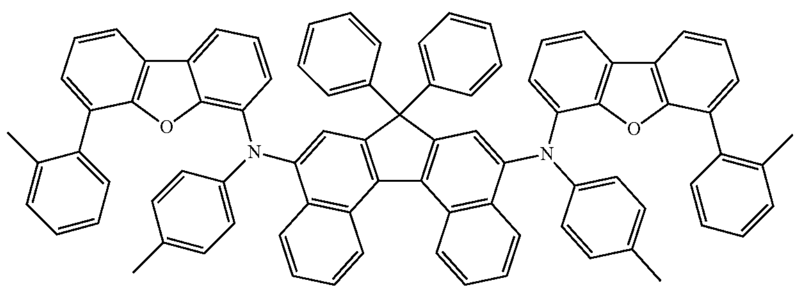
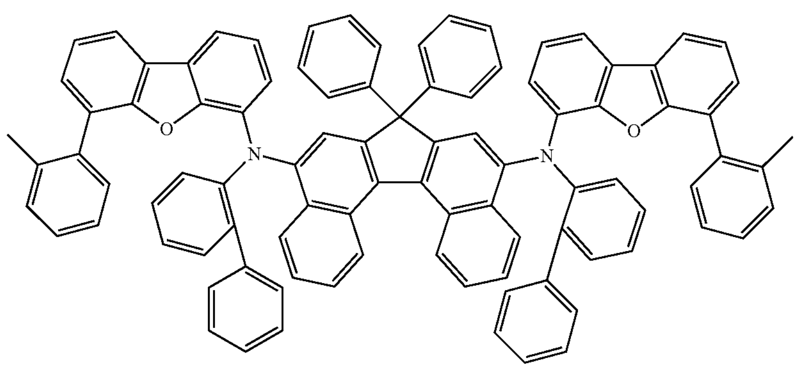
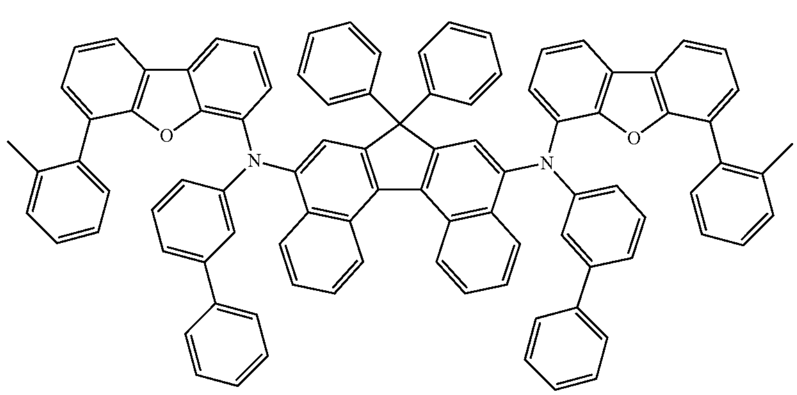

-continued
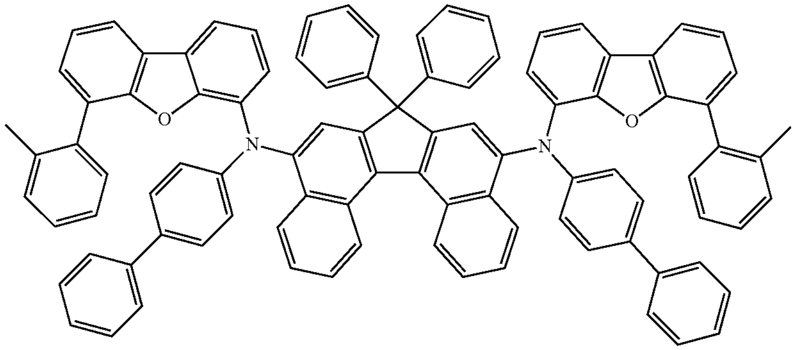
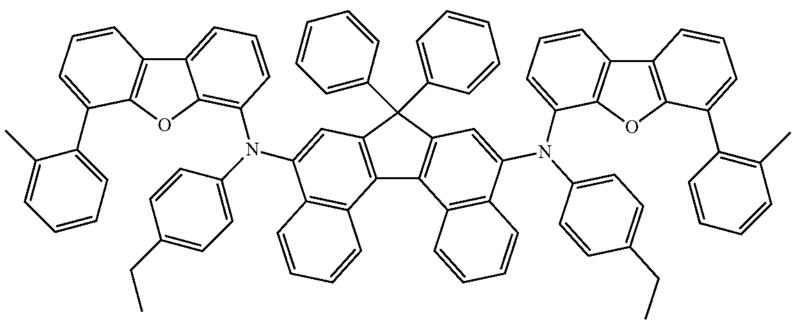
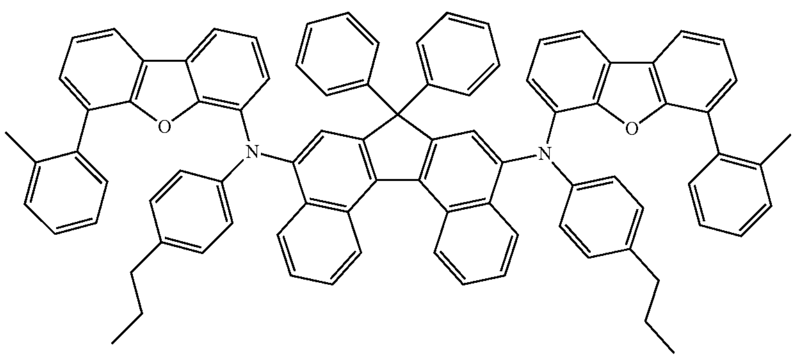
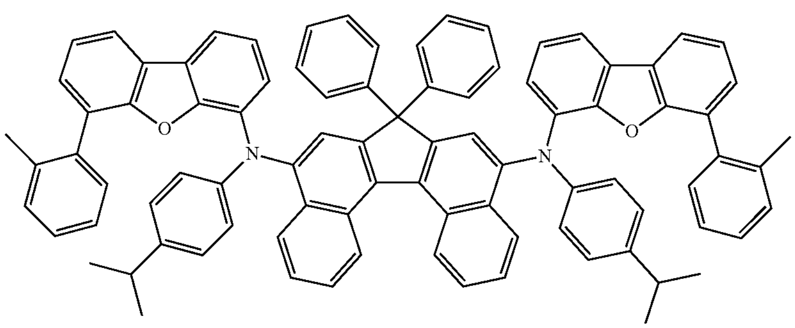
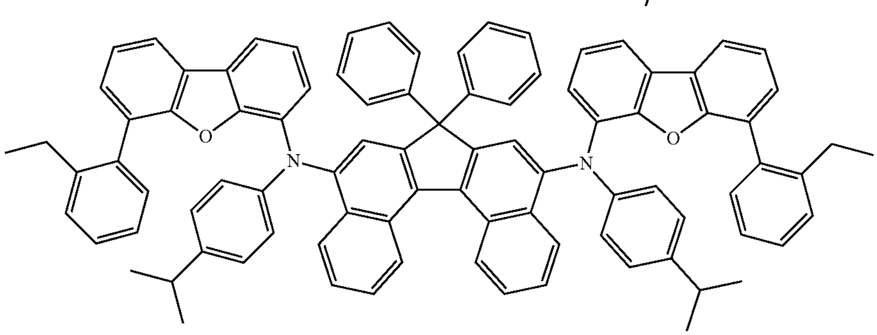

-continued
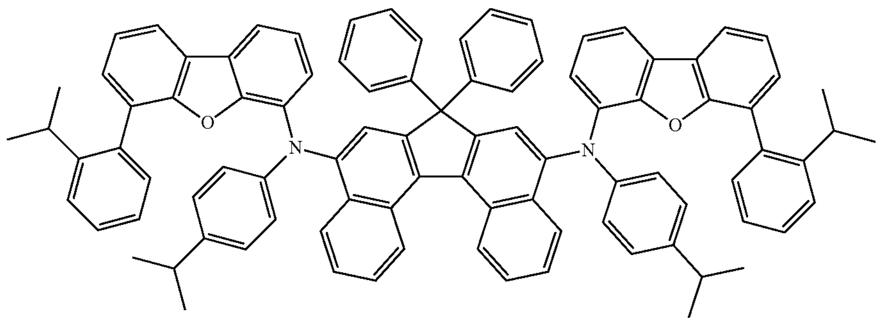
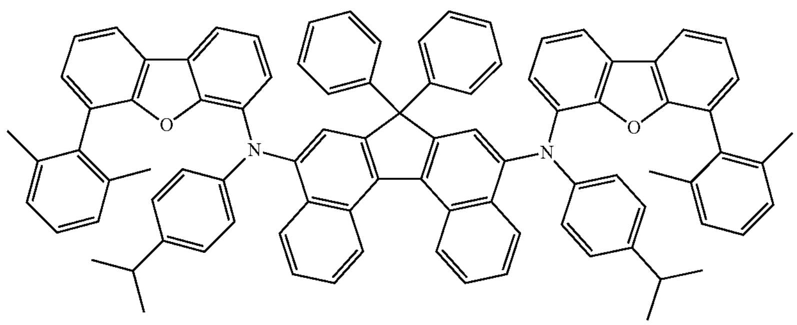
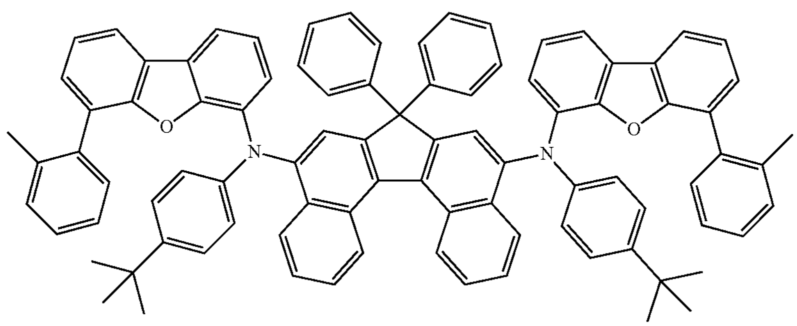
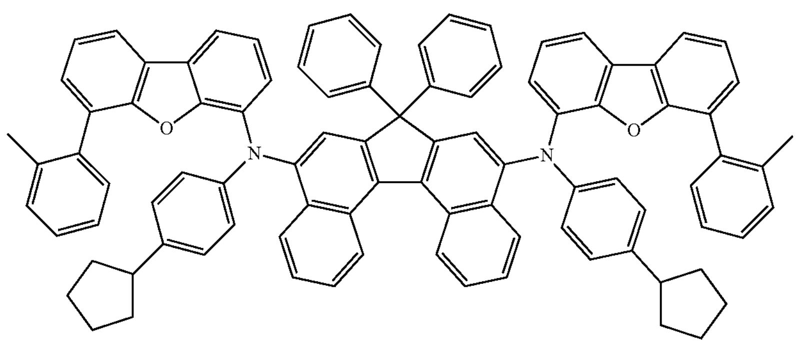
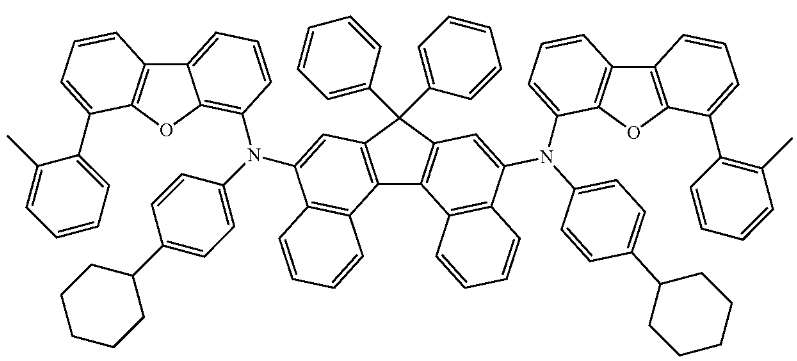

-continued
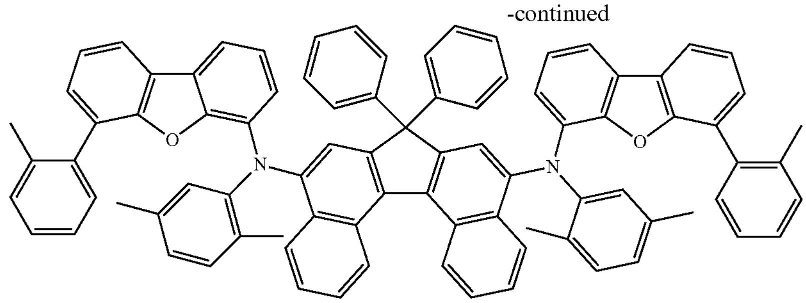
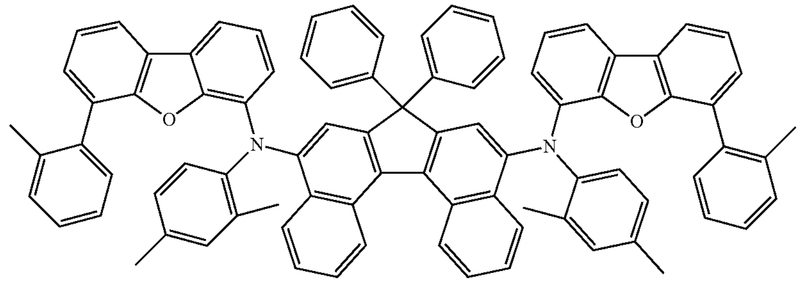
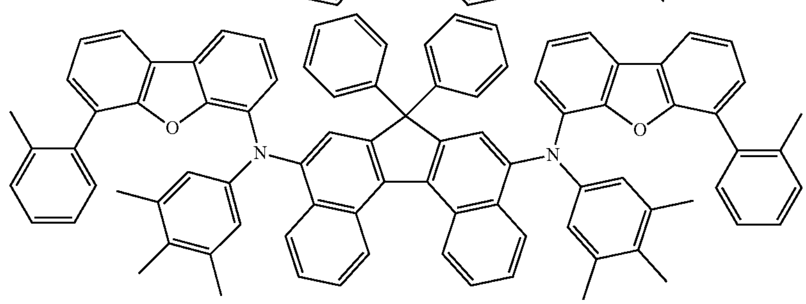
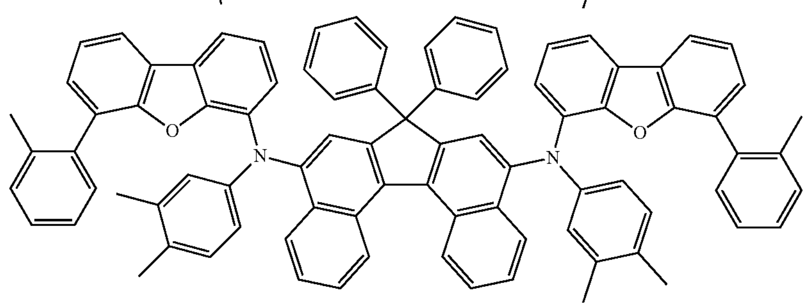
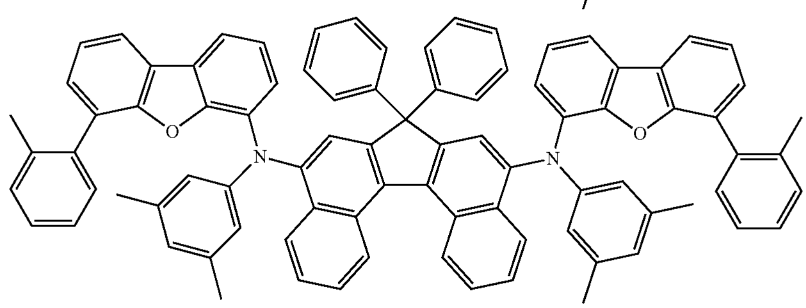
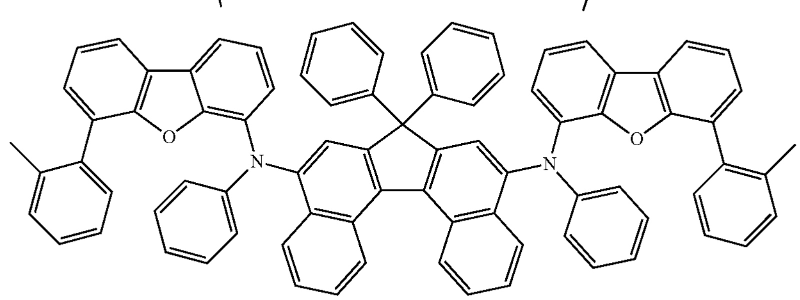

-continued
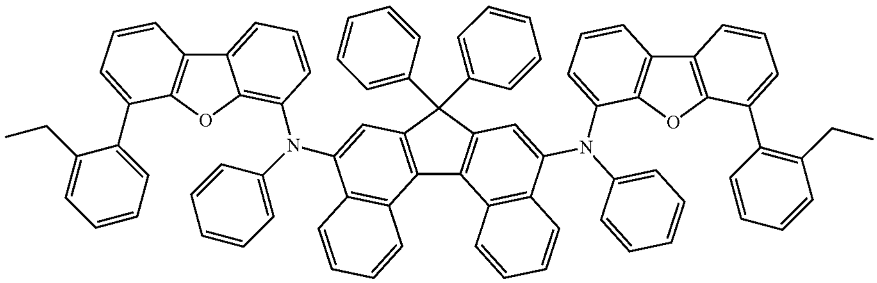
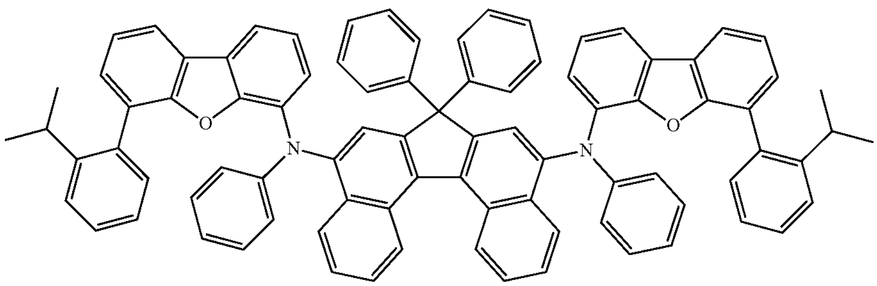
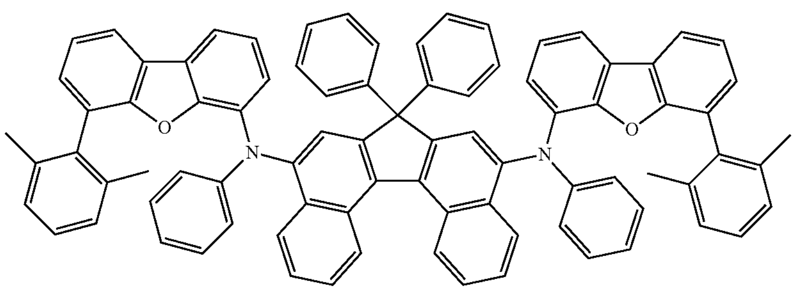
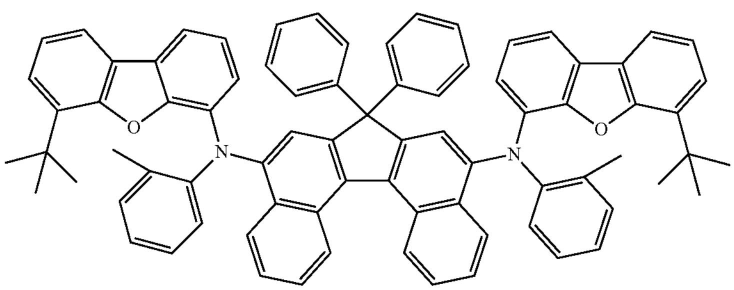
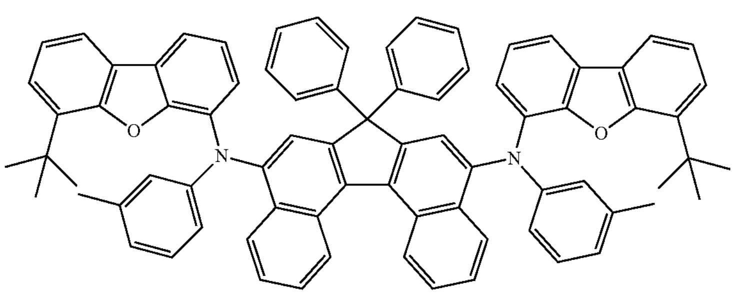

-continued
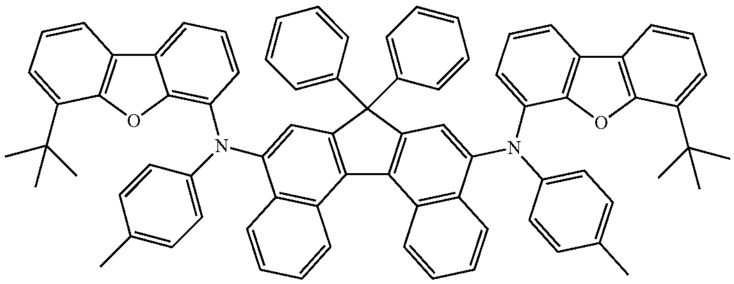
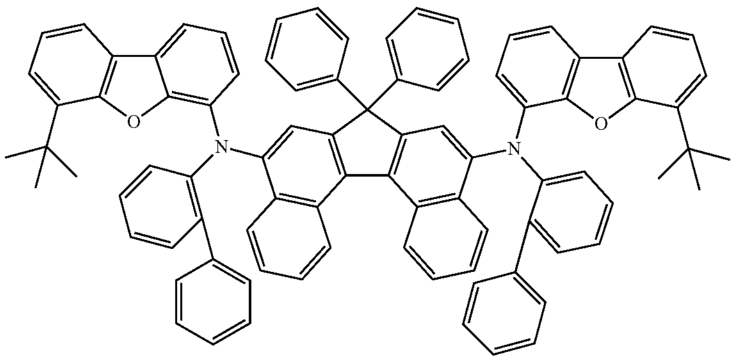
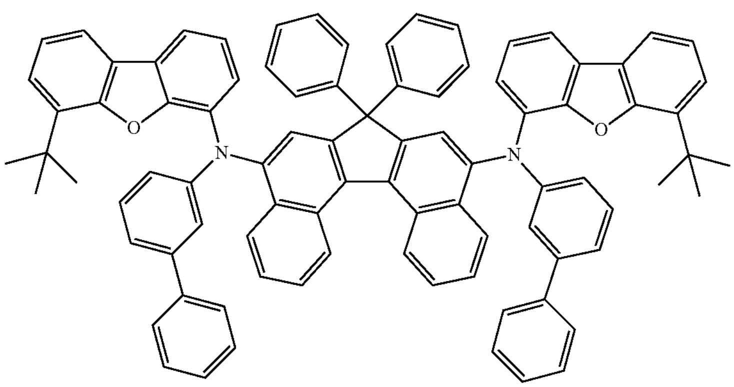
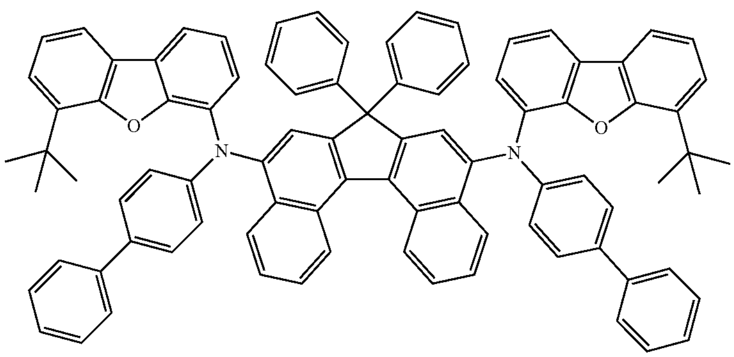
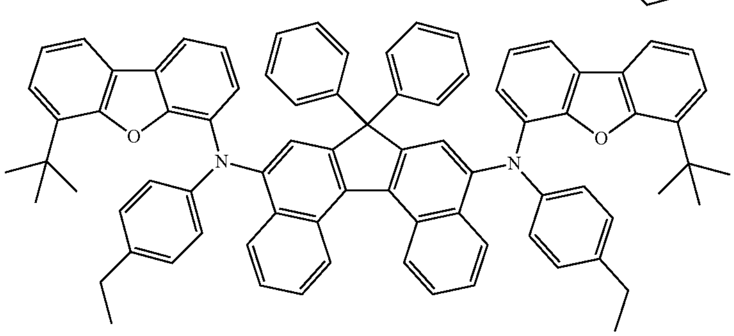

-continued
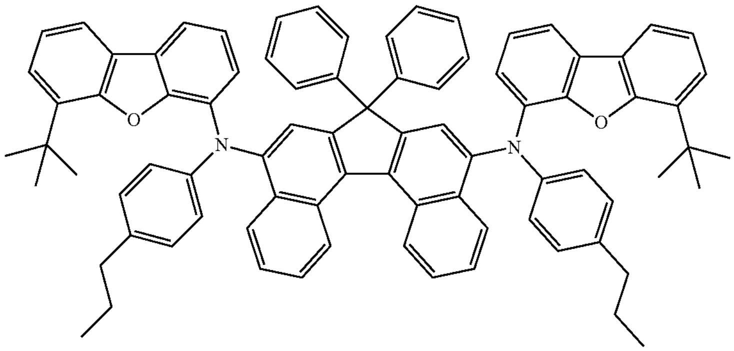
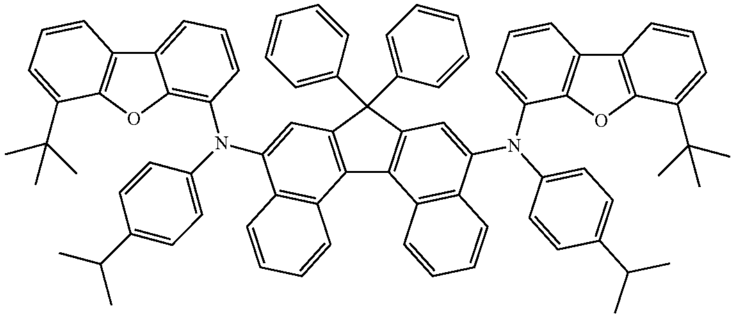
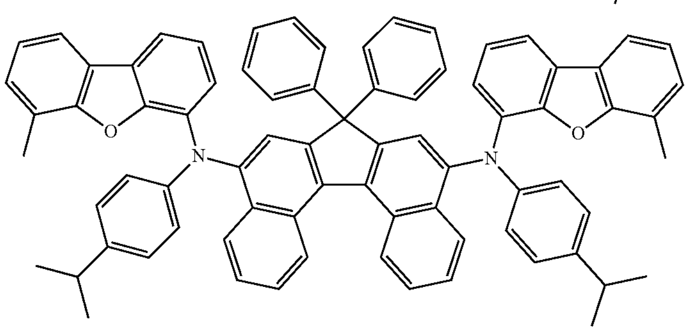
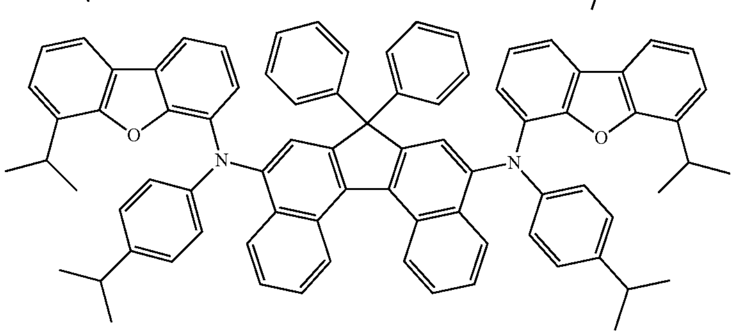
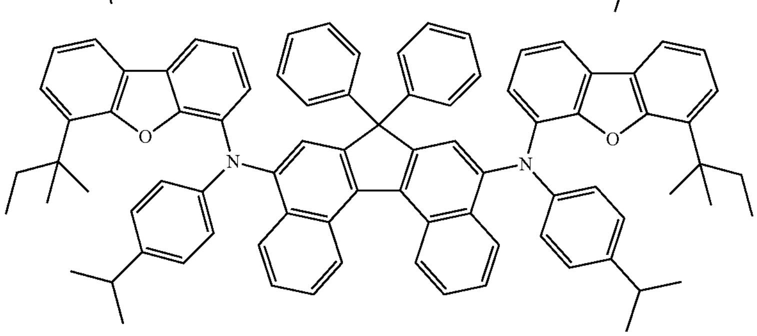

-continued
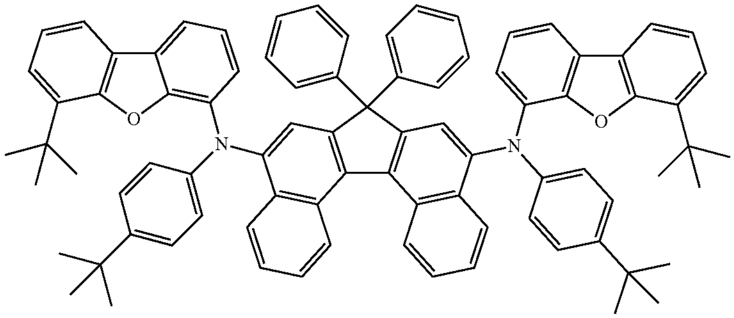
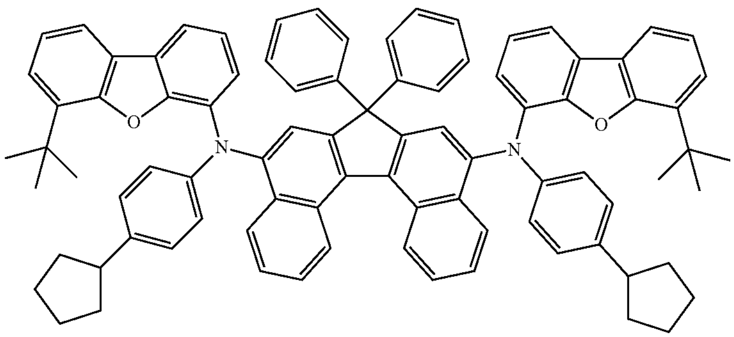
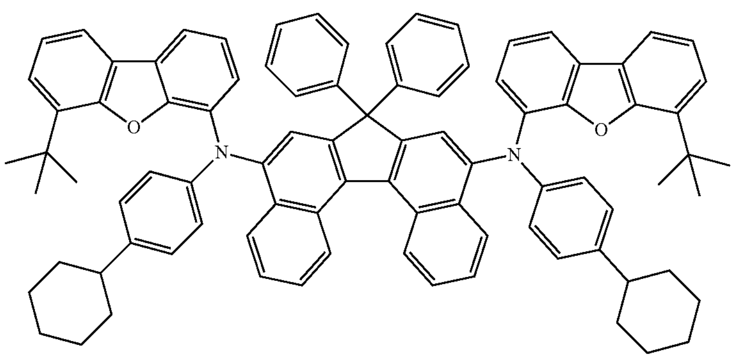
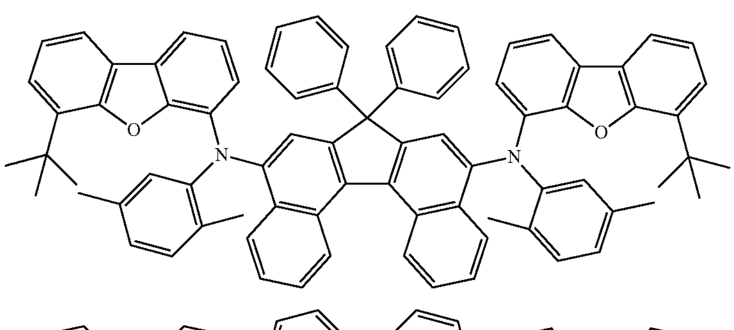
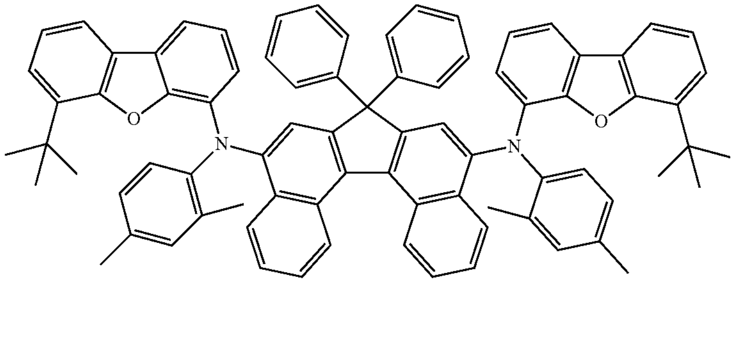

-continued
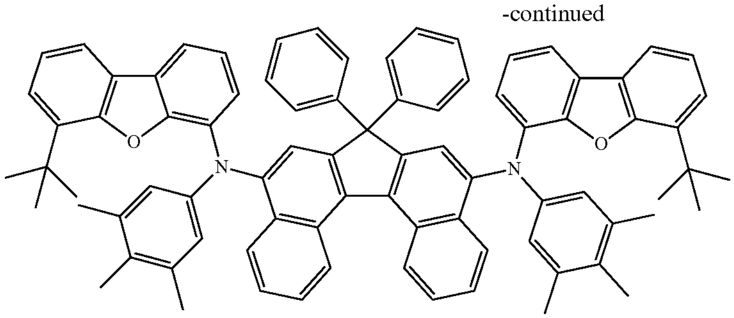
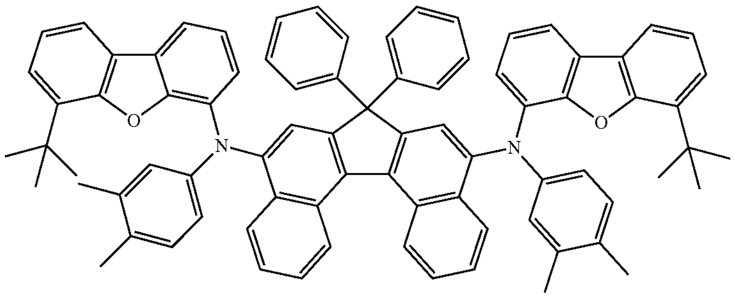
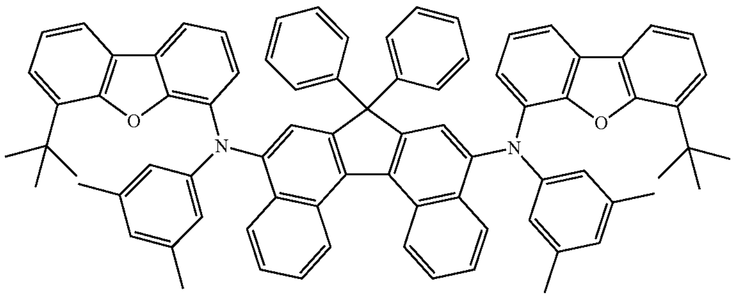
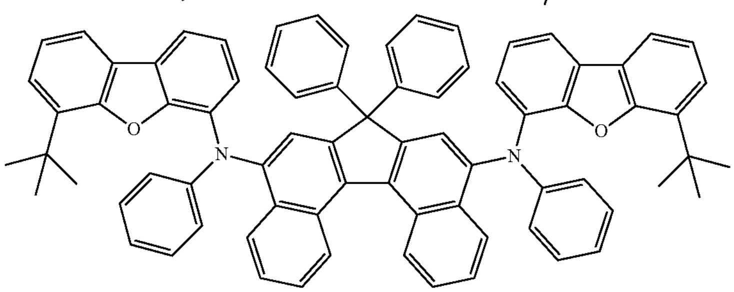
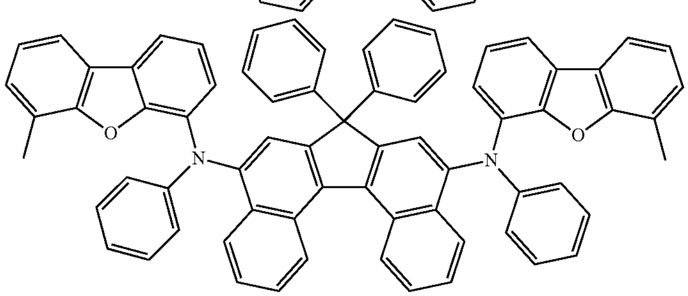
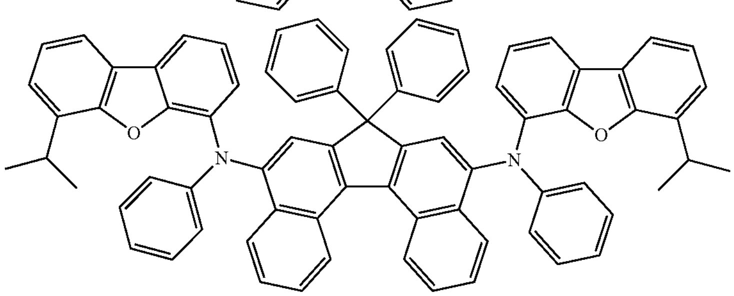

-continued
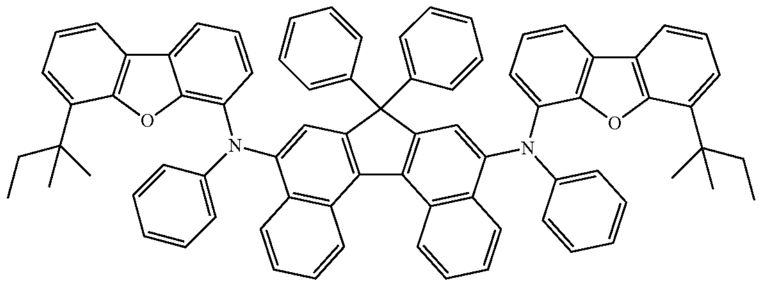
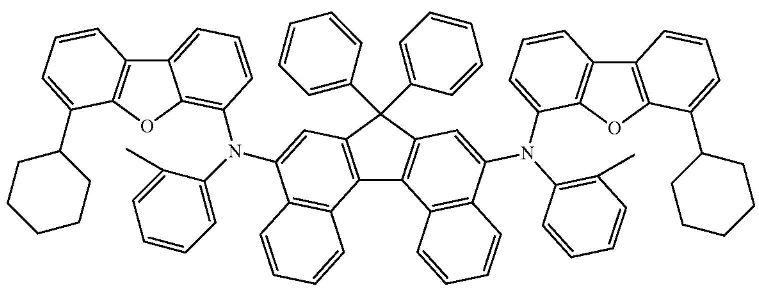
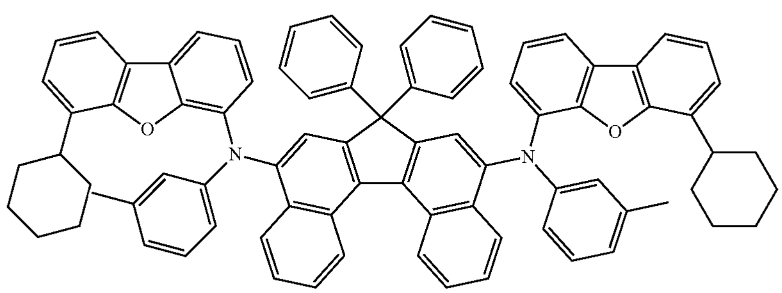
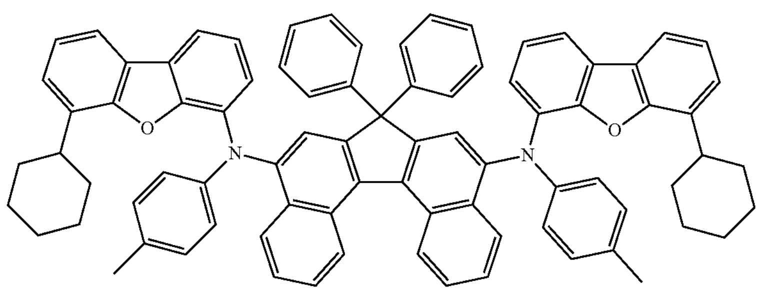
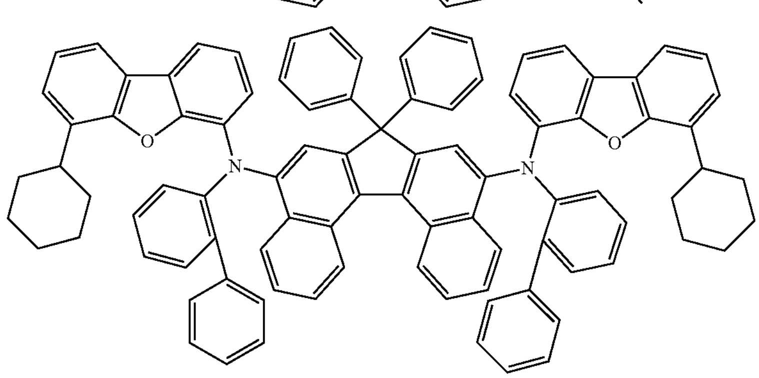

-continued
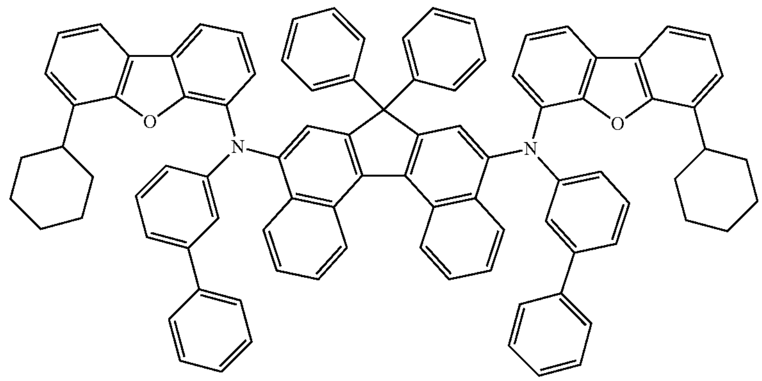
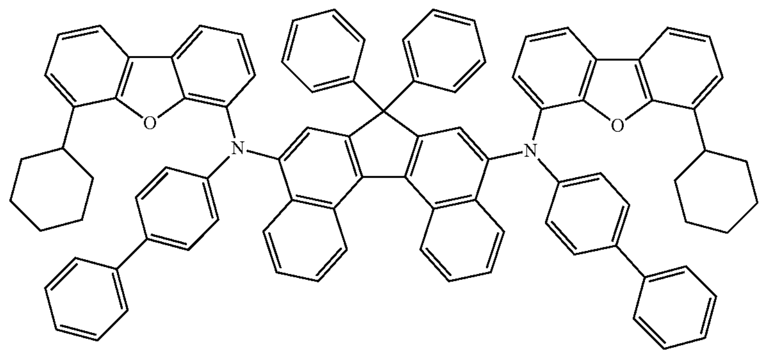
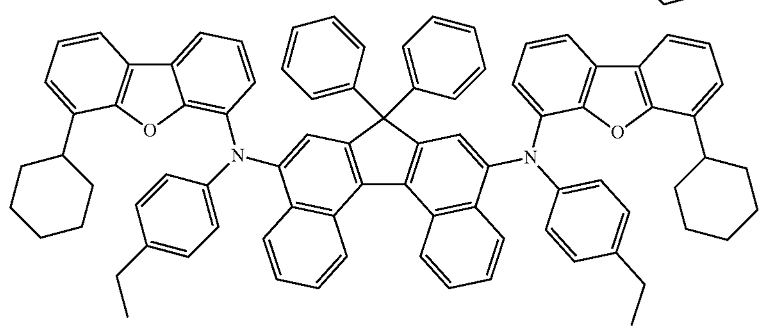
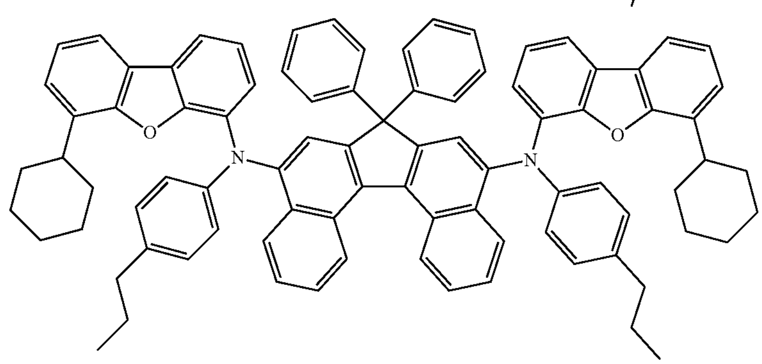
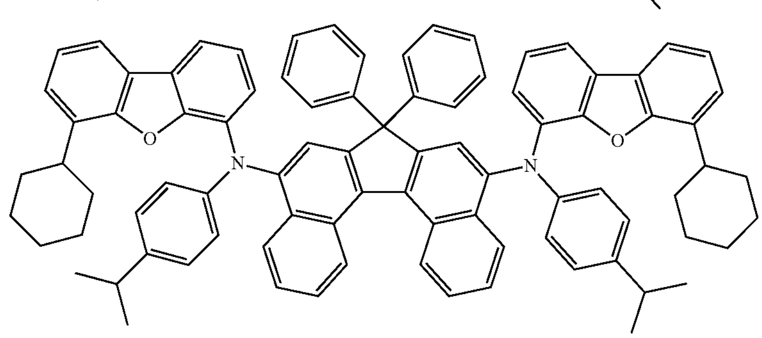

-continued
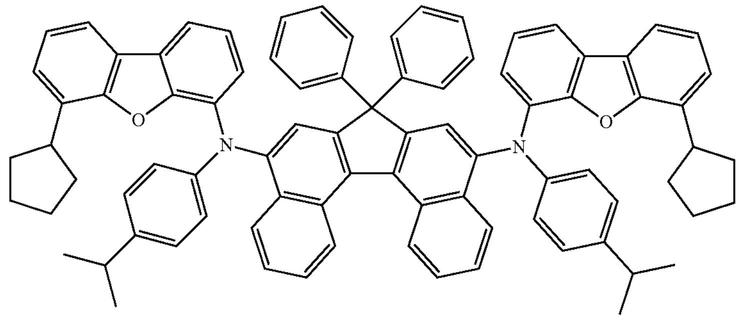
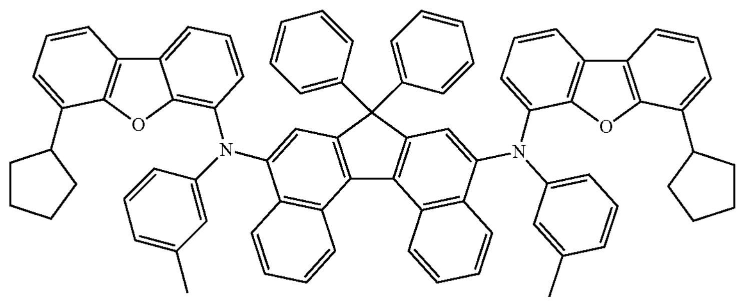
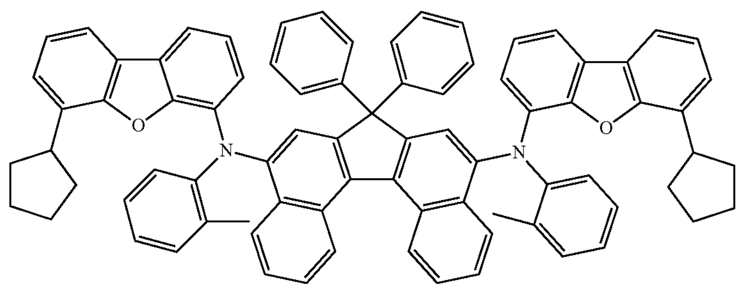
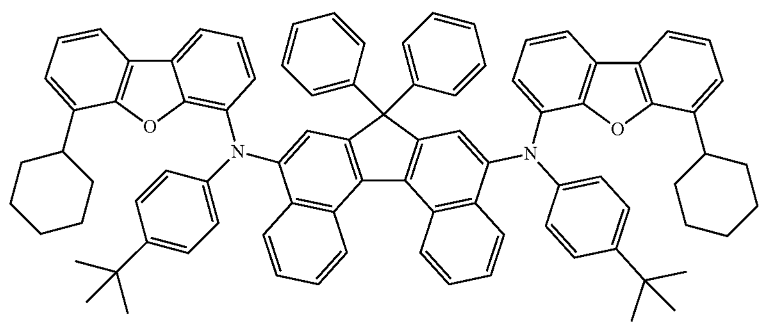
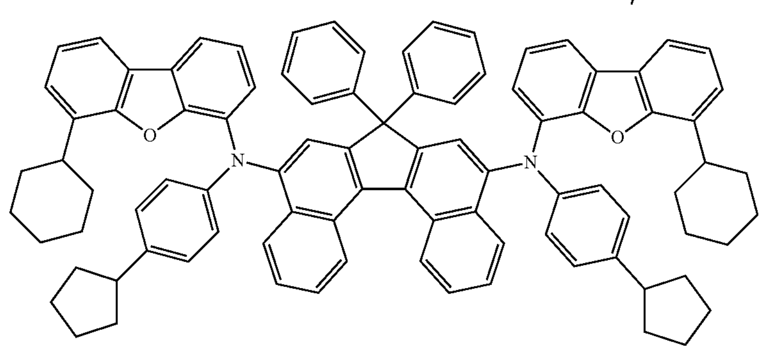

-continued
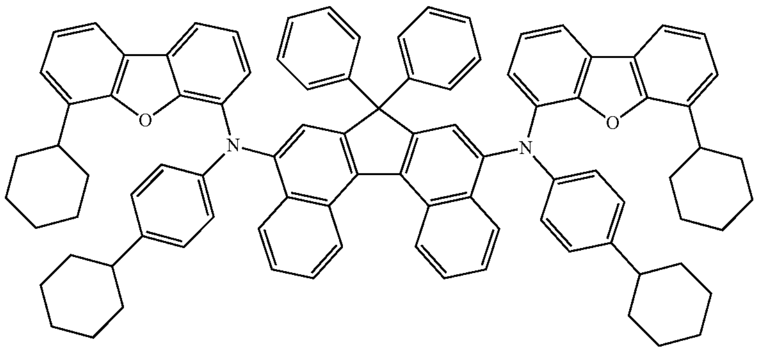
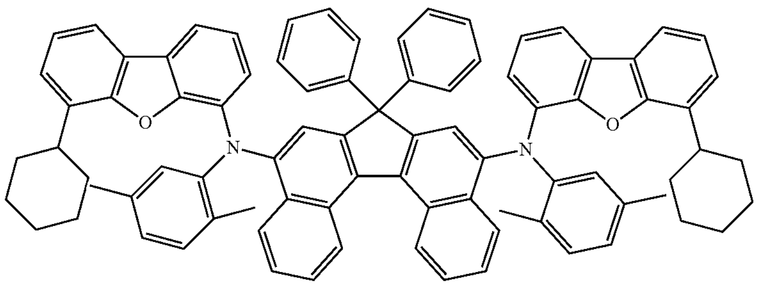
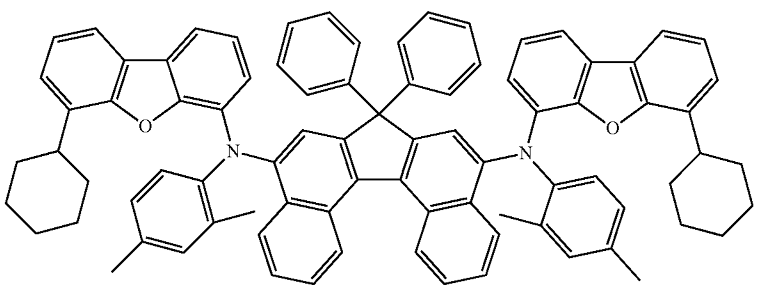
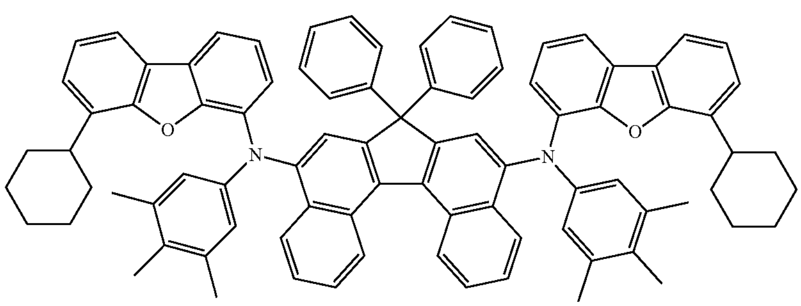
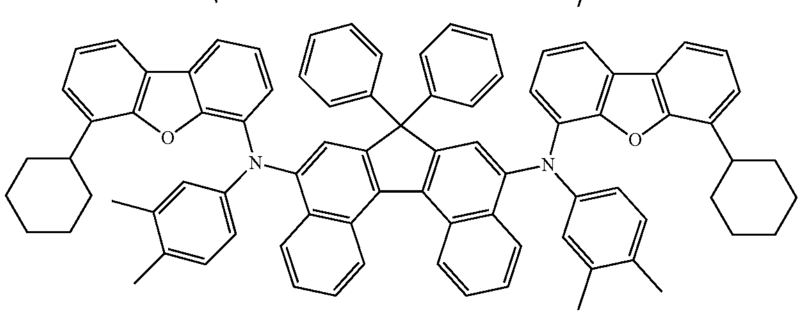

-continued
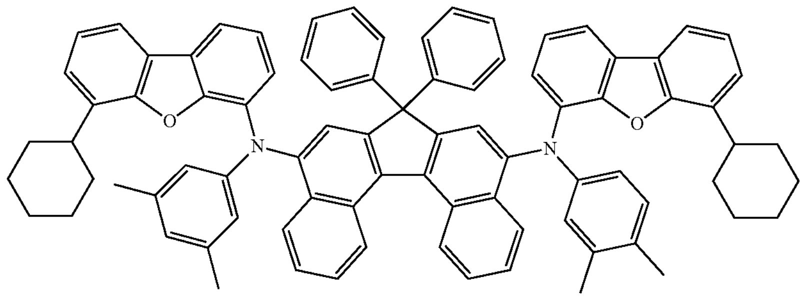
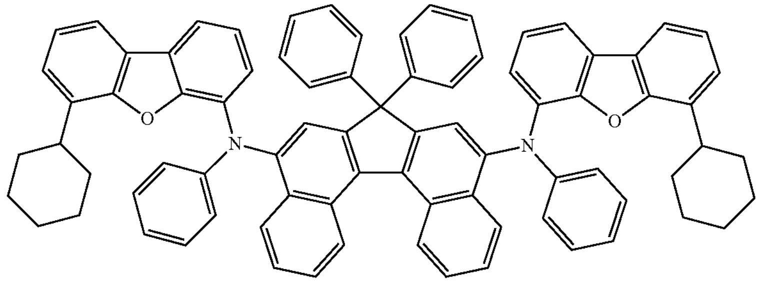
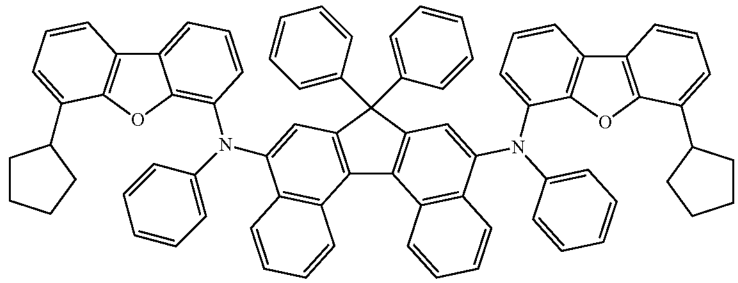
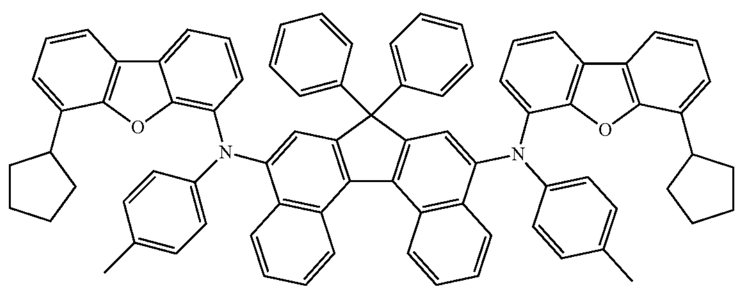
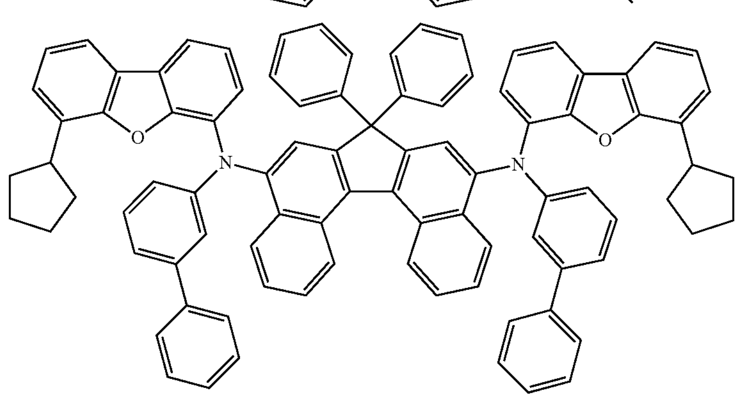

-continued
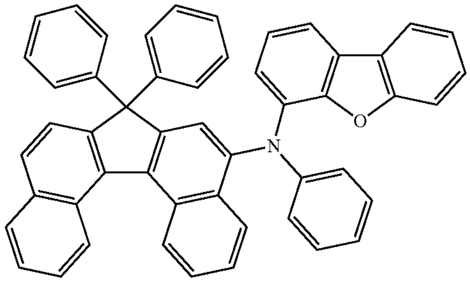
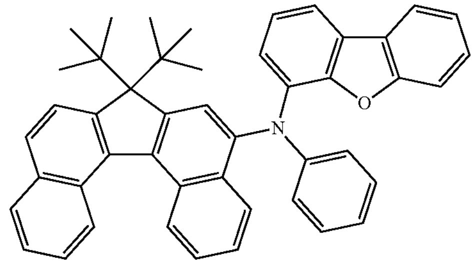
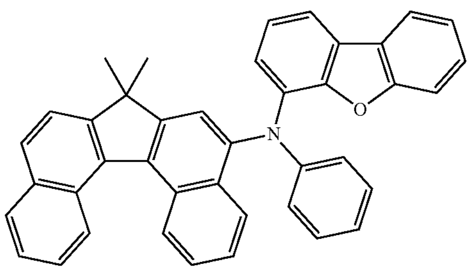
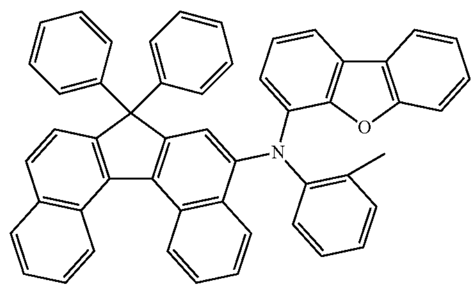
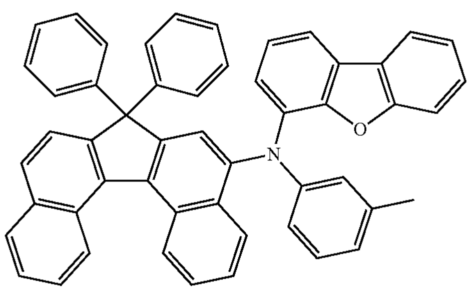
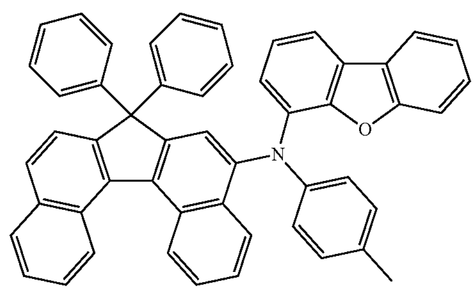
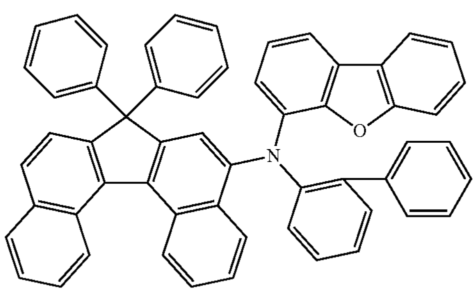
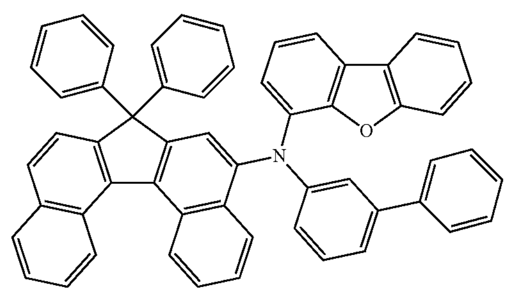
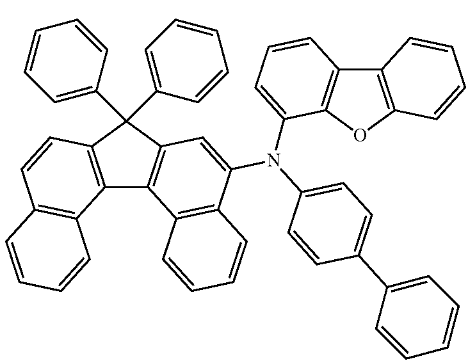
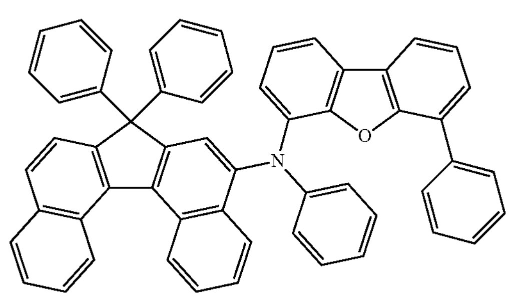

-continued
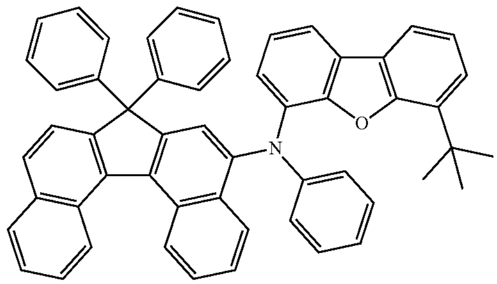
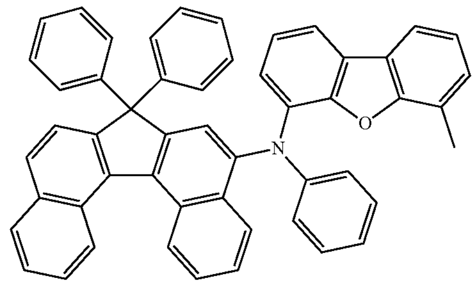
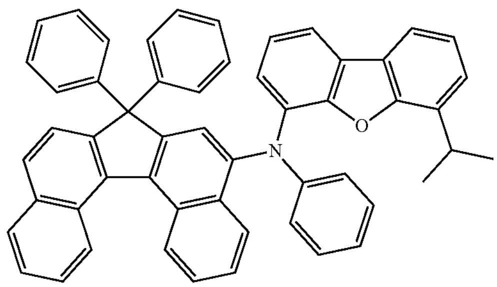
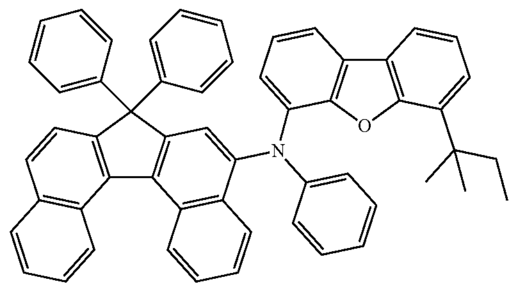
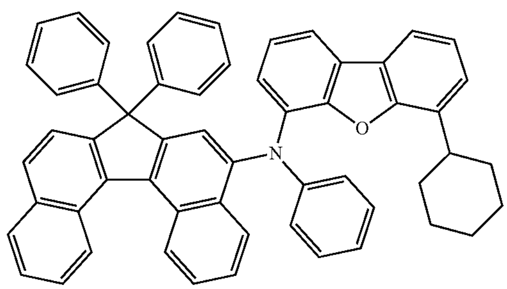
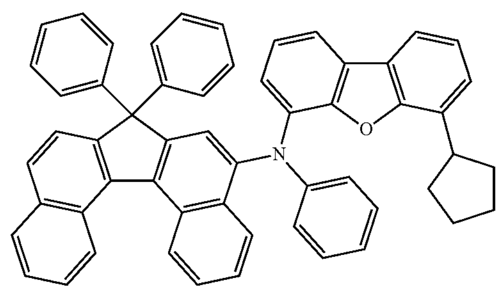
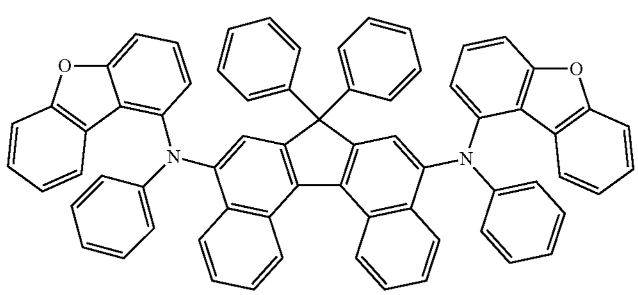
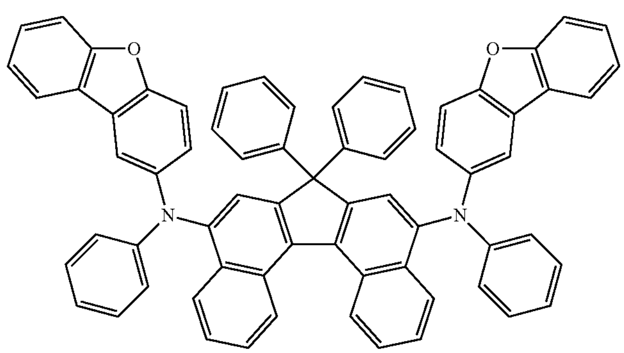

-continued
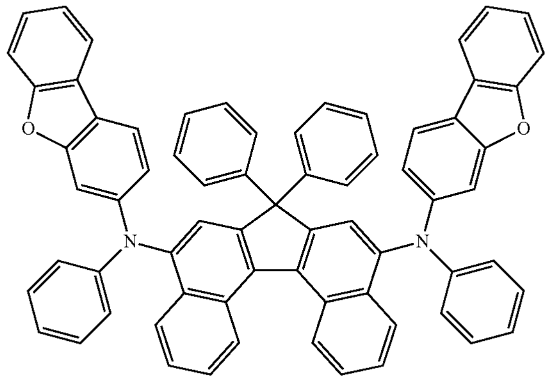
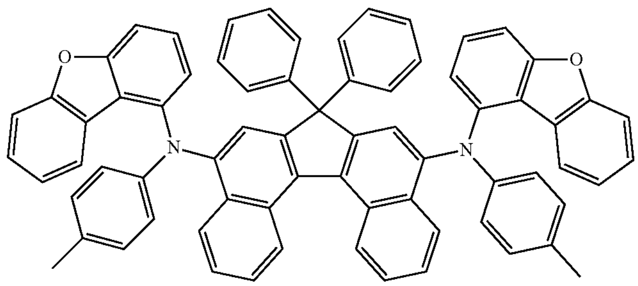
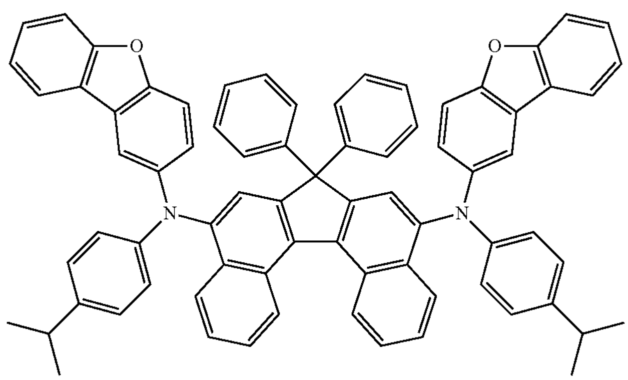
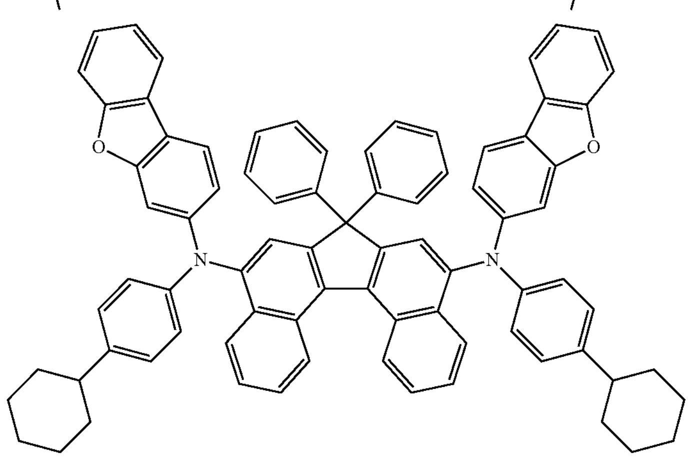

-continued
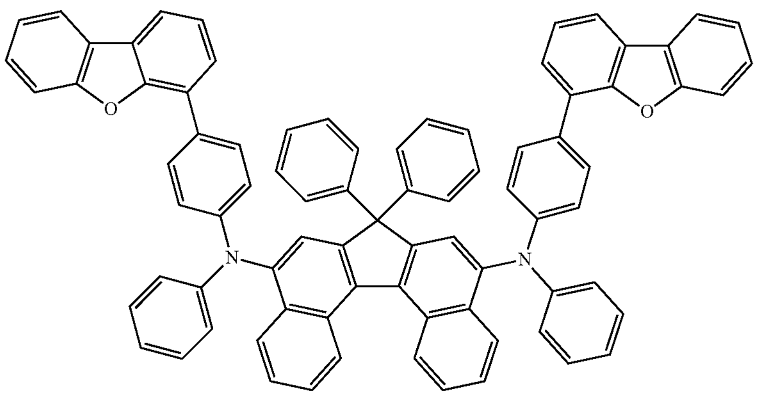
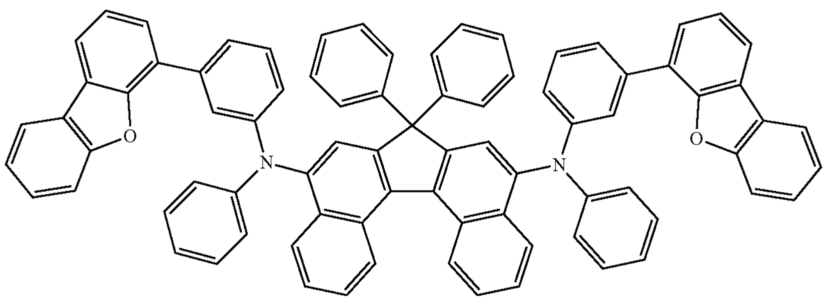
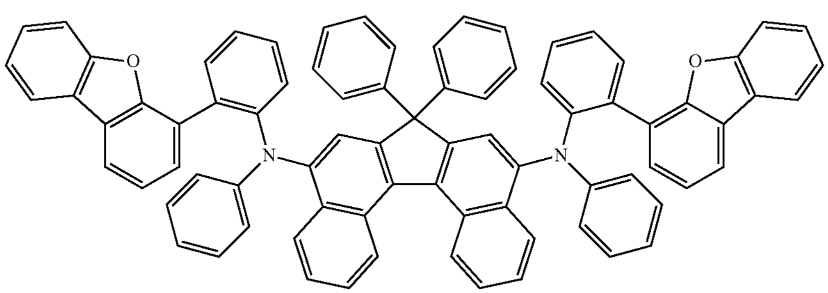
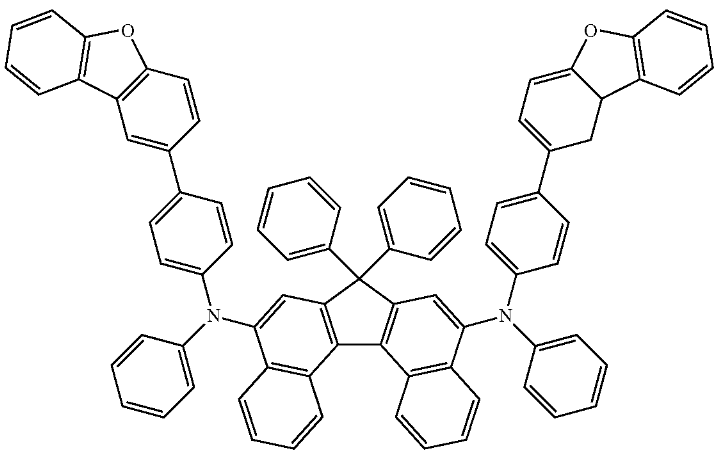

-continued
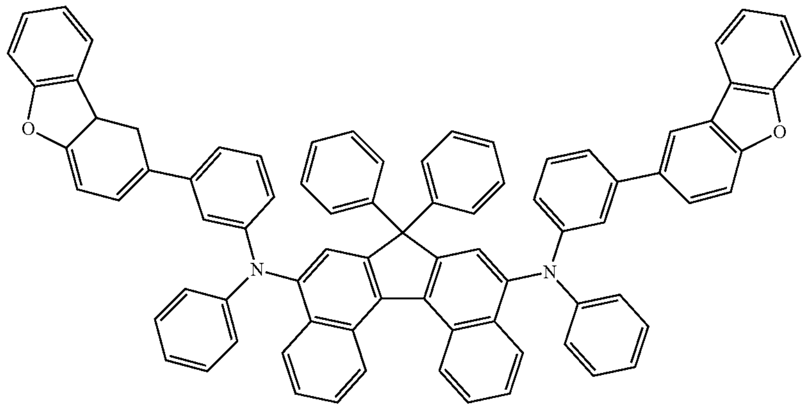
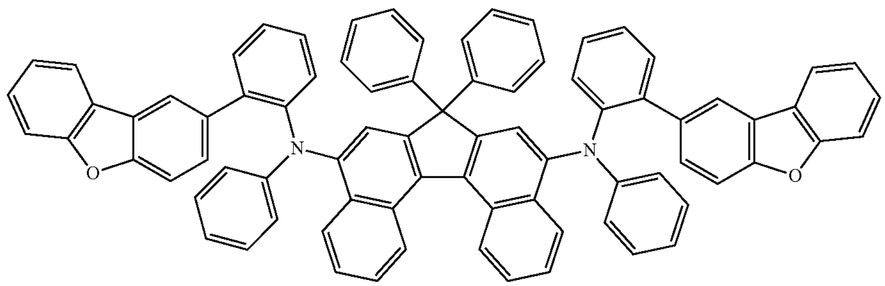
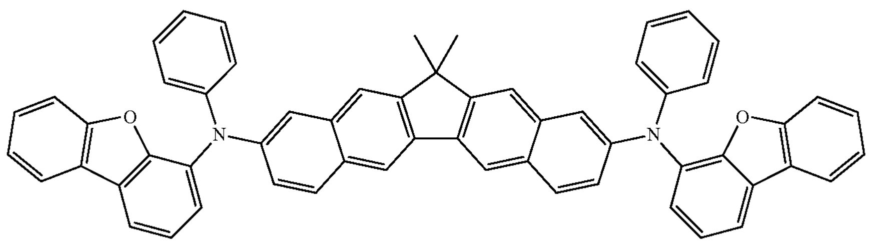
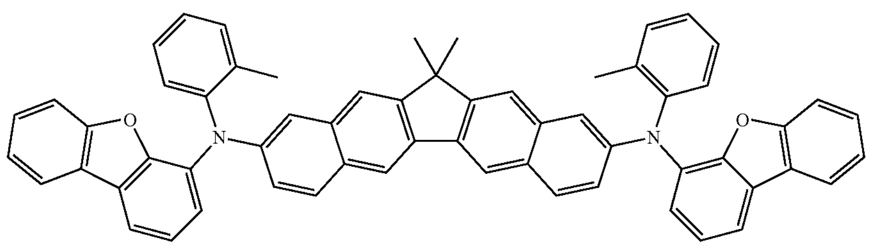
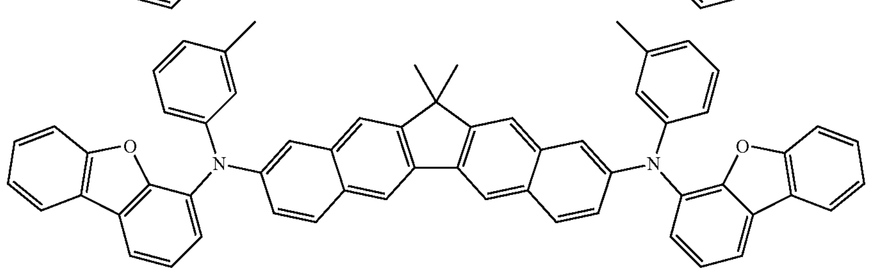
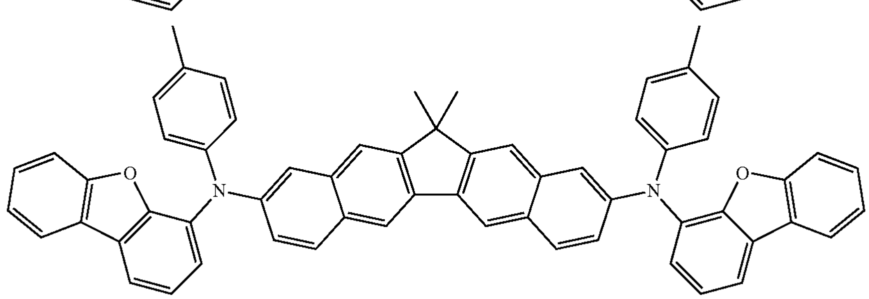

-continued
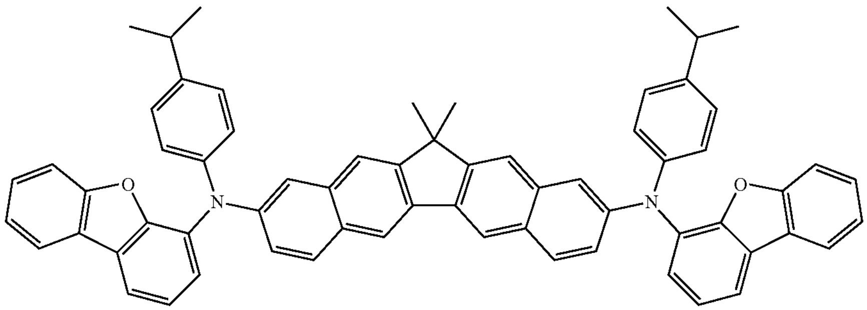
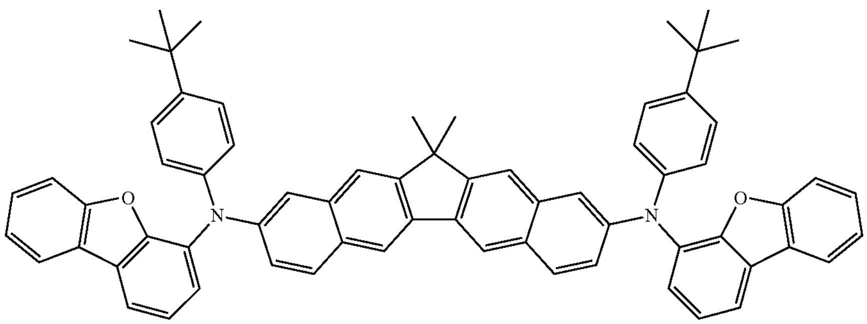
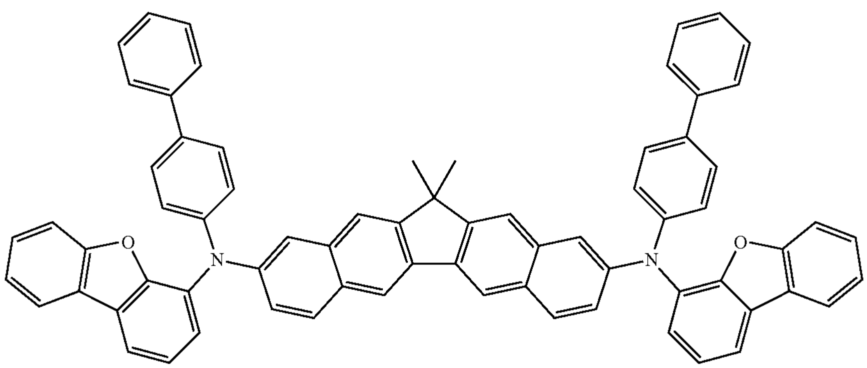
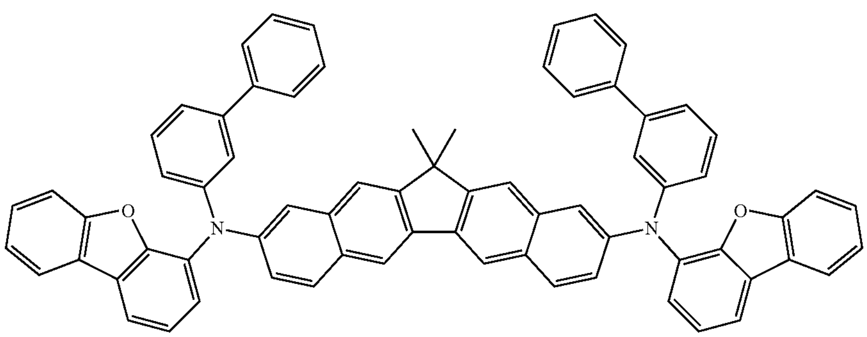
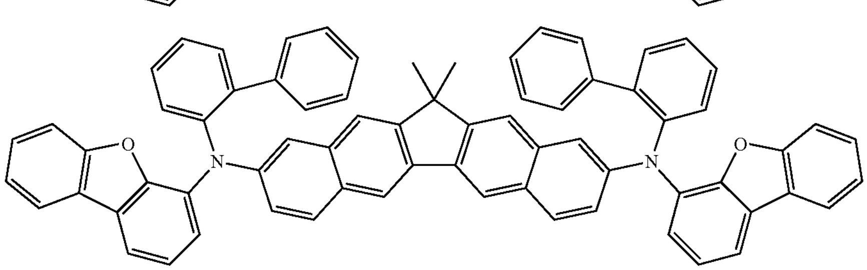

-continued
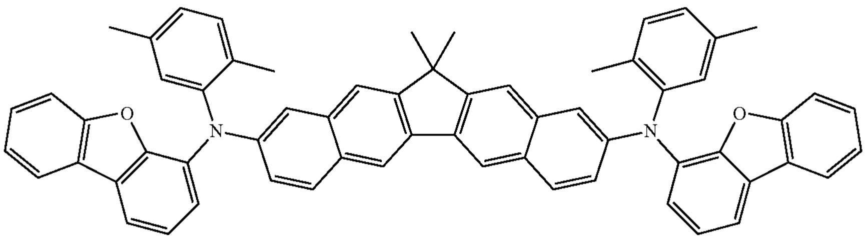
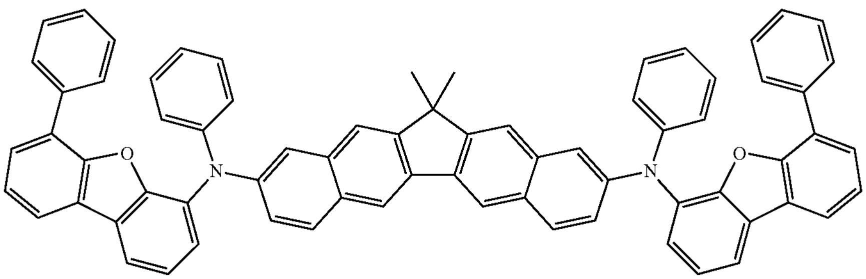
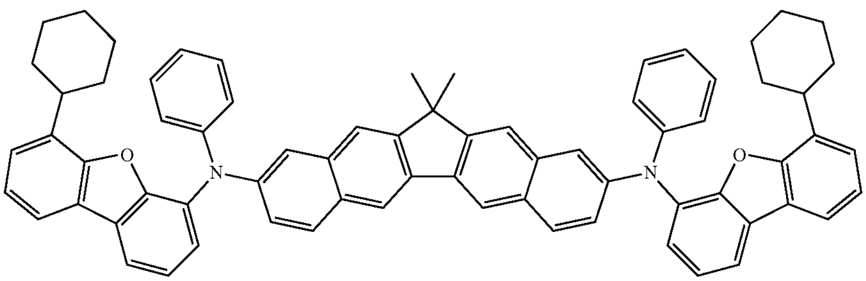
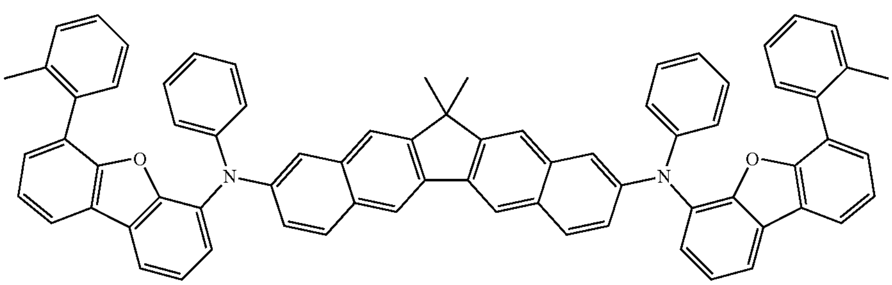
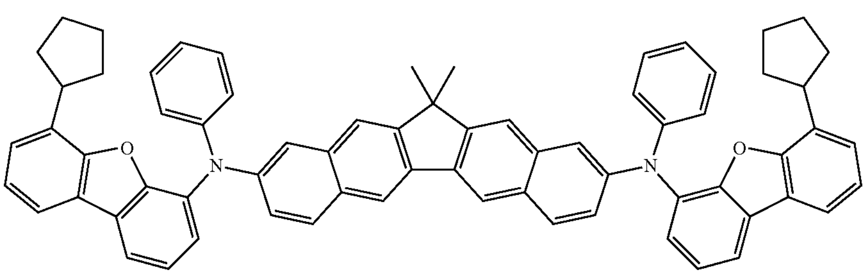
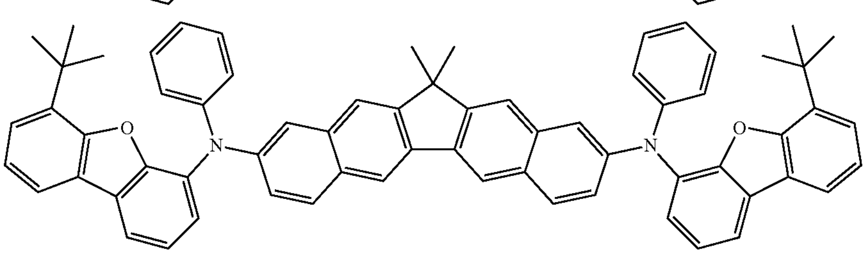

-continued
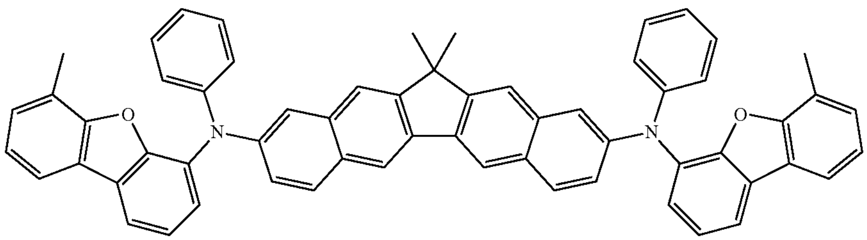
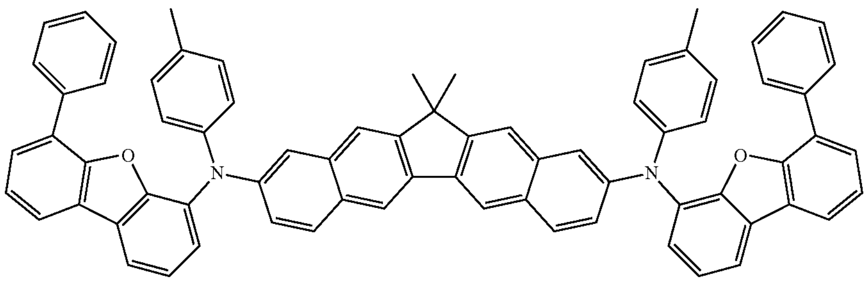
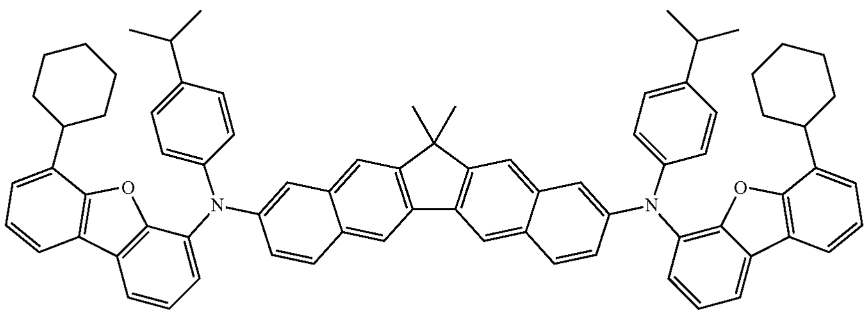
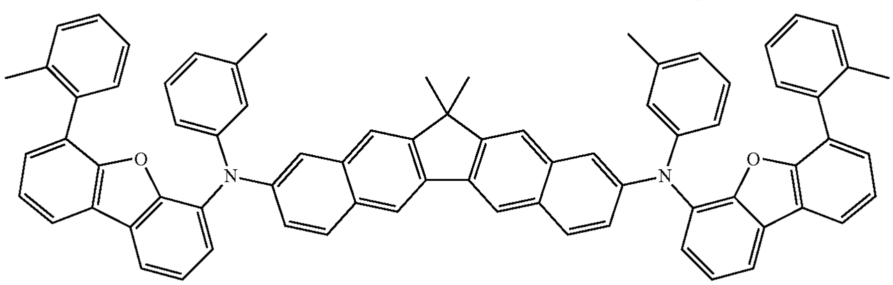
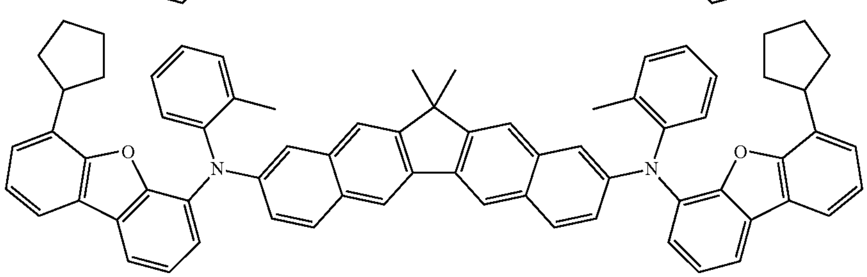
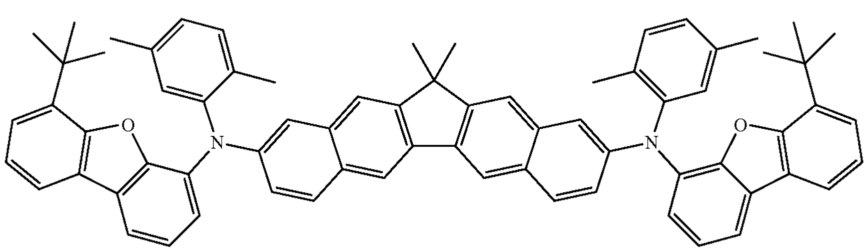

-continued
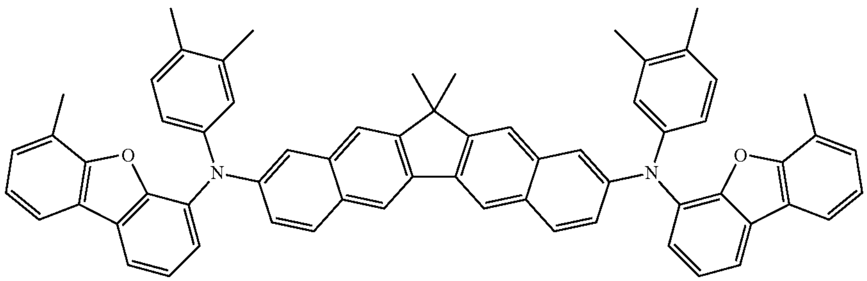
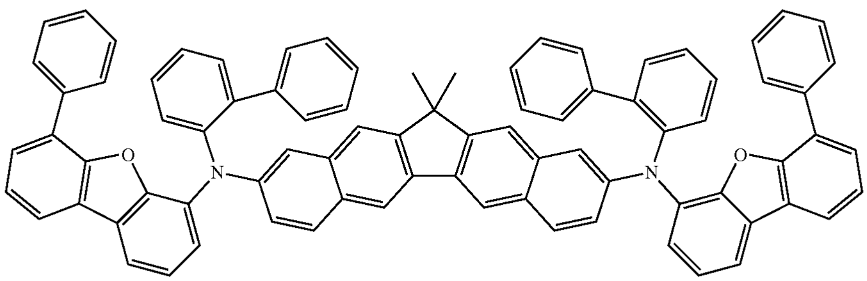
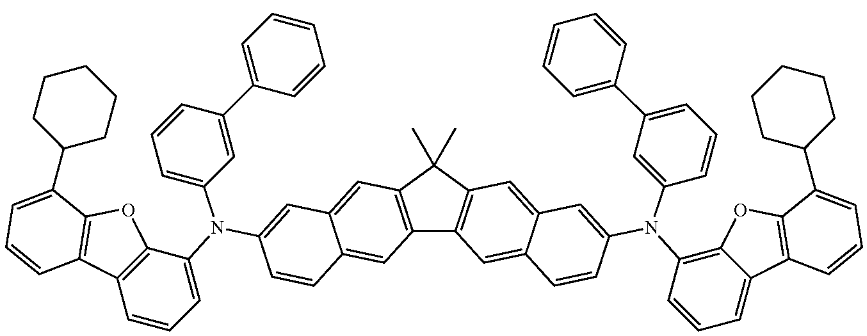
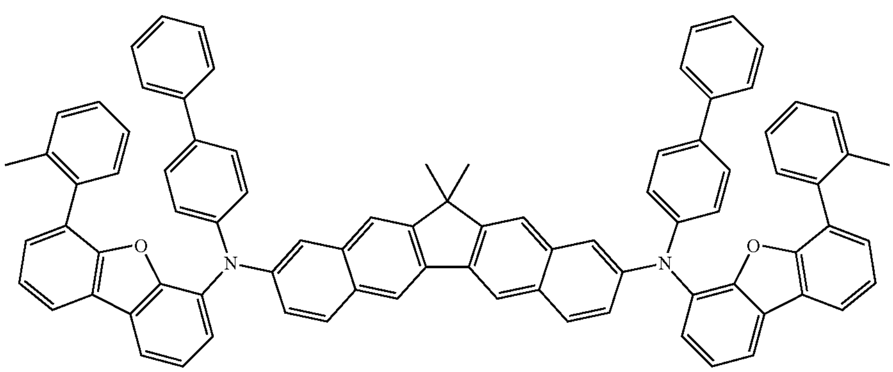
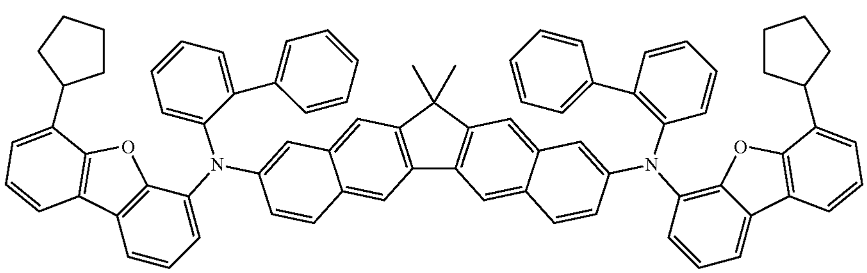

-continued
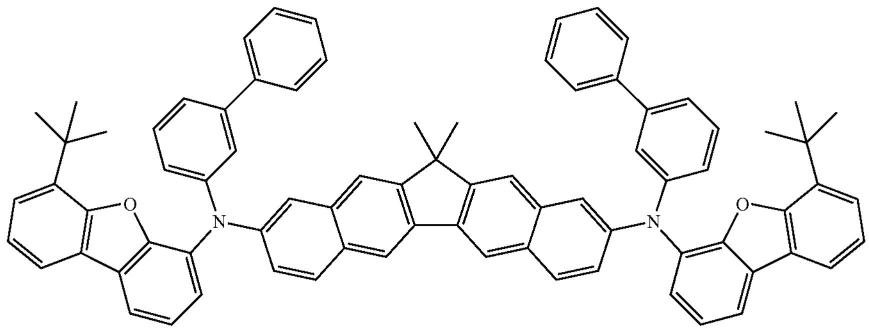
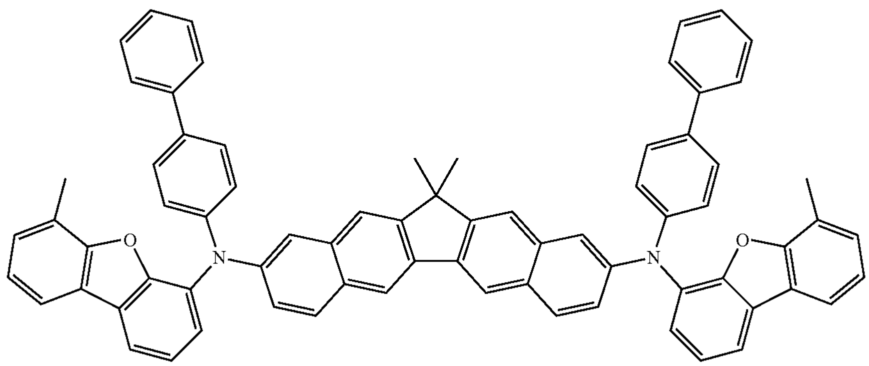
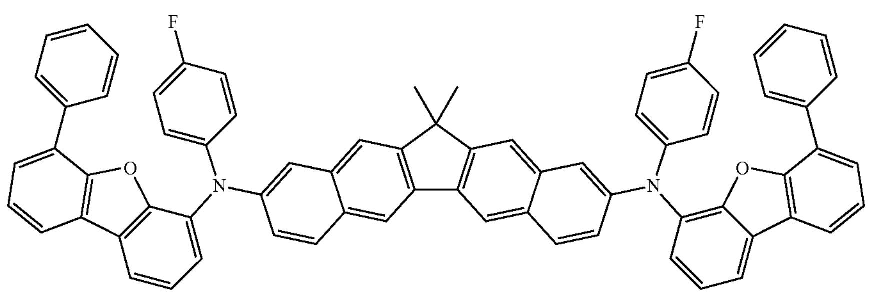
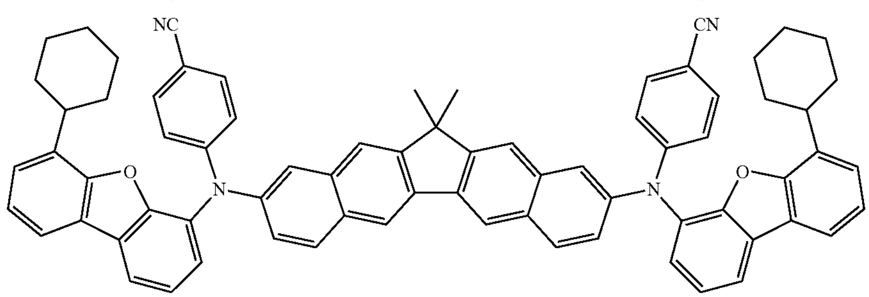
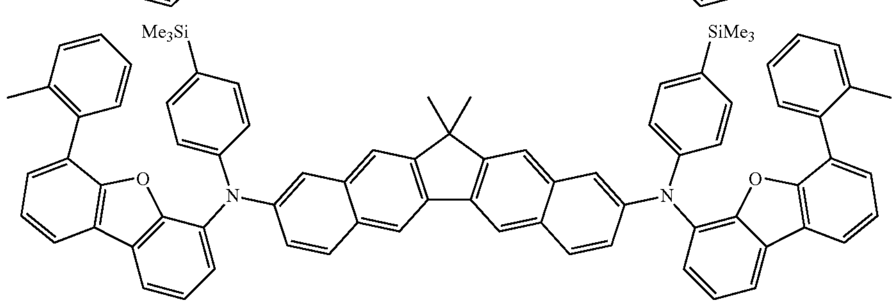

-continued
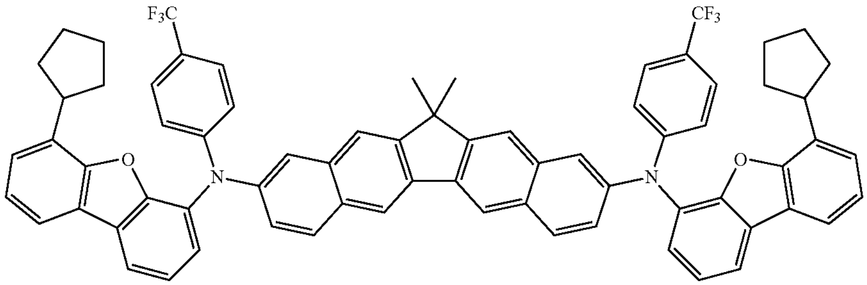
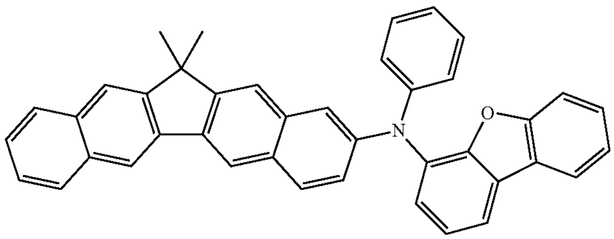
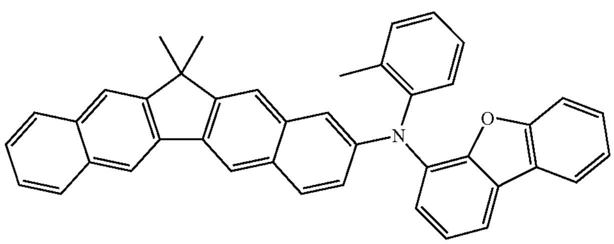
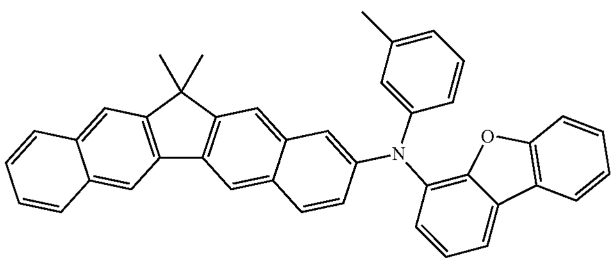
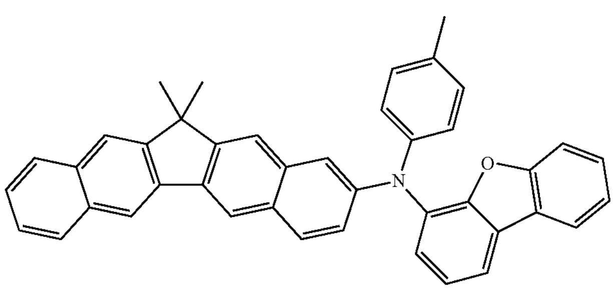
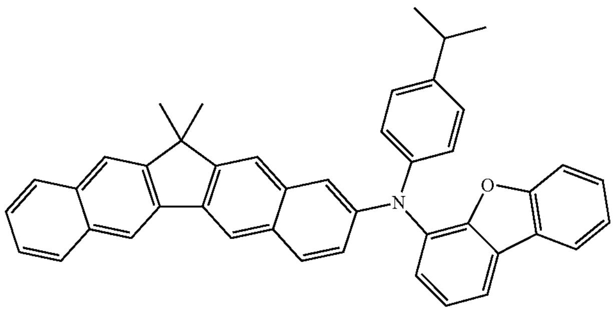

-continued
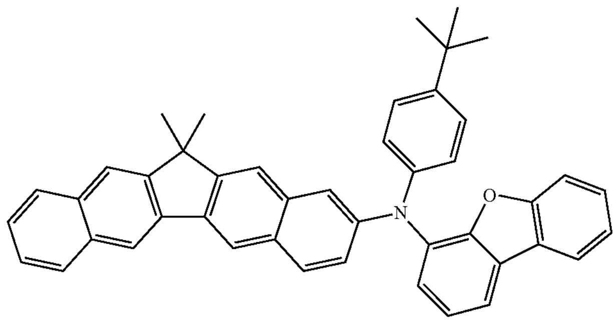
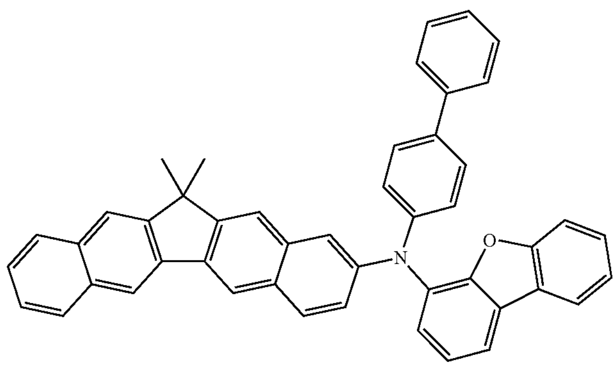
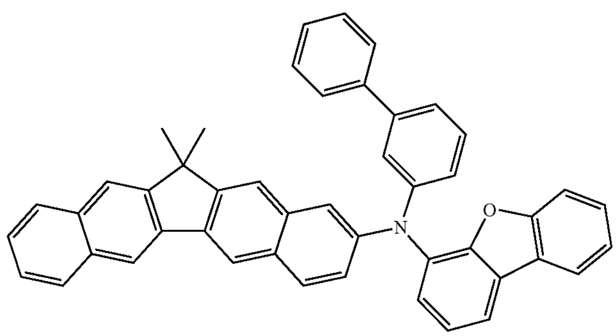
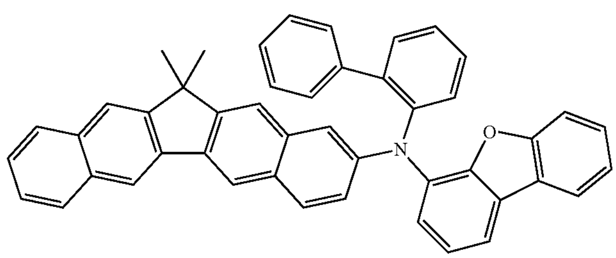
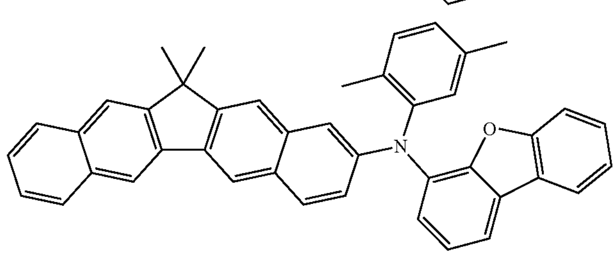

-continued
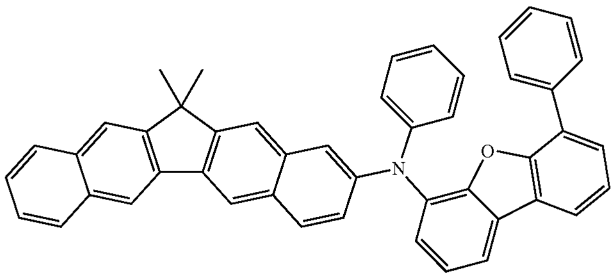
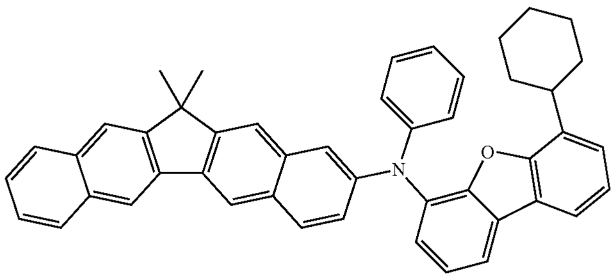
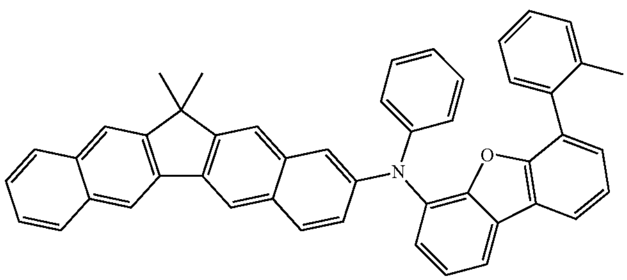
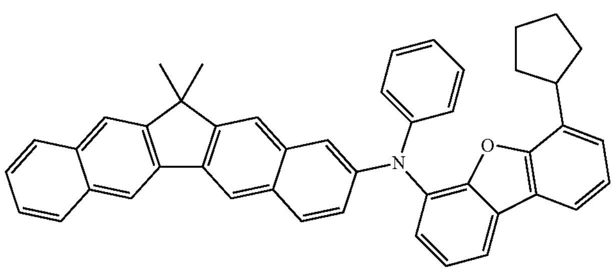
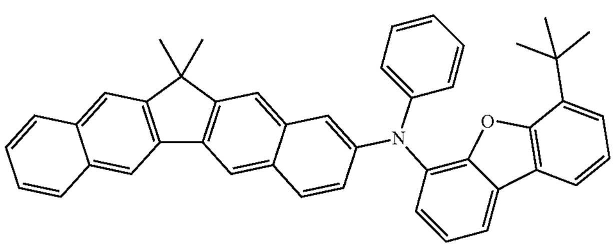
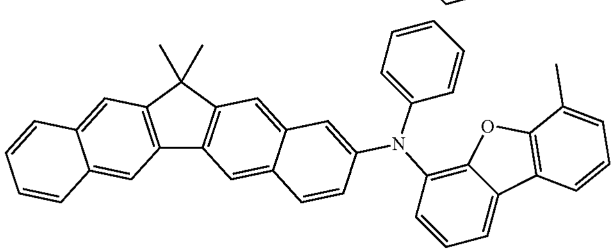

-continued
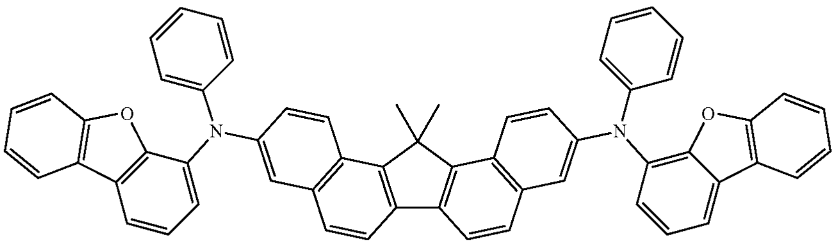
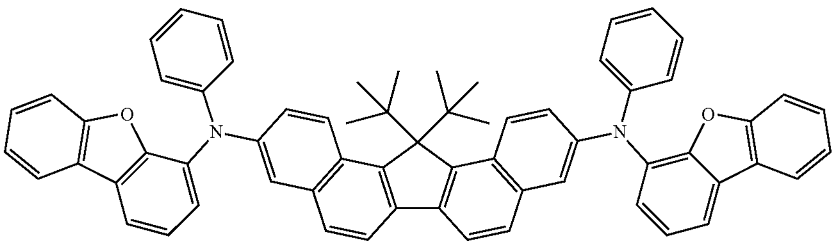
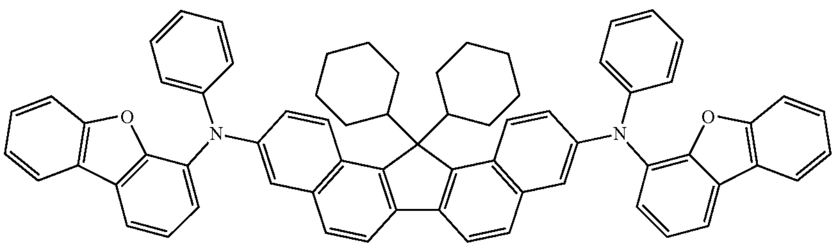
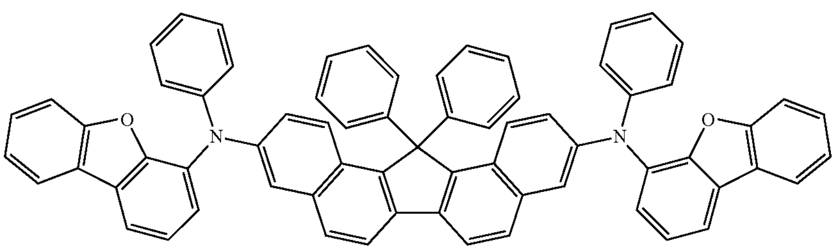
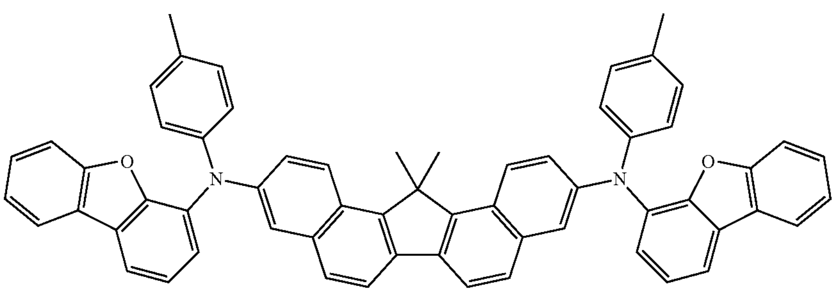
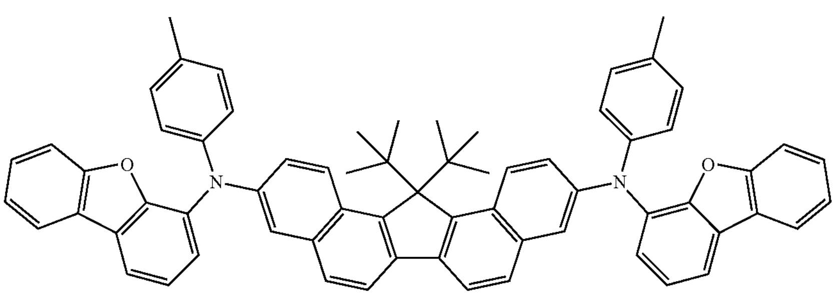

-continued
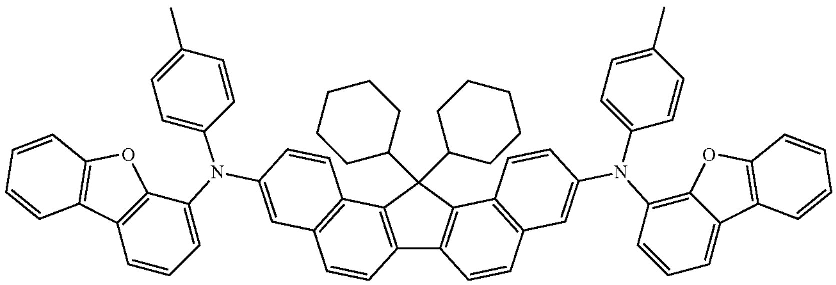
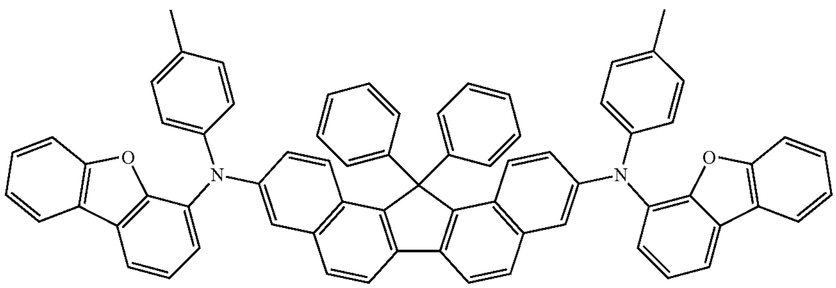
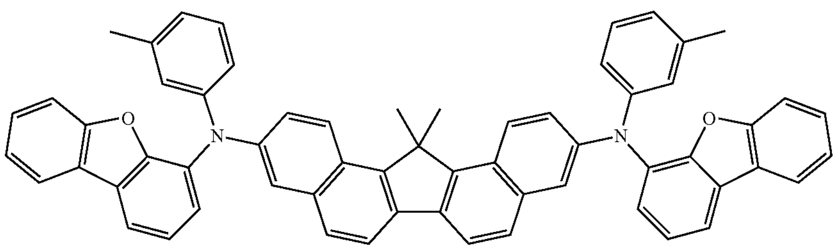
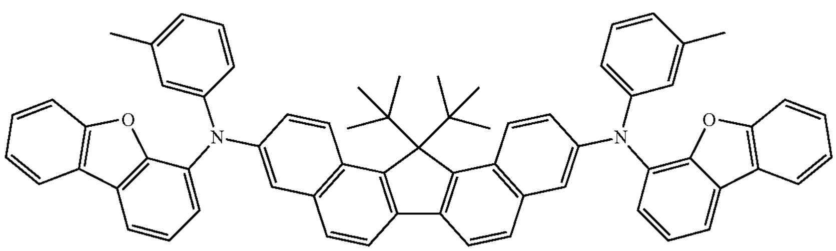
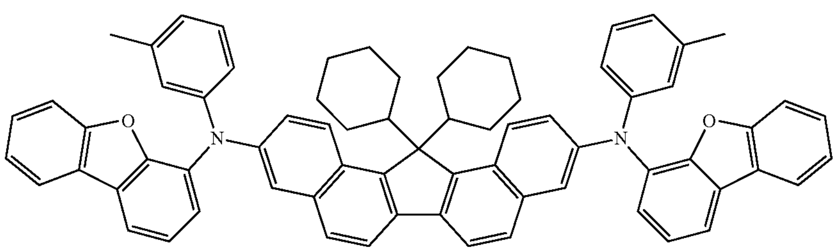
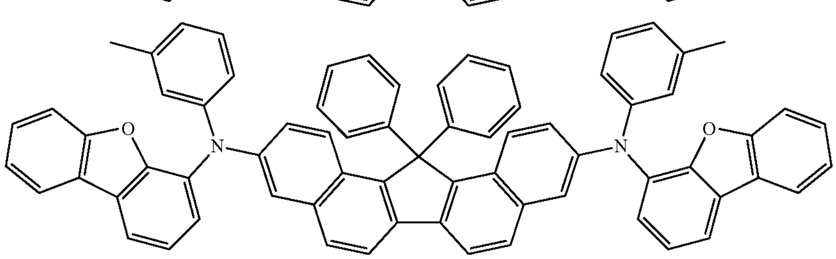

-continued
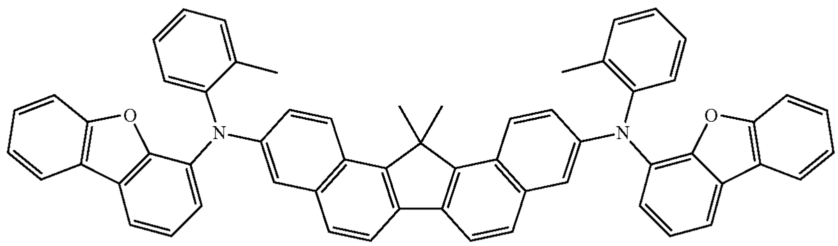
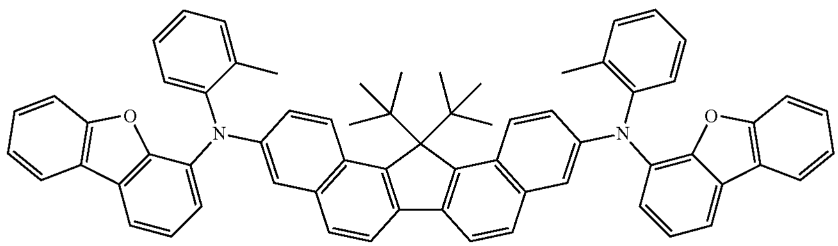
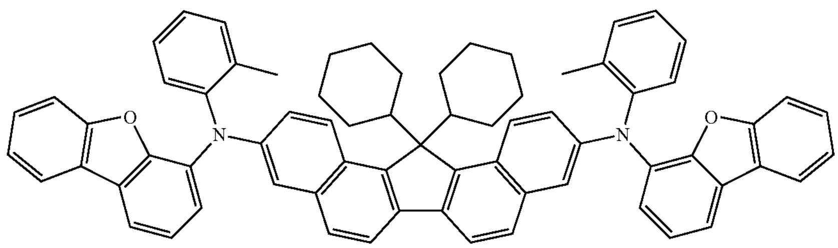
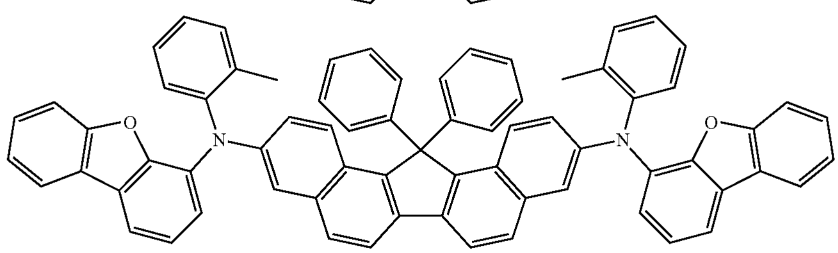
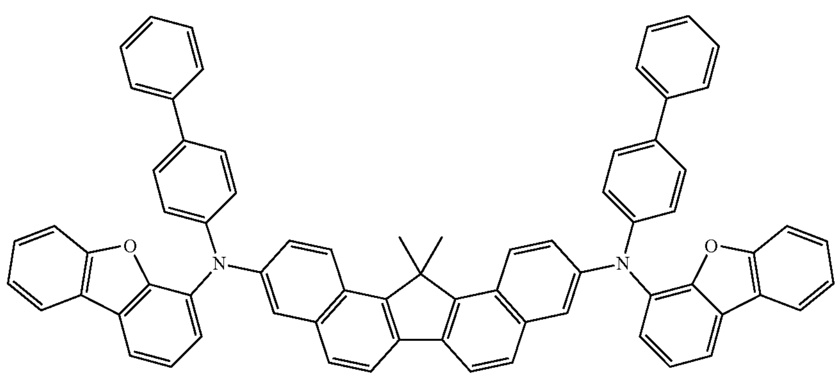
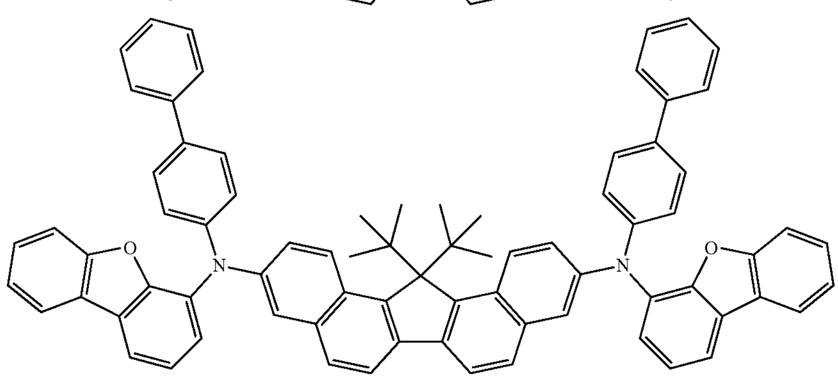

-continued
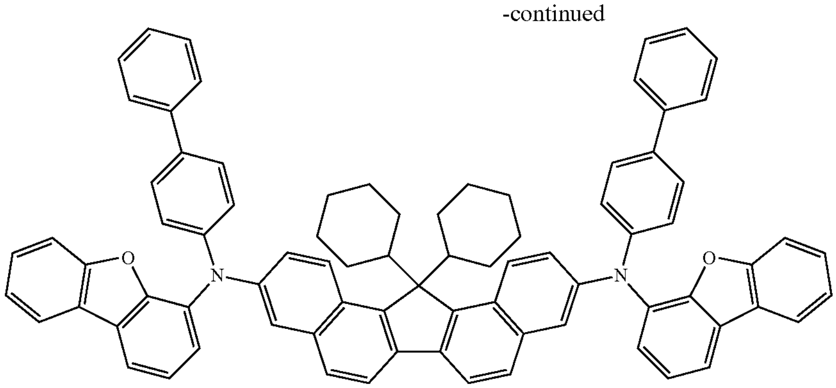
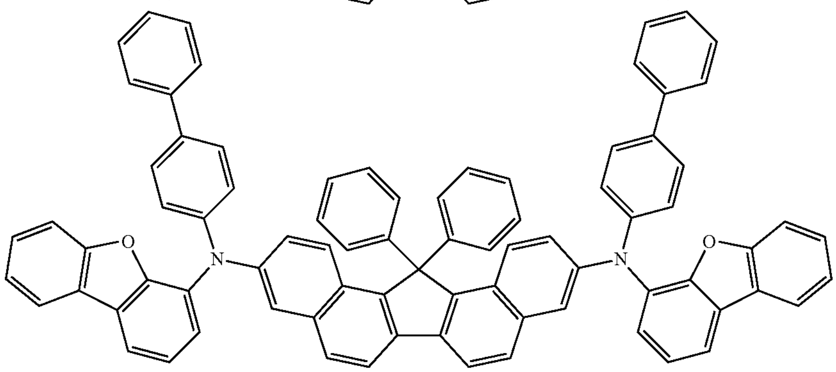
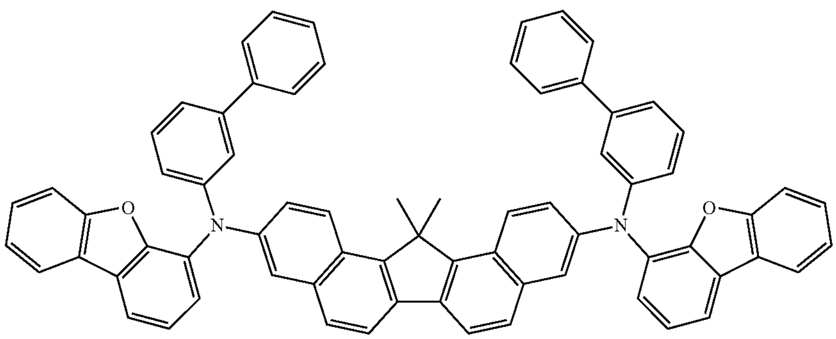
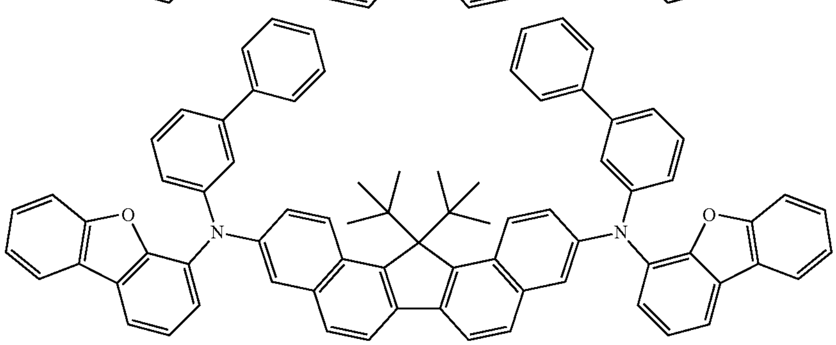
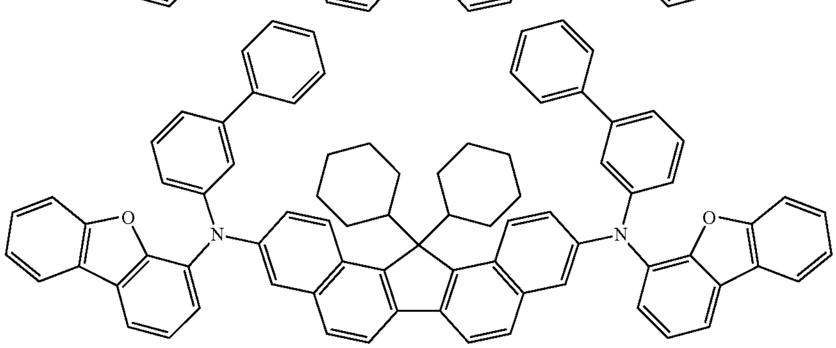

-continued
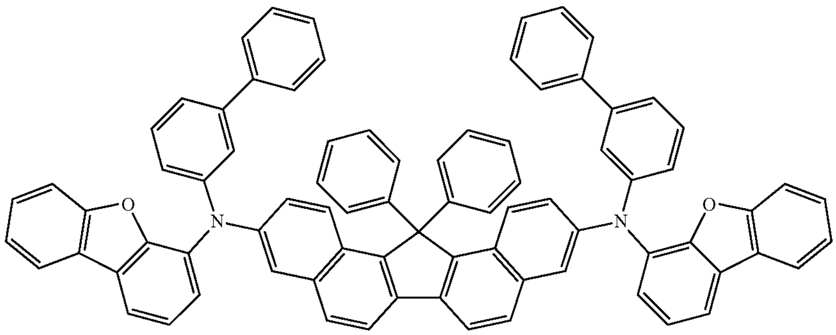
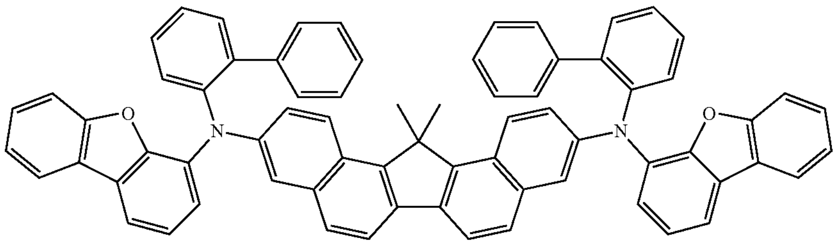
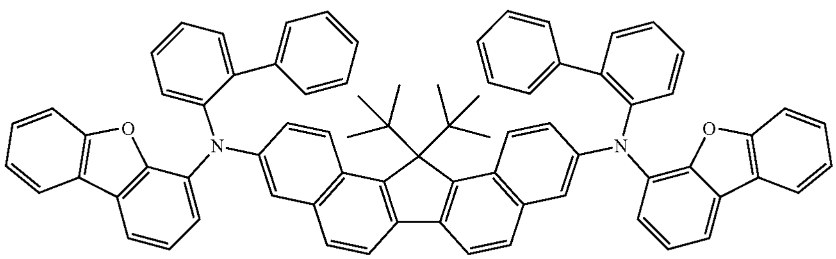
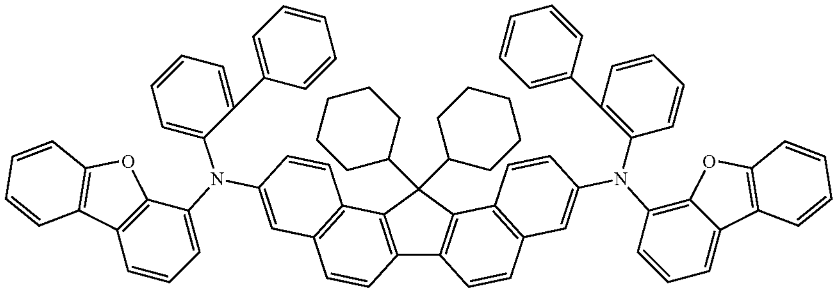
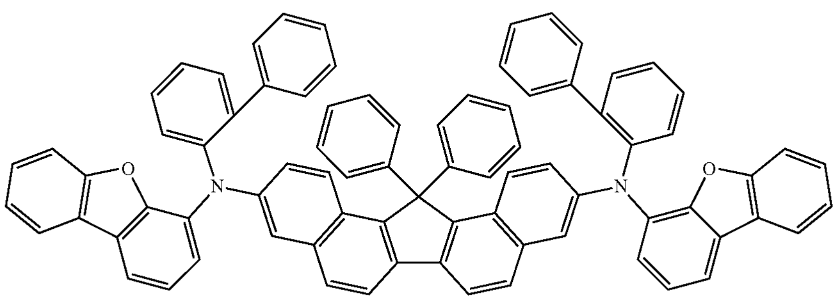
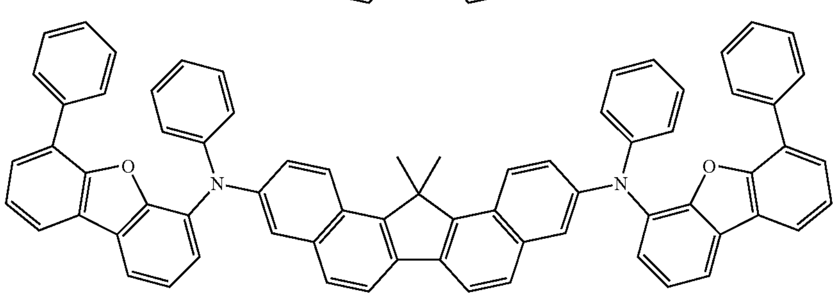

-continued
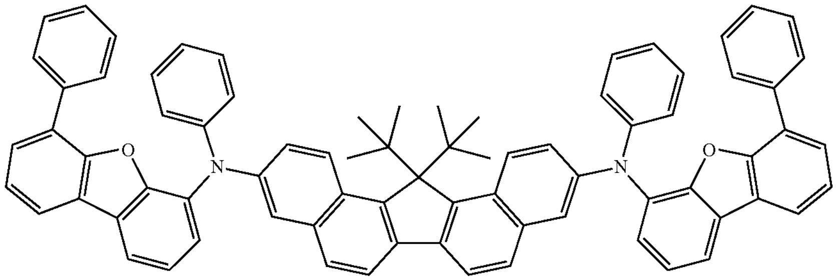
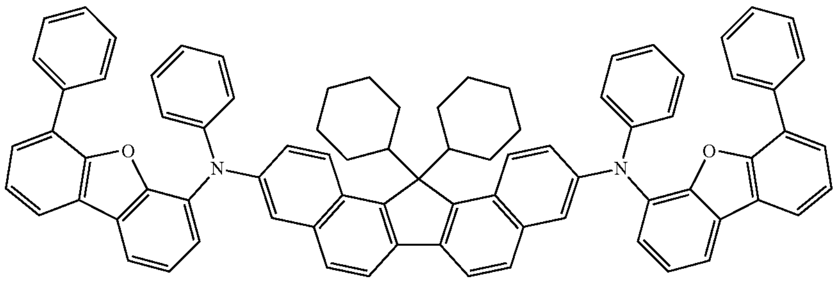
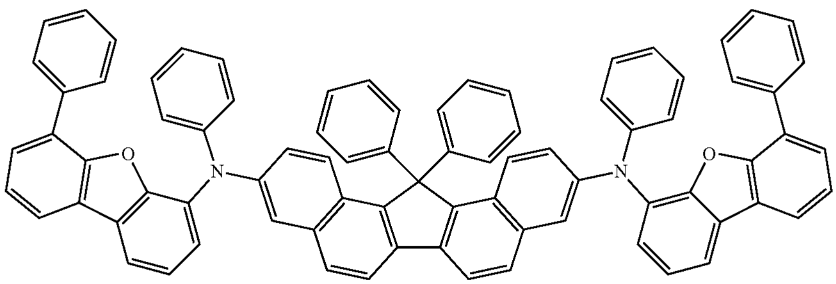
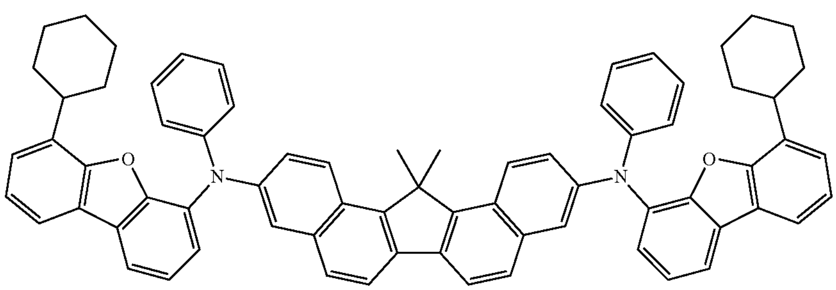
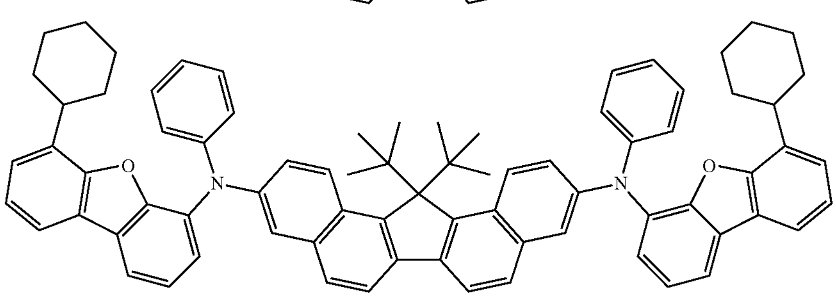
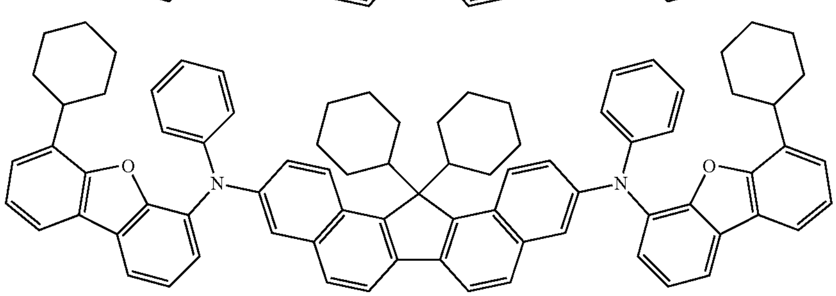

-continued
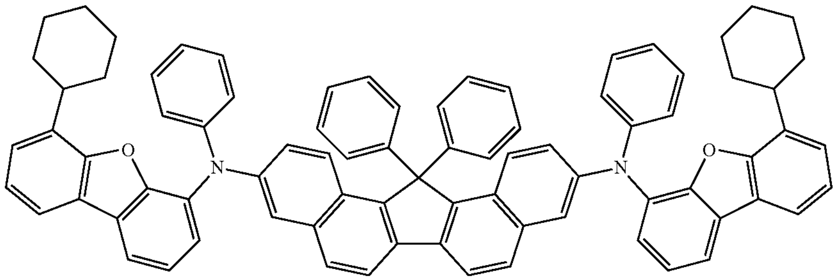
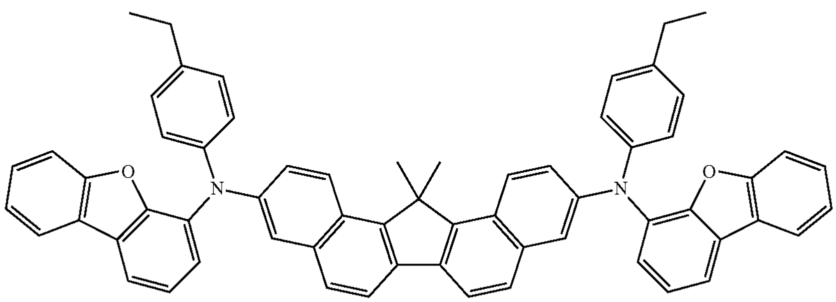
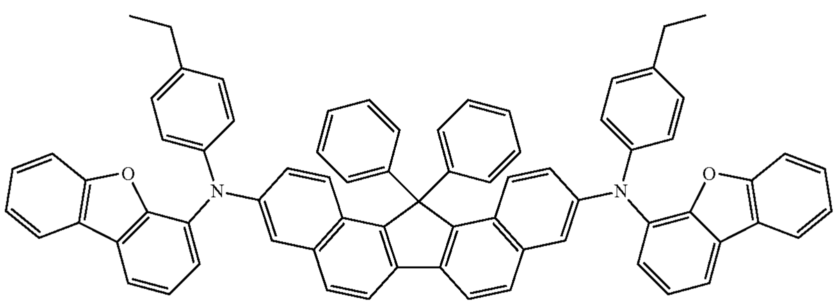
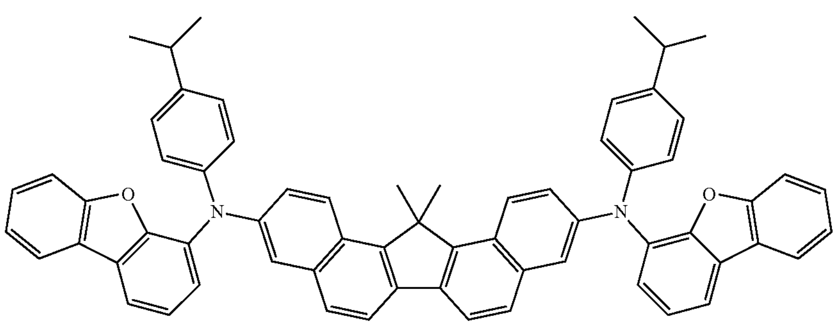
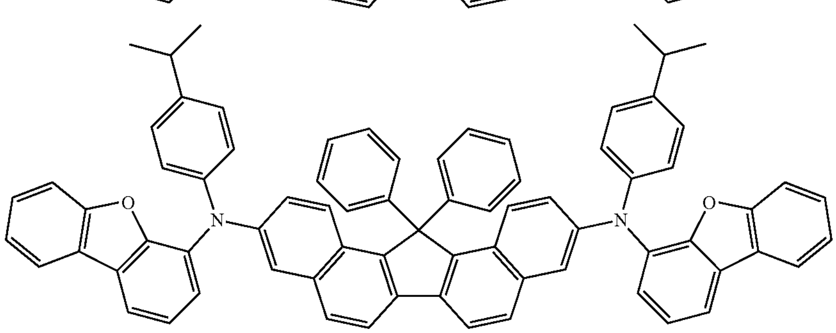

-continued
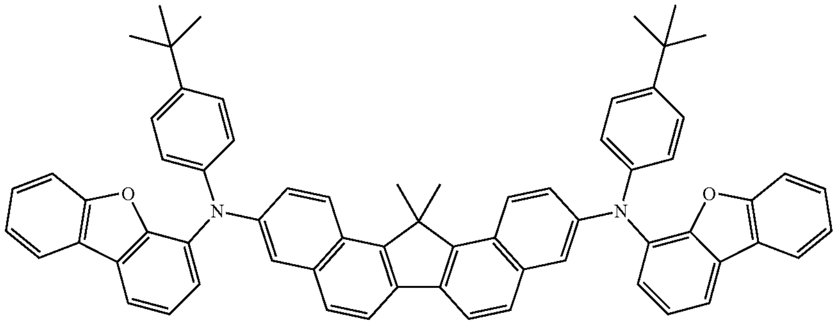
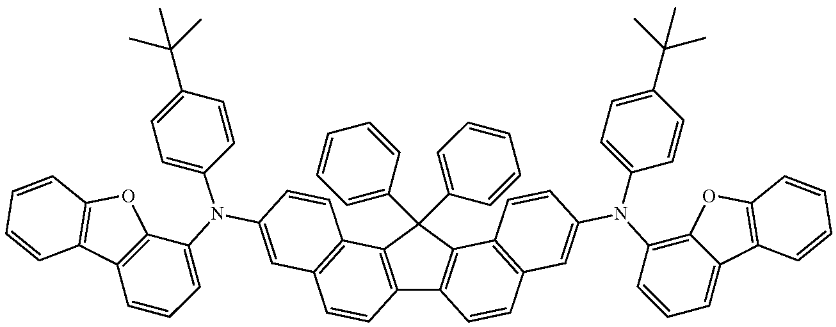
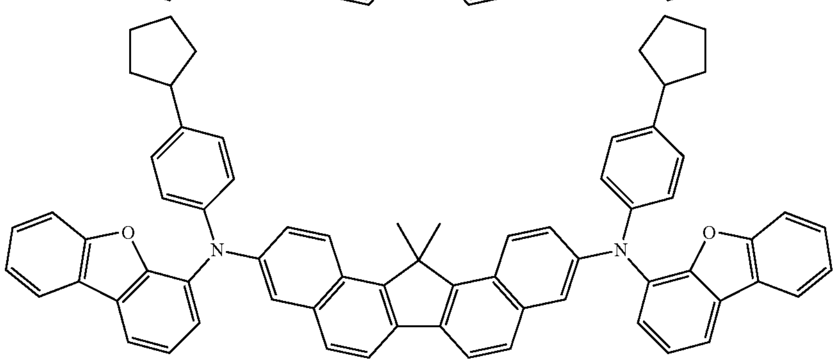
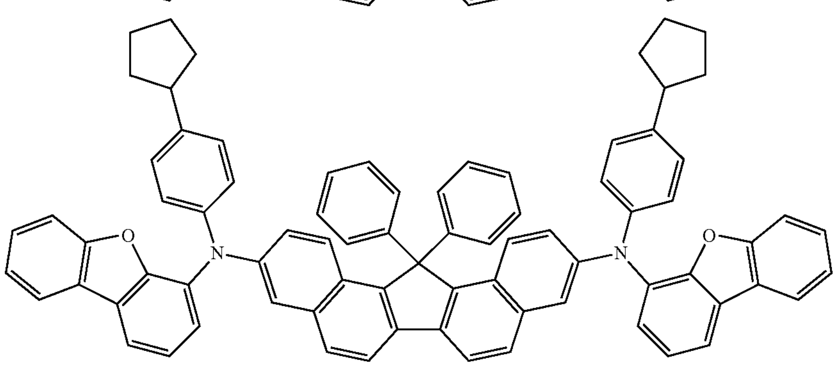
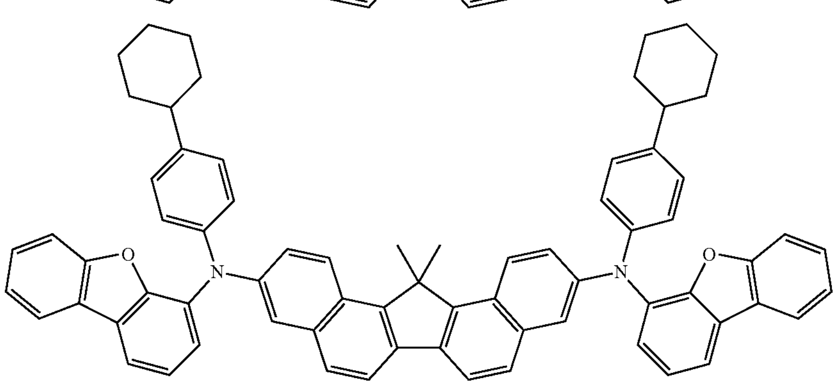

-continued
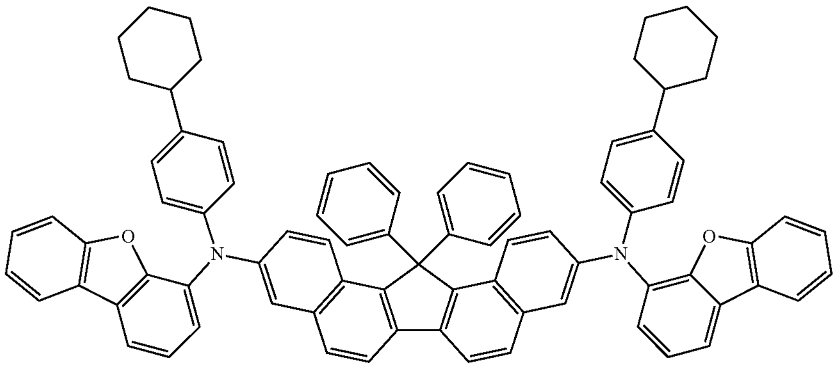
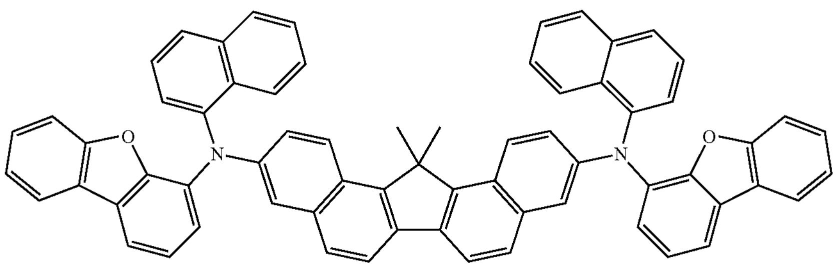
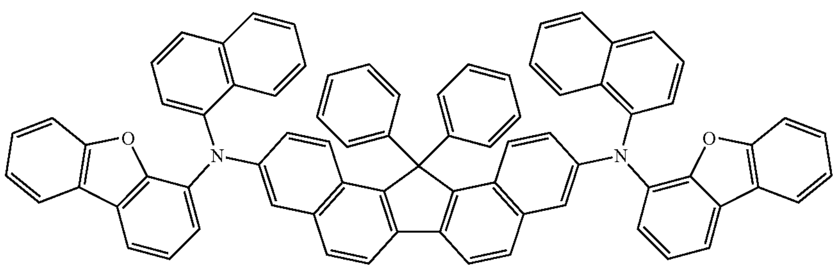
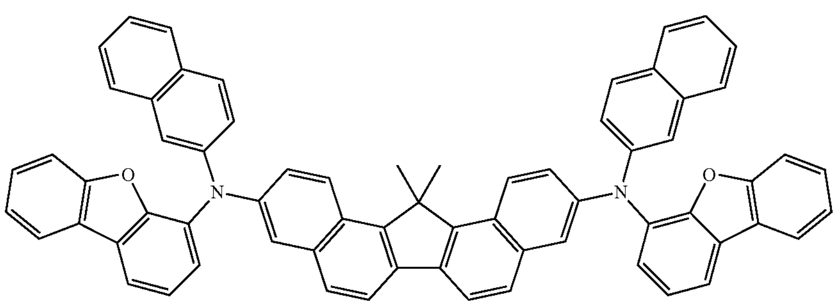
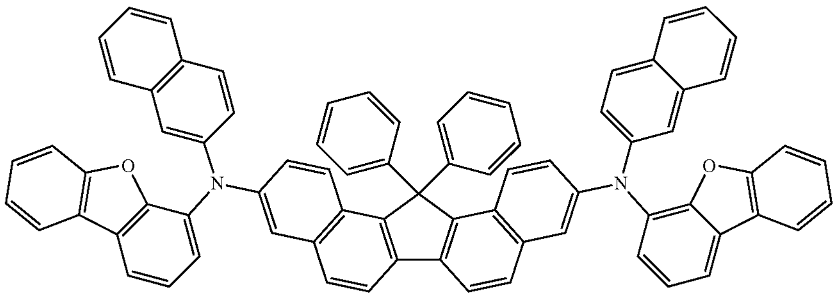

-continued
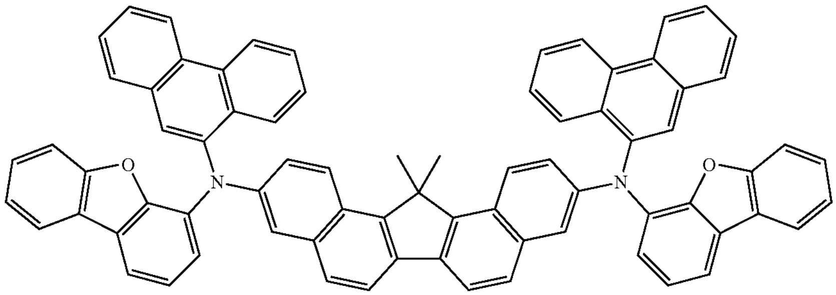
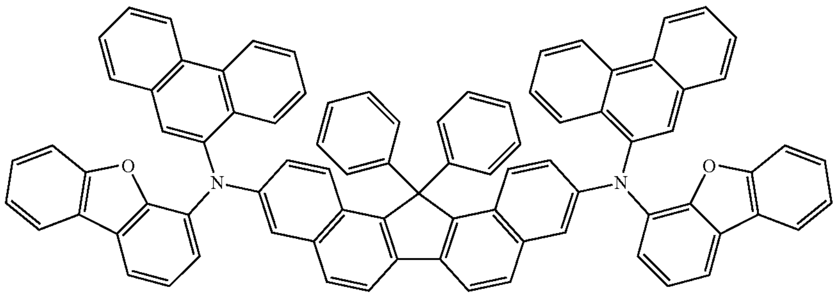
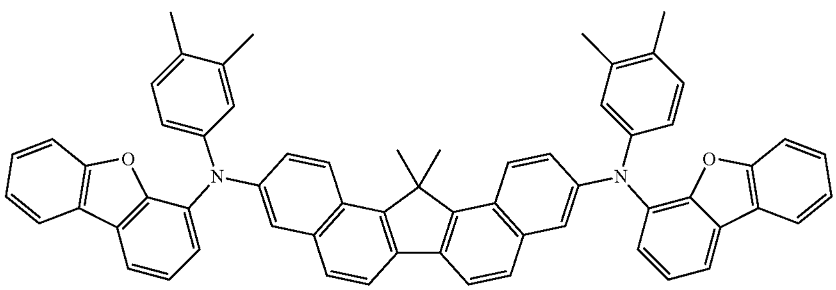
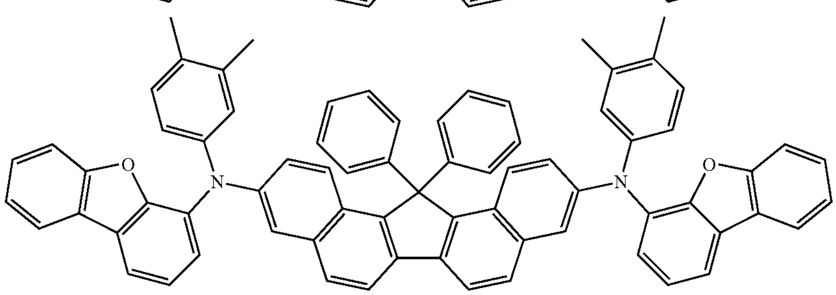
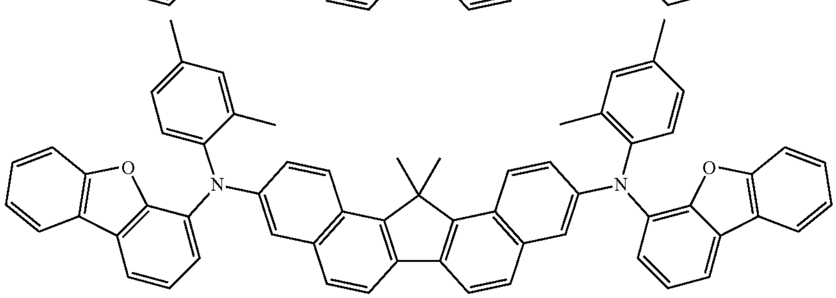
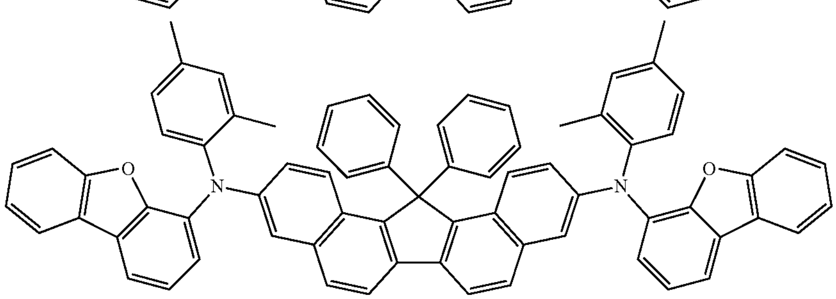

-continued
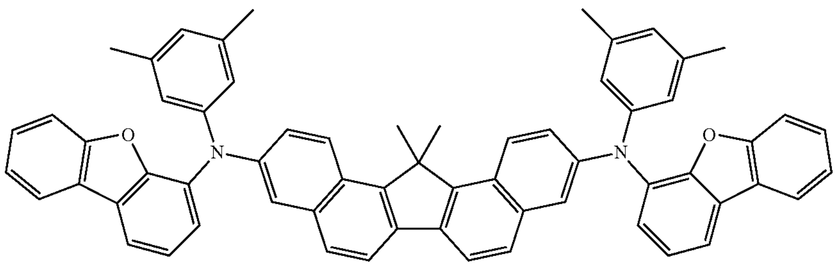
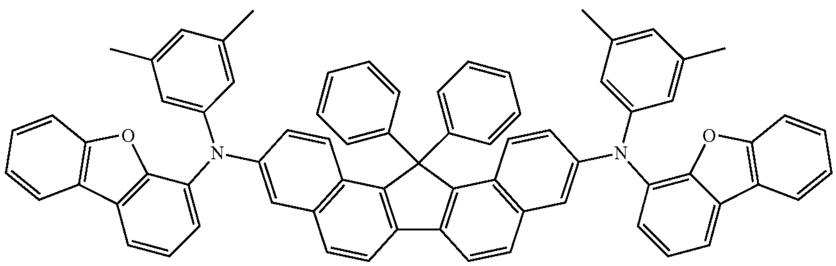
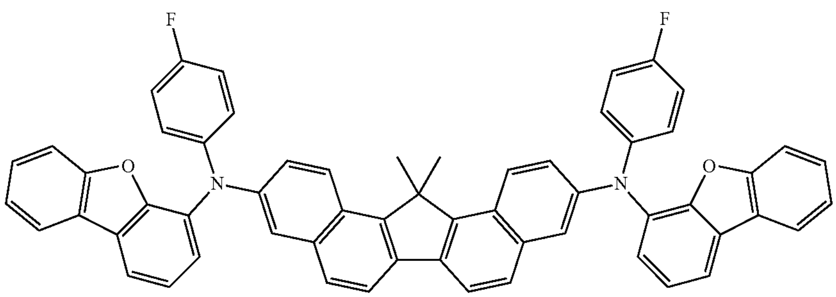
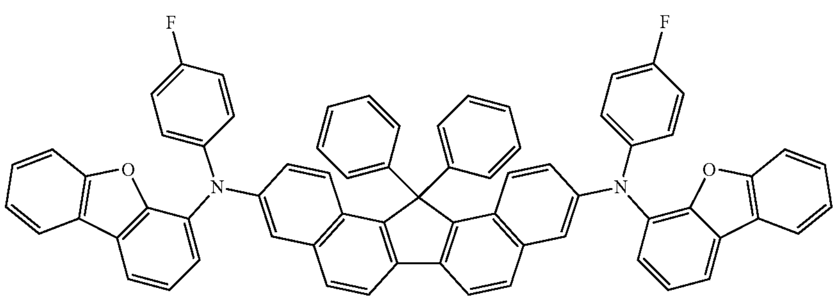
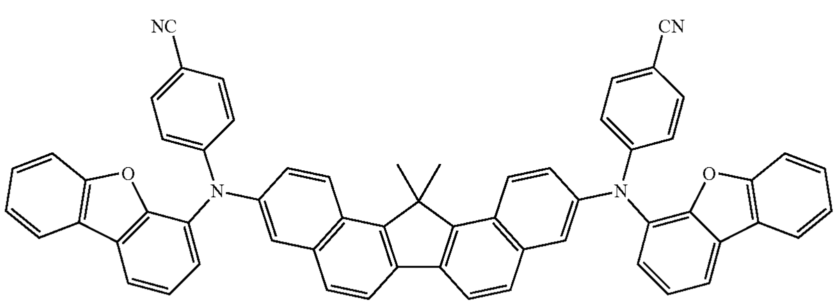
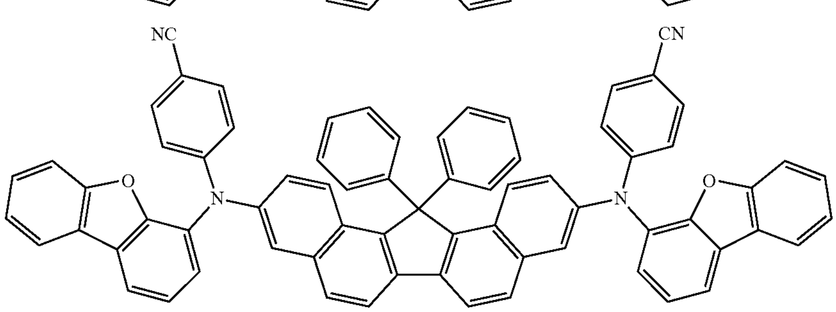

-continued
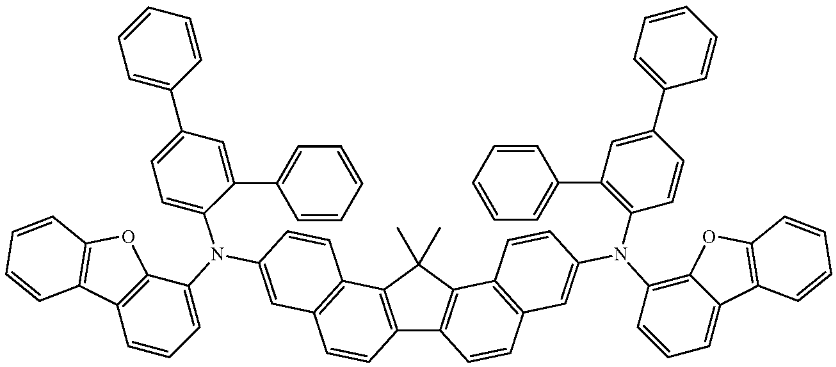
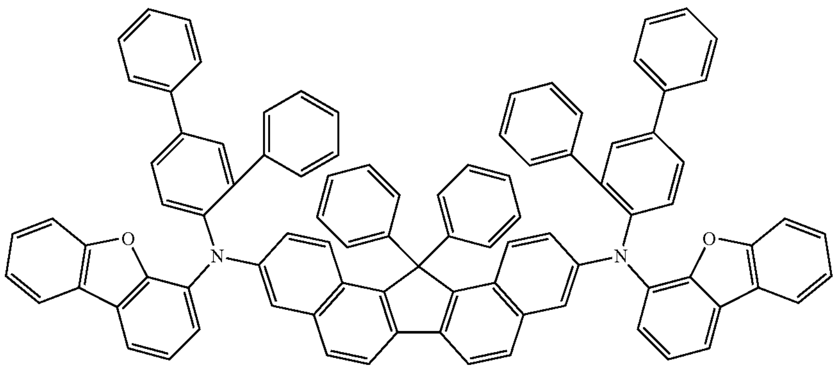
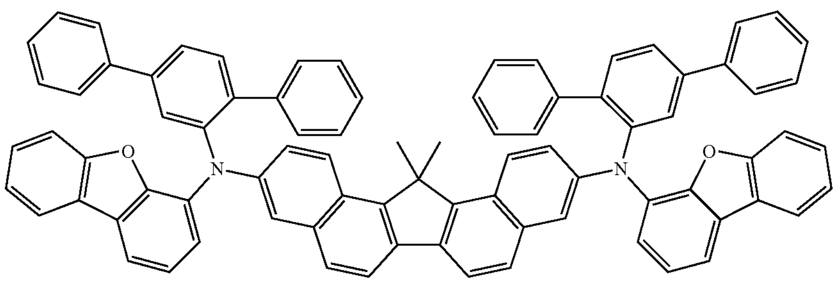
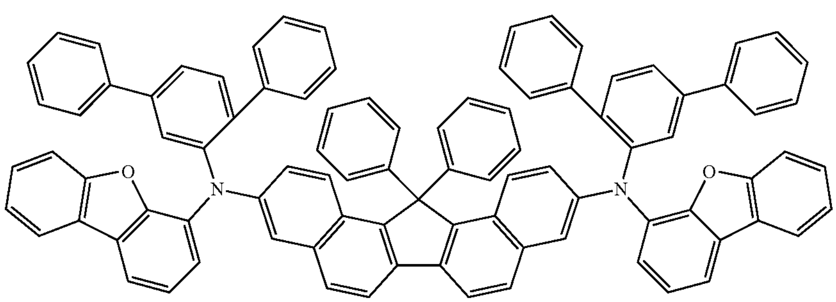
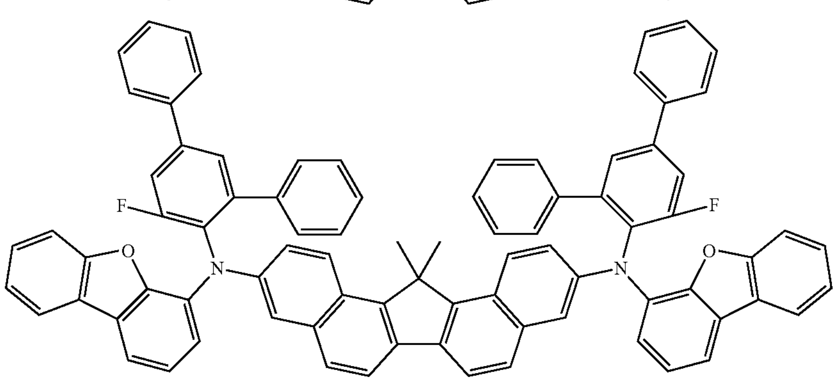

-continued
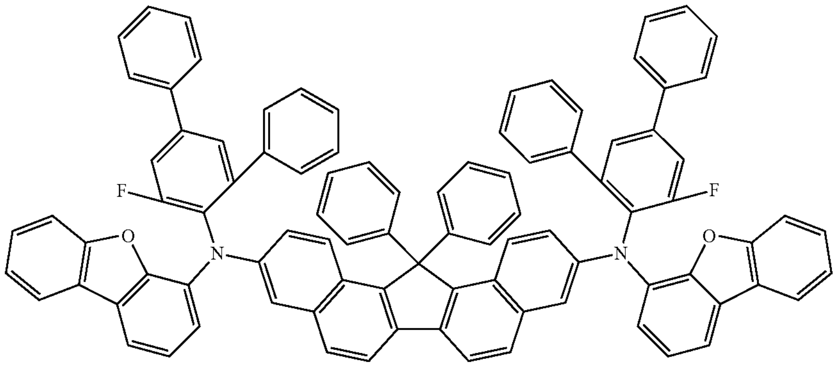
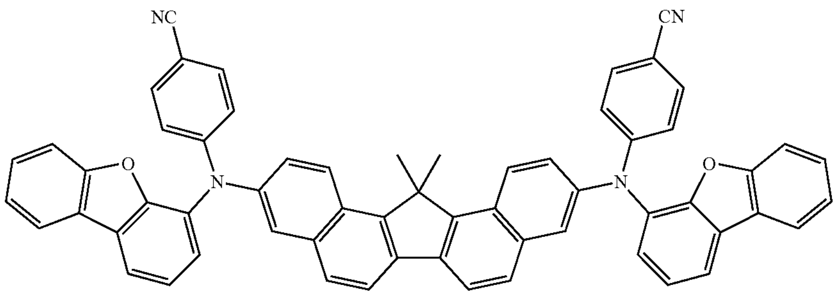
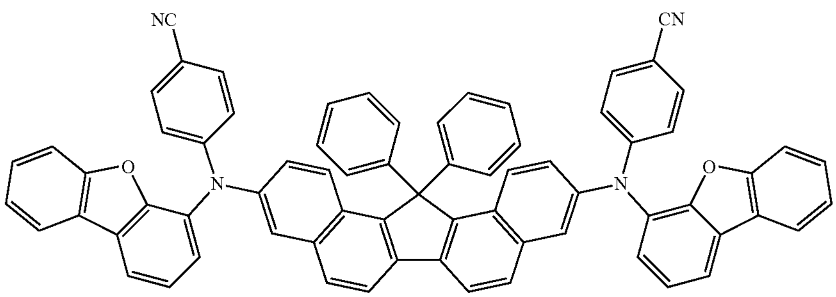
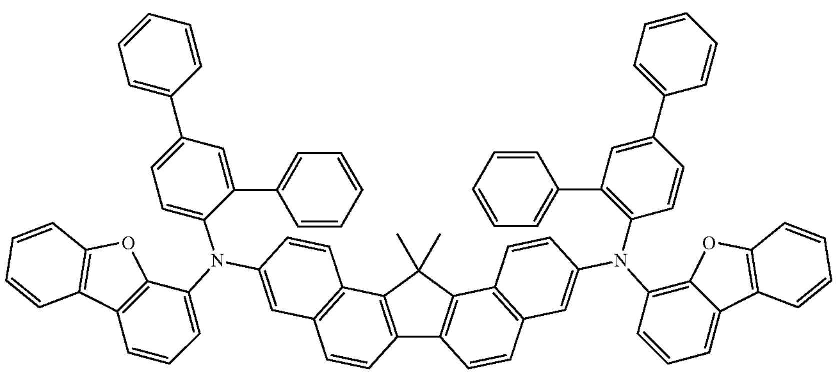
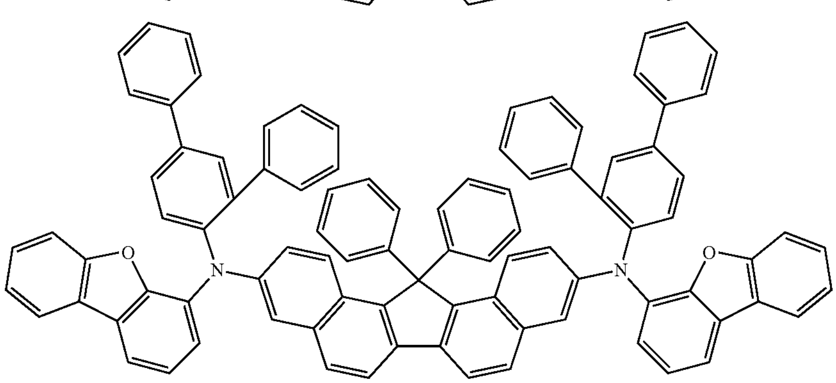

-continued
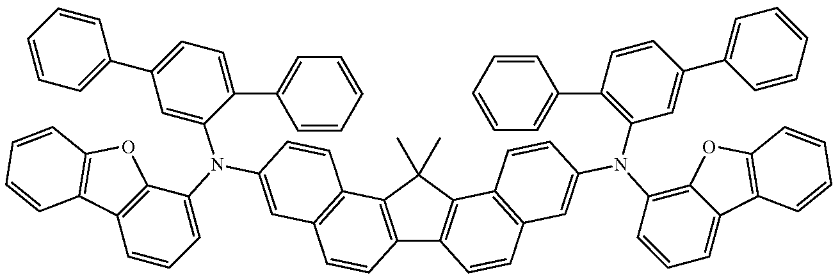
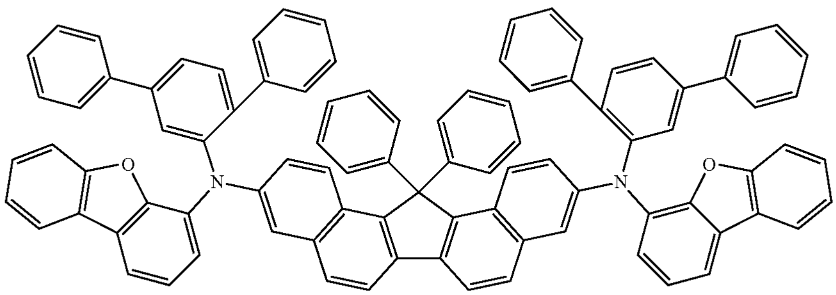
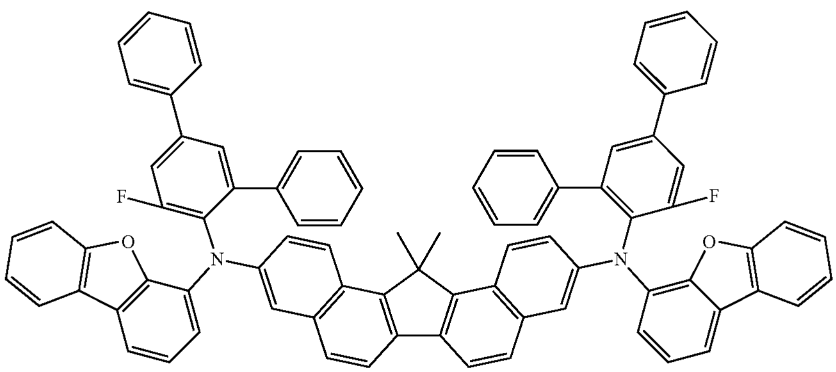
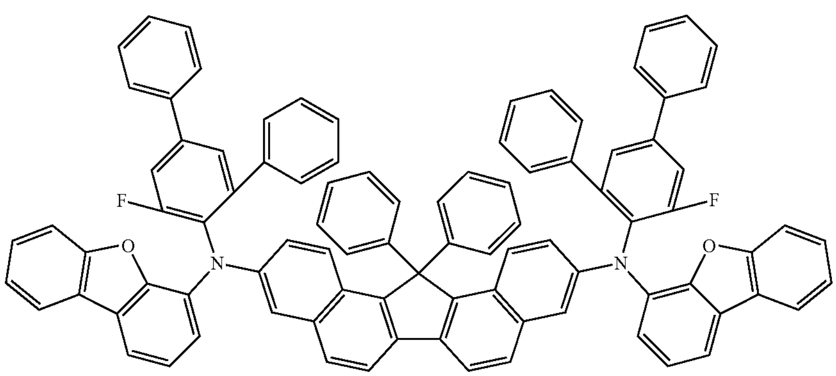
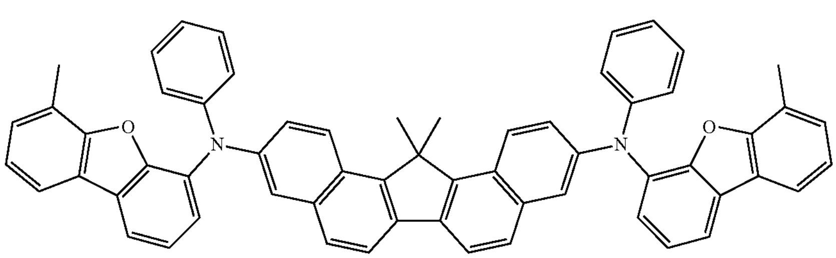

-continued
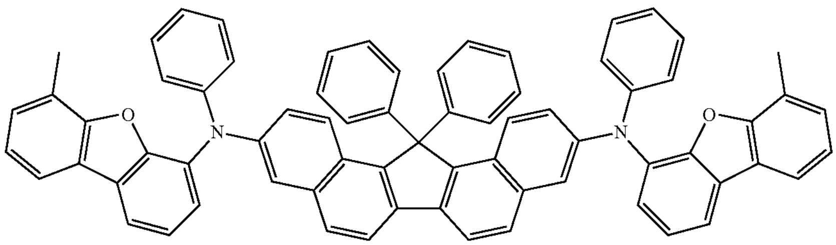
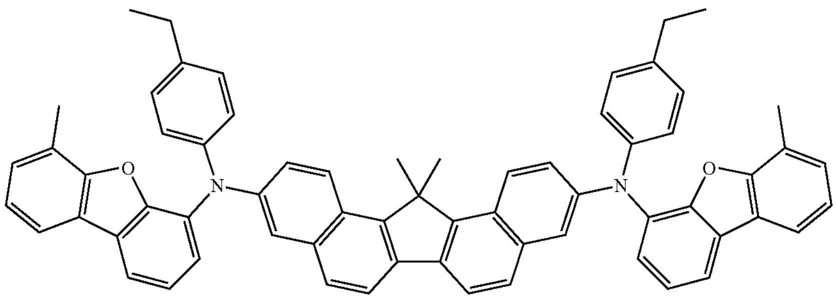
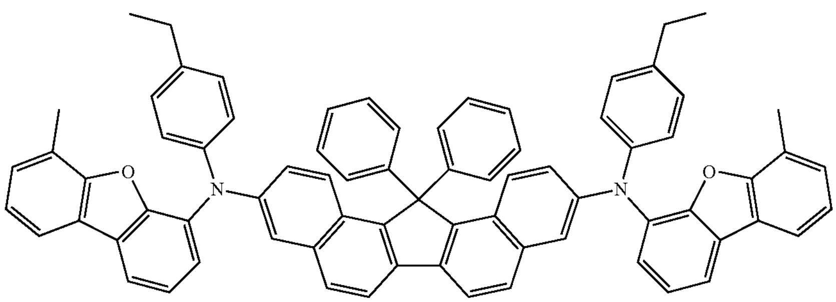
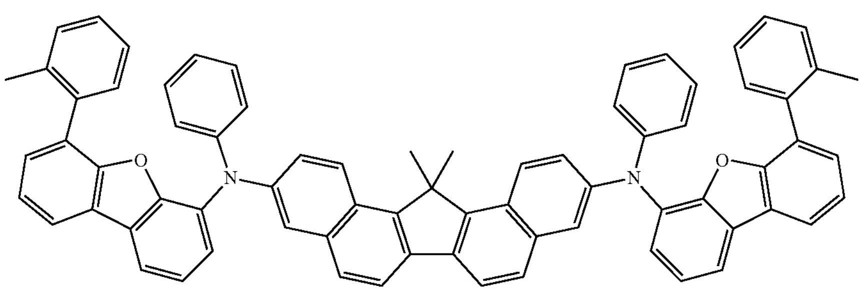
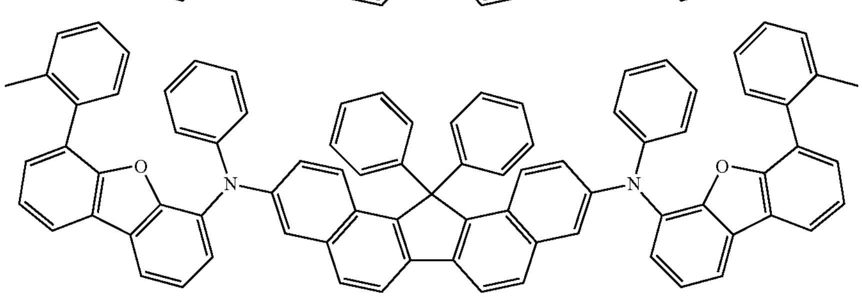
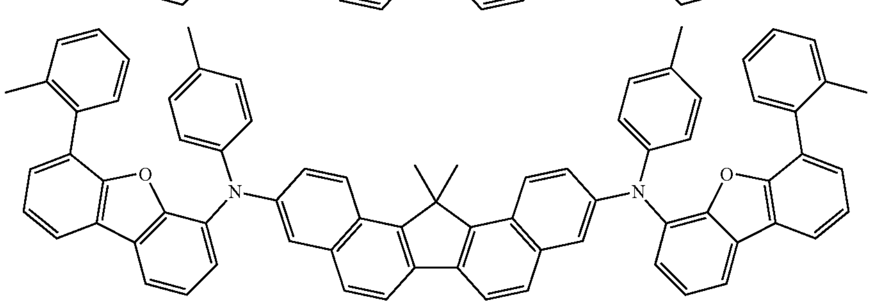

-continued
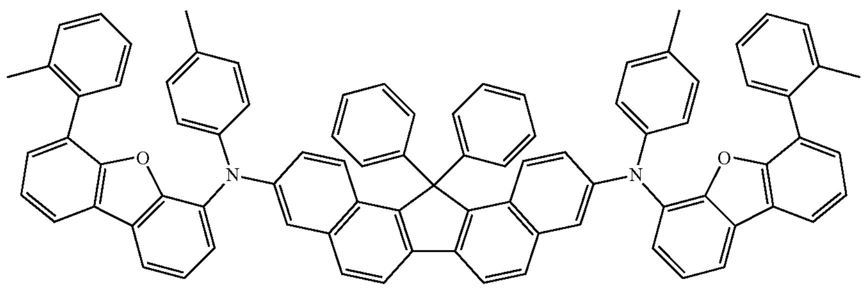
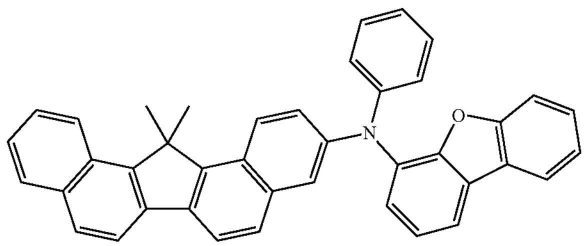
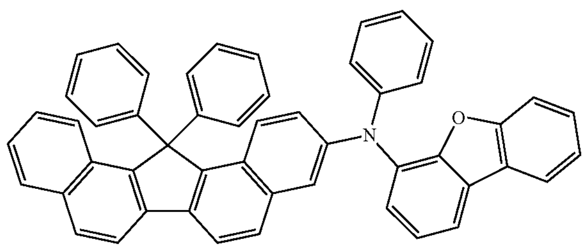
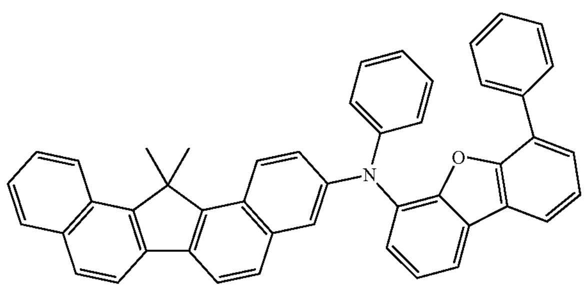
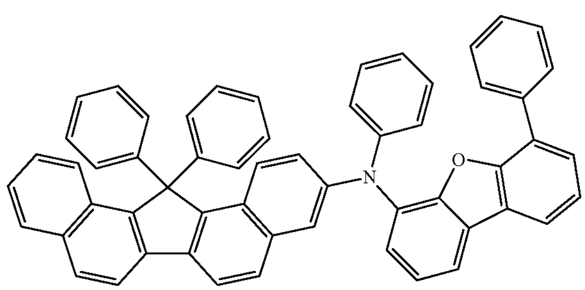
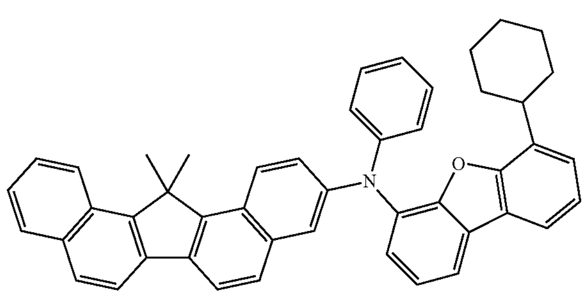

-continued
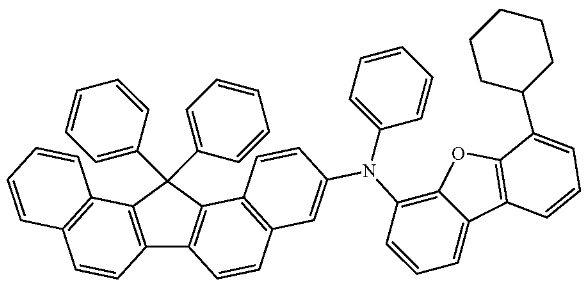
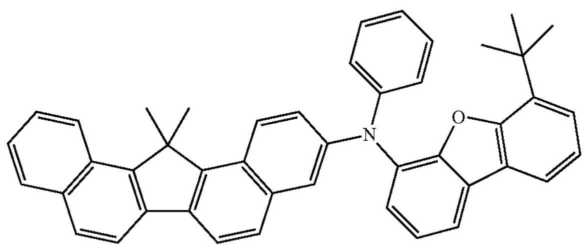
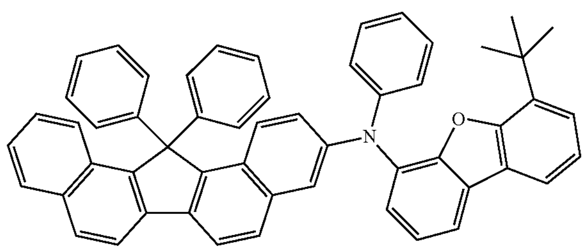
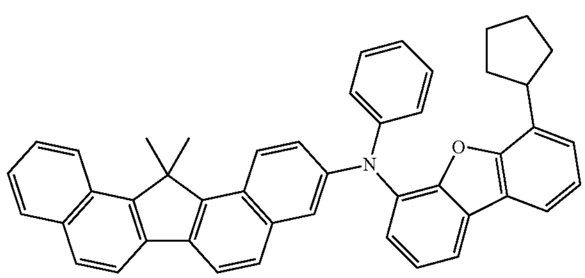
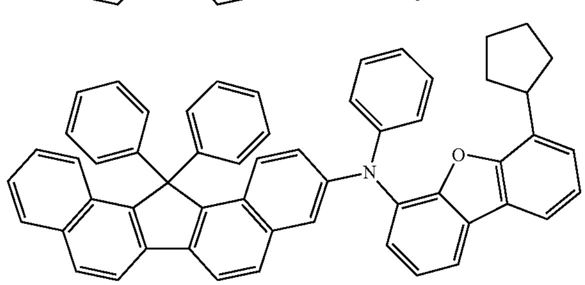
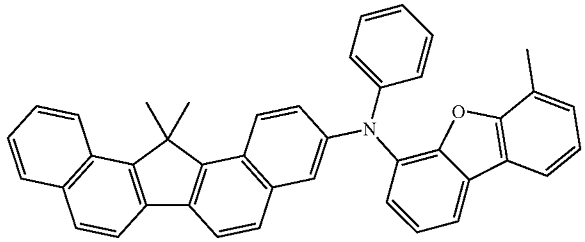

-continued
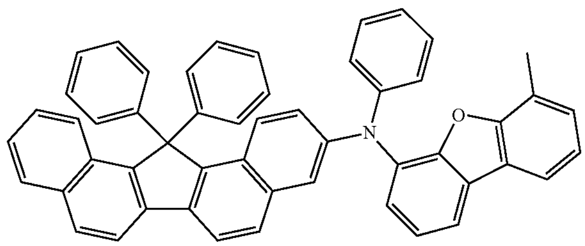
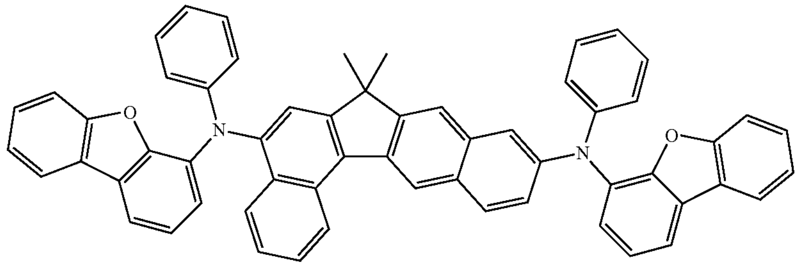
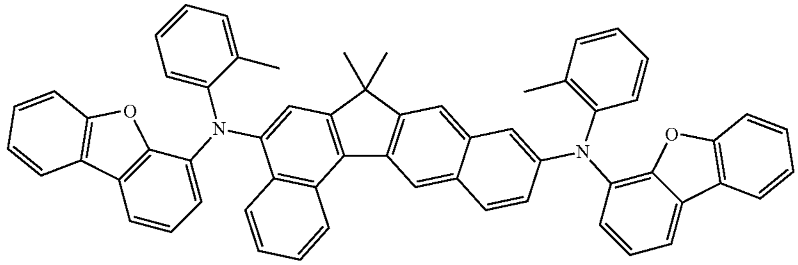
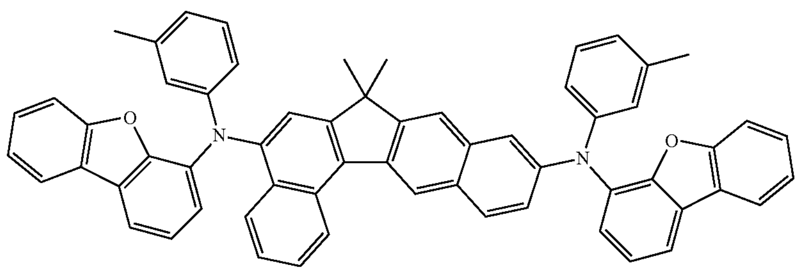
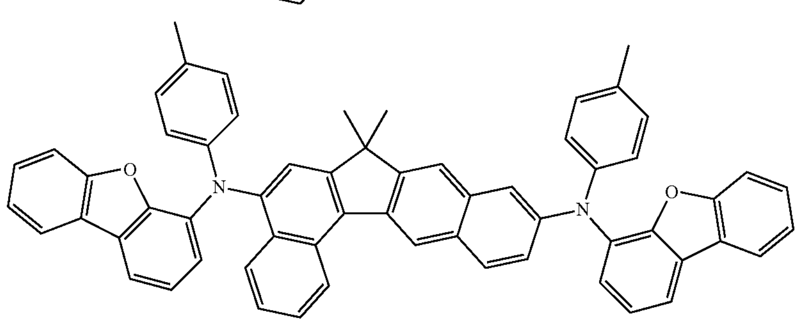
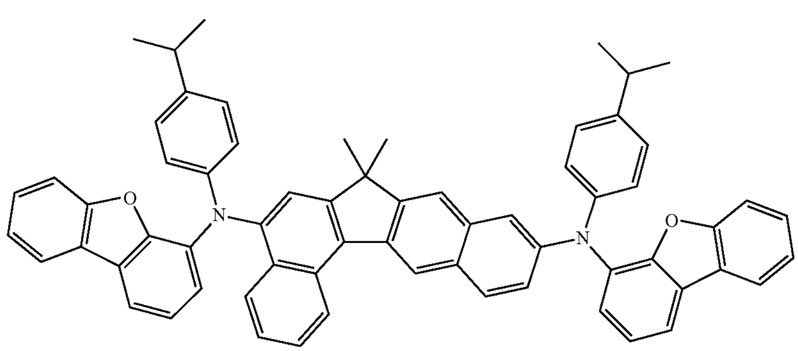

-continued
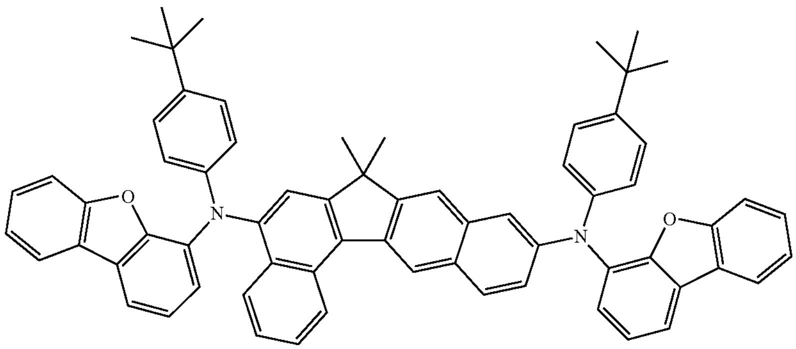
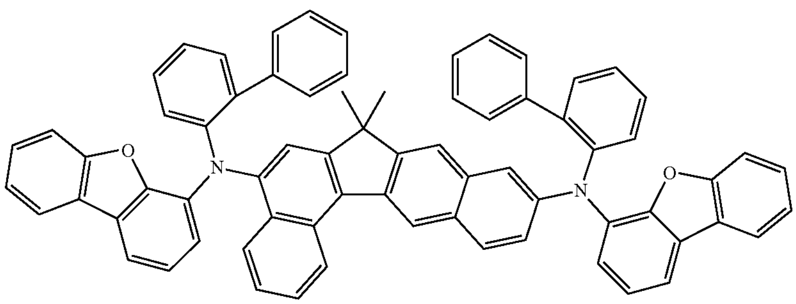
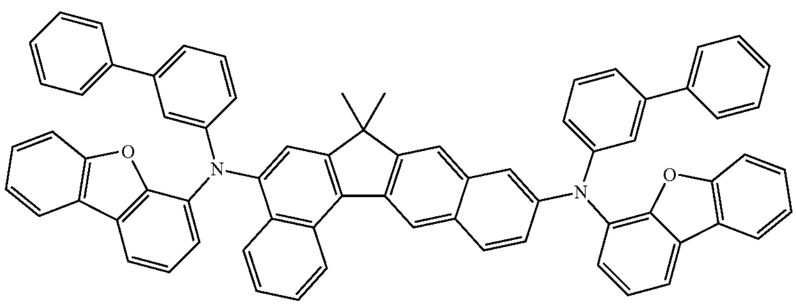
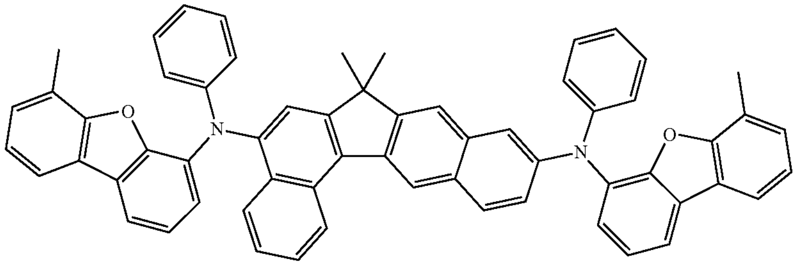
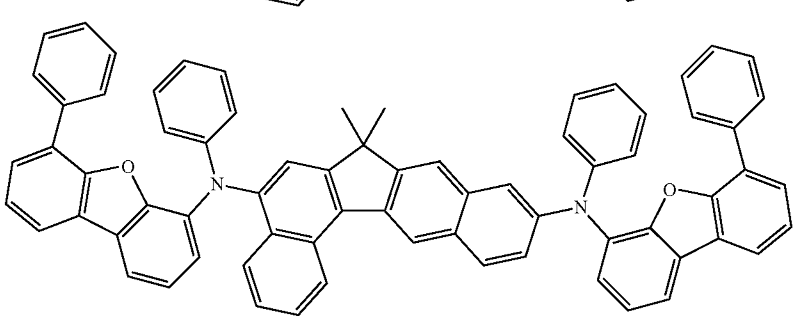

-continued
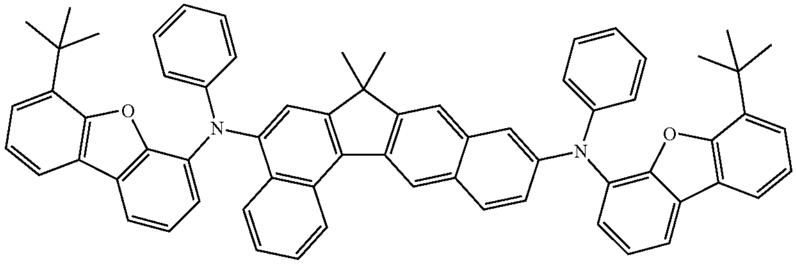
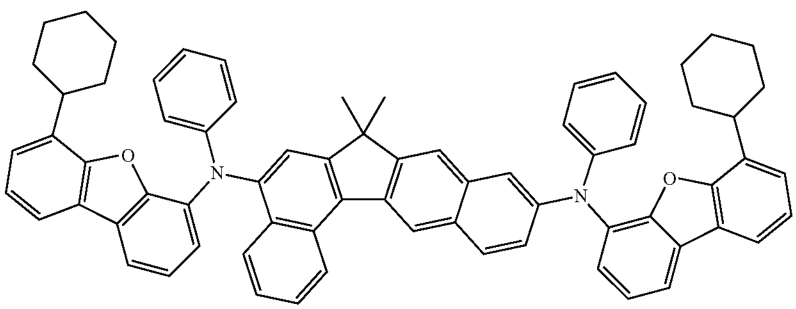
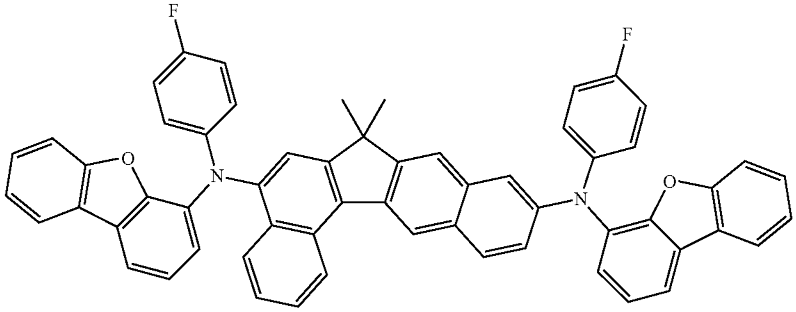
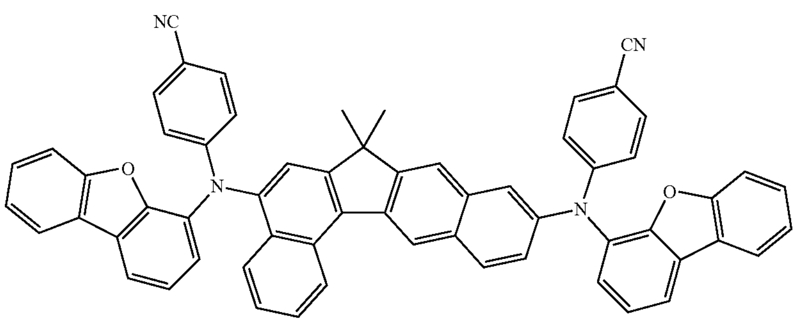
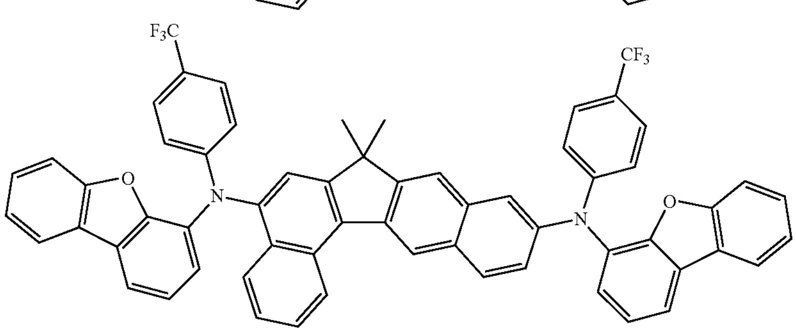

-continued
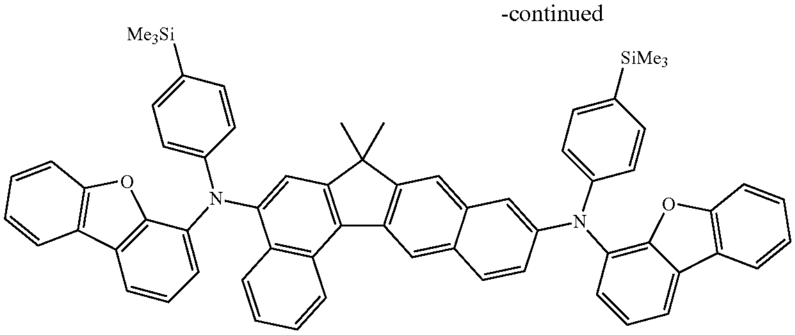
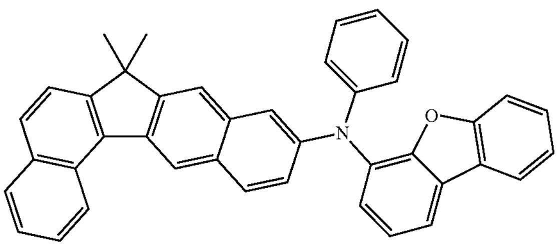
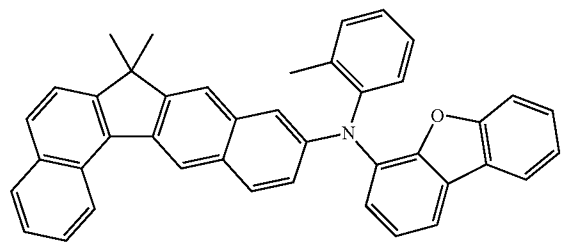
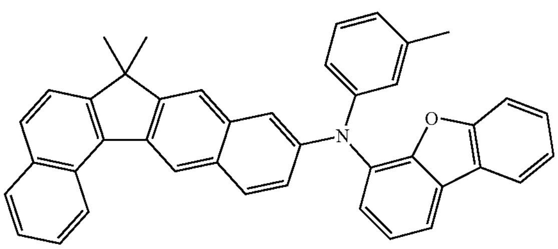
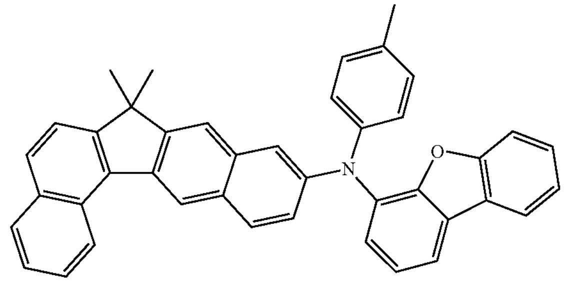
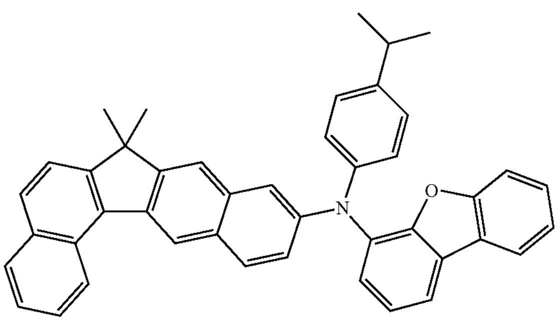
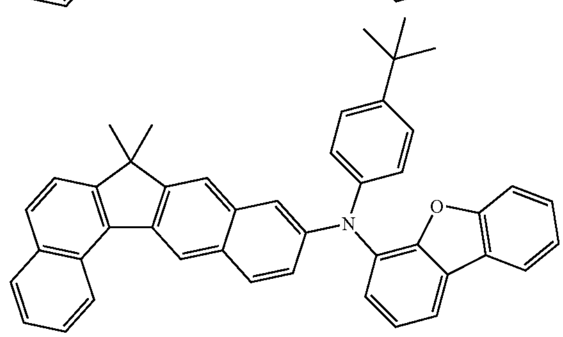
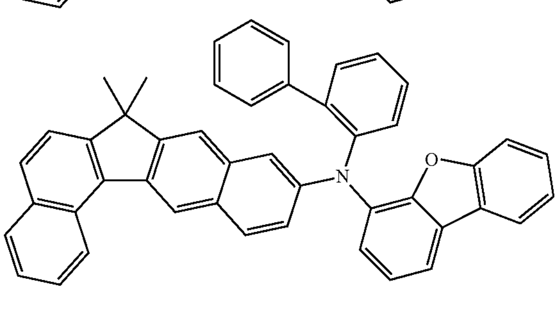
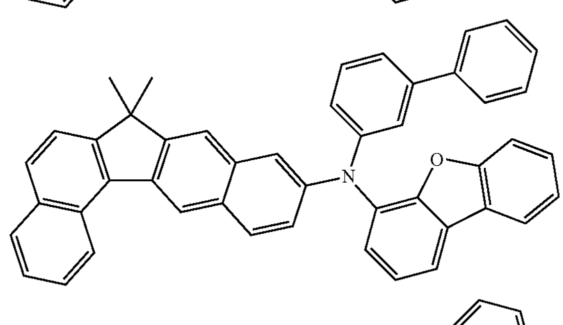
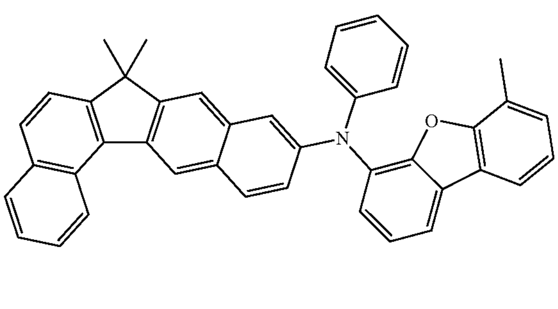
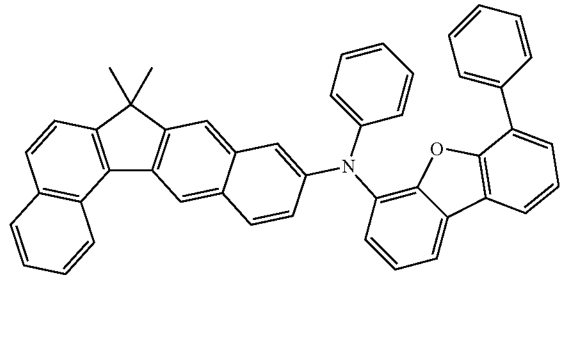

-continued
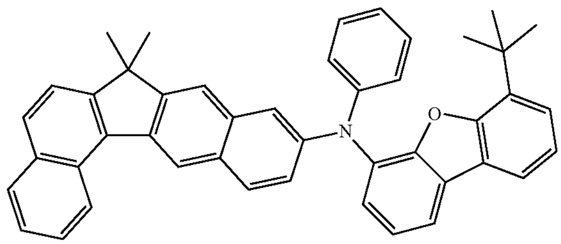
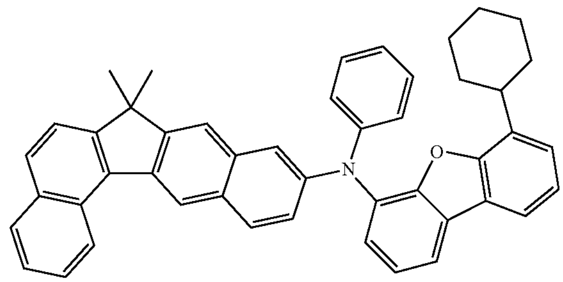
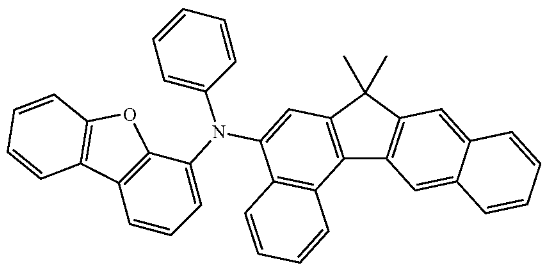
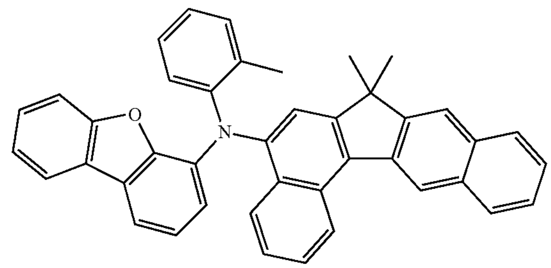
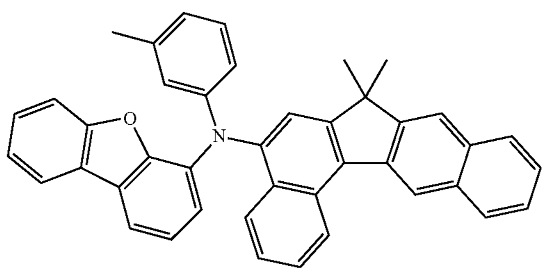
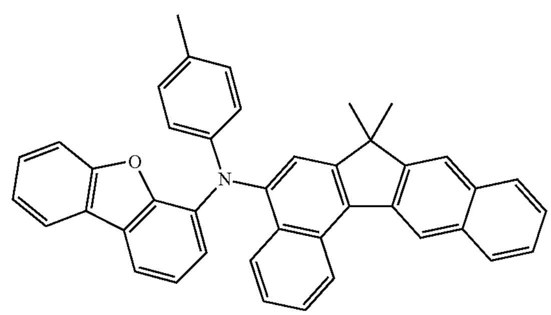
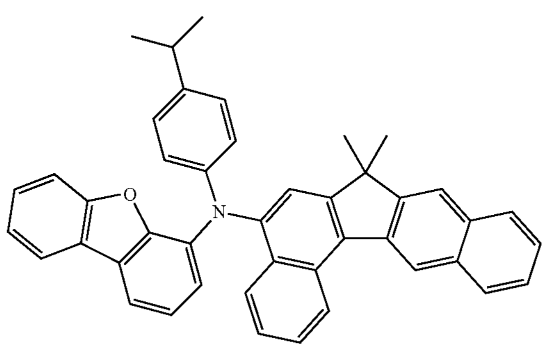
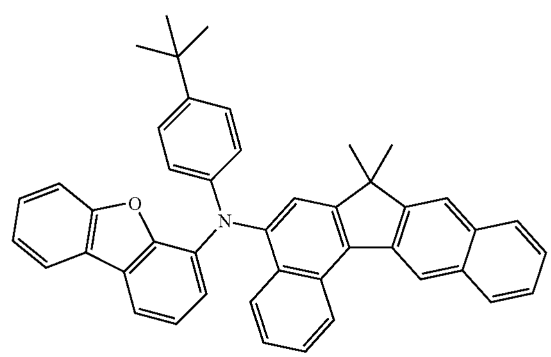
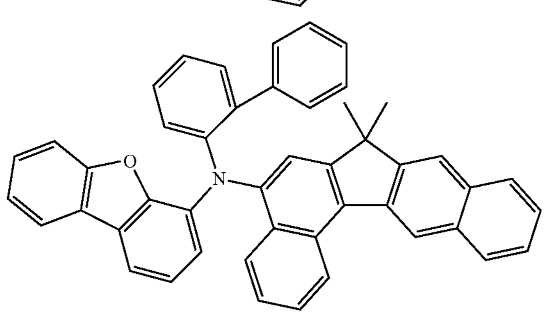
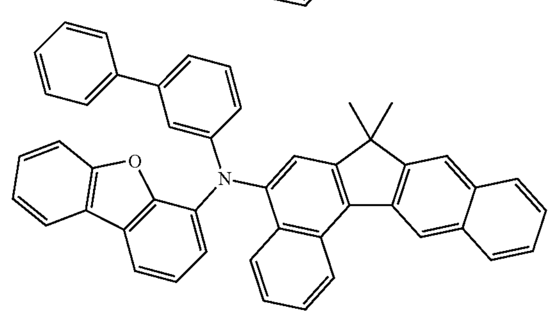

-continued
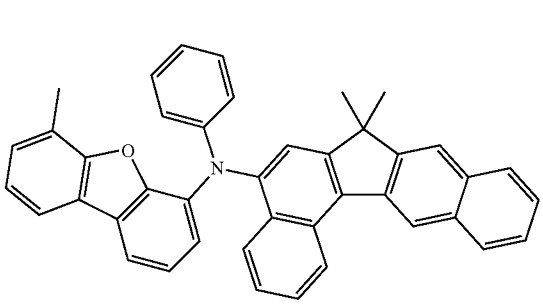
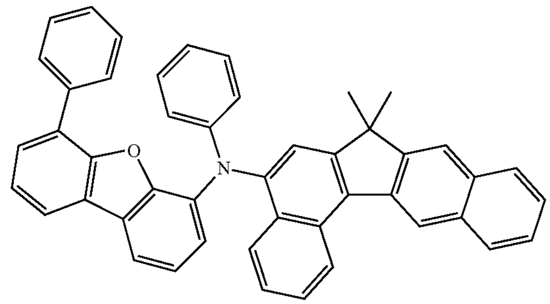
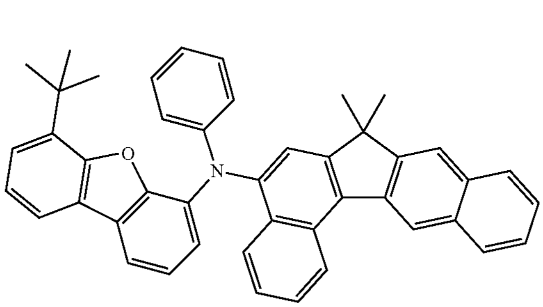
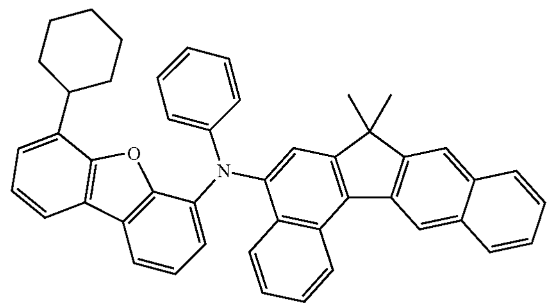
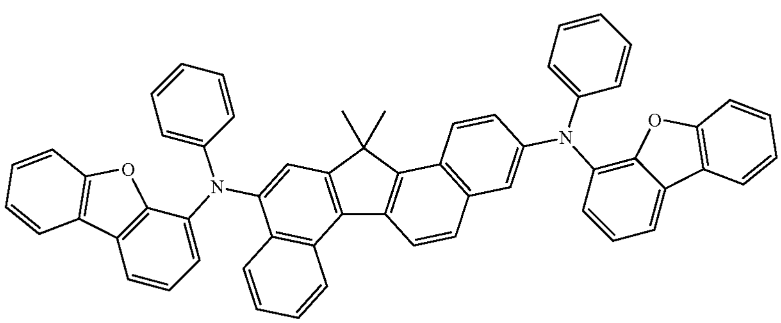
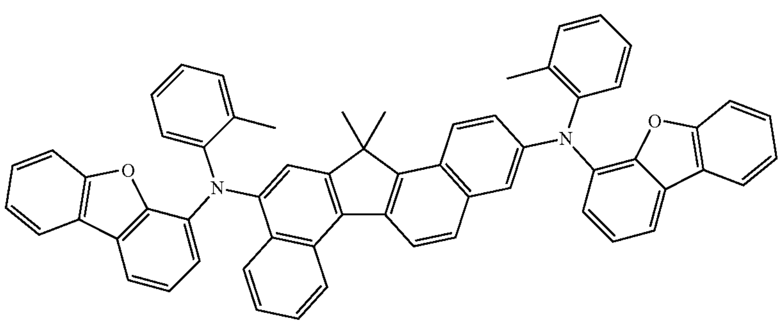
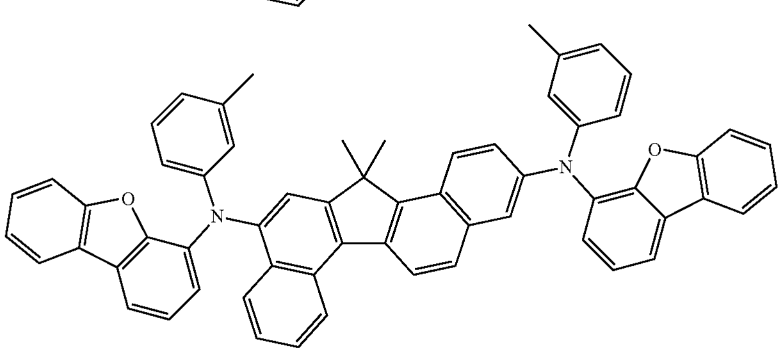

-continued
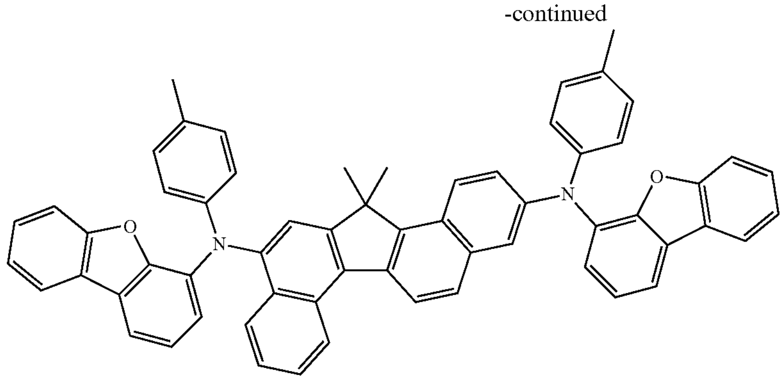
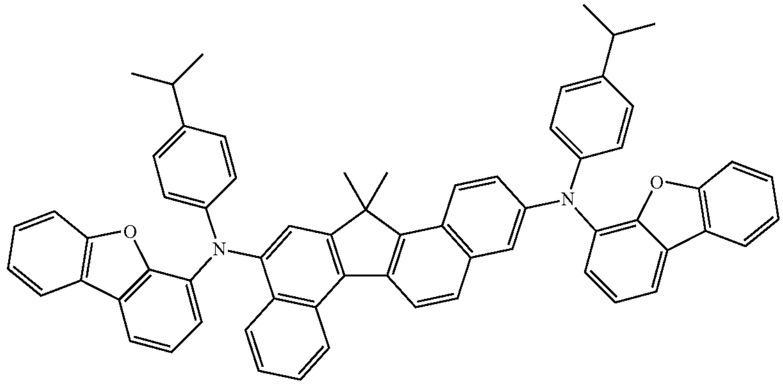
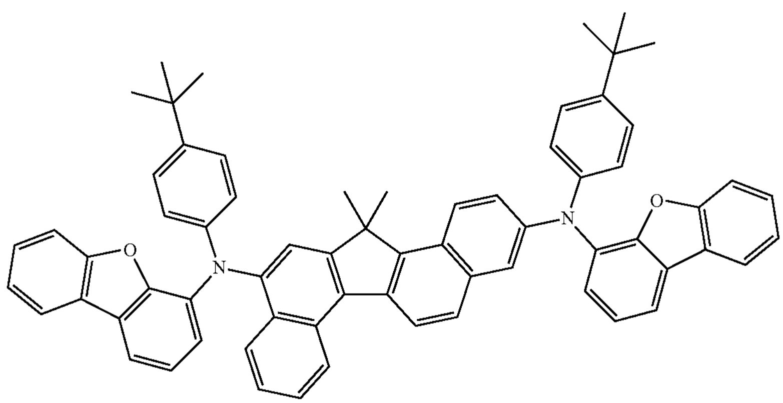
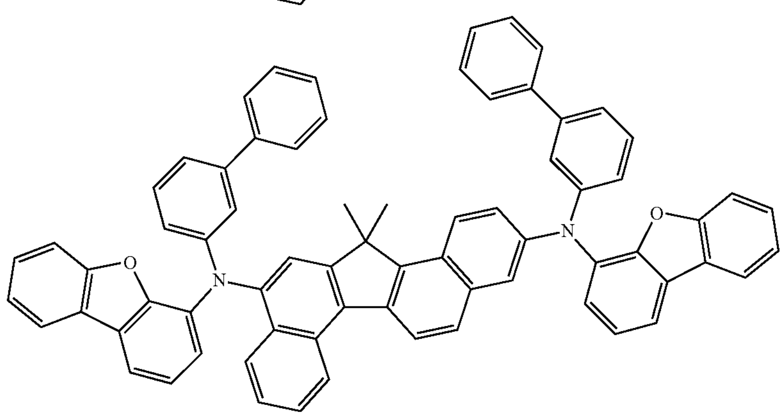

-continued
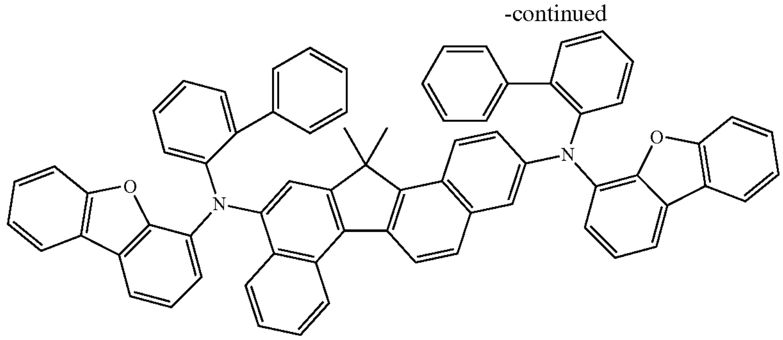
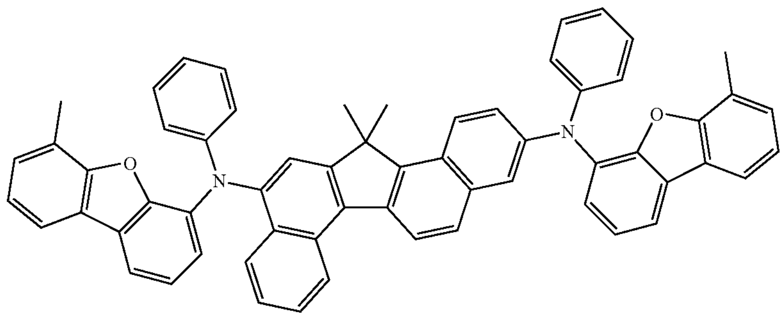
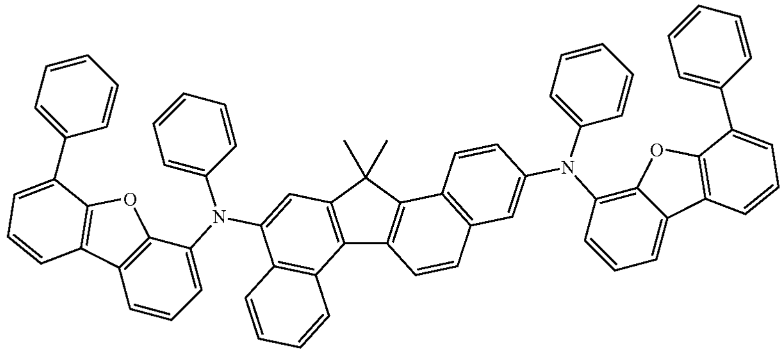
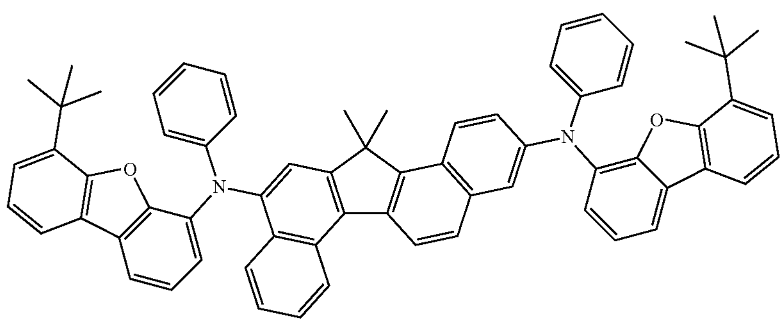
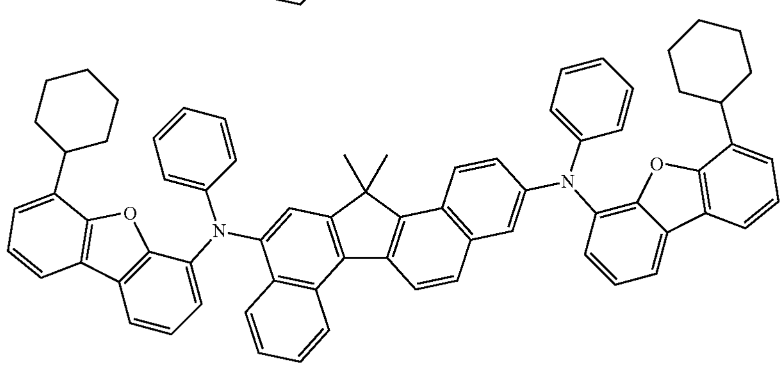

-continued
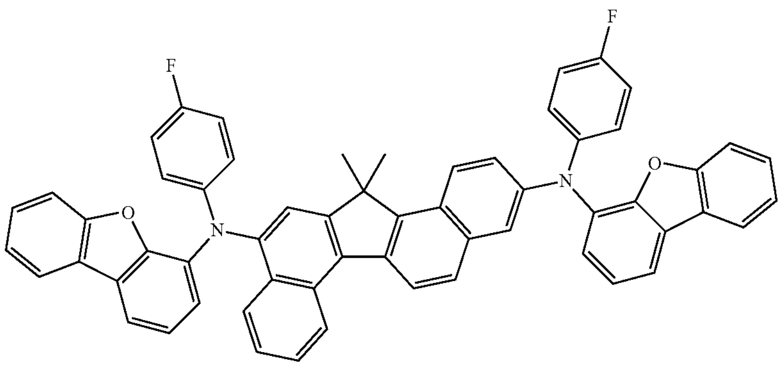
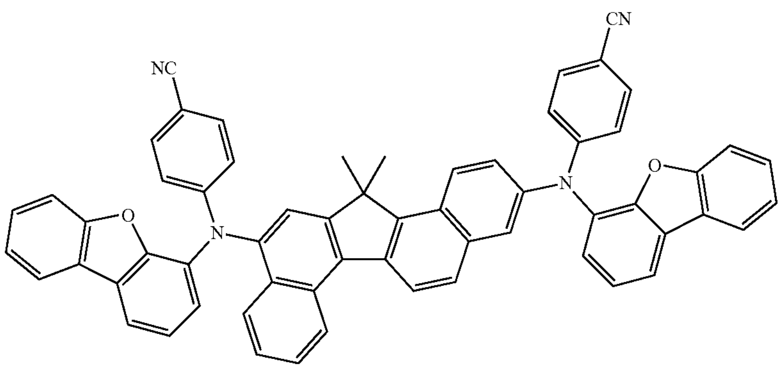
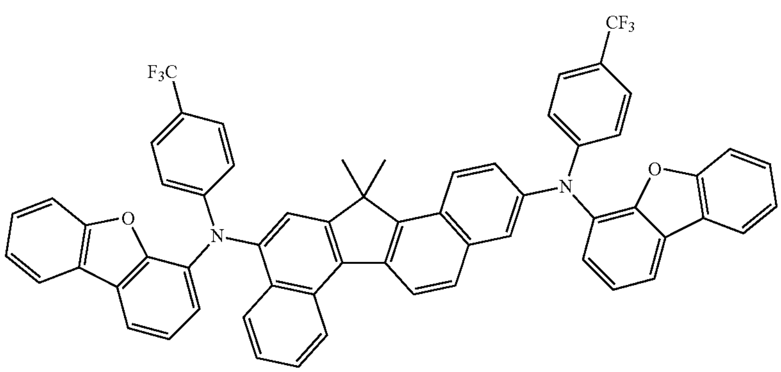
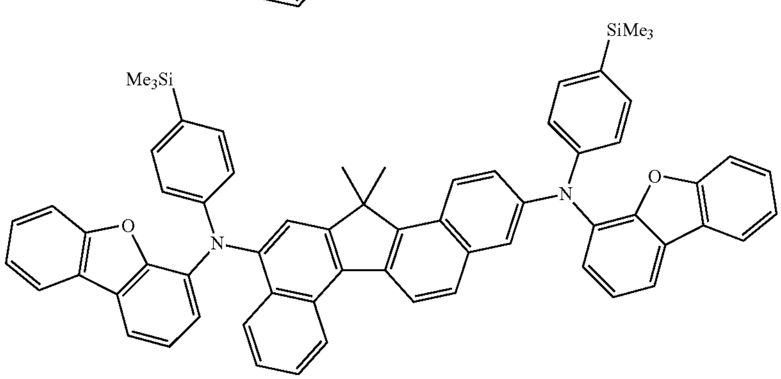

-continued
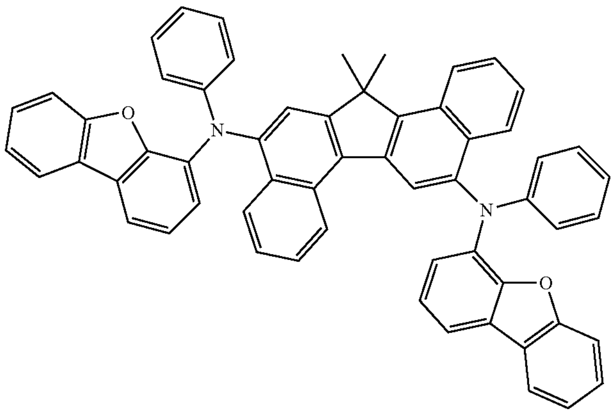
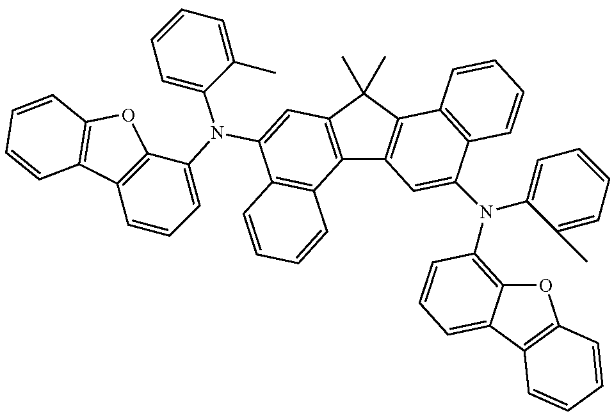
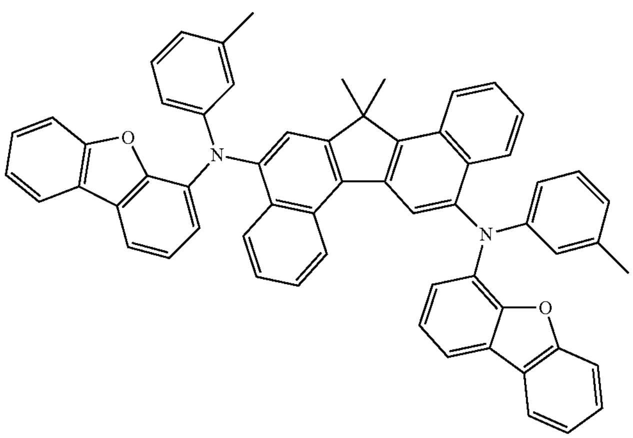
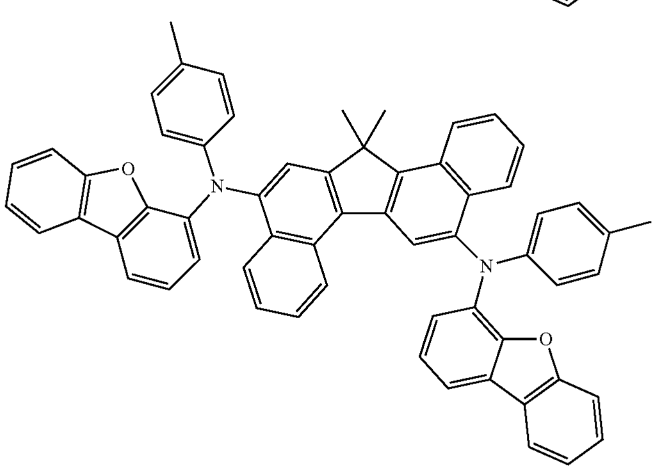

-continued
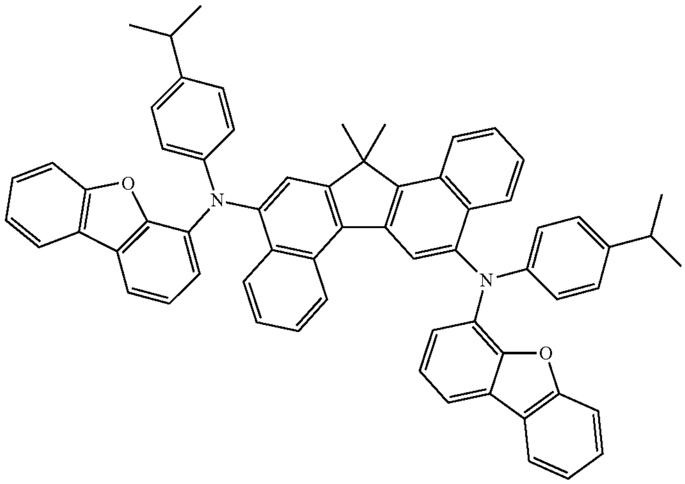
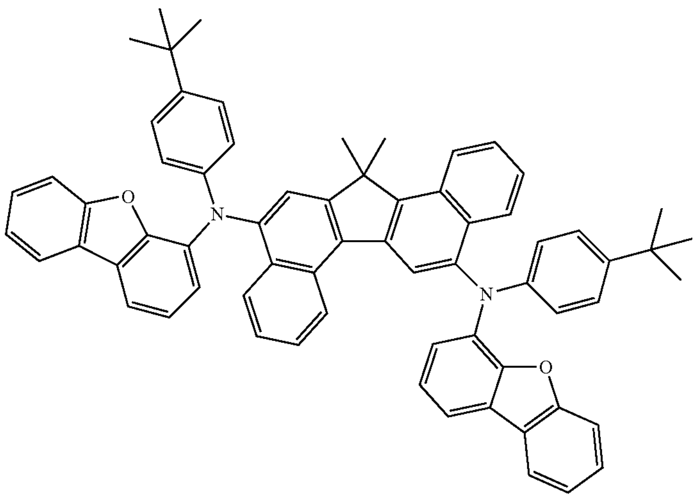
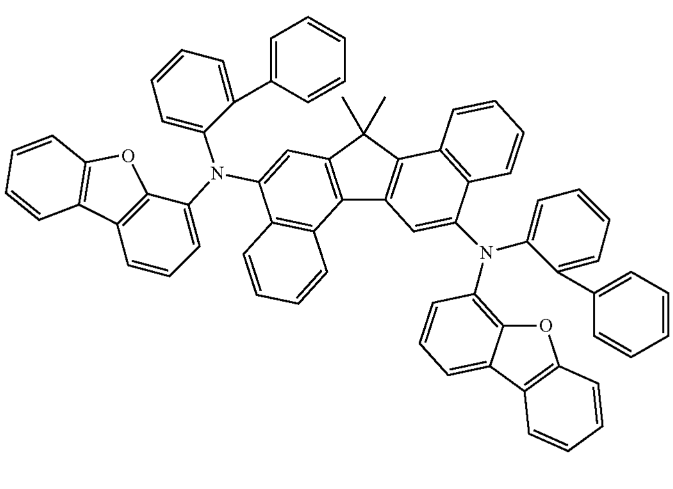

-continued
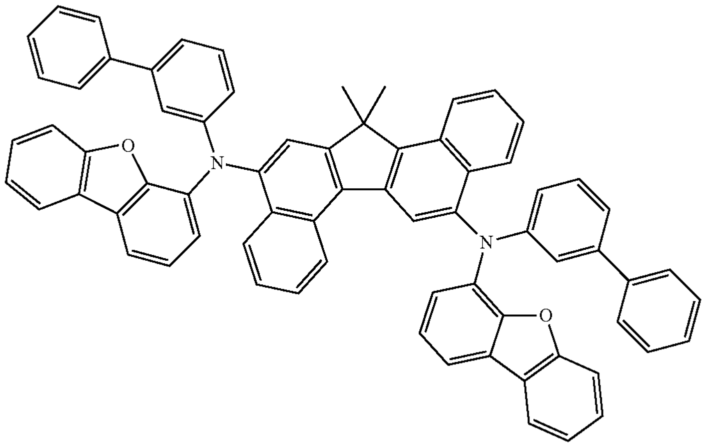
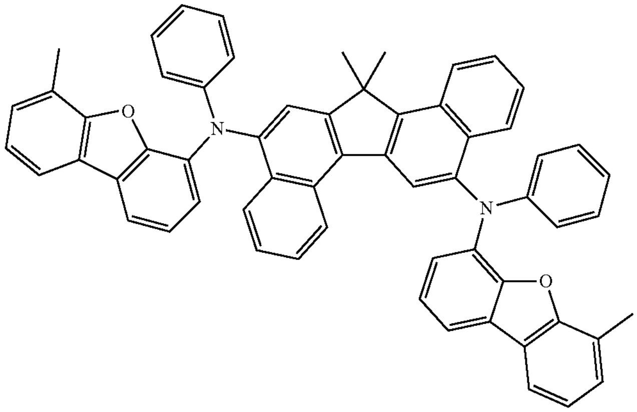
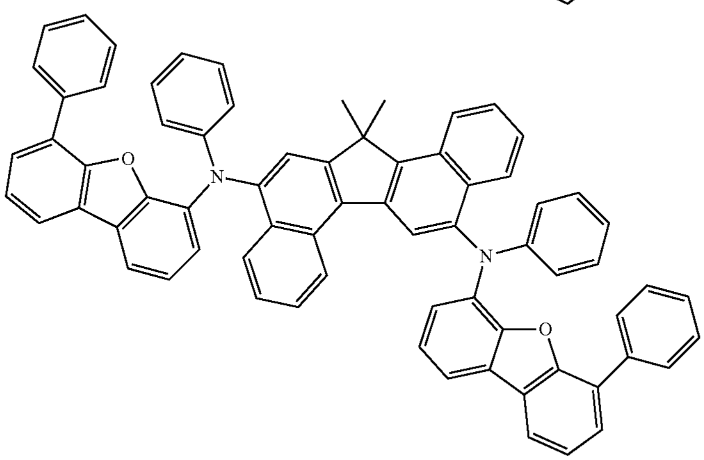
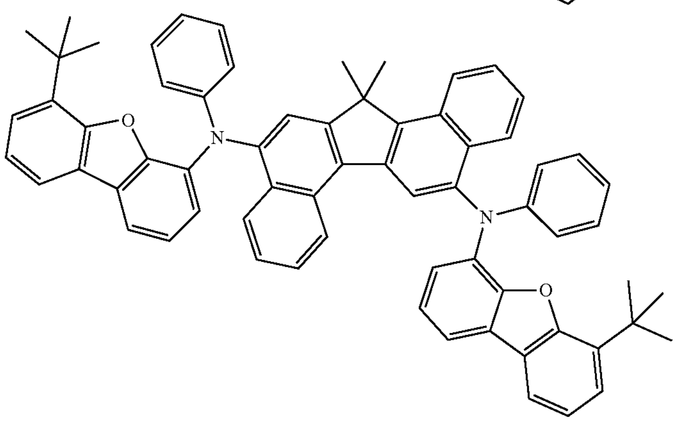

-continued
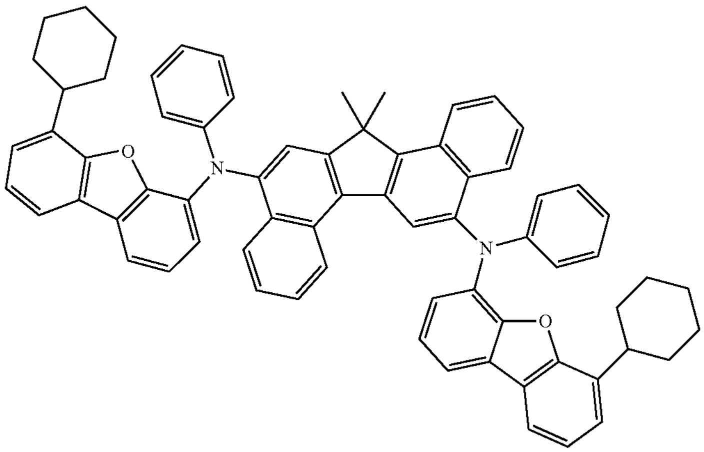
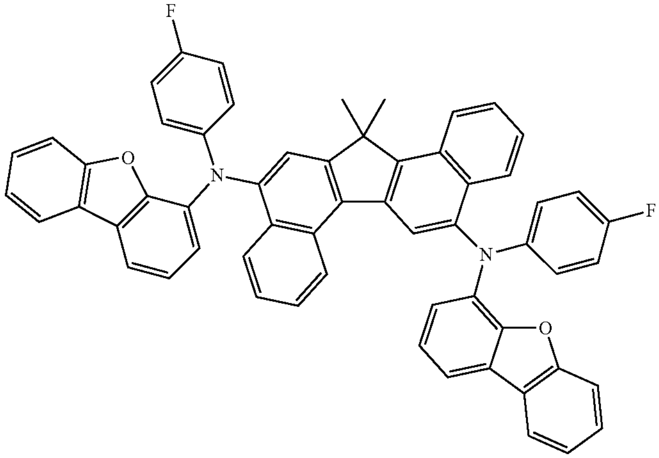
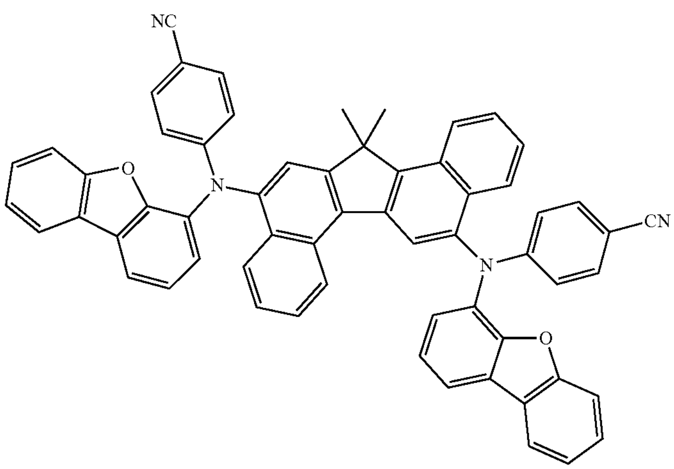
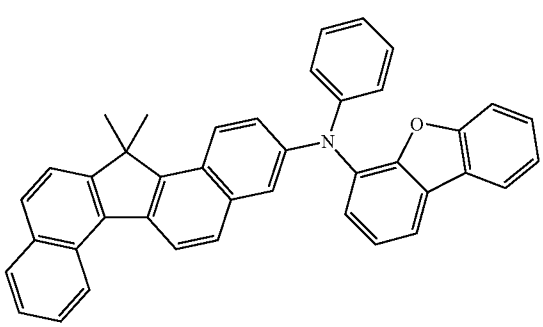
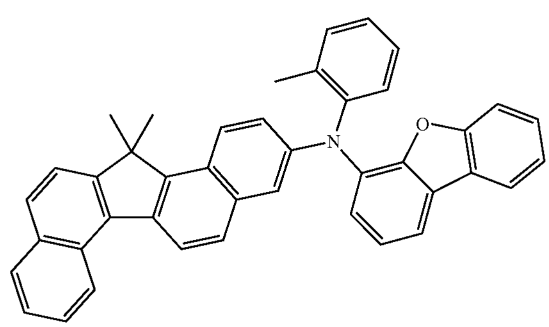

-continued
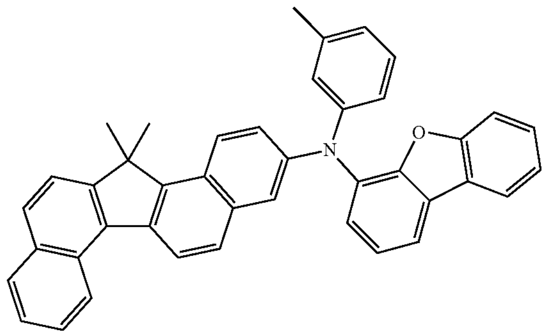
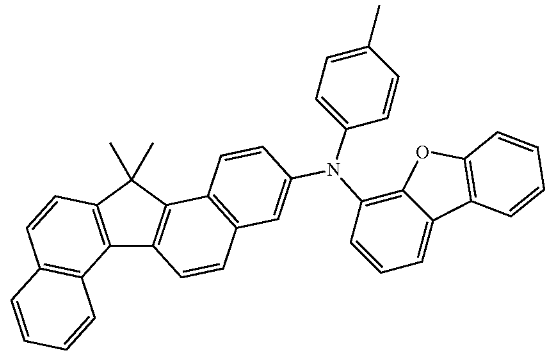
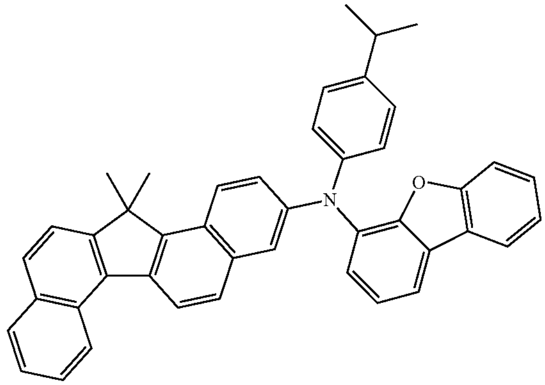
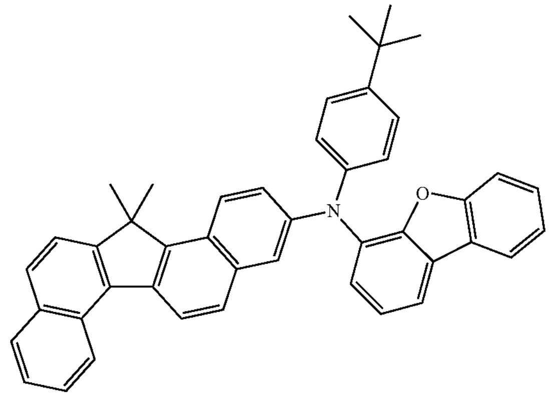
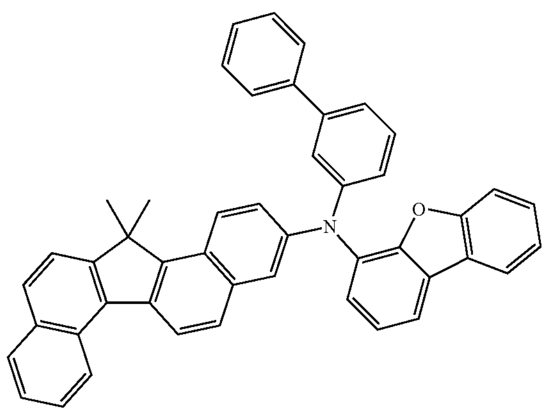
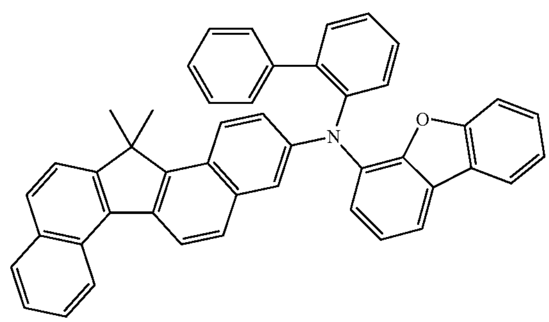
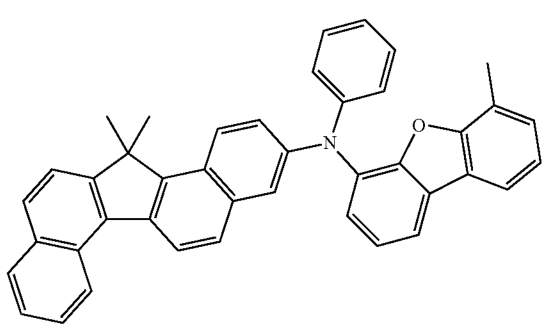
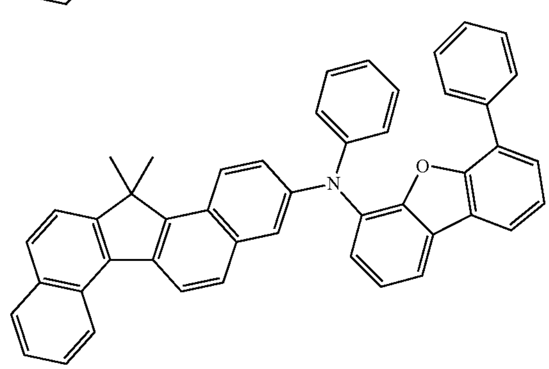

-continued
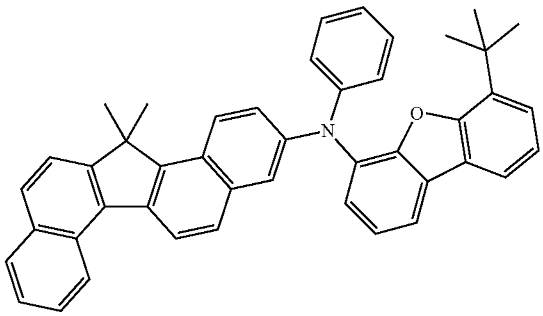
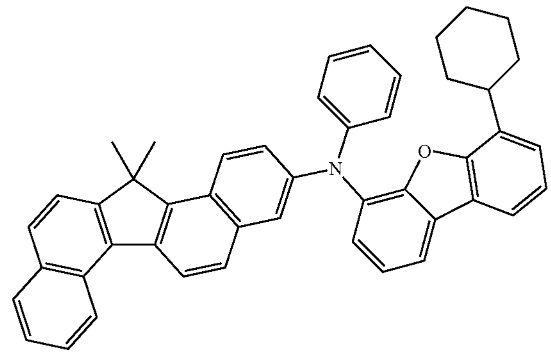
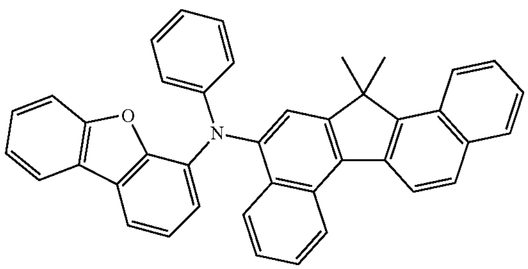
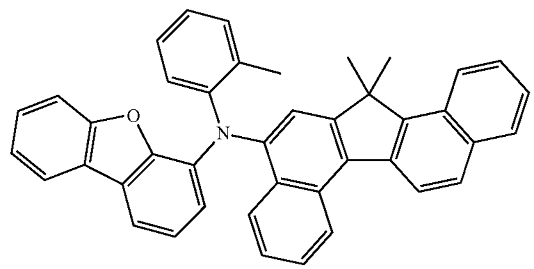
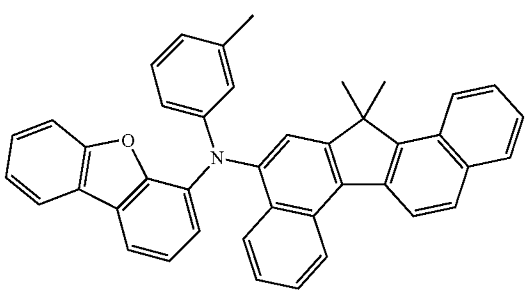
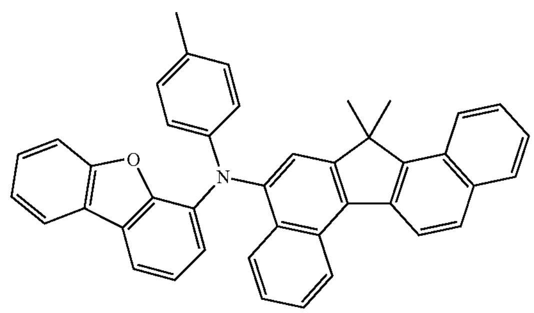
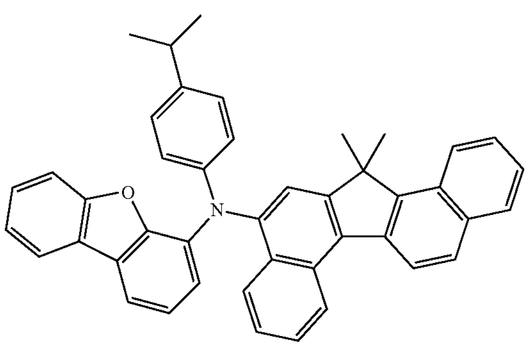
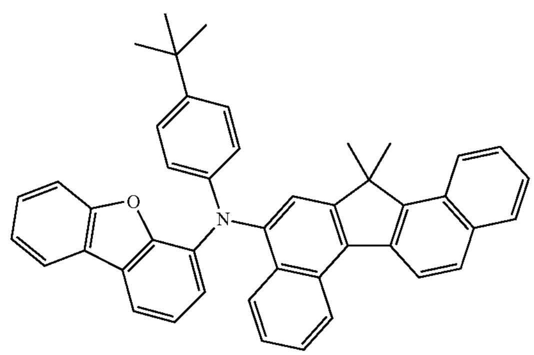
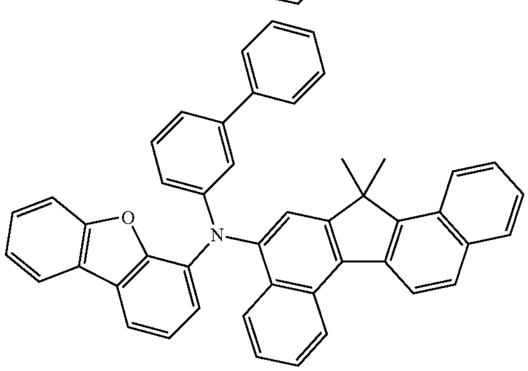
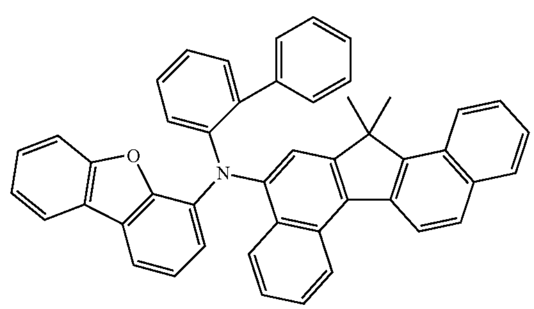

-continued
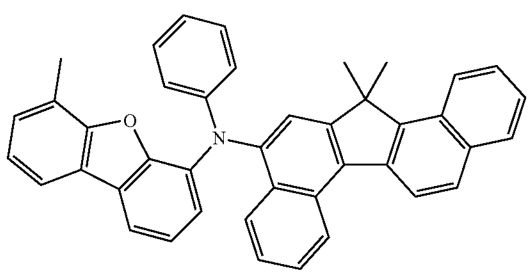
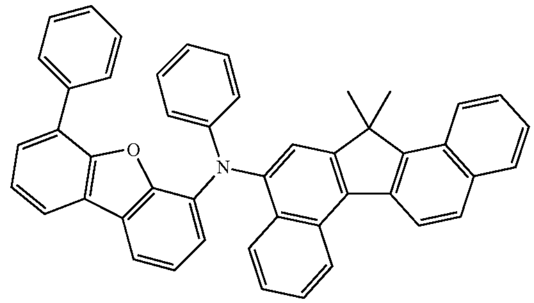
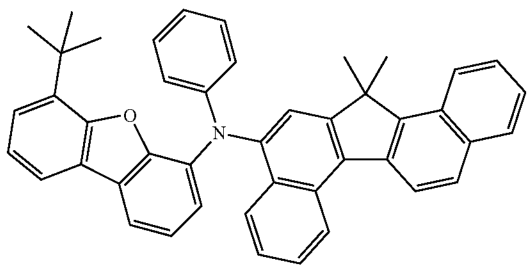
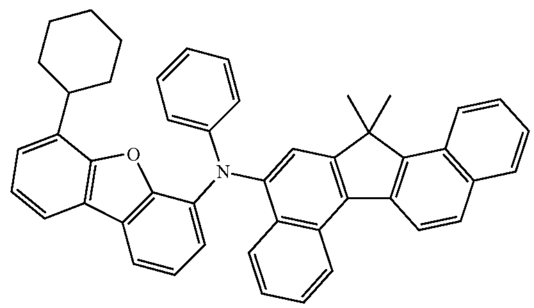
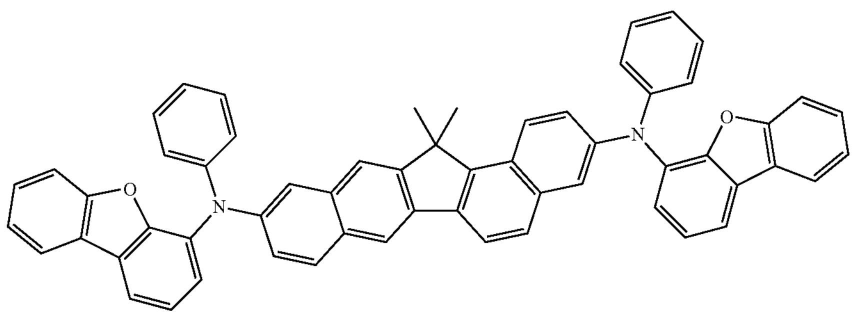
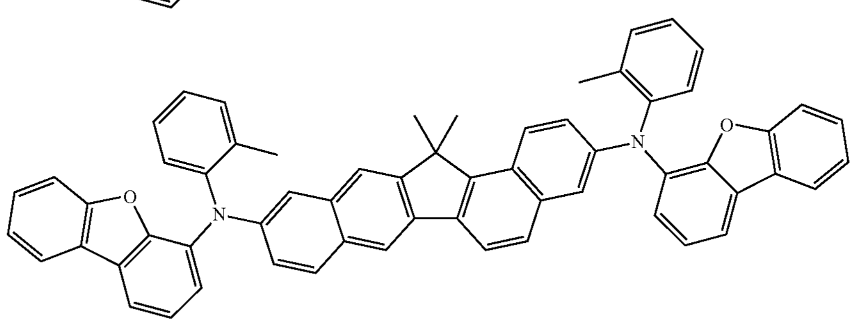
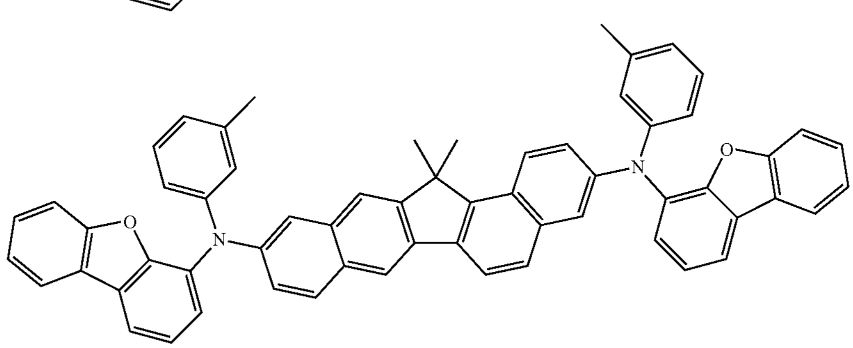

-continued
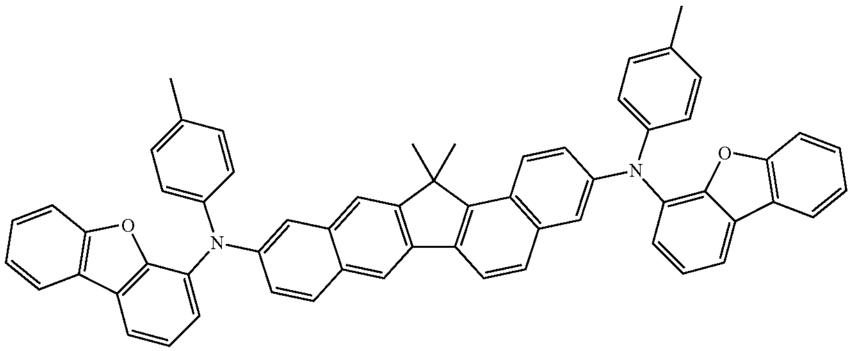
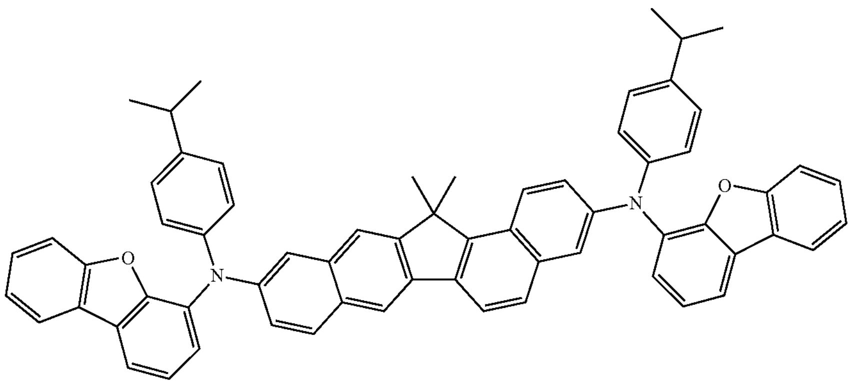
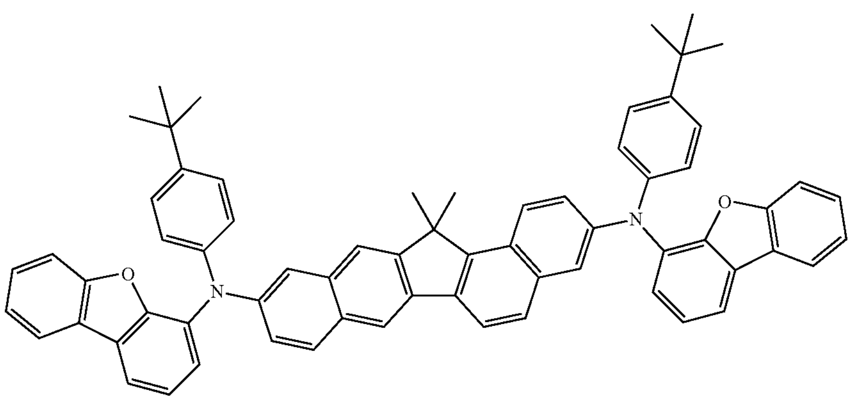
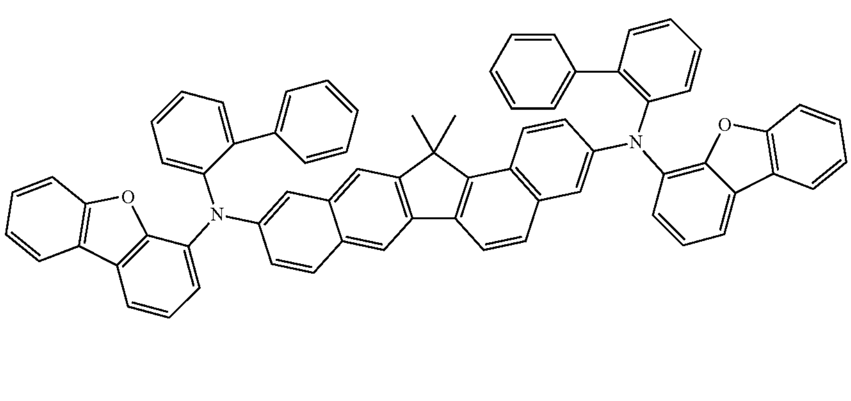

-continued
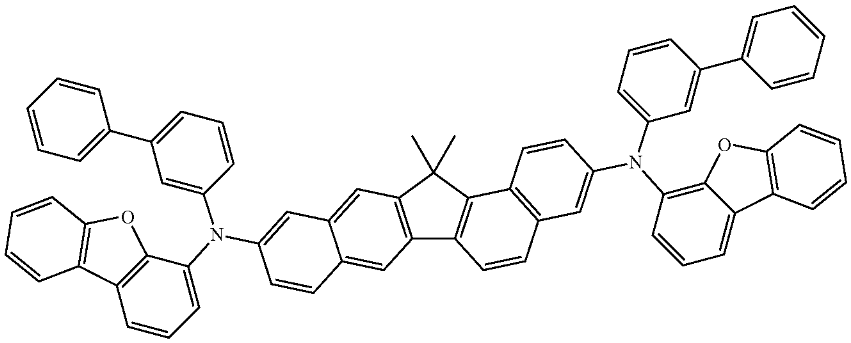
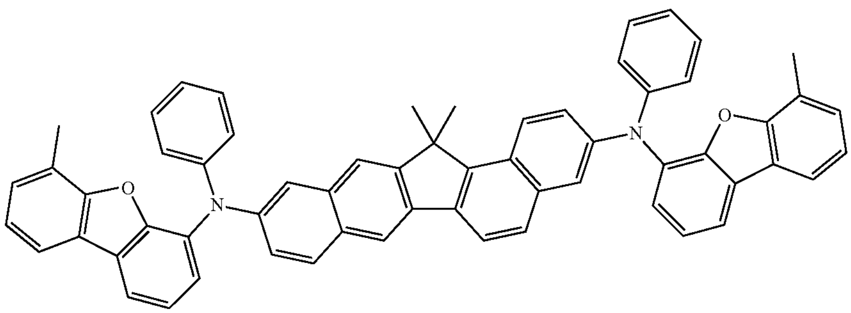
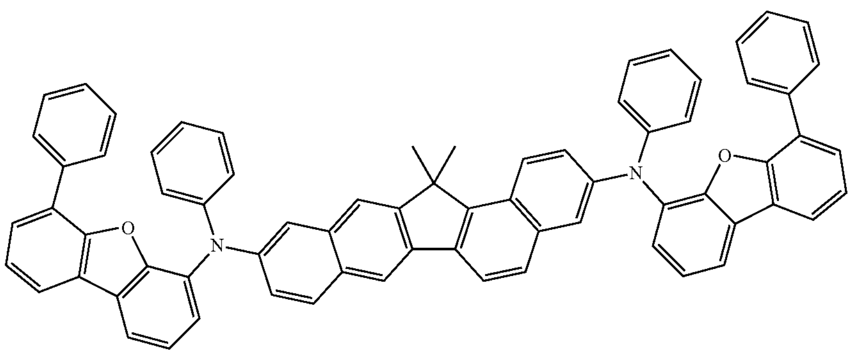
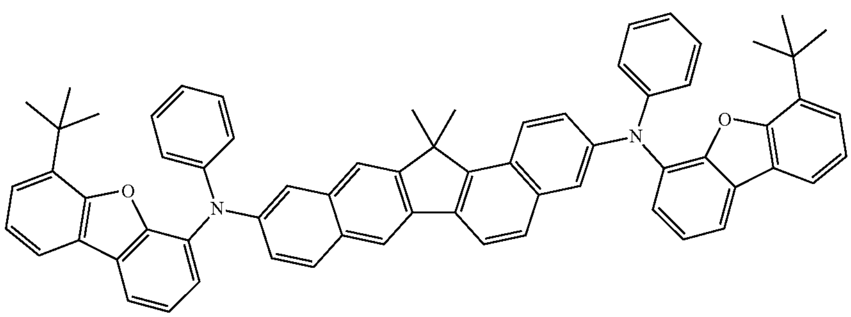
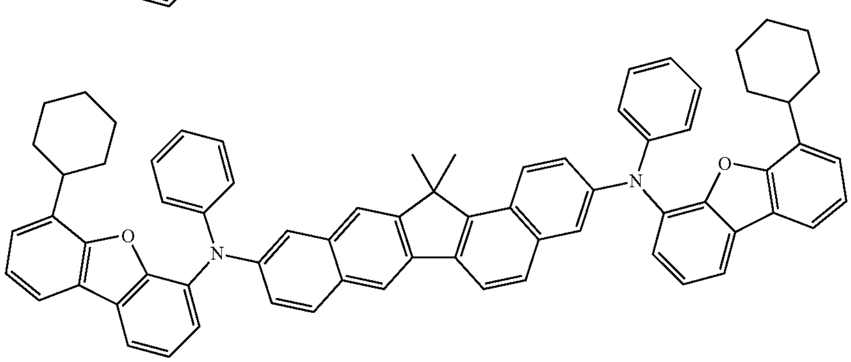

-continued
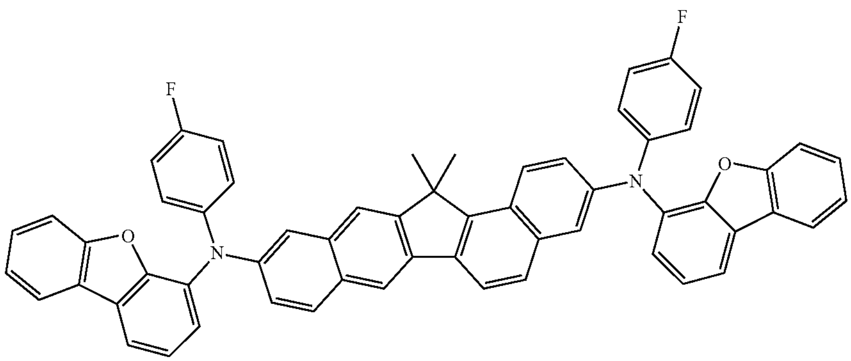
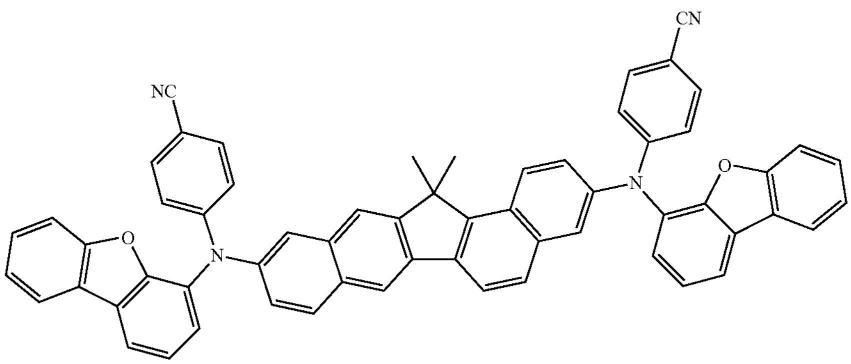
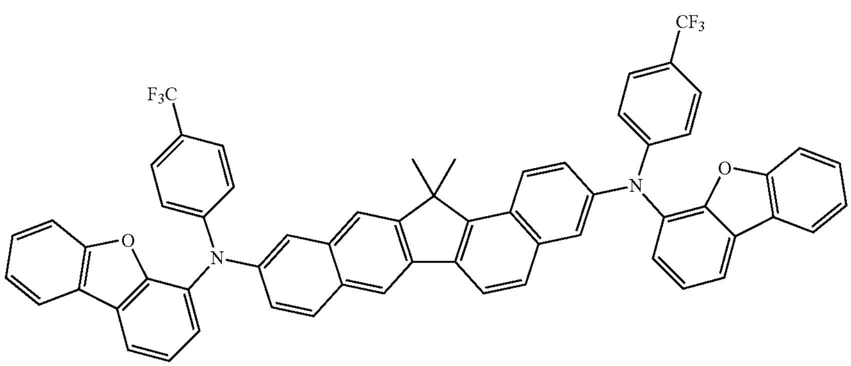
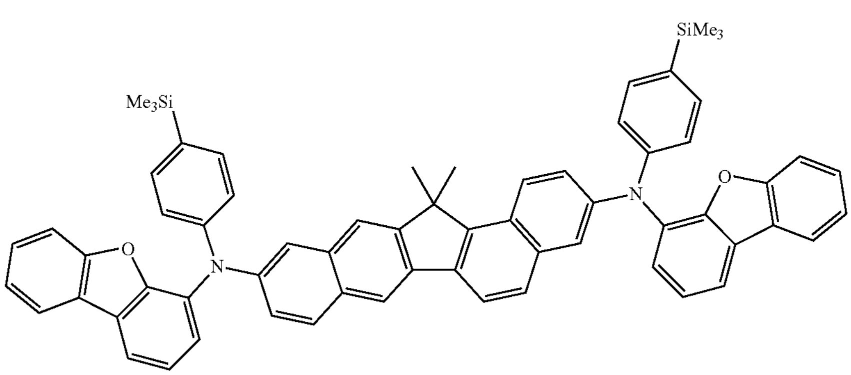

-continued
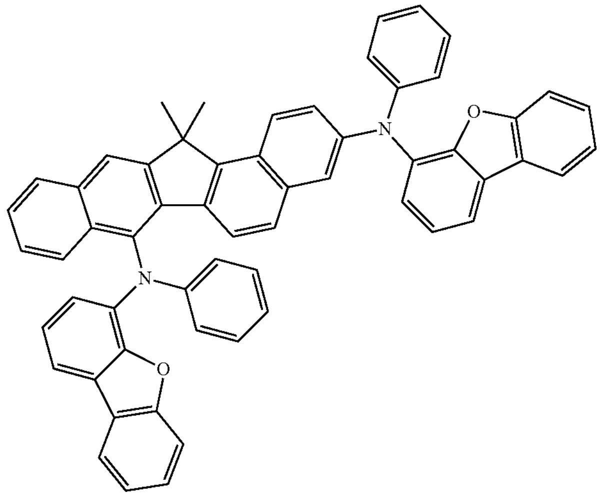
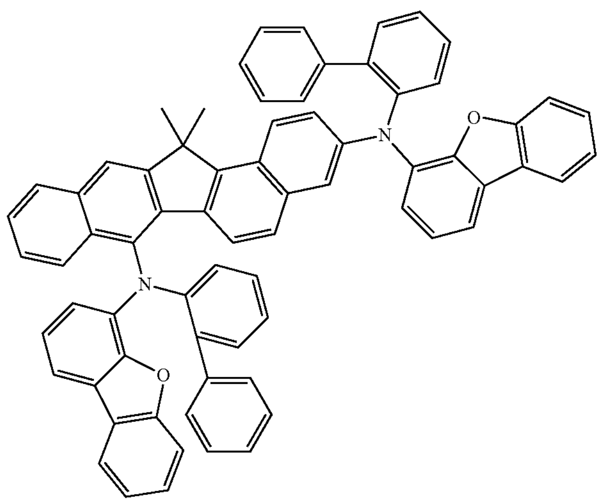
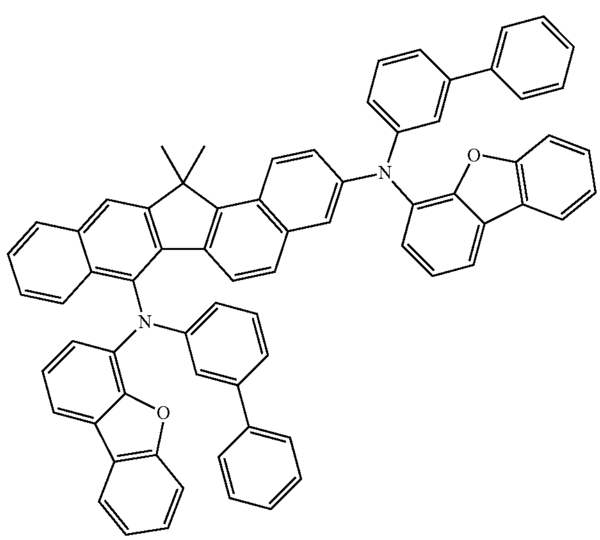

-continued
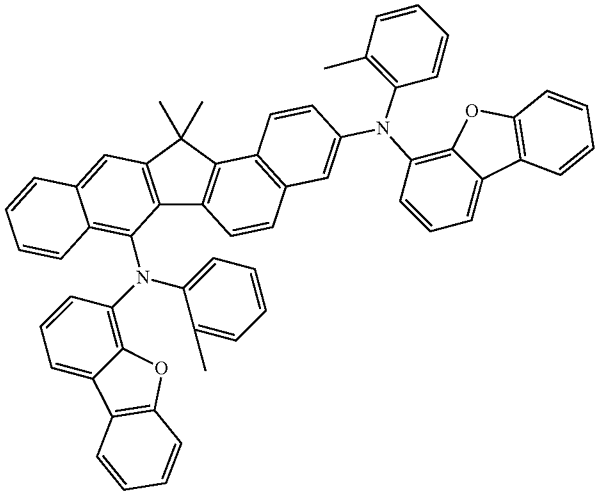
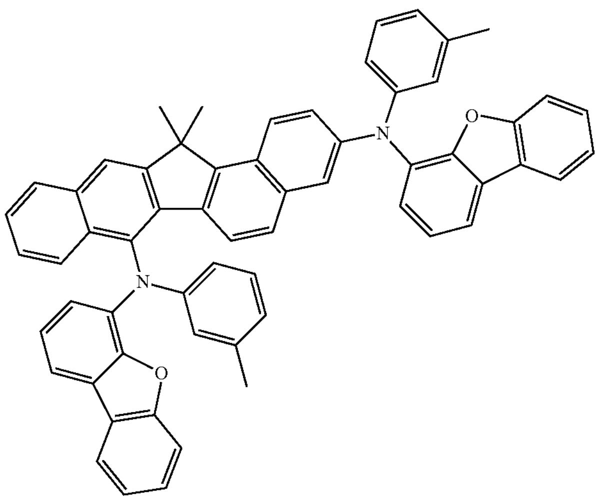
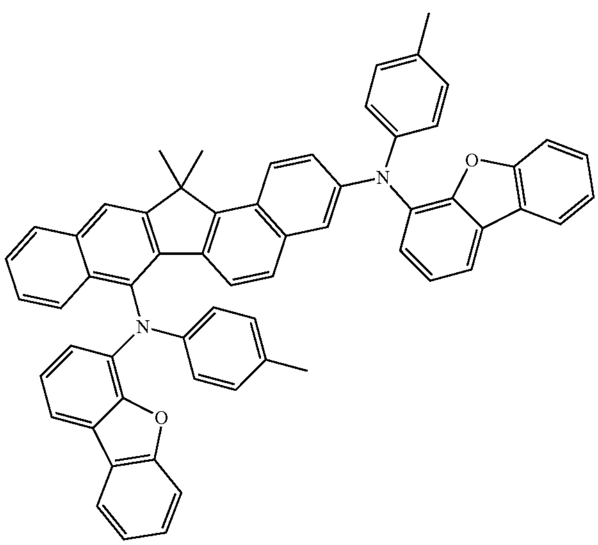

-continued
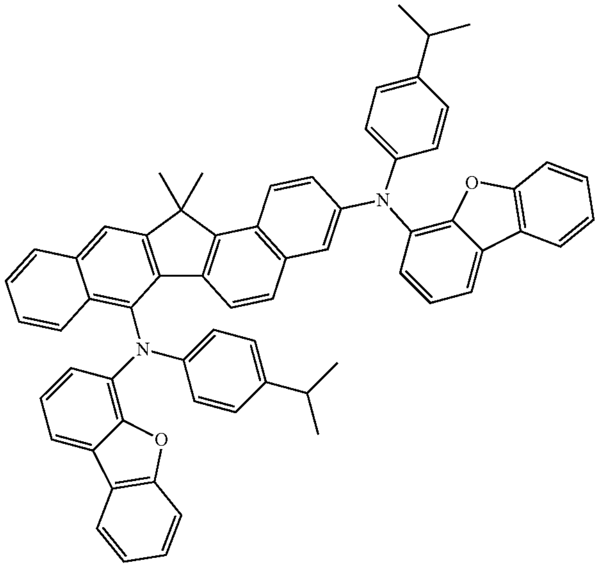
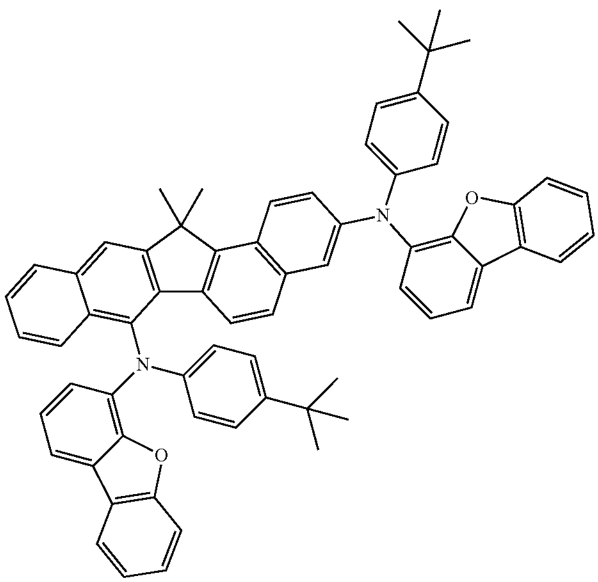
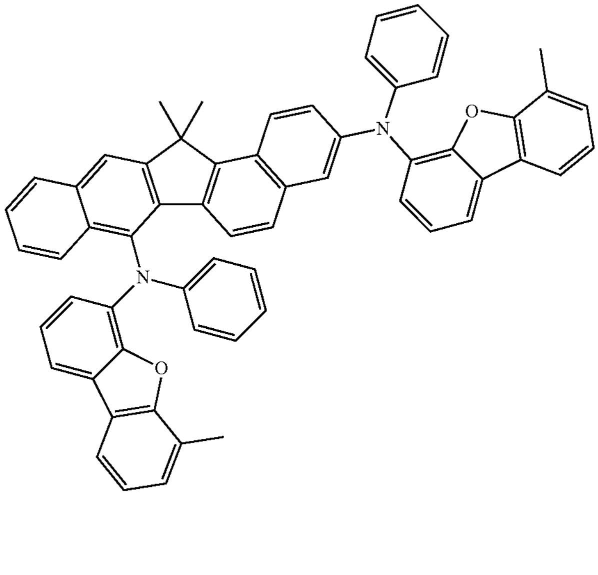

-continued
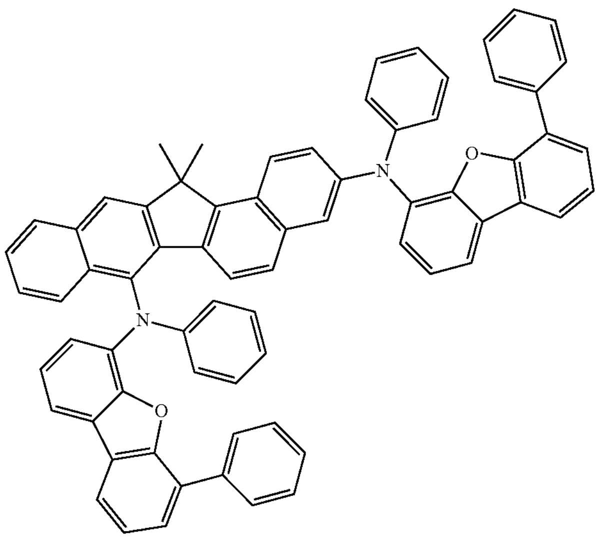
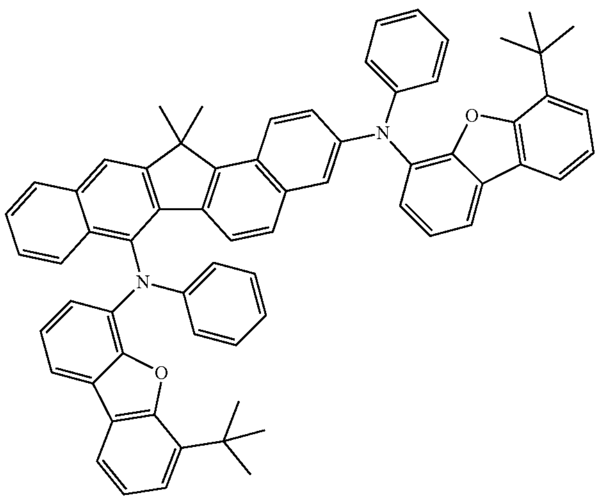
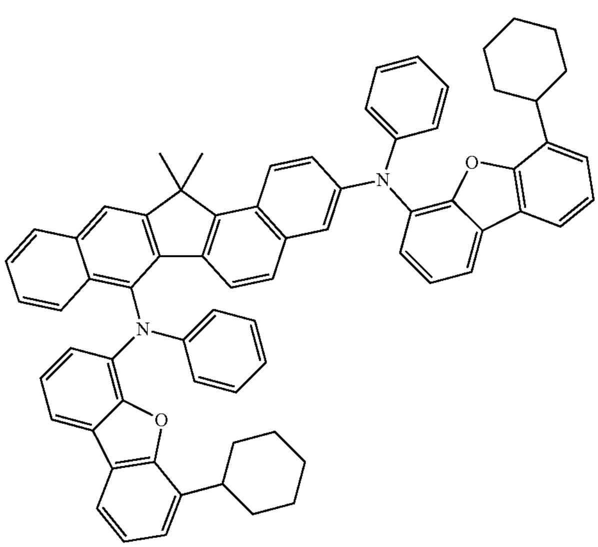

-continued
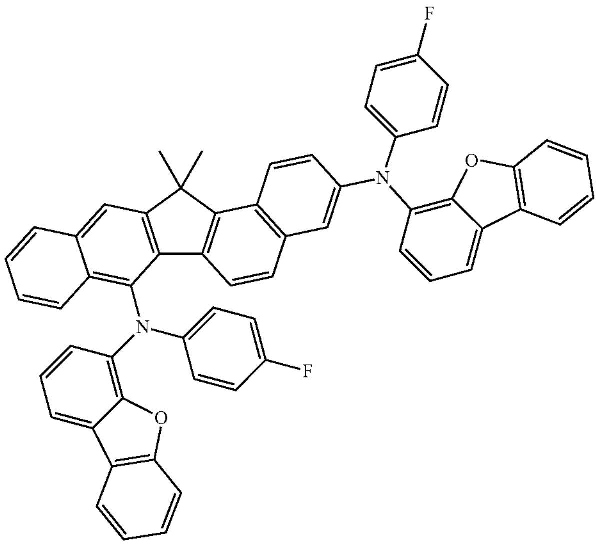
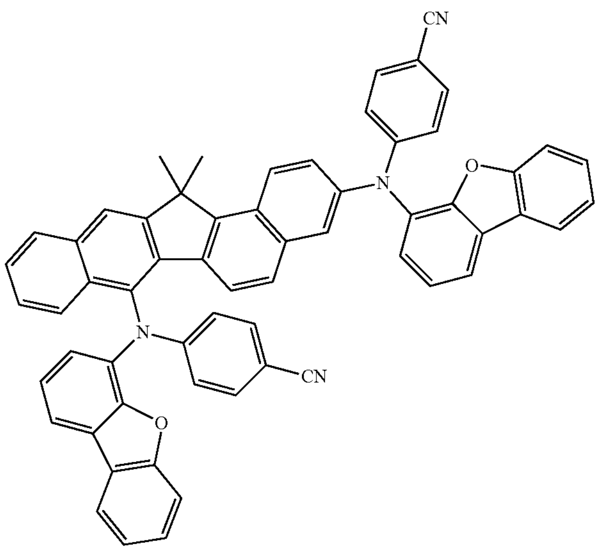
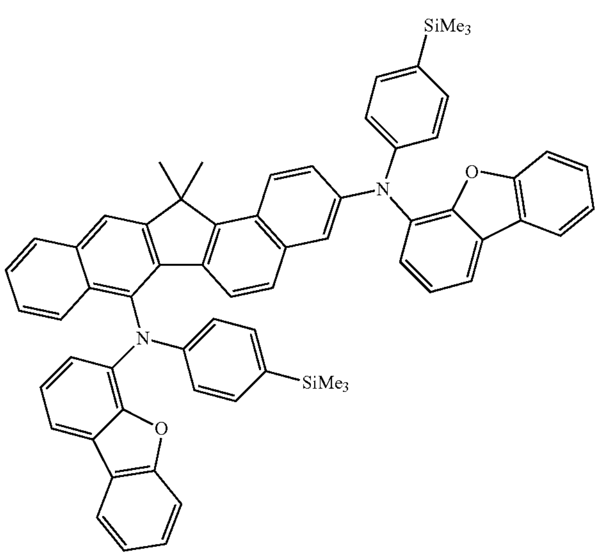

-continued
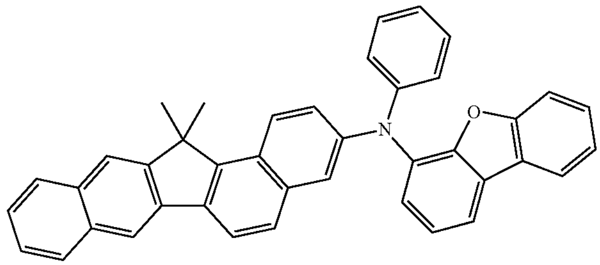
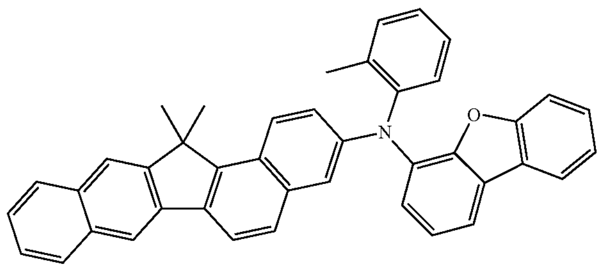
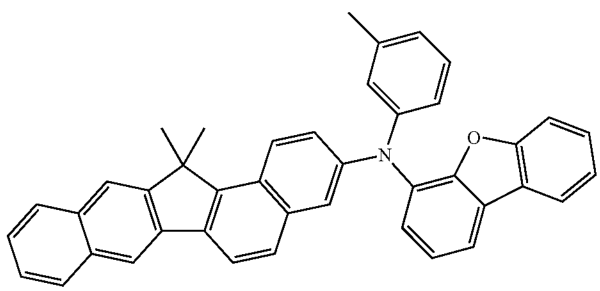
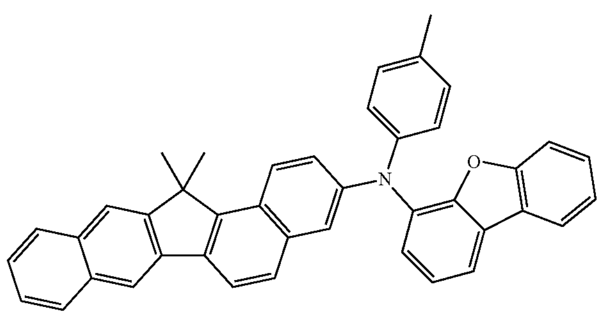
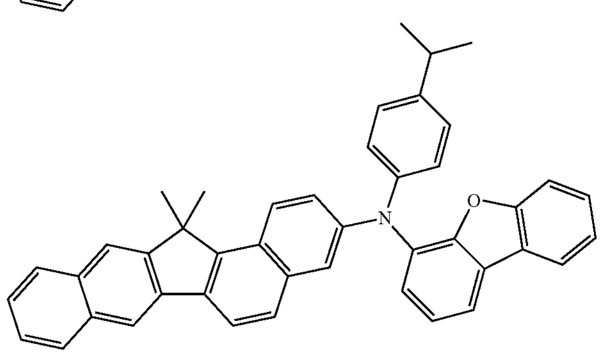

-continued
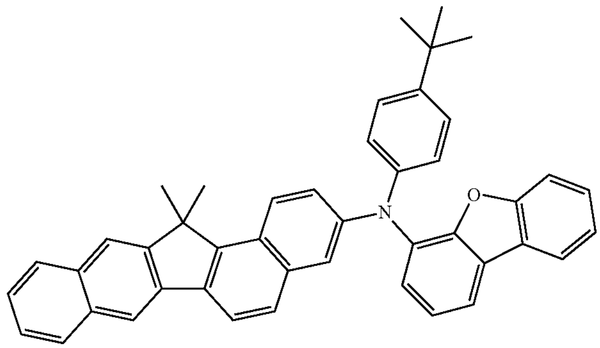
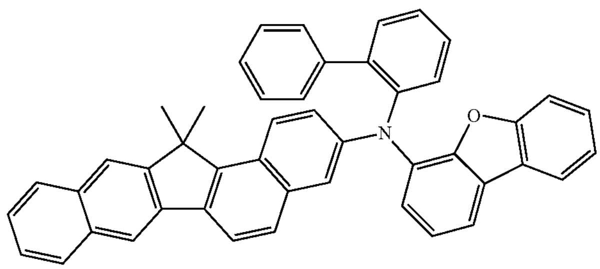
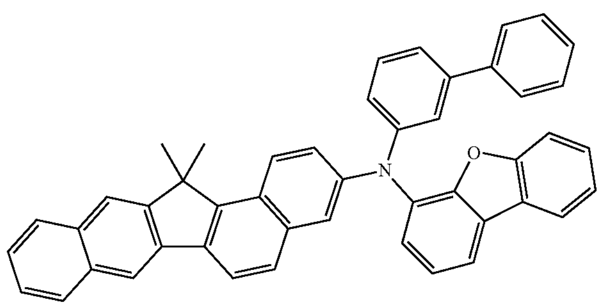
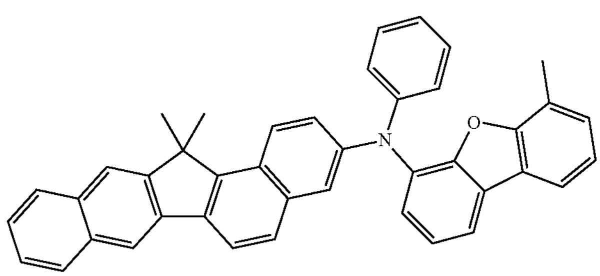
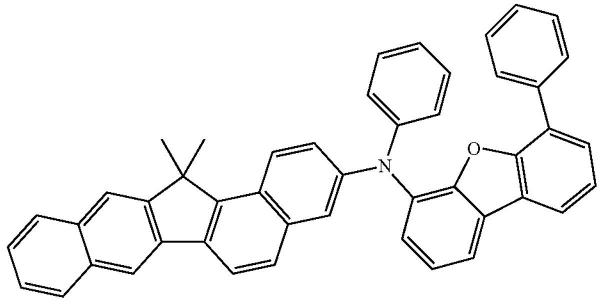

-continued
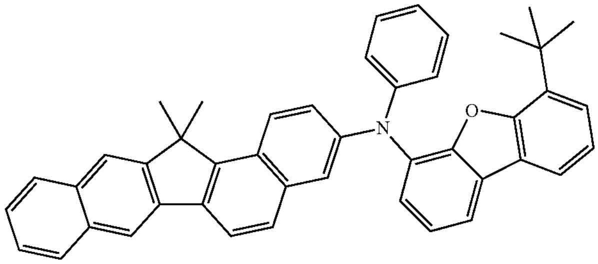
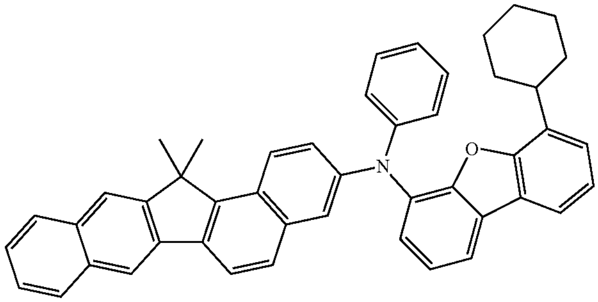
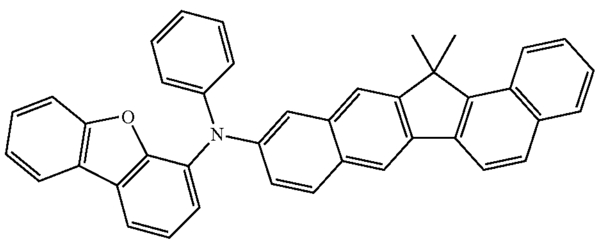
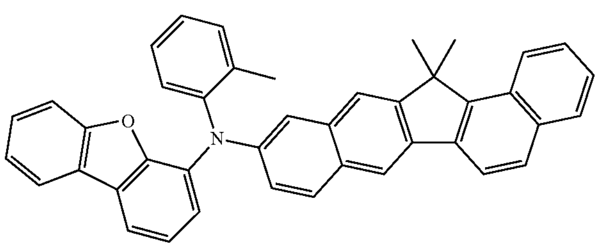
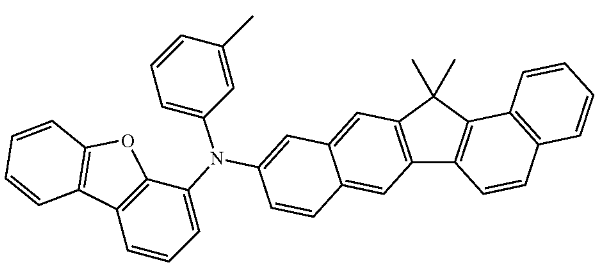
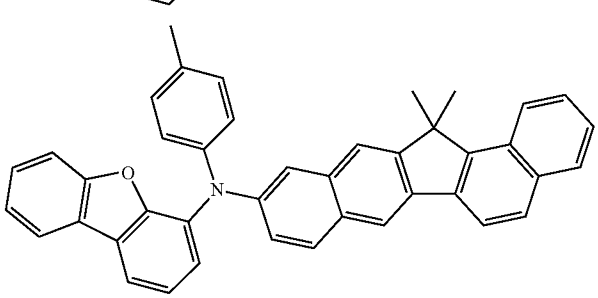

-continued
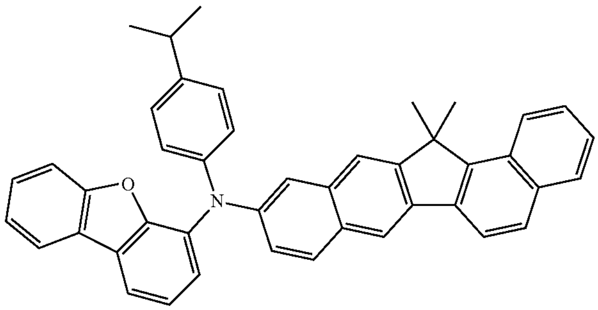
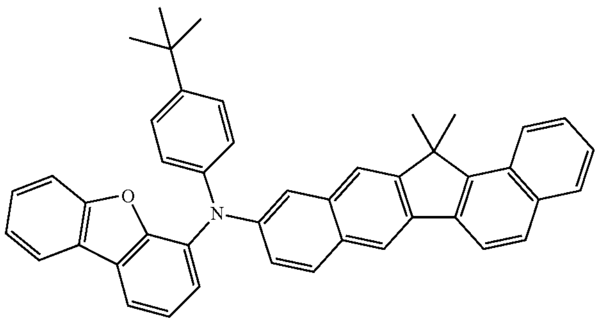
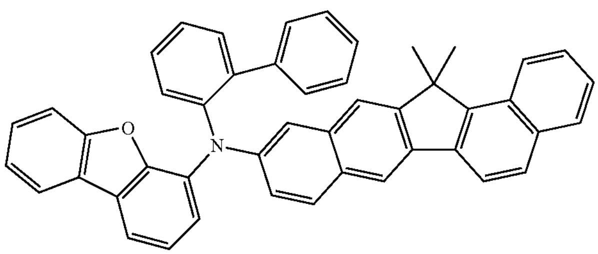
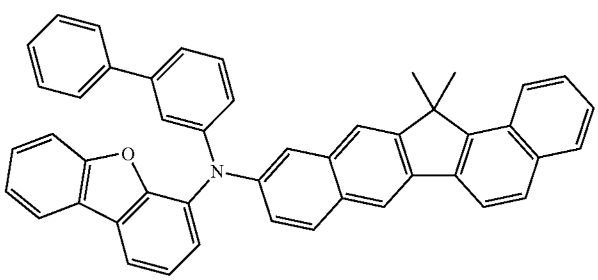
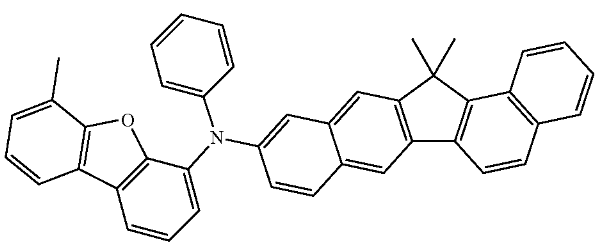
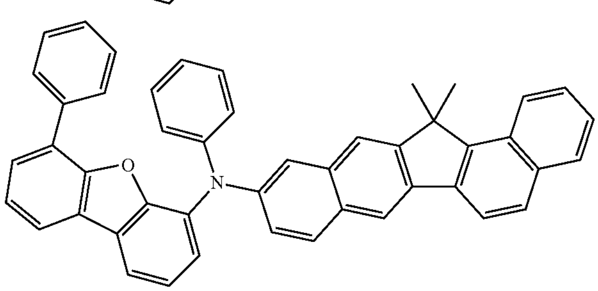

-continued

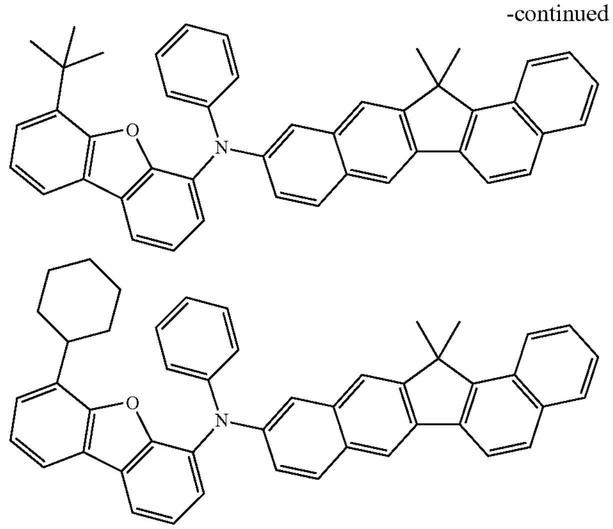

The amine compound is useful as a material for an organic EL device, and particularly as a doping material for a fluorescent emitting layer. The production method of the amine compound is not particularly limited, and a skilled person in the art may readily produce the compound by utilizing and modifying a known synthesis reaction with reference to the examples of the present invention shown below.

Organic EL Device

The organic EL device of the present invention will be described.

The organic EL device of the present invention comprises a cathode, an anode and an organic thin film layer comprising an emitting layer intervening between the cathode and anode, and at least one layer of the organic thin film layer comprises the aforementioned amine compound.

Examples of the organic thin film layer that comprises the amine compound include a hole transporting layer, an emitting layer, a space layer and a barrier layer, but the layer is not limited thereto. The amine compound is preferably comprised in an emitting layer, and more preferably comprised as a doping material of a fluorescent emitting layer, by which prolongation of the service life time of the organic EL device may be expected.

The organic EL device of the present invention may be any of a fluorescent or phosphorescent monochromic light emitting device and a fluorescent-phosphorescent hybrid white light emitting device, and any of a simple device having a single light emitting unit and a tandem device having plural light emitting units. The light emitting unit referred herein means a minimum unit capable of emitting light through recombination of injected holes and electrons having one or more organic layers, at least one of which is an emitting layer.

Representative examples of the device structure of the simple organic EL device include the following device structure.

(1) Anode/Emitting Unit/Cathode

The light emitting unit may be a stacked unit having plural phosphorescent layers and fluorescent layers, and may have a space layer between the emitting layers for preventing excitons formed in a phosphorescent layer from being diffused to a fluorescent layer. Representative examples of the layer structure of the light emitting unit are shown below.

(a) hole transporting layer/emitting layer (/electron transporting layer)

(b) hole transporting layer/first fluorescent layer/second fluorescent layer (/electron transporting layer)

(c) hole transporting layer/phosphorescent layer/space layer/fluorescent layer (/electron transporting layer)

(d) hole transporting layer/first phosphorescent layer/second phosphorescent layer/space layer/fluorescent layer (/electron transporting layer)

(e) hole transporting layer/first phosphorescent layer/space layer/second phosphorescent layer/space layer/fluorescent layer (/electron transporting layer)

(f) hole transporting layer/phosphorescent layer/space layer/first fluorescent layer/second fluorescent layer (/electron transporting layer)

The phosphorescent and fluorescent layers may exhibit different light emission colors. Specifically, examples of the layer structure include, in the stacked emitting layer (d), hole transporting layer/first phosphorescent layer (red emitting layer)/second phosphorescent layer (green emitting layer)/space layer/fluorescent layer (blue emitting layer)/electron transporting layer.

An electron barrier layer may be appropriately provided between the emitting layer and the hole transporting layer or the space layer. A hole barrier layer may be appropriately provided between the emitting layer and the electron transporting layer. The electron barrier layer and the hole barrier layer provided confine electrons or holes in the emitting layer to increase the recombination probability of charges in the emitting layer, thereby enhancing the luminous efficiency.

Representative examples of the device structure of the tandem organic EL device include the following device structure.

(2) Anode/First Light Emitting Unit/Intermediate Layer/Second Light Emitting Unit/Cathode The first light emitting unit and the second emitting unit herein may each be one that is similar to the aforementioned light emitting unit.

The intermediate layer may also be generally referred to as an intermediate electrode, an intermediate conductive layer, a charge generating layer, an electron withdrawing layer, a connecting layer or an intermediate insulating layer, and may be constituted by a known material capable of supplying electrons to the first light emitting unit and supplying holes to the second light emitting unit.

FIG. 1 is a schematic illustration showing an example of the organic EL device of the present invention. The organic EL device 1 has a substrate 2, an anode 3, a cathode 4, and a light emitting unit 10 disposed between the anode 3 and the cathode 4. The light emitting unit 10 has an emitting layer 5 comprising at least one fluorescent layer comprising a fluorescent host material and a fluorescent dopant. A hole transporting layer 6 and the like may be provided between the emitting layer 5 and the anode 3, and an electron transporting layer 7 and the like may be provided between the emitting layer 5 and the cathode 4. An electron barrier layer may be provided on the emitting layer 5 on the side of the anode 3, and a hole barrier layer may be provided on the emitting layer 5 on the side of the cathode 4. According to the structure, electrons and holes may be confined in the emitting layer 5, thereby enhancing the formation probability of excitons in the emitting layer 5.

In the present invention, a host that is combined with a fluorescent dopant is referred to as a fluorescent host, and a host that is combined with a phosphorescent dopant is referred to as a phosphorescent host. The fluorescent host and the phosphorescent host are not distinguished only by the molecular structures thereof. In other words, the fluorescent host means a material that constitutes a fluorescent layer comprising a fluorescent dopant, and does not mean that it cannot be used as a material constituting a phosphorescent layer. The same is applied to the phosphorescent host.

Substrate

The organic EL device of the present invention may be formed on a light-transmissive substrate. The light-transmissive substrate is a substrate that supports the organic EL device, and is preferably a smooth substrate having a transmittance of 50% or more to light in the visible region of from 400 to 700 nm. Specific examples thereof include a glass plate and a polymer plate. Examples of the glass plate include those formed of soda-lime glass, barium-strontium-containing glass, lead glass, aluminosilicate glass, borosilicate glass, barium borosilicate glass or quartz as a raw material. Examples of the polymer plate include those formed of polycarbonate, acrylic resins, polyethylene terephthalate, polyether sulfide or polysulfone as a raw material.

Anode

The anode of the organic EL device has a function of injecting holes to the hole transporting layer or the emitting layer, and is effectively formed of a material having a work function of 4.5 eV or more. Specific examples of the material for the anode include indium tin oxide (ITO), tin oxide (NESA), indium zinc oxide, gold, silver, platinum and copper. The anode may be formed by forming these electrode materials into a thin film by such a method as a vapor deposition method and a sputtering method. In the case where emitted light from the emitting layer is taken out from the side of the anode, the anode preferably has a transmittance of 10% or more to light in the visible region. The anode preferably has a sheet resistance of several hundreds [Ω/□] or less. The anode generally has a thickness of from 10 nm to 1 μm, and preferably from 10 to 200 nm, while depending on the material.

Cathode

The cathode has a function of injecting electrons to the electron injecting layer, the electron transporting layer or the emitting layer, and is preferably formed of a material having a small work function. The cathode material is not particularly limited, and specific examples thereof include indium, aluminum, magnesium, a magnesium-indium alloy, a magnesium-aluminum alloy, an aluminum-lithium alloy, an aluminum-scandium-lithium alloy and a magnesium-silver alloy. As similar to the anode, the cathode may be formed by forming these materials into a thin film by such a method as a vapor deposition method and a sputtering method. The emitted light may be taken out from the side of the cathode depending on necessity.

Emitting Layer

The emitting layer is an organic layer that has a light emitting function, and in the case where a doping system is employed, the emitting layer comprises a host material and a dopant material. In this case, the host material mainly has a function of facilitating recombination of electrons and holes and confining excitons in the emitting layer, and the doping material mainly has a function of causing the excitons obtained by recombination to efficiently emit light.

In the case of a phosphorescent device, the host material mainly has a function of confining excitons formed with the dopant in the emitting layer.

The emitting layer may be a double host emitting layer (which may also be referred to as a host-cohost emitting layer), in which the carrier balance in the emitting layer is controlled by combining, for example, an electron transporting host and a hole transporting host.

The emitting layer may also be a double dopant emitting layer, in which two or more kinds of doping materials that have high quantum yields are used, and the doping materials each emit light. Specifically, for example, a host, a red dopant and a green dopant may be vapor-deposited simultaneously to form a common emitting layer emitting yellow light.

Plural emitting layers may be laminated to form a laminated body in the above-described emitting layer, by which electrons and holes are accumulated on the interface of the emitting layers to converge the recombination region to the interface of the emitting layers, thereby enhancing the quantum yield.

The ease of injection of holes and the ease of injection of electrons to the emitting layer may be different from each other, and the hole transportability and the electron transportability, which are expressed by the mobilities of holes and electrons, respectively, in the emitting layer may be different from each other.

The emitting layer may be formed by a known method, such as a vapor deposition method, a spin coating method and a Langmuir-Blodgett method. The emitting layer may also be formed in such a manner that the material compounds are dissolved in a solvent along with a binder, such as a resin, to form a solution, which is then formed into a thin film by a spin coating method or the like.

The emitting layer is preferably a molecular deposited film. The molecular deposited film is a thin film formed by deposition of the material compounds from a gas phase state or a film formed by solidifying the material compounds from a solution state or a liquid phase state, and the molecular deposited film may be usually distinguished from a thin film formed by a Langmuir-Blodgett method (i.e., a molecular accumulated film) depending on the differences in the aggregated structure and the higher order structure or the functional difference derived therefrom.

The emitting layer preferably has a thickness of from 5 to 50 nm, more preferably from 7 to 50 nm, and further preferably from 10 to 50 nm. When the thickness is 5 nm or more, the formation of the emitting layer is facilitated, and when the thickness is 50 nm or less, the driving voltage may be prevented from being increased.

Dopant

The fluorescent dopant (fluorescent material) forming the emitting layer is a compound capable of emitting light from the singlet excited state and is not particularly limited as far as the compound emits light from the singlet excited state. Examples thereof include a fluorantene derivative, a stylylarylene derivative, a pyrene derivative, an arylacetylene derivative, a fluorene derivative, a boron complex, a perylene derivative, an oxadiazole derivative, an anthracene derivative, a stylylamine derivative and an arylamine derivative, preferred examples thereof include an anthracene derivative, a fluorantene derivative, a stylylamine derivative, an arylamine derivative, a stylylarylene derivative, a pyrene derivative and a boron complex, and more preferred examples thereof include an anthracene derivative, a fluorantene derivative, a stylylamine derivative, an arylamine derivative and a boron complex.

The content of the fluorescent dopant in the emitting layer is not particularly limited and may be appropriately determined depending on the purpose, and the content is preferably from 0.1 to 70% by mass, more preferably from 1 to 30% by mass, further preferably from 1 to 20% by mass, and still further preferably from 1 to 10% by mass. When the content of the fluorescent dopant is 0.1% by mass or more, sufficient light emission may be obtained, and when the content thereof is 70% by mass or less, the concentration quenching may be prevented from occurring.

Host

Examples of the host in the emitting layer include an anthracene derivative and a polycyclic aromatic skeleton-containing compound, and preferred examples thereof include an anthracene derivative.

As the host for the blue emitting layer, for example, an anthracene derivative represented by the following formula (5) may be used.

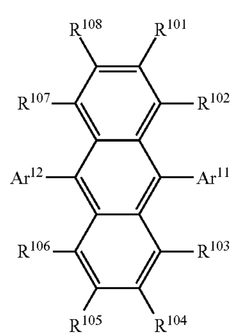

(5)

In the formula (5), $Ar^{11}$ and $Ar^{12}$ each independently represent a substituted or unsubstituted monocyclic group having from 5 to 50 ring atoms or a substituted or unsubstituted condensed ring group having from 8 to 50 ring atoms; and $R^{101}$ to $R^{108}$ each independently represent a group selected from a hydrogen atom, a substituted or unsubstituted monocyclic group having from 5 to 50 ring atoms, a substituted or unsubstituted condensed ring group having from 8 to 50 ring atoms, a group constituted by combining the monocyclic group and the condensed ring group, a substituted or unsubstituted alkyl group having from 1 to 50 carbon atoms, a substituted or unsubstituted cycloalkyl group having from 3 to 50 ring carbon atoms, a substituted or unsubstituted alkoxy group having from 1 to 50 carbon atoms, a substituted or unsubstituted aralkyl group having from 7 to 50 carbon atoms, a substituted or unsubstituted aryloxy group having from 6 to 50 ring carbon atoms, a substituted or unsubstituted silyl group, a halogen atom and a cyano group.

The monocyclic group in the formula (5) means a group that is constituted only by a cyclic structure without a condensed structure.

Preferred examples of the monocyclic group having from 5 to 50 ring atoms (preferably from 5 to 30 ring atoms, and more preferably from 5 to 20 ring atoms) include an aromatic group, such as a phenyl group, a biphenylyl group, a terphenylyl group and a quaterphenylyl group, and a heterocyclic group, such as a pyridyl group, a pyrazyl group, a pyrimidinyl group, a triazinyl group, a furyl group and a thienyl group.

More preferred examples of the monocyclic group among these include a phenyl group, a biphenylyl group and a terphenylyl group.

The condensed ring group in the formula (5) means a group containing two or more ring structures condensed to each other.

Preferred examples of the condensed ring group having from 8 to 50 ring atoms (preferably from 8 to 30 ring atoms, and more preferably from 8 to 20 ring atoms) include a condensed aromatic ring group, such as a naphthyl group, a phenanthryl group, an anthryl group, a chrysenyl group, a benzoanthryl group, a benzophenanthryl group, a triphenylenyl group, a benzochrysenyl group, an indenyl group, a fluorenyl group, a 9,9-dimethylfluorenyl group, a benzofluorenyl group, a dibenzofluorenyl group, a fluorantenyl group and a benzofluorantenyl group, and a condensed heterocyclic group, such as a benzofuranyl group, a benzothiophenyl group, an indolyl group, a dibenzofuranyl group, a dibenzothiophenyl group, a carbazolyl group, a quinolyl group and a phenanthrolinyl group.

More preferred examples of the condensed ring group among these include a naphthyl group, a phenanthryl group, an anthryl group, a 9,9-dimethylfluorenyl group, a fluorantenyl group, a benzoanthryl group, a dibenzothiophenyl group, a dibenzofuranyl group and a carbazolyl group.

Preferred examples of the substituent of $Ar^{11}$ and $Ar^{12}$ include the aforementioned monocyclic groups and condensed ring groups.

Specific examples of the alkyl group, the cycloalkyl group, the alkoxy group, the aralkyl group, the aryloxy group, the substituted silyl group and the halogen atom in the formula (5) include the groups described for $R^1$ to $R^{14}$ and the arbitrary substituents in the formulae (2) and (3).

Preferred specific examples of the anthracene derivative represented by the formula (5) are shown below.

The anthracene derivative represented by the formula (5) is preferably one of anthracene derivatives (A), (B) and (C) shown below, which may be selected depending on the structure and the demanded characteristics of the organic EL device, to which the anthracene derivative is applied.

Anthracene Derivative (A)

In the anthracene derivative (A), $Ar^{11}$ and $Ar^{12}$ in the formula (5) each independently represent a substituted or unsubstituted condensed ring group having from 8 to 50 ring atoms. The anthracene derivative may be classified into the case where $Ar^{11}$ and $Ar^{12}$ are the same substituted or unsubstituted condensed rings, and the case where $Ar^{11}$ and $Ar^{12}$ are different substituted or unsubstituted condensed rings.

The anthracene derivative having $Ar^{11}$ and $Ar^{12}$ in the formula (5) that are different substituted or unsubstituted condensed rings (including difference in the substitution positions) is particularly preferred, and preferred examples of the condensed ring are as described above. Among these, a naphthyl group, a phenanthryl group, a benzoanthryl group, a 9,9-dimethylfluorenyl group and a dibenzofuranyl group are preferred.

Anthracene Derivative (B)

In the anthracene derivative (B), one of $Ar^{11}$ and $Ar^{12}$ in the formula (5) represents a substituted or unsubstituted monocyclic group having from 5 to 50 ring atoms, and the other thereof represents a substituted or unsubstituted condensed ring group having from 8 to 50 ring atoms.

In a preferred embodiment thereof, $Ar^{12}$ represents a naphthyl group, a phenanthryl group, a benzoanthryl group, a 9,9-dimethylfluorenyl group or a dibenzofuranyl group, and $Ar^{11}$ represents a phenyl group having a monocyclic group or a condensed ring group substituted thereon.

Preferred examples of the monocyclic group and the condensed ring group are as described above.

In another preferred embodiment thereof, $Ar^{12}$ represents a condensed ring group, and $Ar^{11}$ represents an unsubstituted phenyl group. In this case, particularly preferred examples of the condensed ring group include a phenanthryl group, a 9,9-dimethylfluorenyl group, a dibenzofuranyl group and a benzoanthryl group.

Anthracene Derivative (C)

In the anthracene derivative (C), $Ar^{11}$ and $Ar^{12}$ in the formula (5) each independently represent a substituted or unsubstituted monocyclic group having from 5 to 50 ring atoms.

In a preferred embodiment thereof, $Ar^{11}$ and $Ar^{12}$ each represent a substituted or unsubstituted phenyl group. More preferred embodiment thereof include the case where $Ar^{11}$ represents an unsubstituted phenyl group, and $Ar^{12}$ represents a phenyl group having a monocyclic group or a condensed ring group substituted thereon, and the case where $Ar^{11}$ and $Ar^{12}$ each independently represent a phenyl group having a monocyclic group or a condensed ring group substituted thereon.

Preferred examples of the monocyclic group and the condensed ring group as the substituent are as described above. More preferred examples thereof include a phenyl group and a biphenyl group as a monocyclic group as the substituent, and a naphthyl group, a phenanthryl group, a 9,9-dimethylfluorenyl group, a dibenzofuranyl group and a benzoanthryl group as a condensed ring as the substituent.

Specific examples of the anthracene derivative represented by the formula (5) are shown below.

EM1

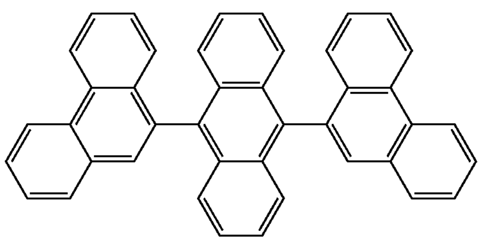

EM2

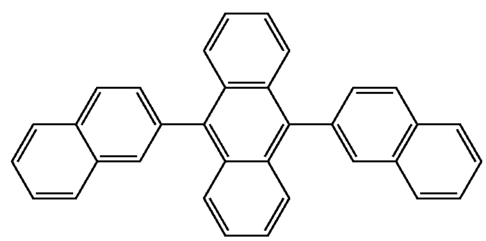

EM3

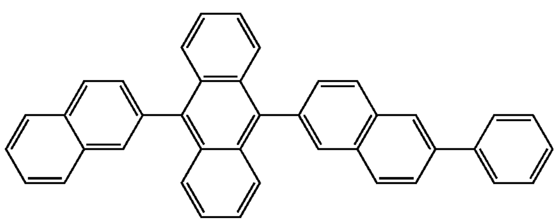

EM4

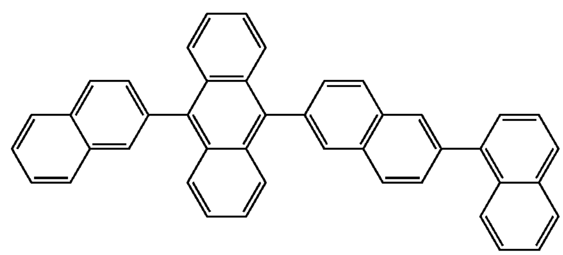

EM5

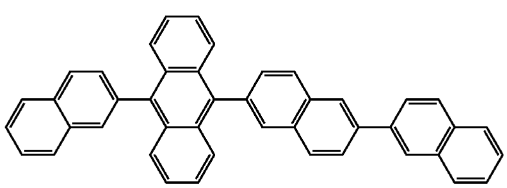

EM6

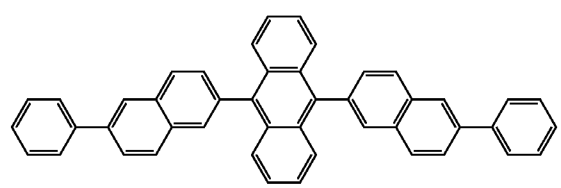

EM7

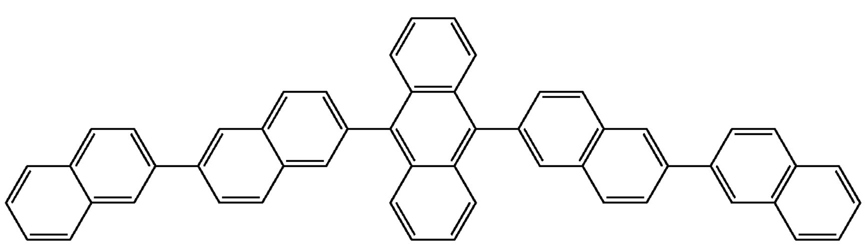

-continued
EM8
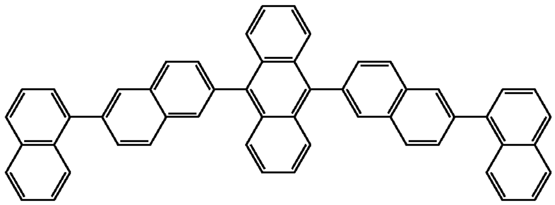
EM9
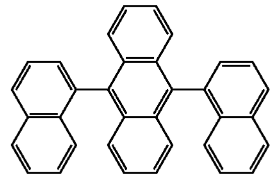
EM10
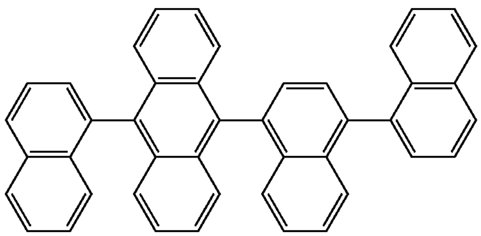
EM11
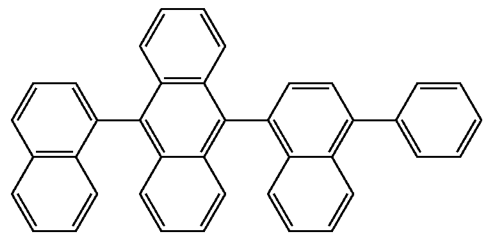
EM12
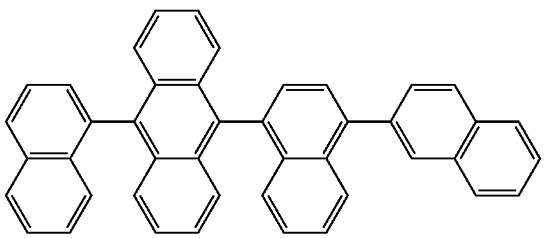
EM13
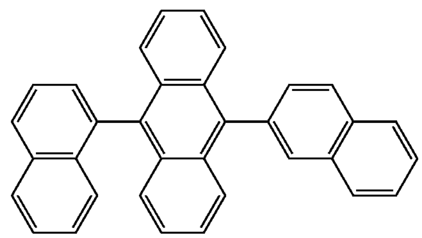
EM14
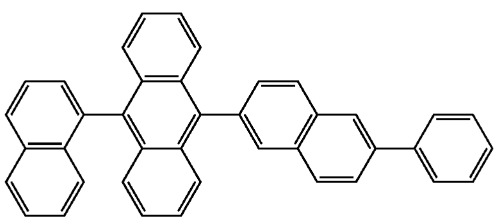
EM15
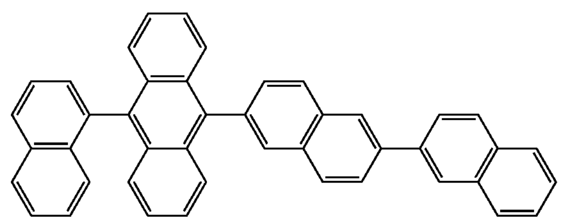
EM16
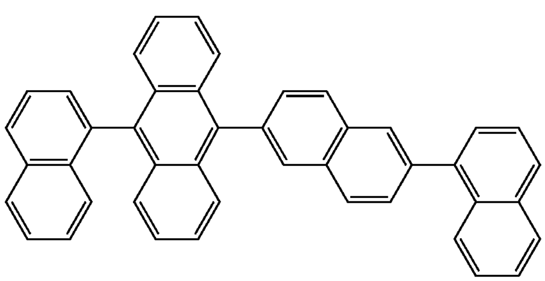
EM17
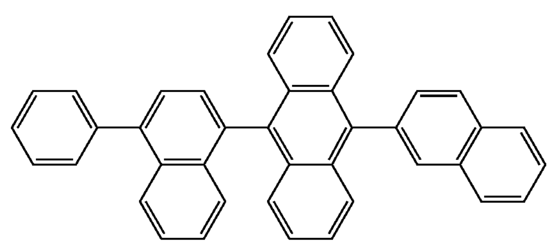
EM18
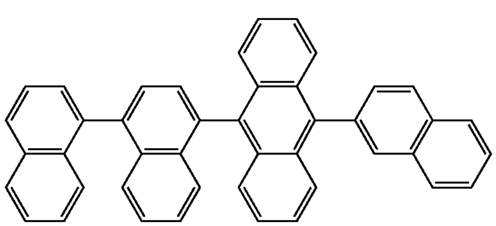
EM19
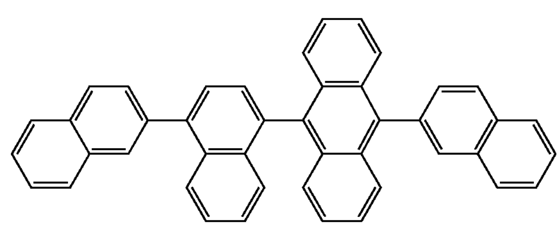

-continued
EM20
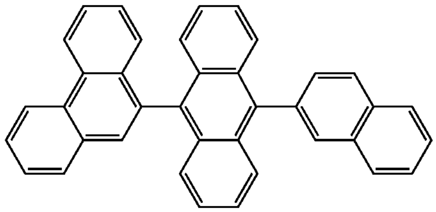
EM21
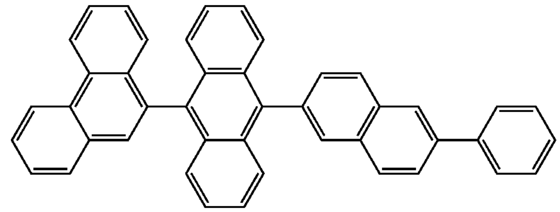
EM22
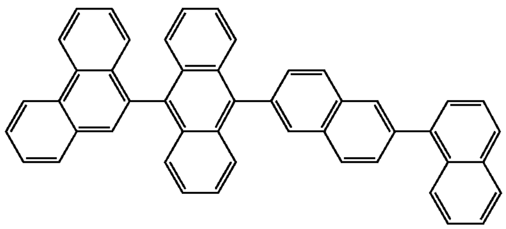
EM23
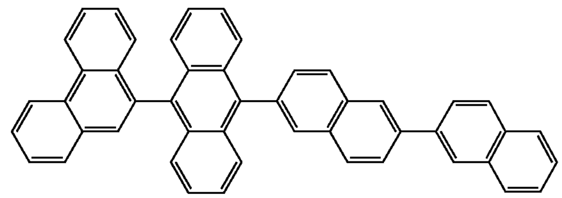
EM24
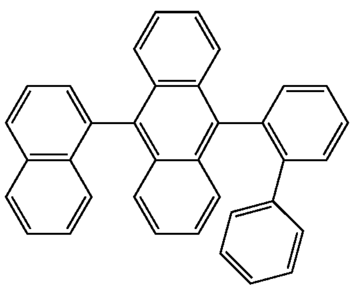
EM25
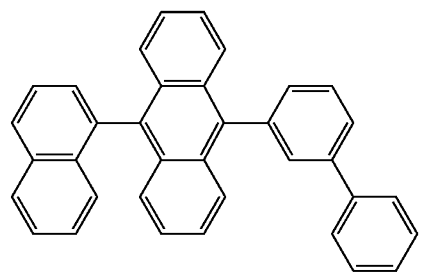
EM26
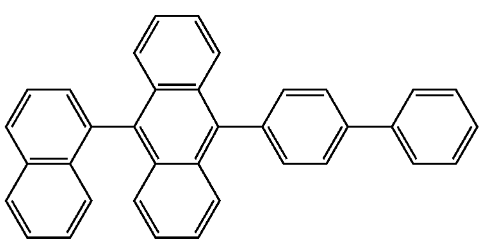
EM27
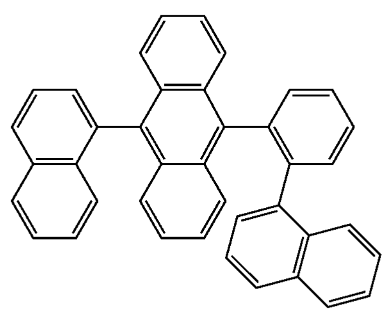
EM28
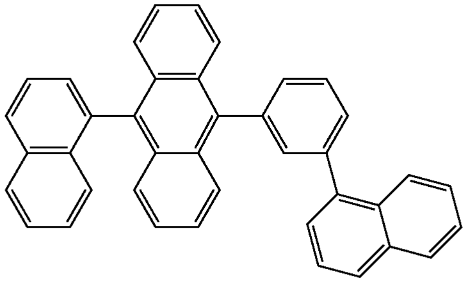
EM29
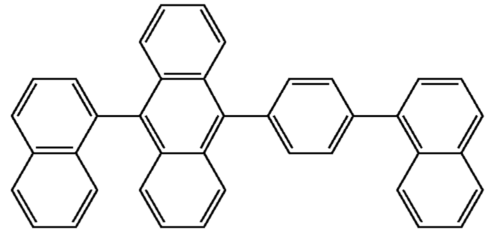

-continued
EM30
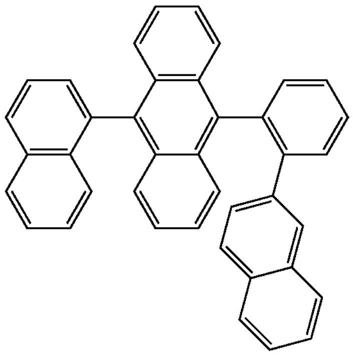
EM31
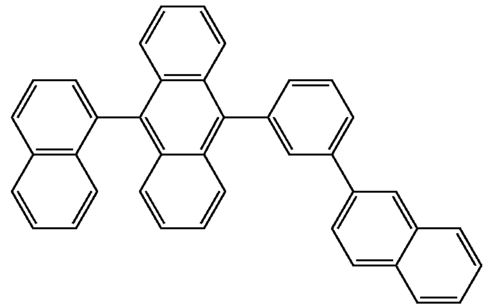
EM32
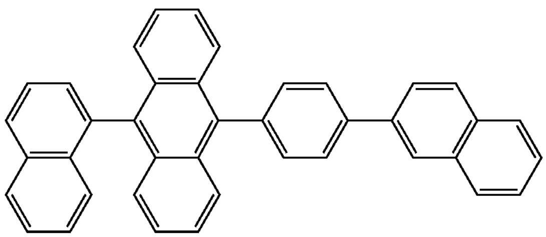
EM33
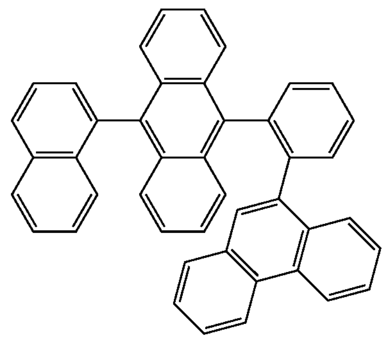
EM34
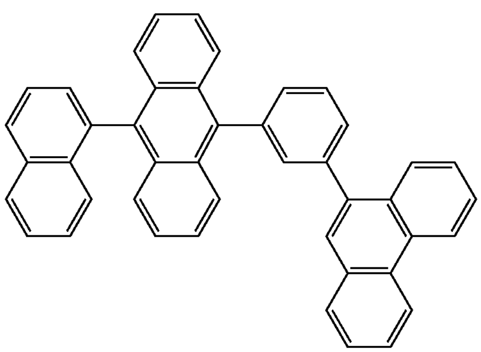
EM35
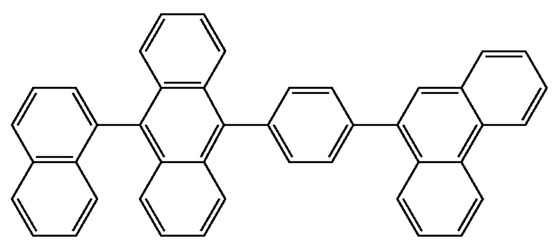
EM36
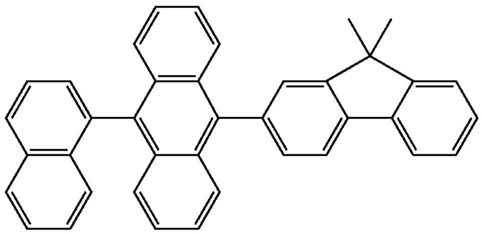
EM37
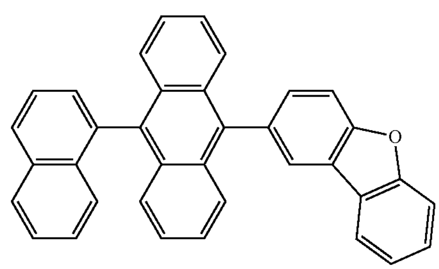

-continued
EM38
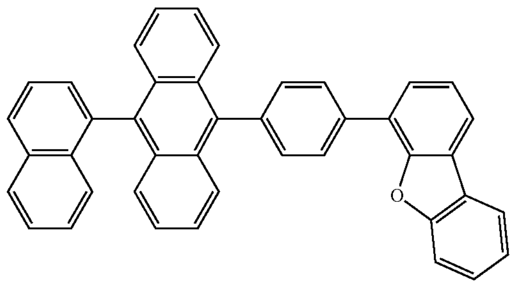
EM39
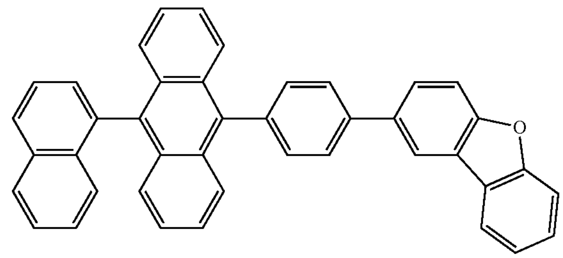
EM40
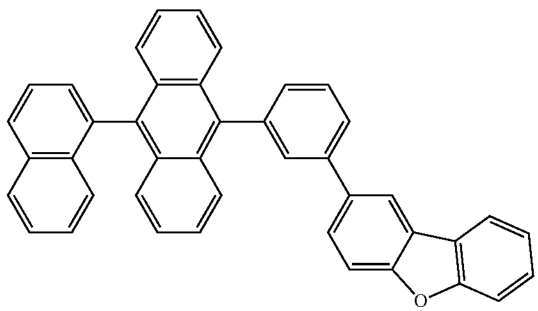
EM41
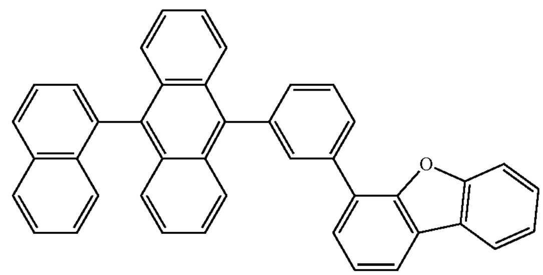
EM42
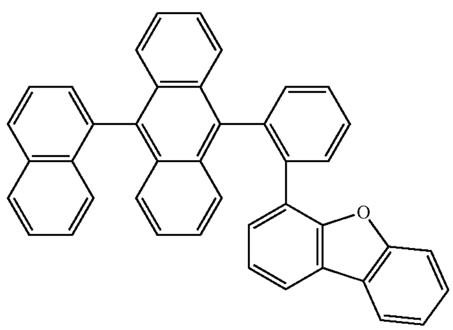
EM43
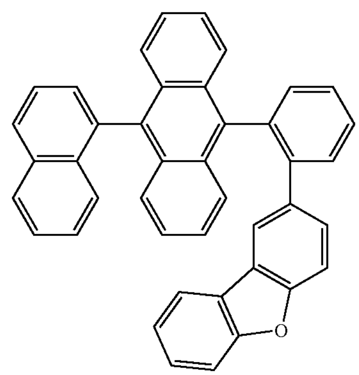
EM44
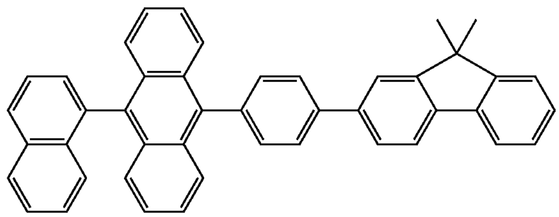
EM45
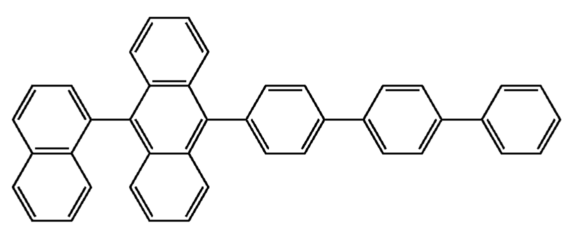

-continued
EM46
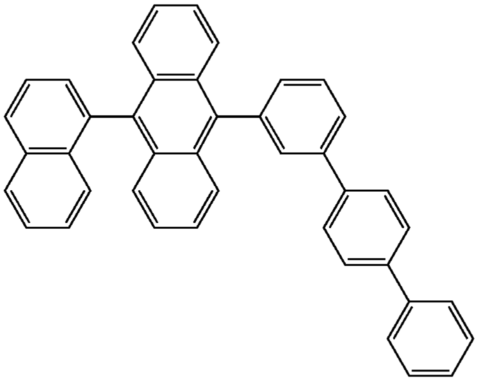
EM47
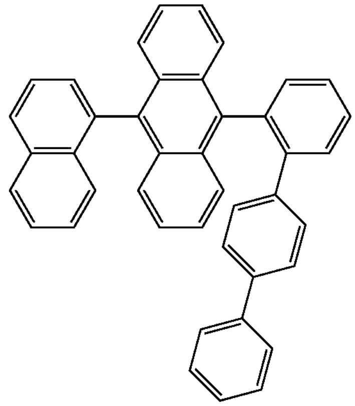
EM48
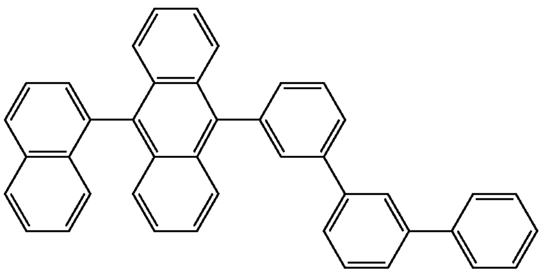
EM49
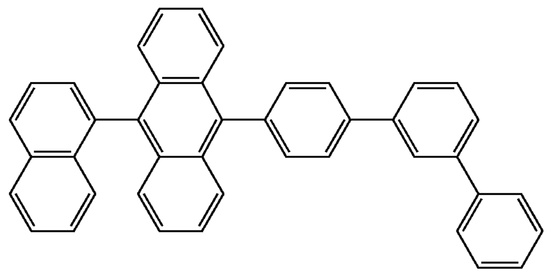
EM50
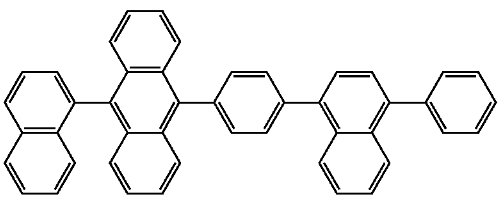
EM51
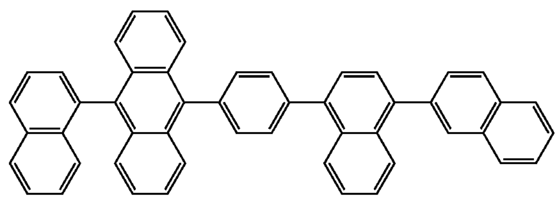
EM52
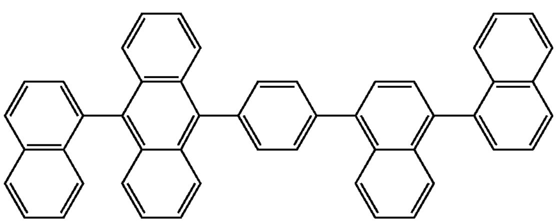
EM53
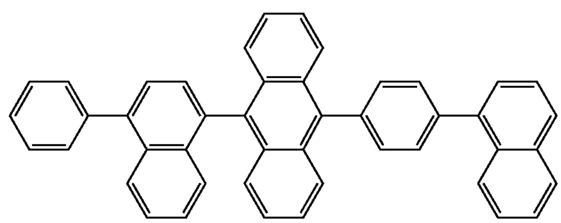
EM54
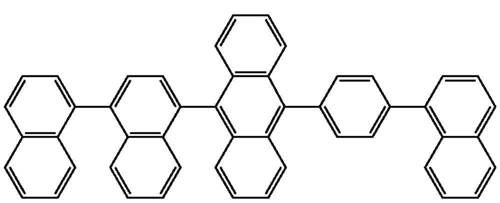
EM55
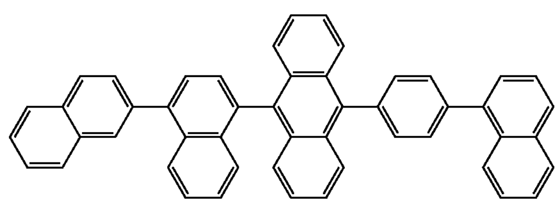
EM56
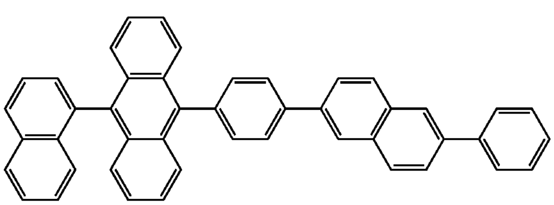
EM57
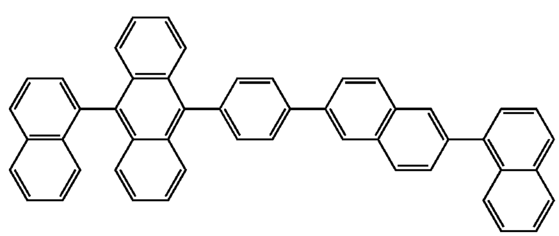

-continued
EM58
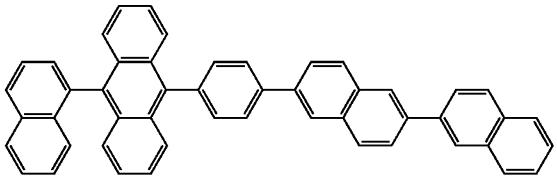
EM59
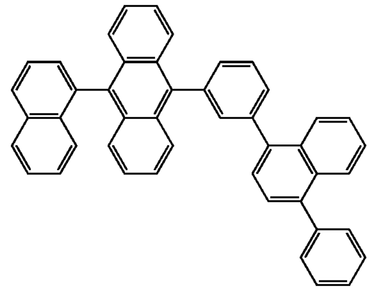
EM60
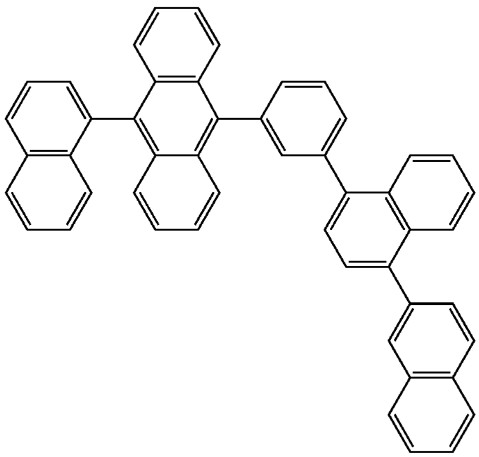
EM61
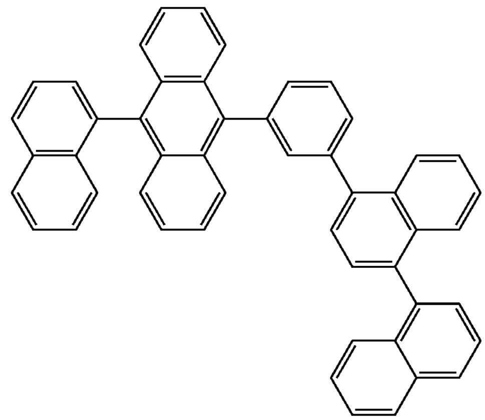
EM62
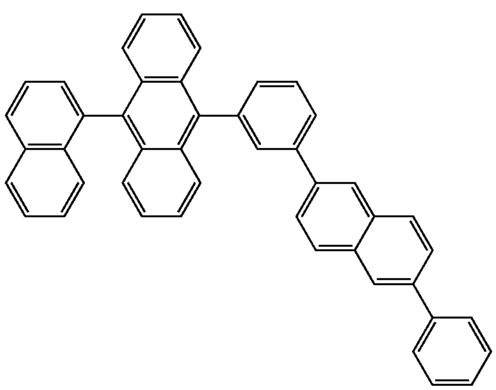
EM63
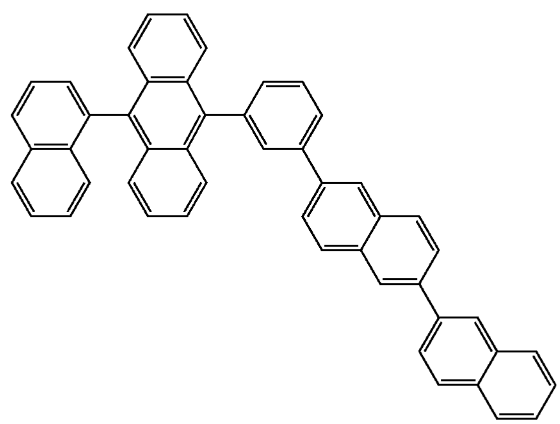
EM64
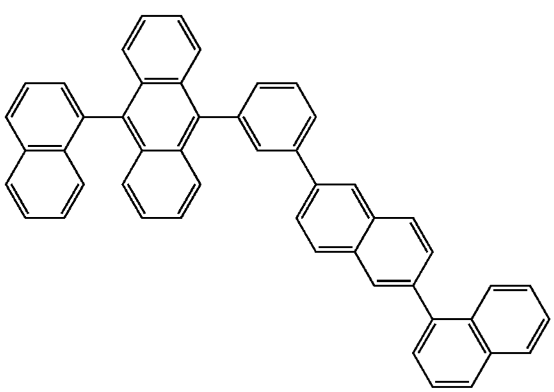
EM65
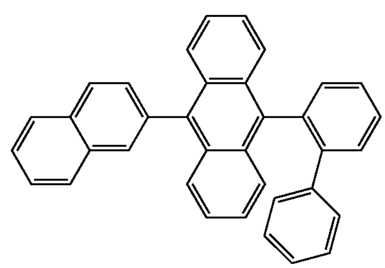

-continued
EM66
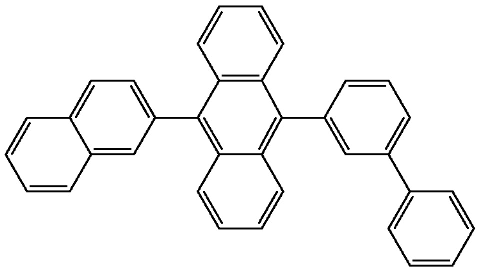
EM67
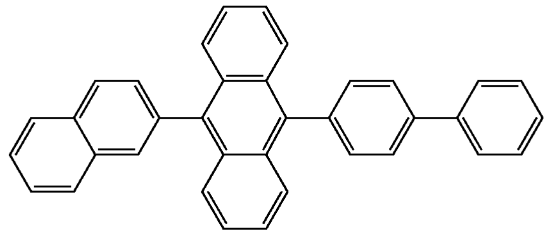
EM68
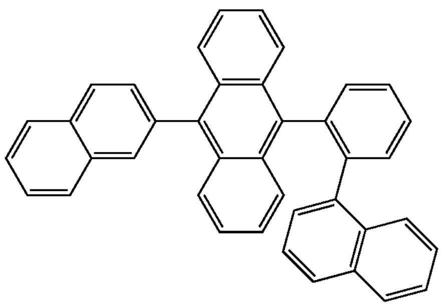
EM69
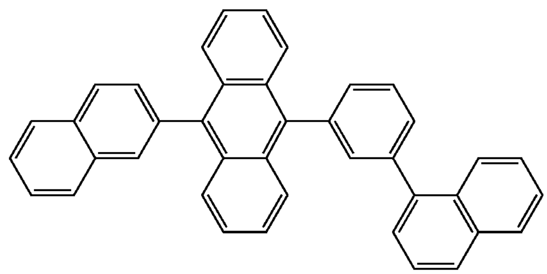
EM70
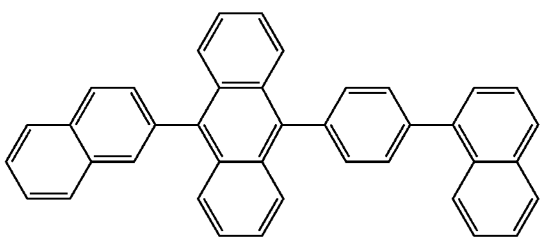
EM71
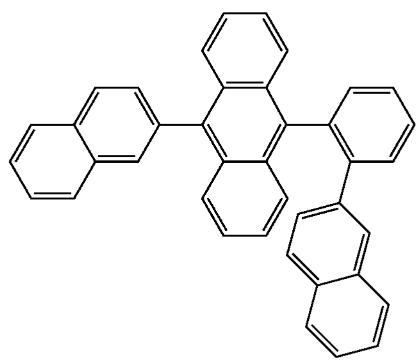
EM72
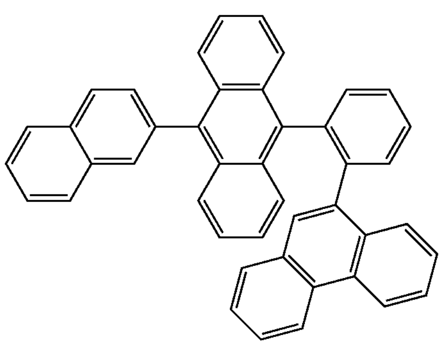
EM73
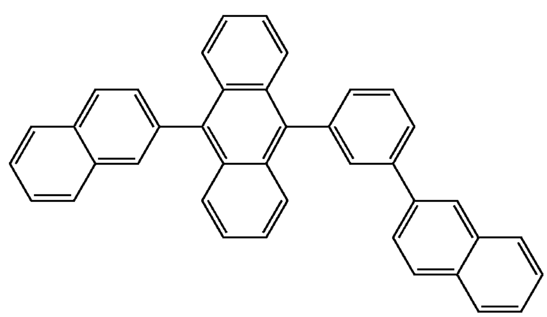

-continued
EM74
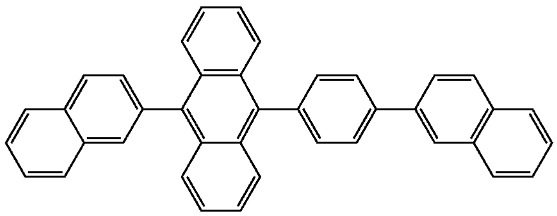
EM75
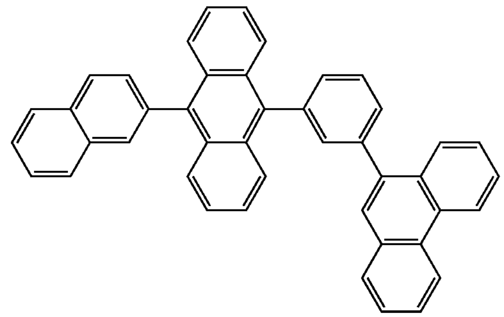
EM76
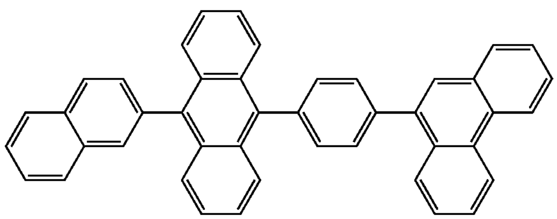
EM77
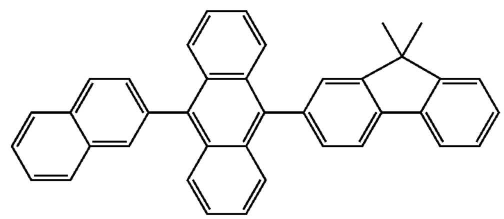
EM78
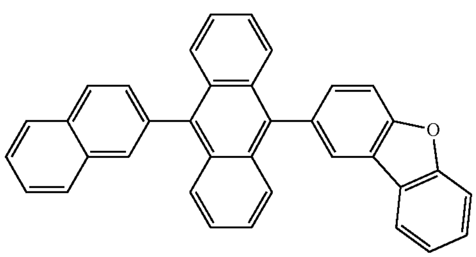
EM79
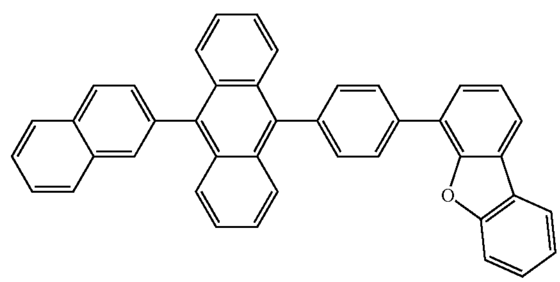
EM80
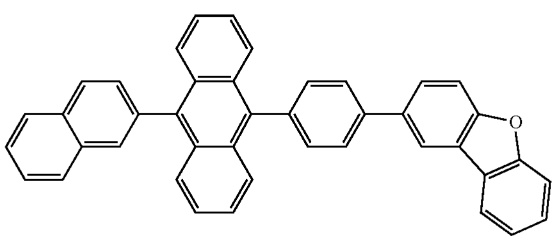
EM81
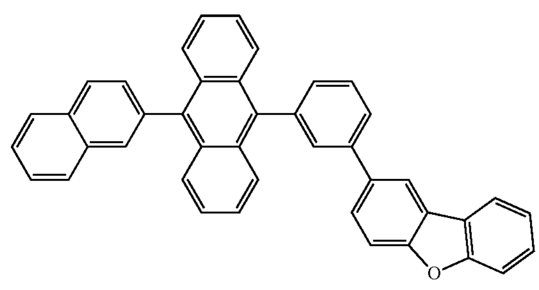
EM82
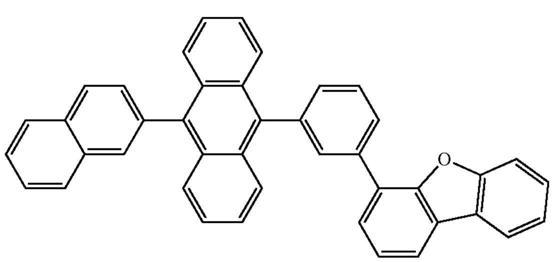
EM83
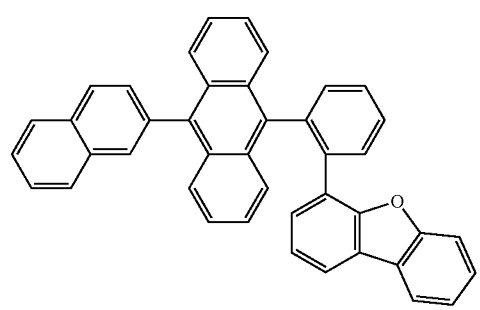

-continued
EM84
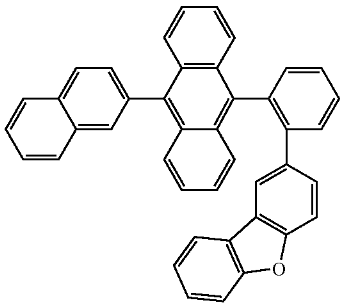
EM85
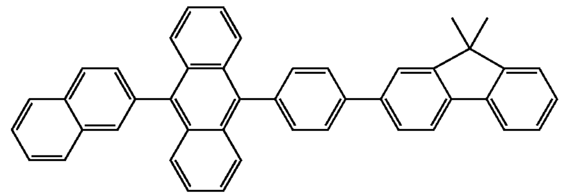
EM86
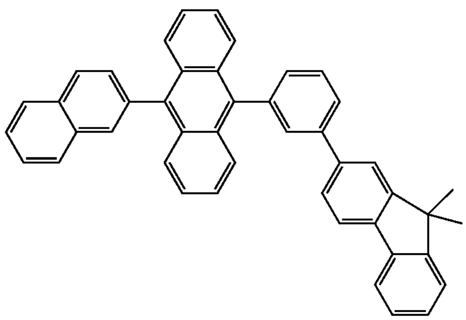
EM87
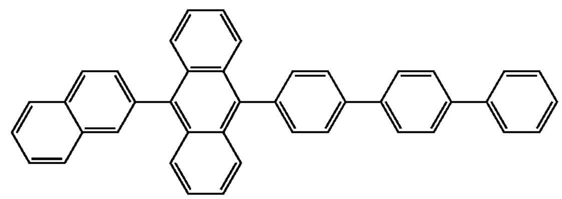
EM88
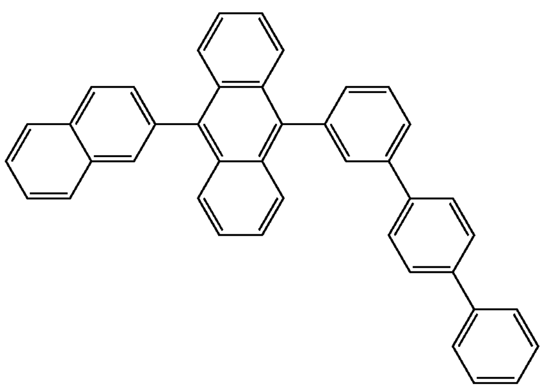
EM89
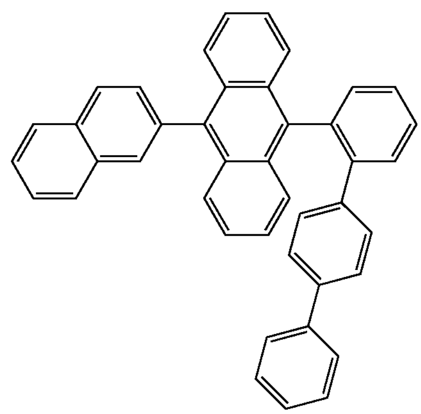
EM90
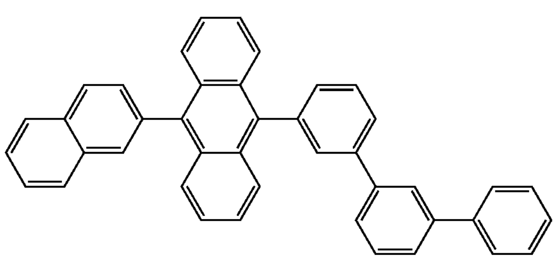
EM91
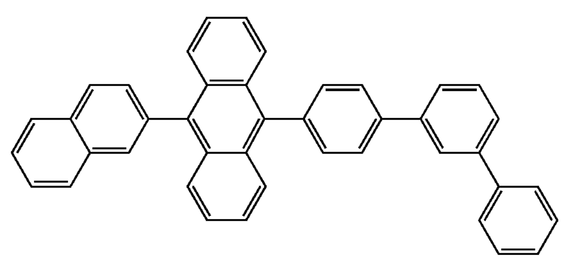
EM92
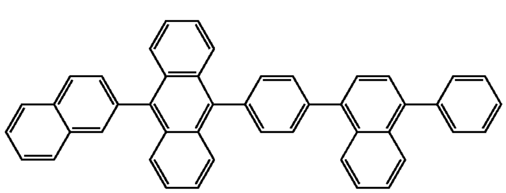
EM93
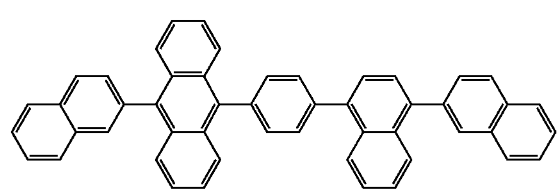

-continued
EM94
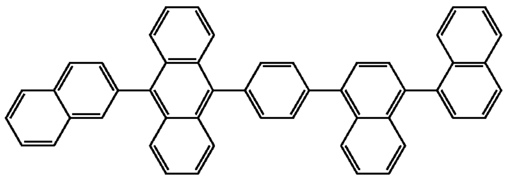
EM95
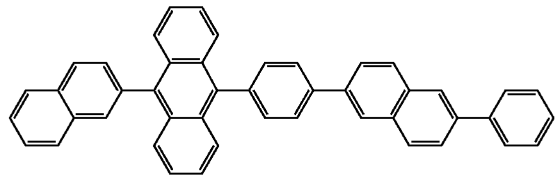
EM96
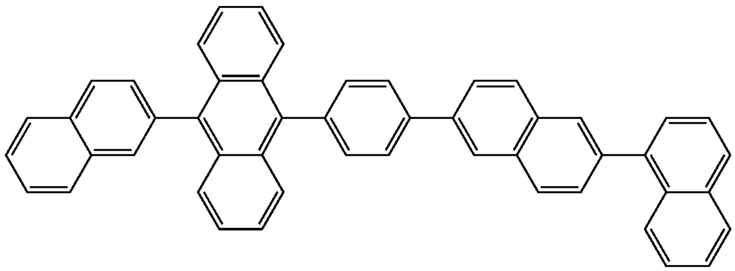
EM97
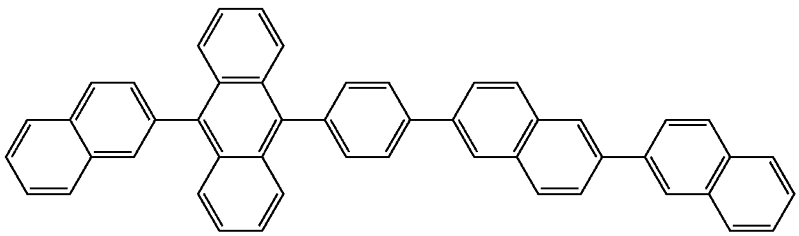
EM98
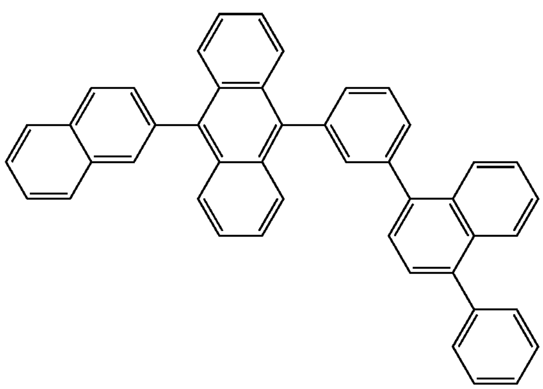
EM99
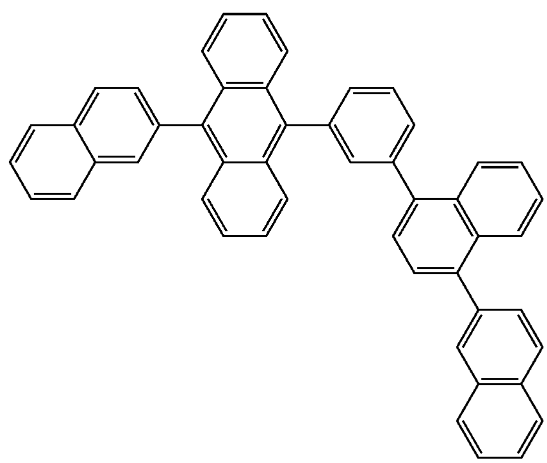
EM100
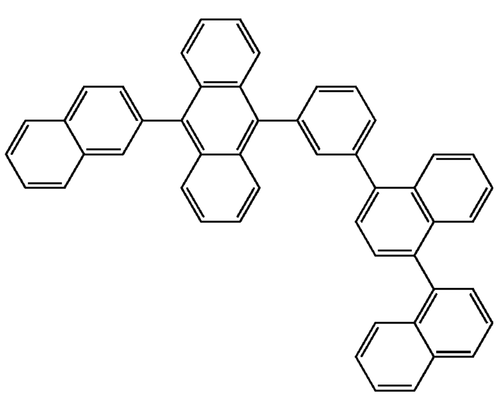
EM101
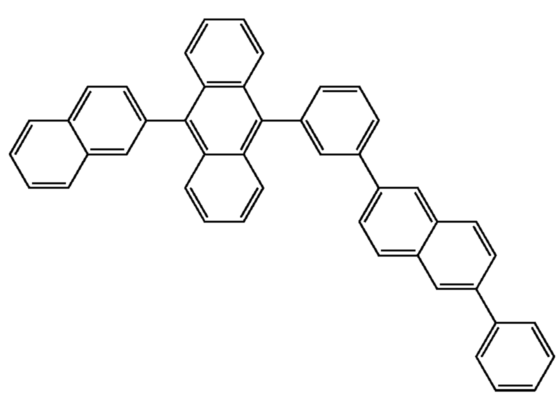

-continued
EM102
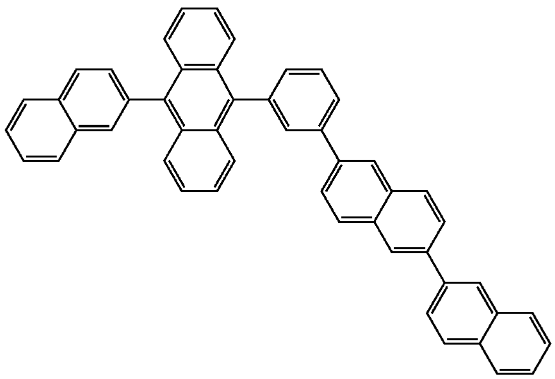
EM103
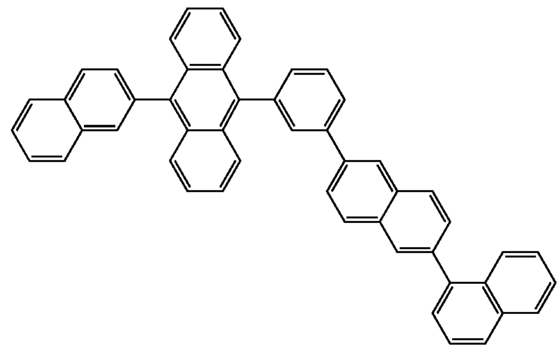
EM104
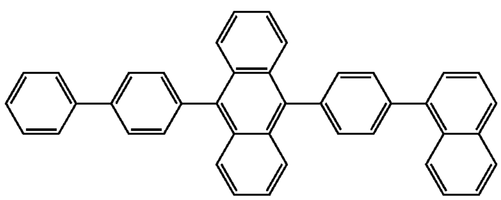
EM105
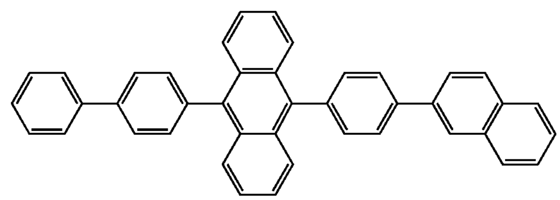
EM106
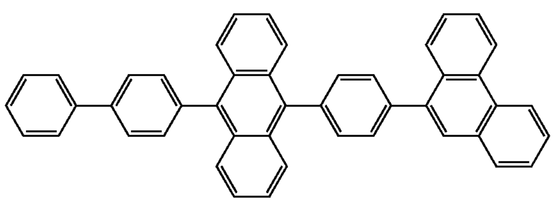
EM107
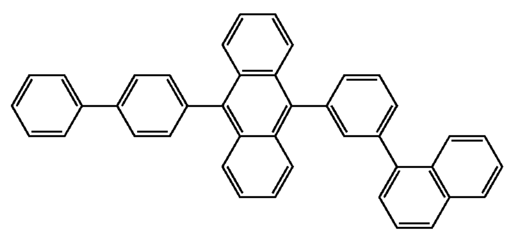
EM108
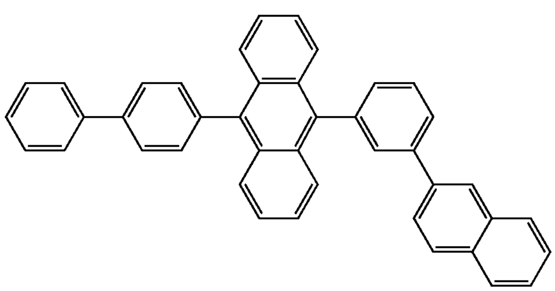
EM109
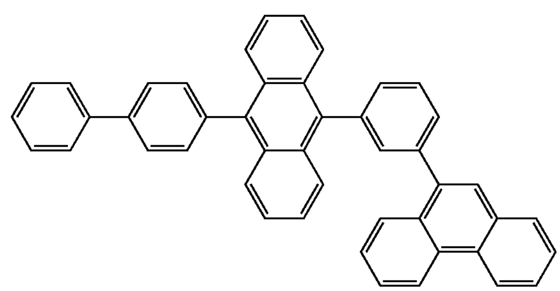
EM110
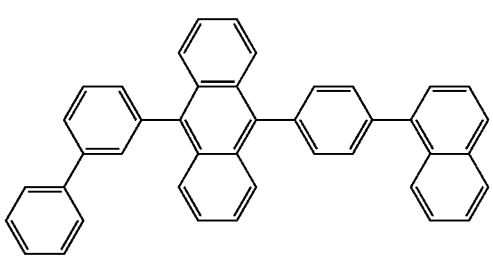
EM111
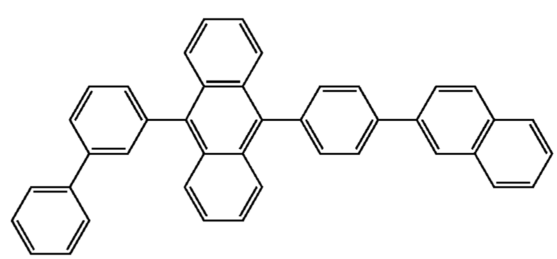

-continued
EM112
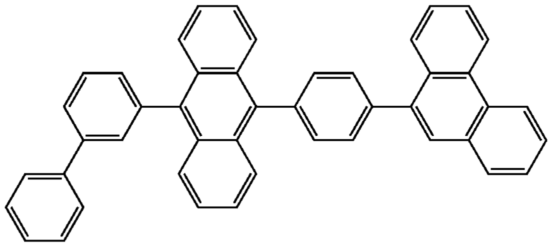
EM113
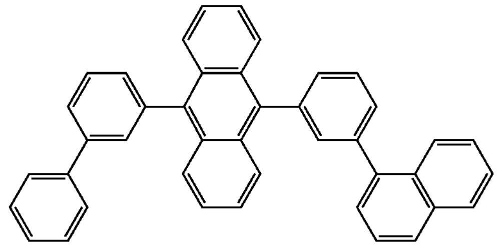
EM114
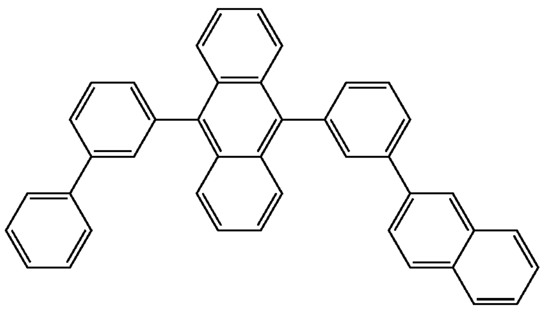
EM115
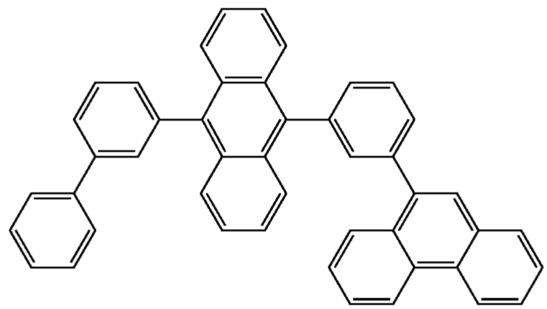
EM116
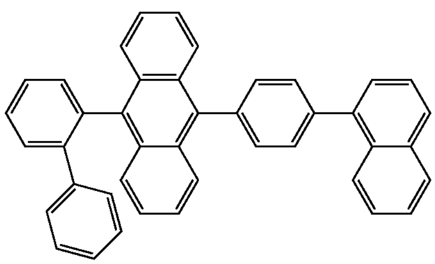
EM117
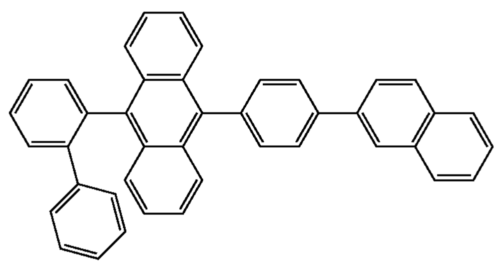
EM118
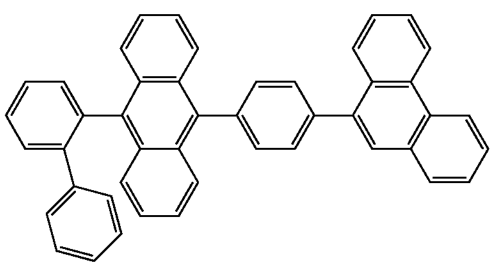
EM119
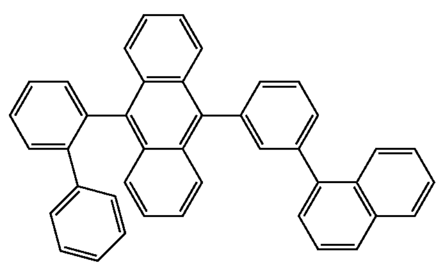
EM120
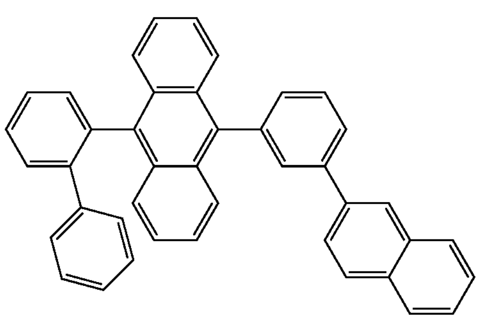
EM121
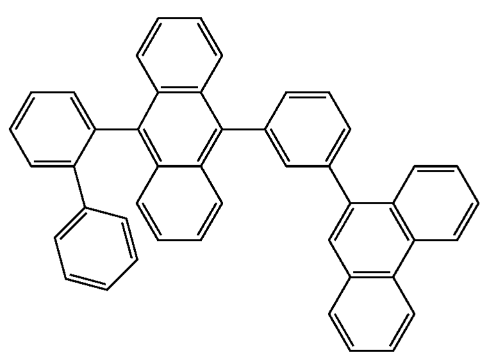

-continued
EM122
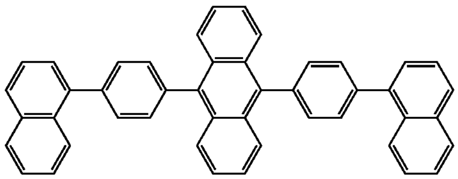
EM123
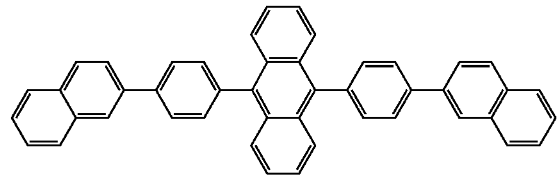
EM124
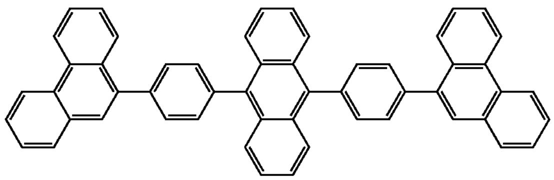
EM125
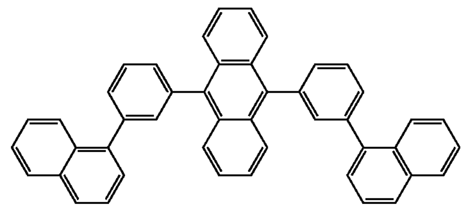
EM126
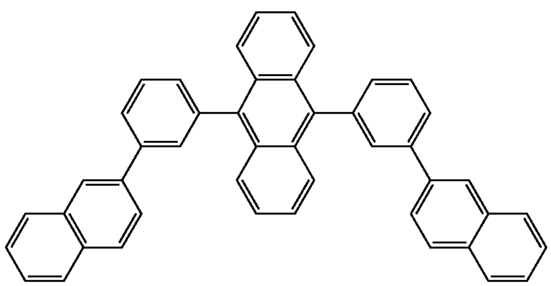
EM127
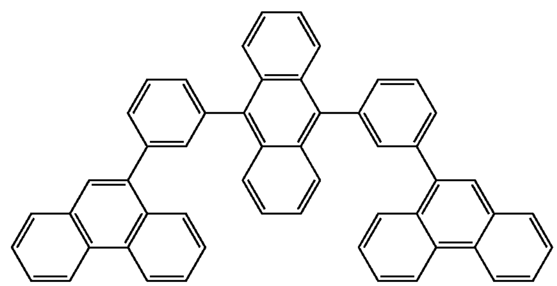
EM128
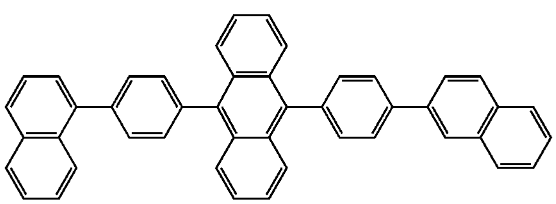
EM129
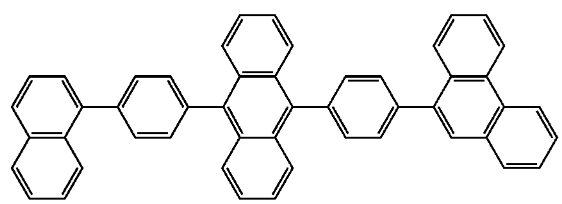
EM130
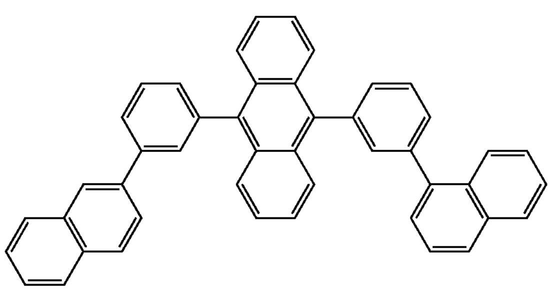
EM131
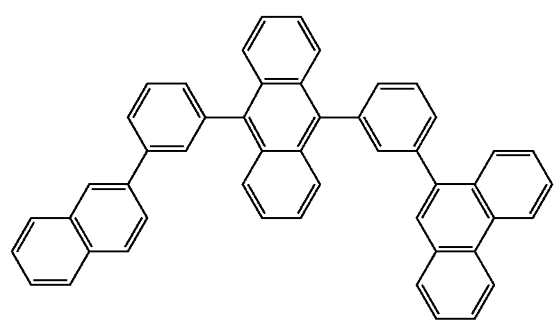
EM132
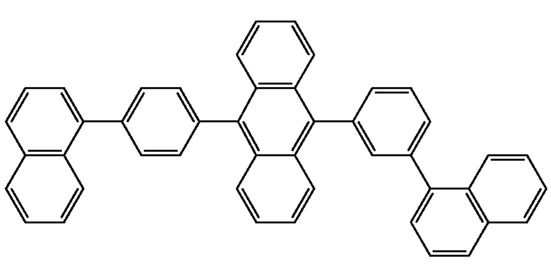
EM133
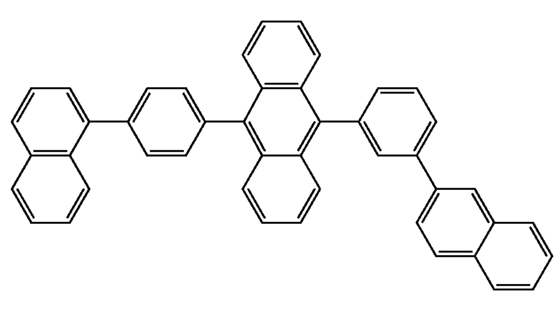

-continued
EM134
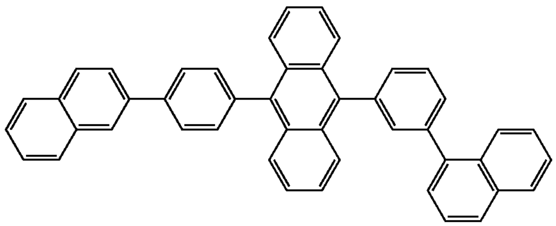
EM135
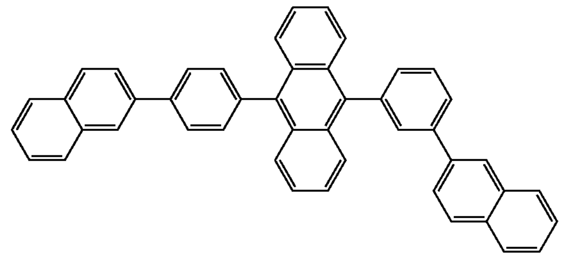
EM136
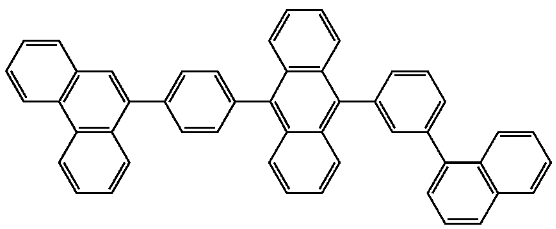
EM137
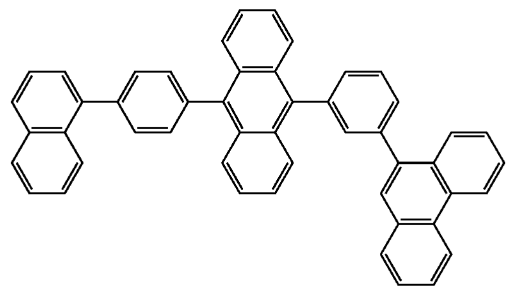
EM138
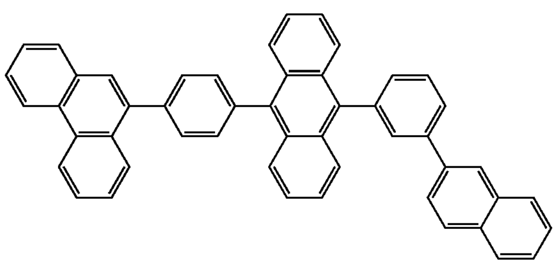
EM139
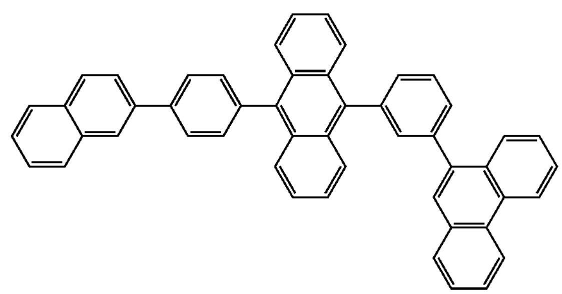
EM140
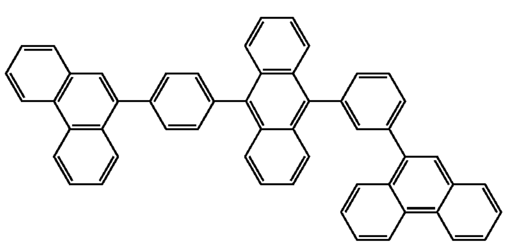
EM141
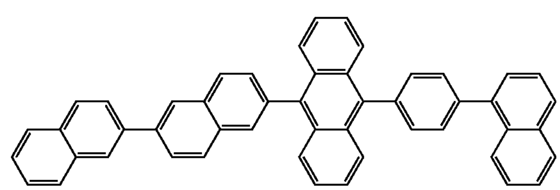
EM142
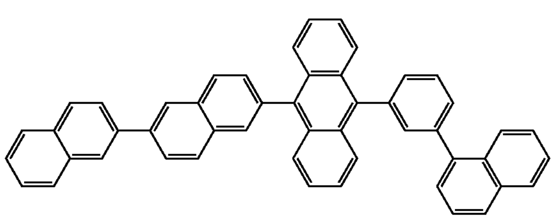
EM143
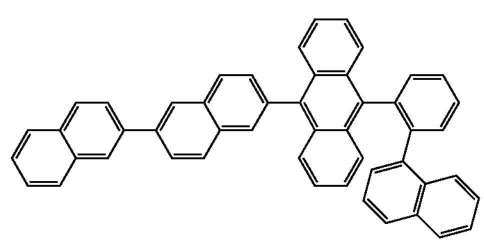

-continued
EM144
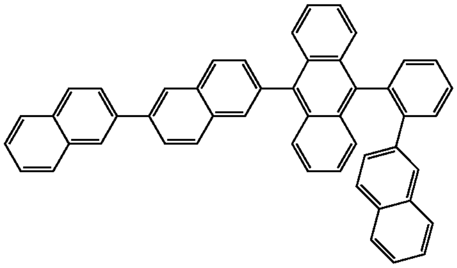
EM145
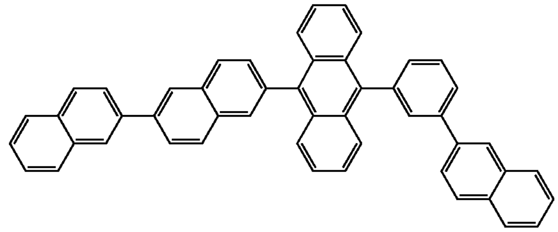
EM146
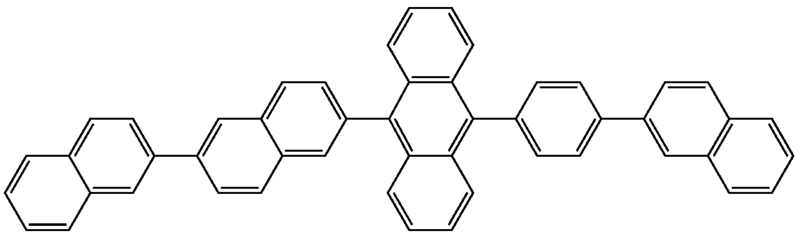
EM147
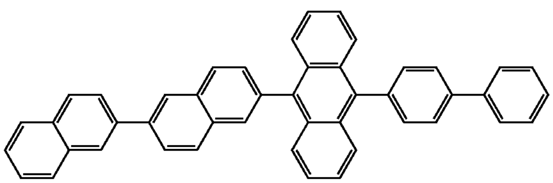
EM148
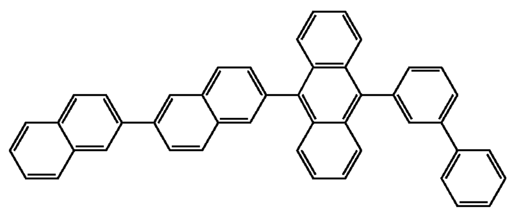
EM149
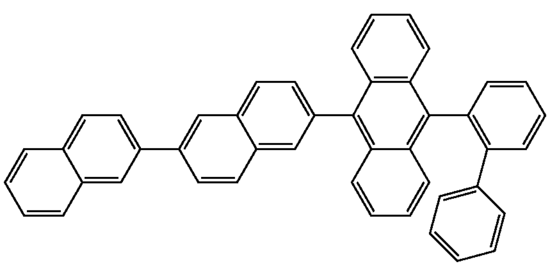
EM150
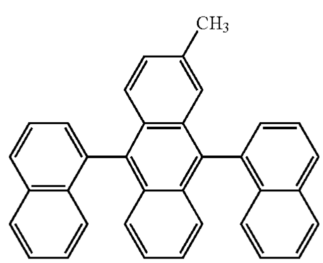
EM151
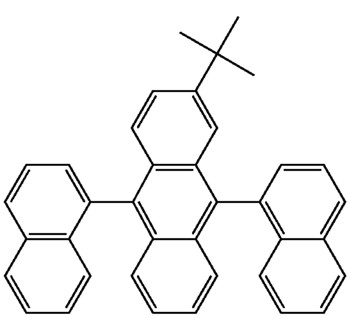
EM152
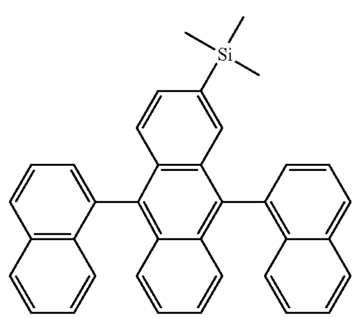

-continued
EM153
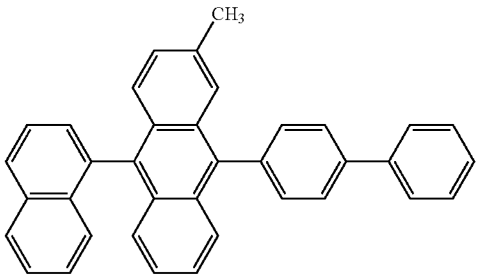
EM154
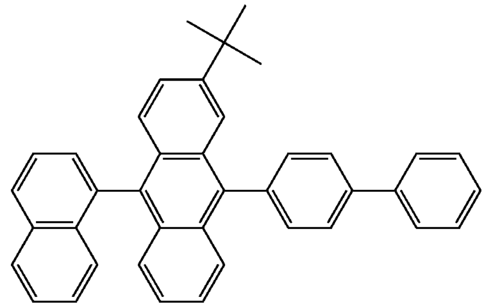
EM155
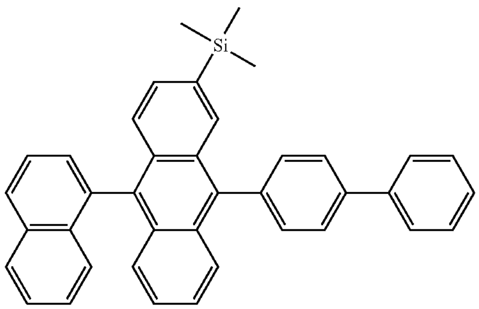
EM156
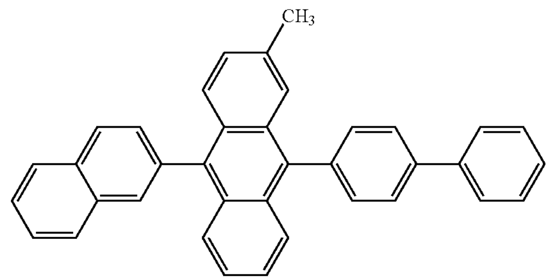
EM157
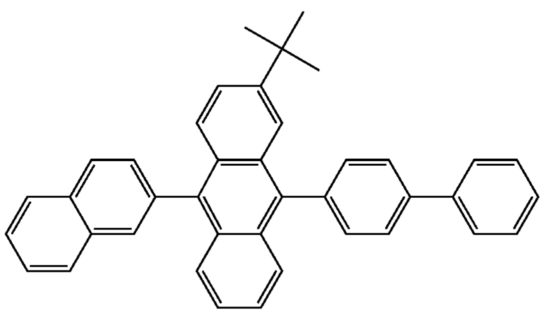
EM158
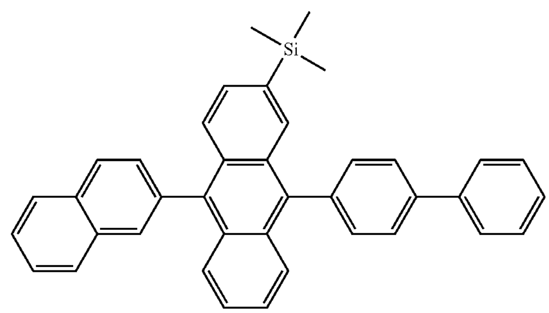
EM159
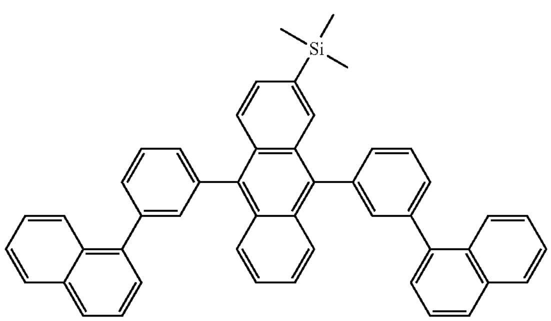
EM160
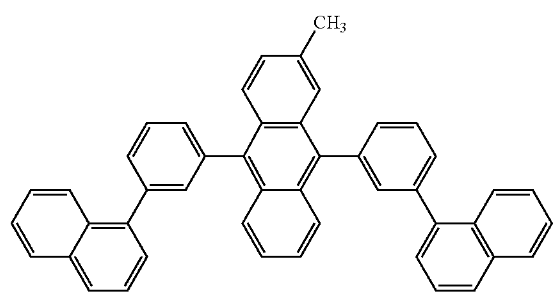
EM161
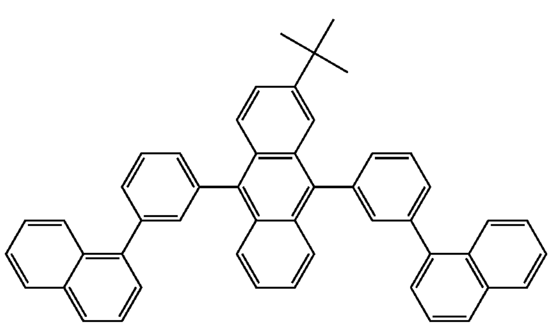
EM162
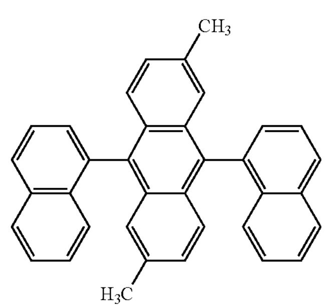

-continued
EM163
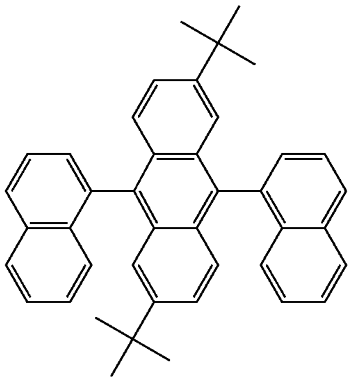
EM164
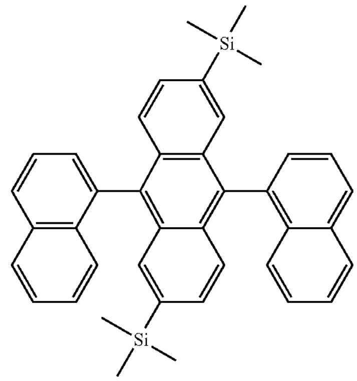
EM165
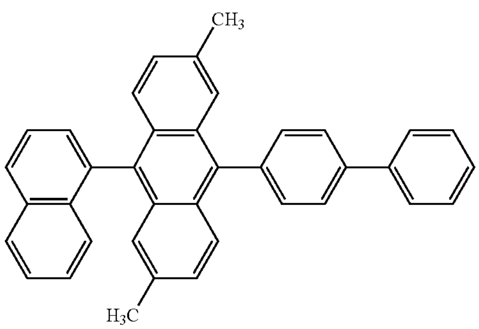
EM166
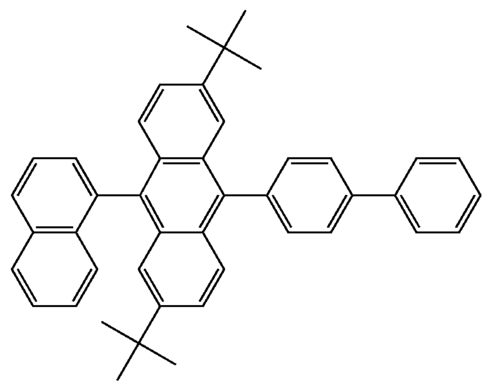
EM167
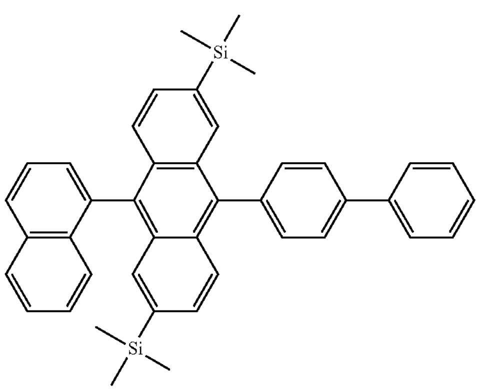
EM168
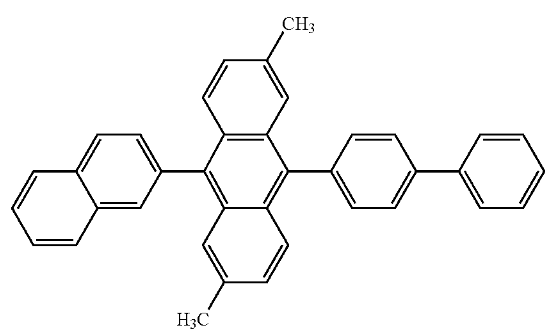
EM169
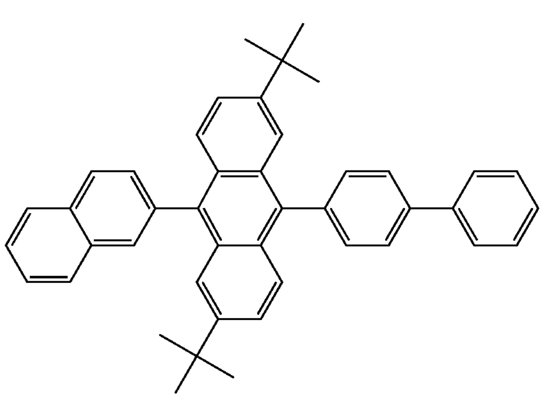
EM170
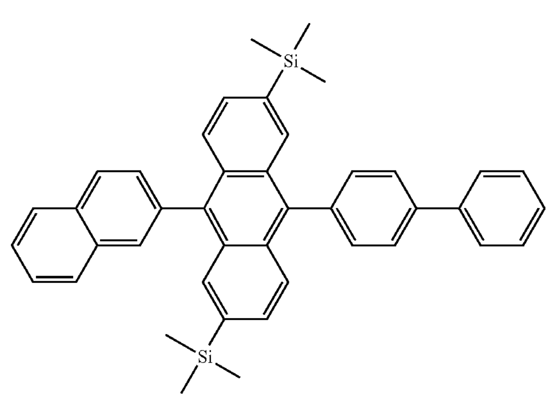

-continued
EM171
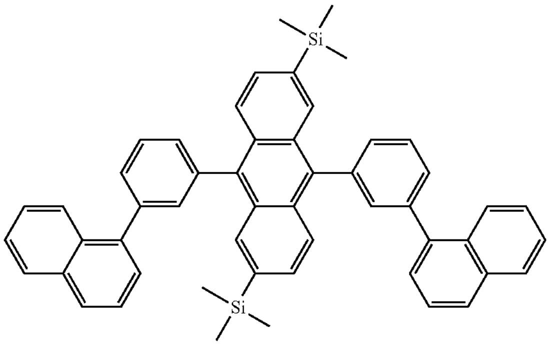
EM172
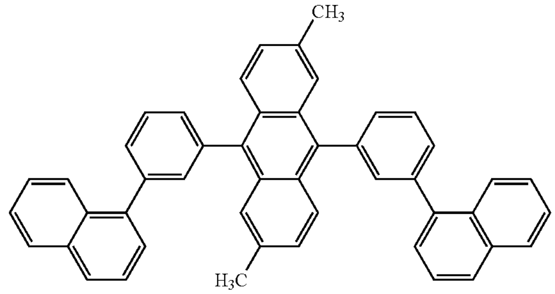
EM173
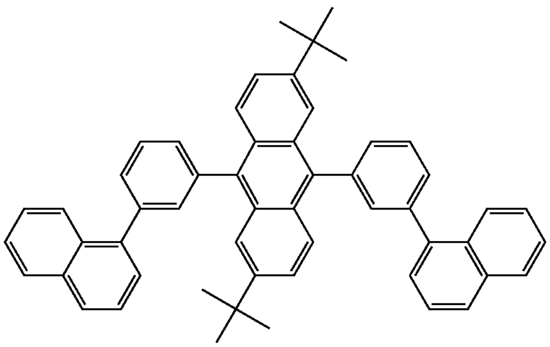
EM174
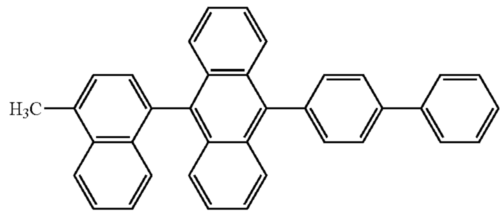
EM175
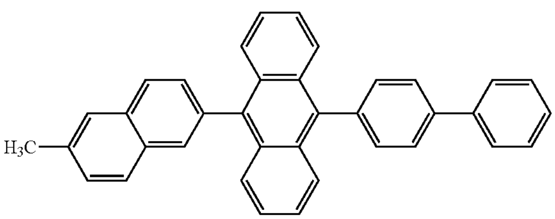
EM176
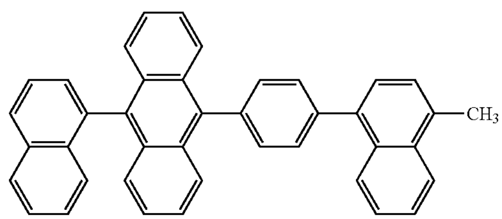
EM177
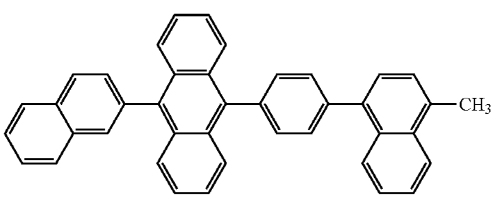
EM178
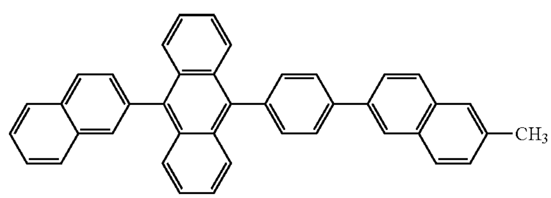
EM179
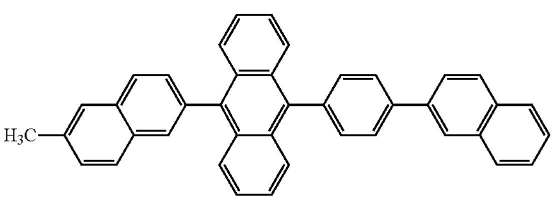
EM180
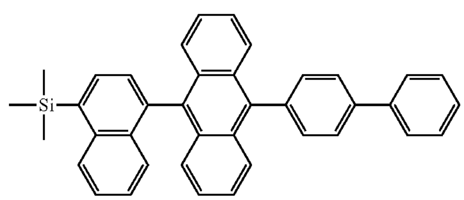
EM181
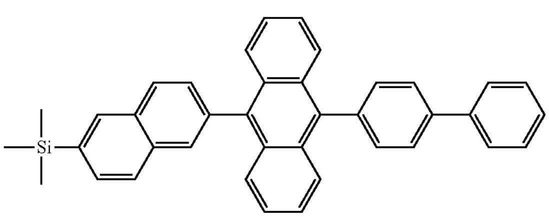
EM182
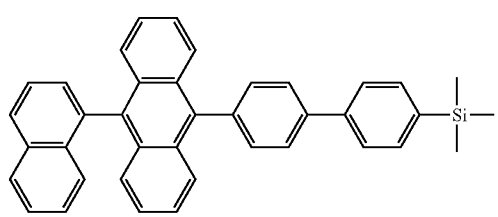

-continued
EM183
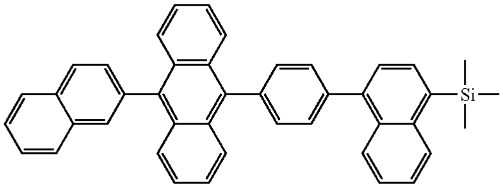
EM184
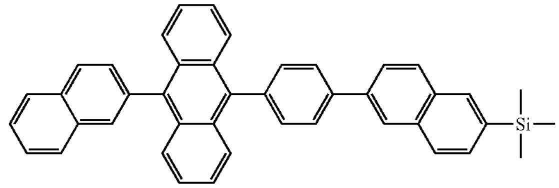
EM185
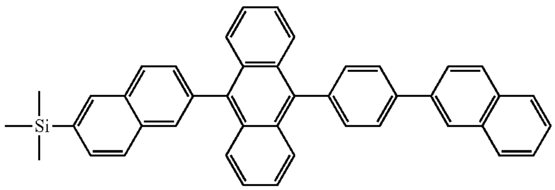
EM186
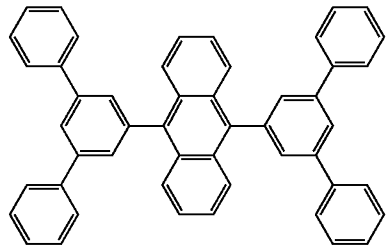
EM187
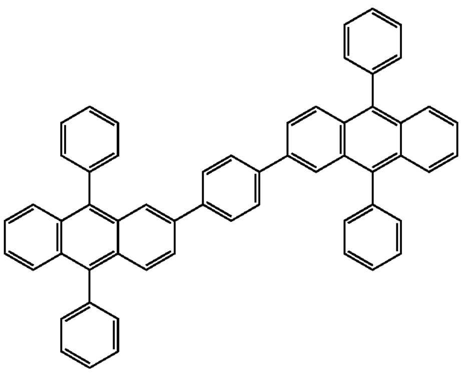
EM188
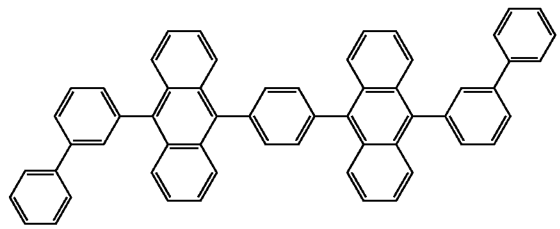
EM189
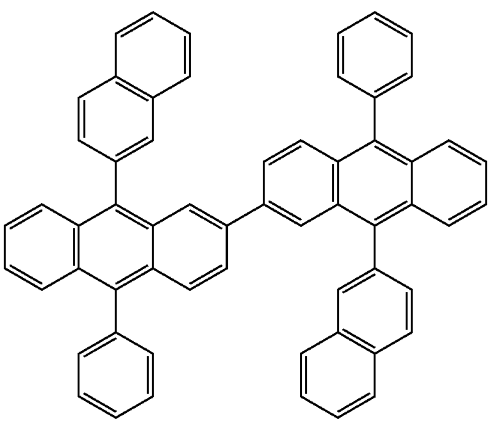
EM190
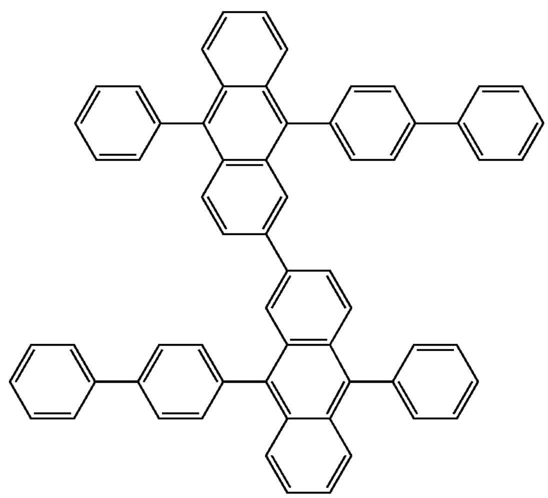
EM191
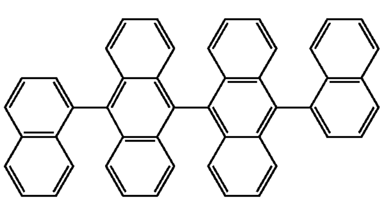
EM192
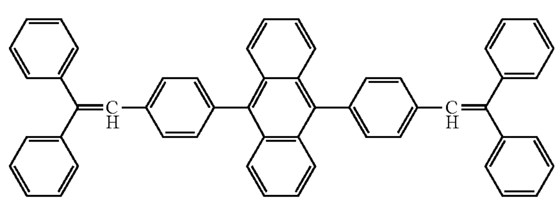

-continued
EM193
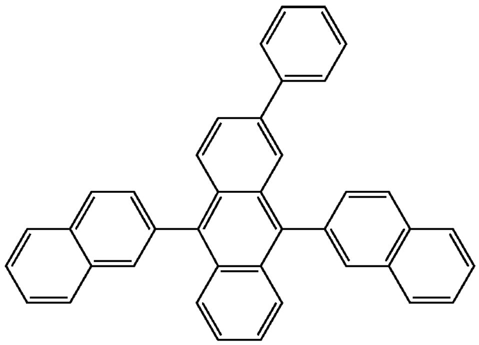
EM194
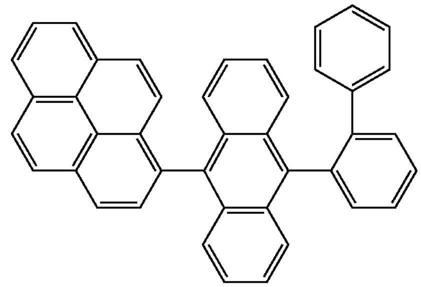
EM195
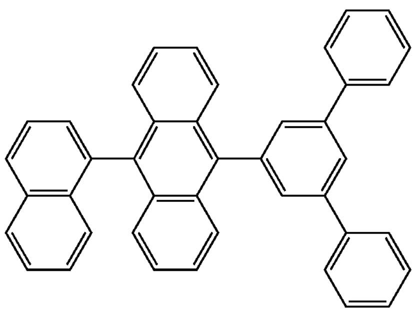
EM196
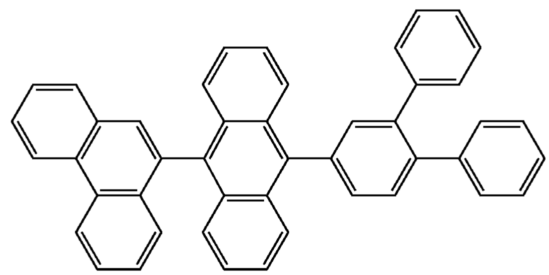
EM197
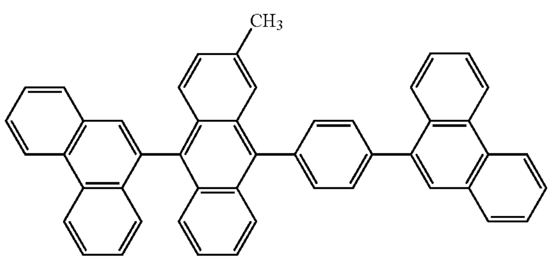
EM198
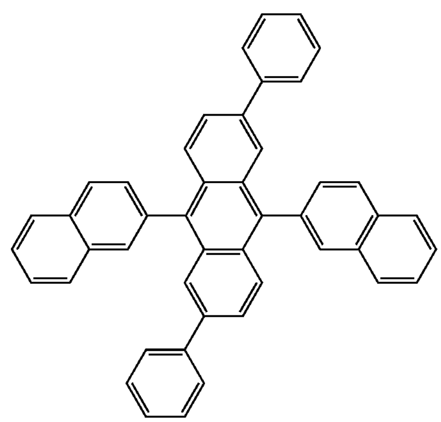
EM199
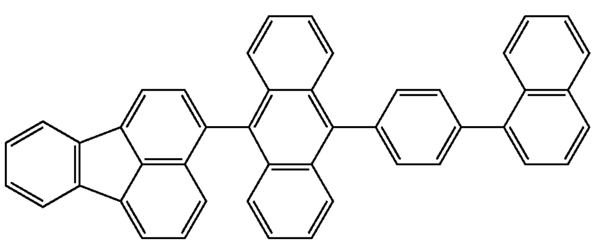
EM200
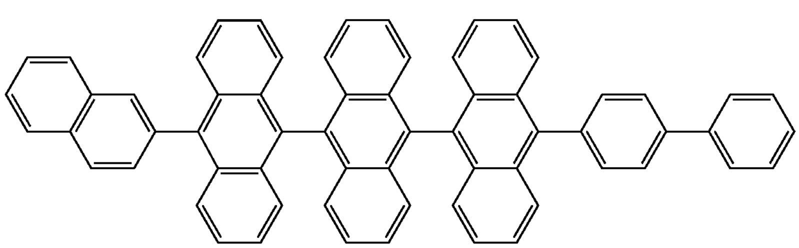

-continued
EM201
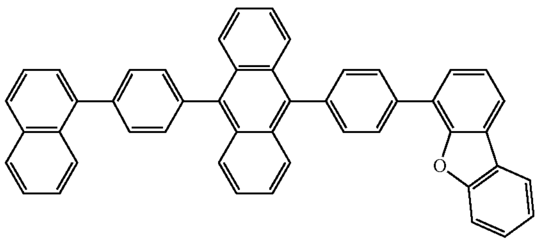
EM202
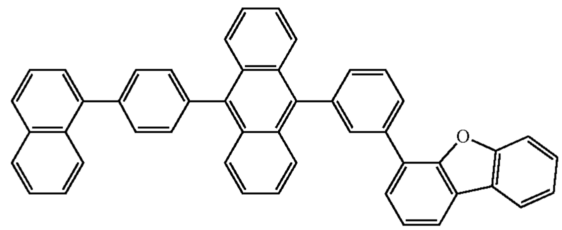
EM203
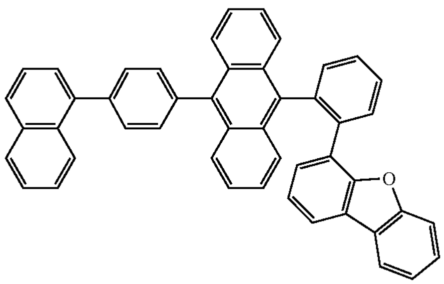
EM204
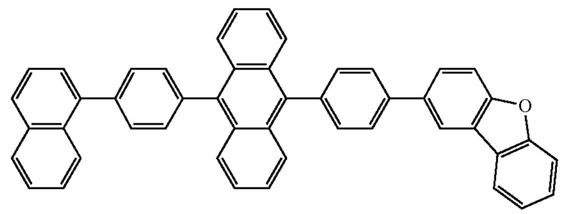
EM205
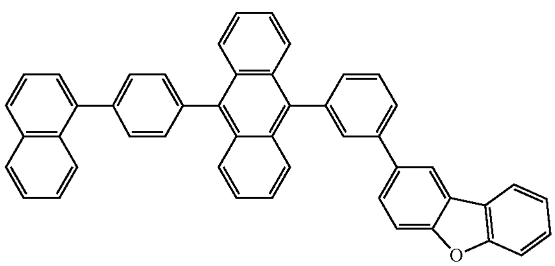
EM206
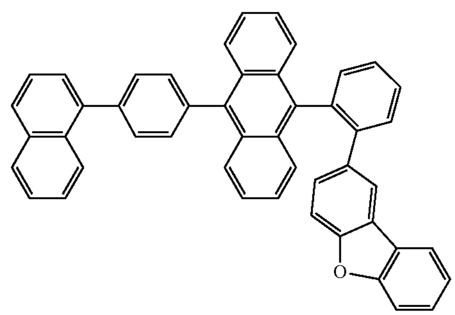
EM207
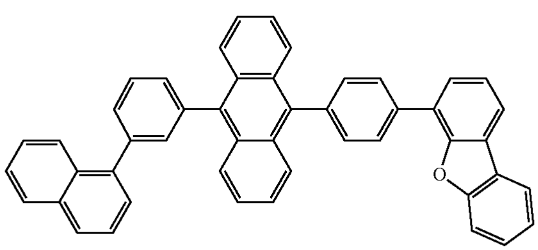
EM208
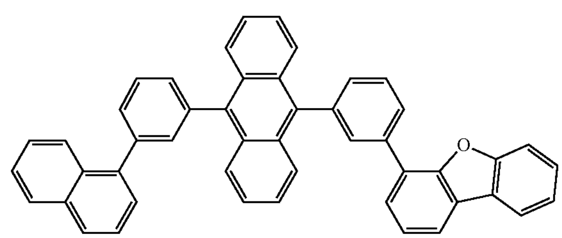
EM209
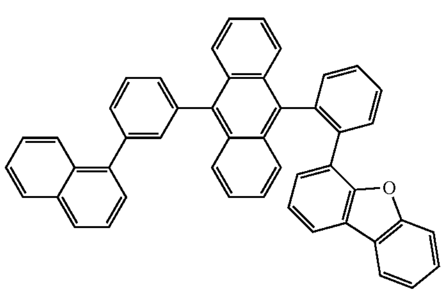
EM210
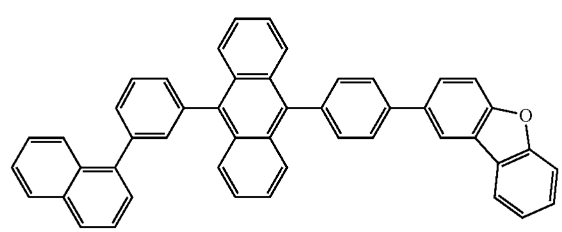

-continued
EM211
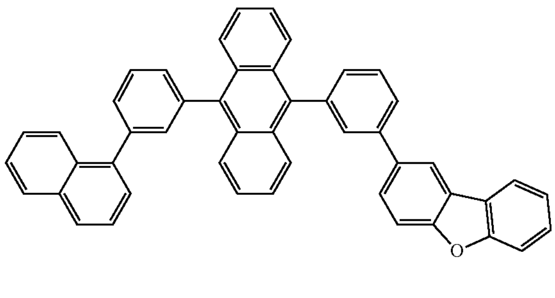
EM212
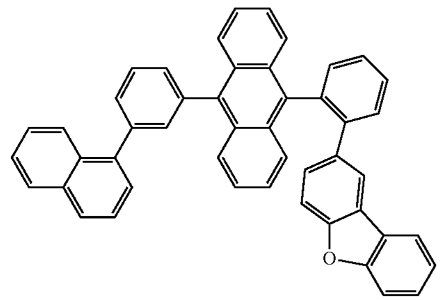
EM213
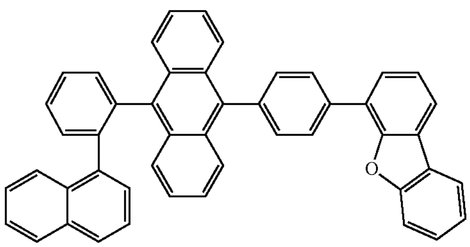
EM214
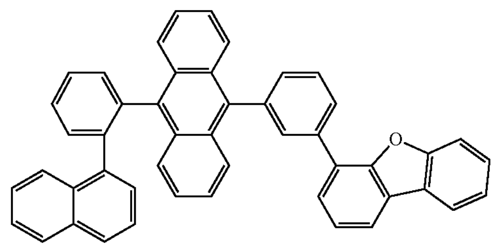
EM215
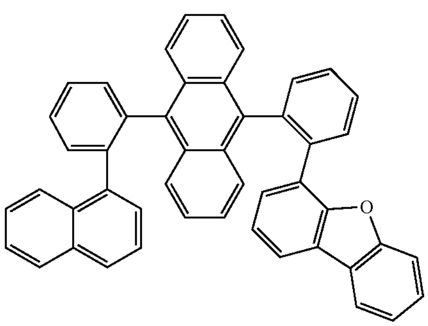
EM216
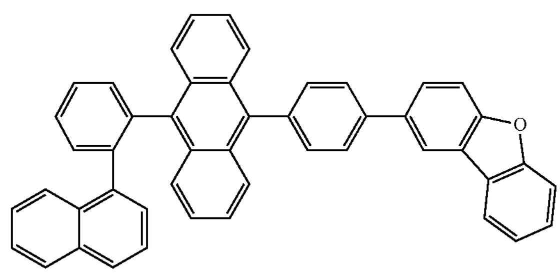
EM217
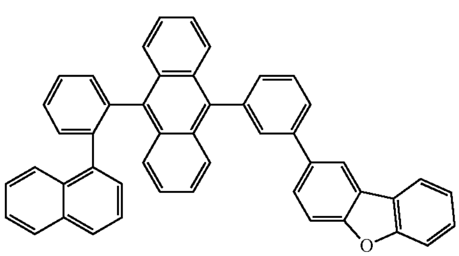
EM218
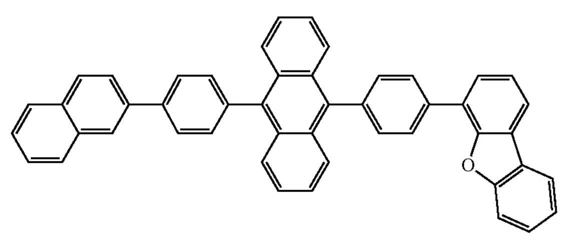
EM219
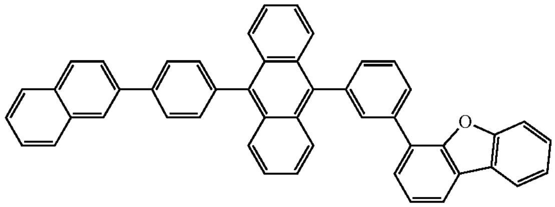
EM220
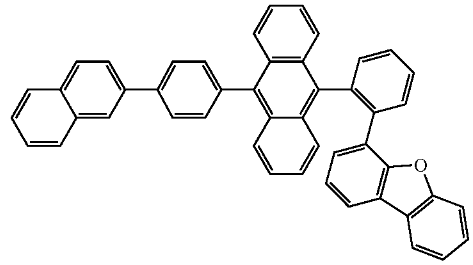

-continued
EM221
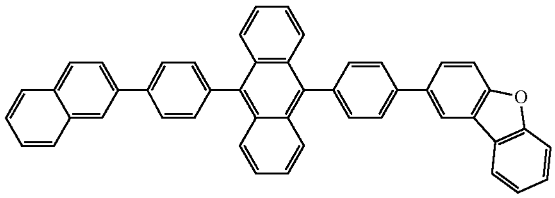
EM222
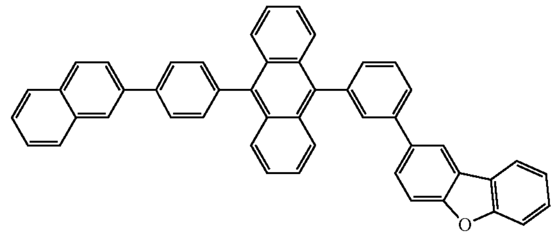
EM223
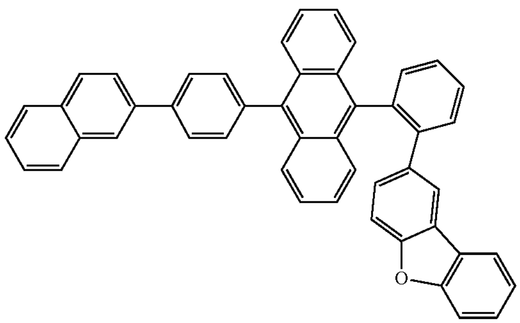
EM224
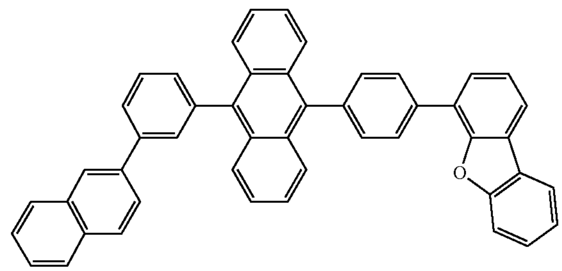
EM225
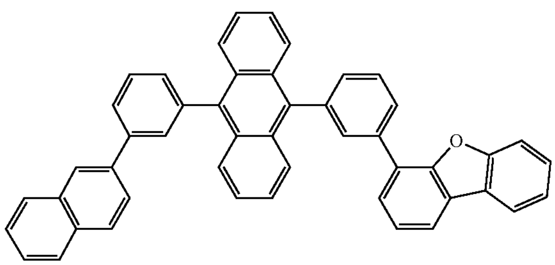
EM226
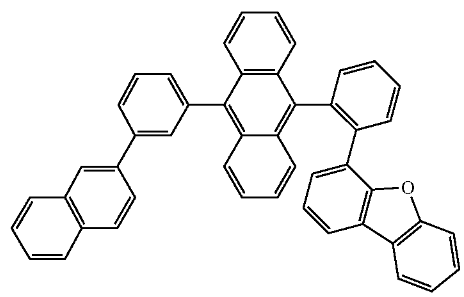
EM227
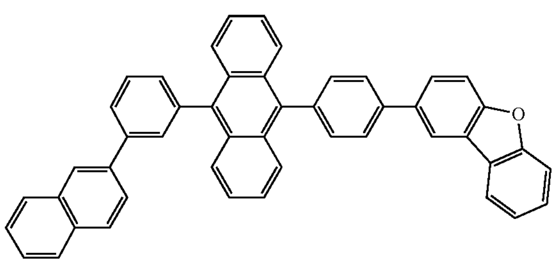
EM228
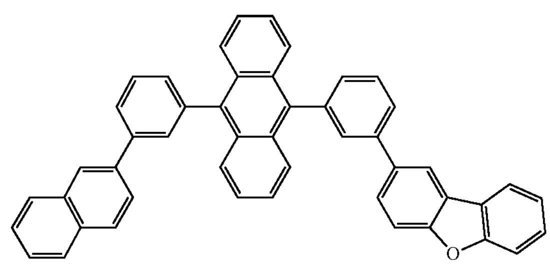
EM229
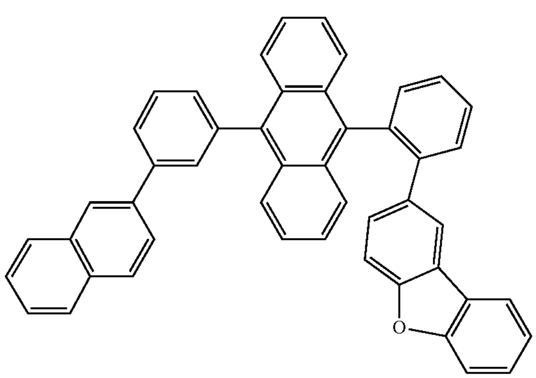
EM230
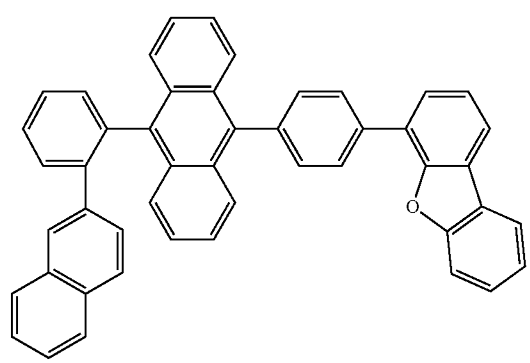

-continued
EM231
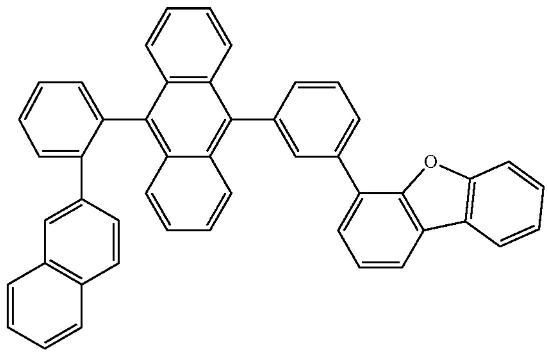
EM232
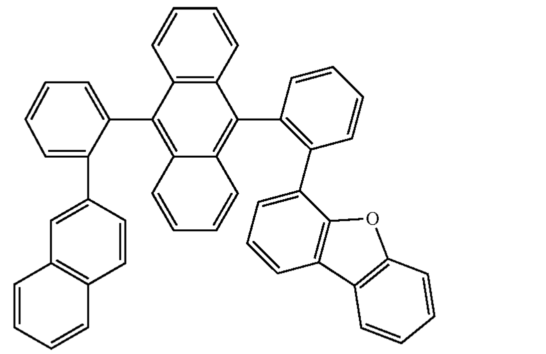
EM233
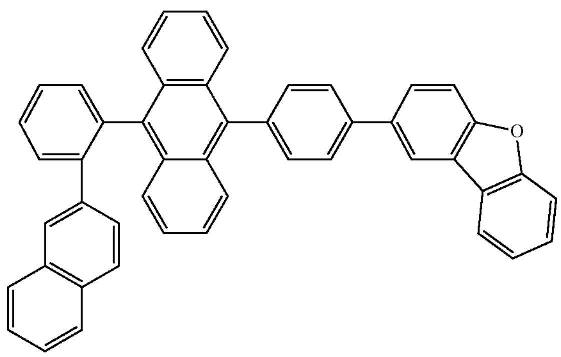
EM234
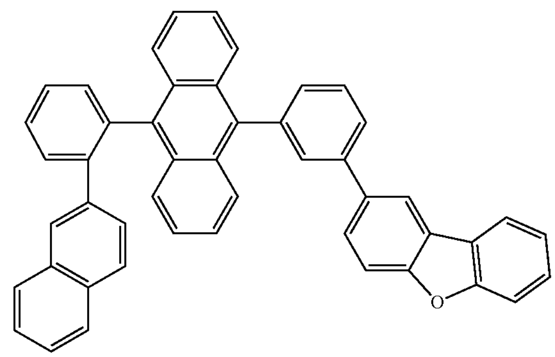
EM235
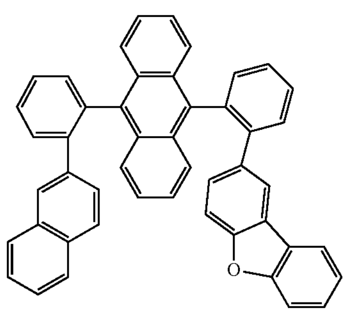
EM236
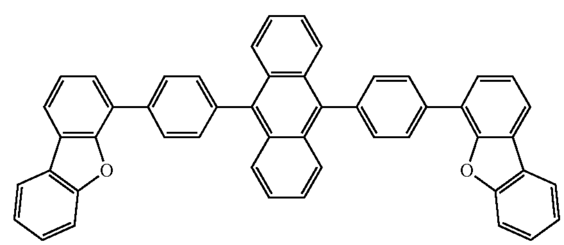
EM237
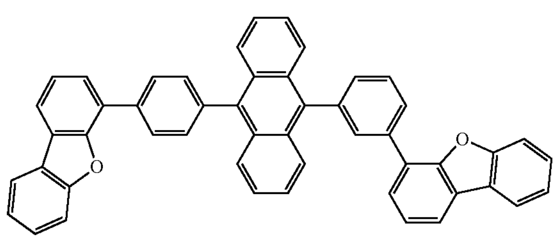
EM238
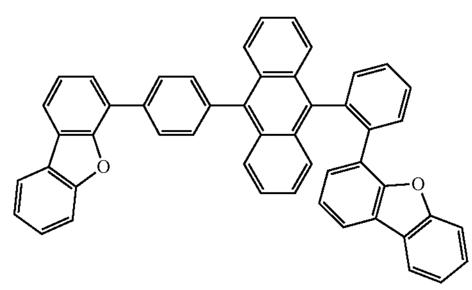
EM239
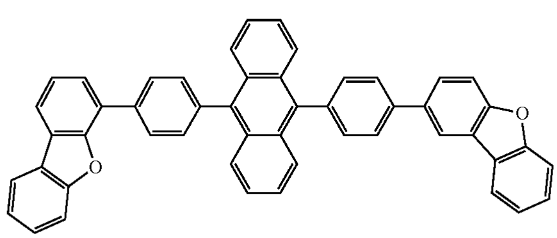
EM240
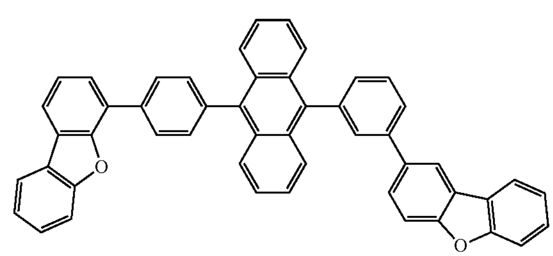

-continued
EM241
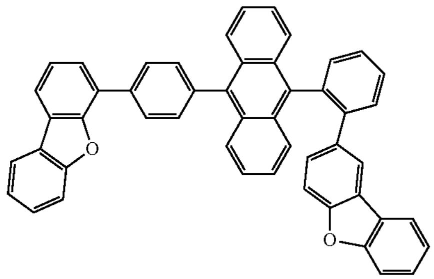
EM242
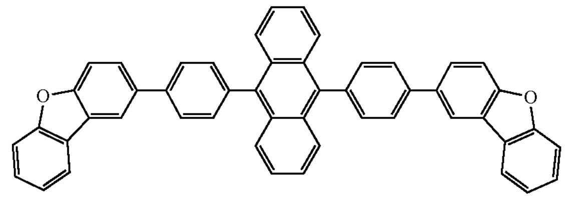
EM243
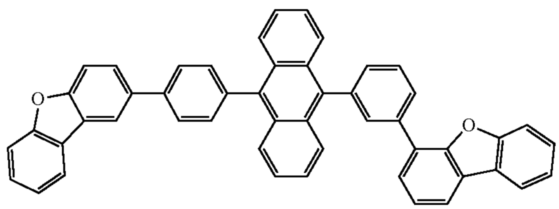
EM244
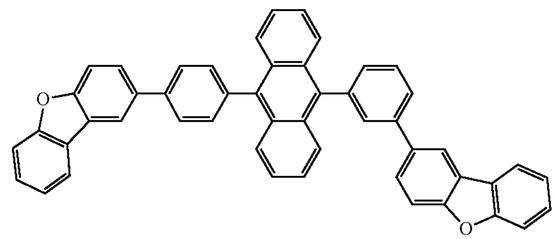
EM245
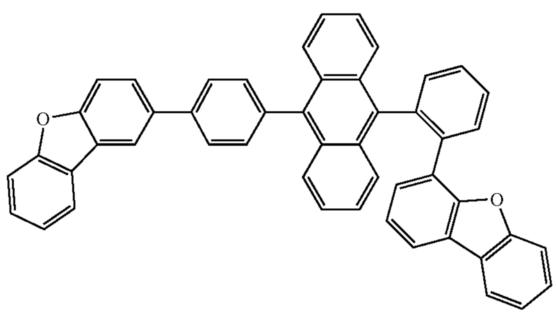
EM246
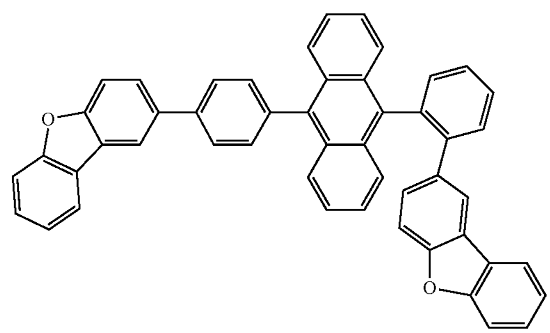
EM247
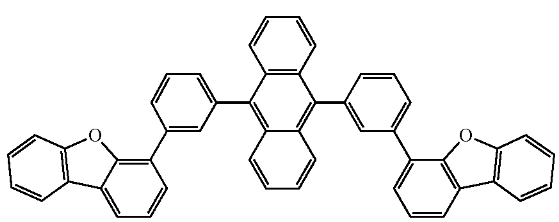
EM248
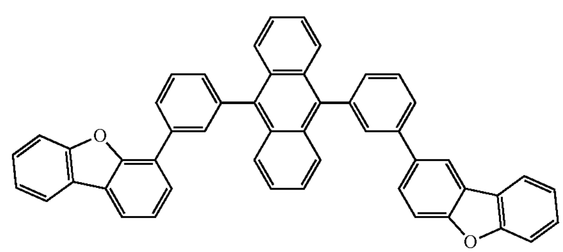
EM249
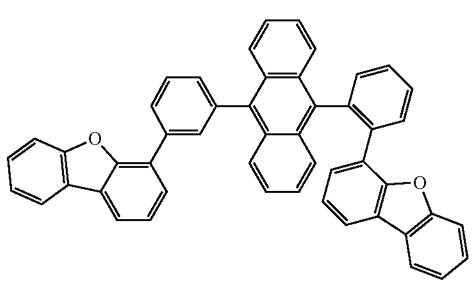
EM250
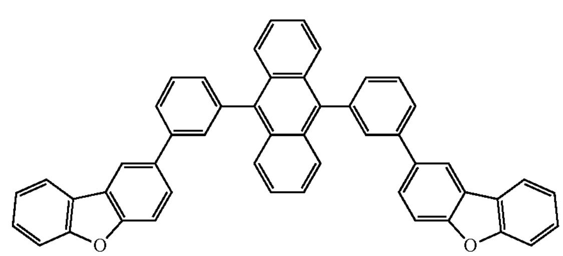

-continued
EM251
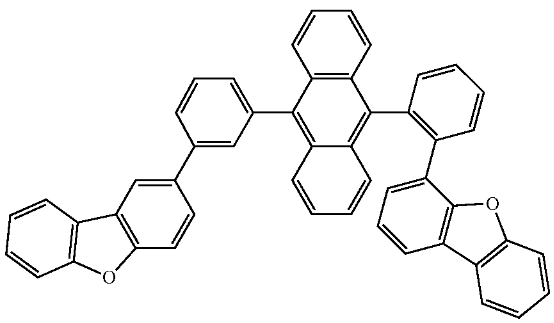
EM252
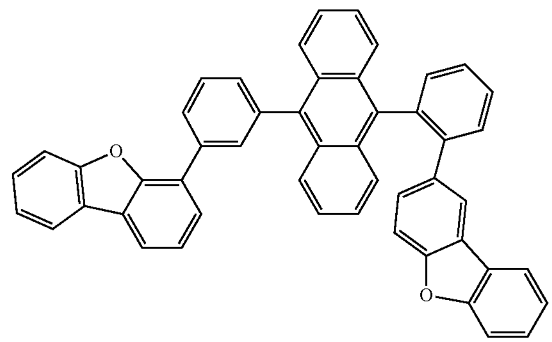
EM253
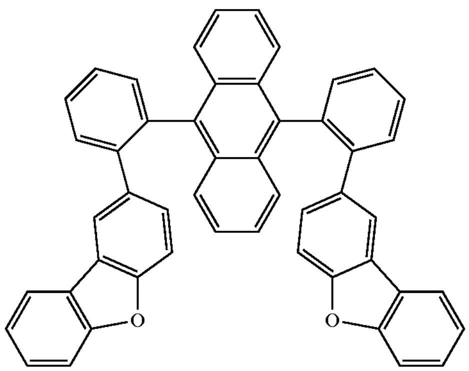
EM254
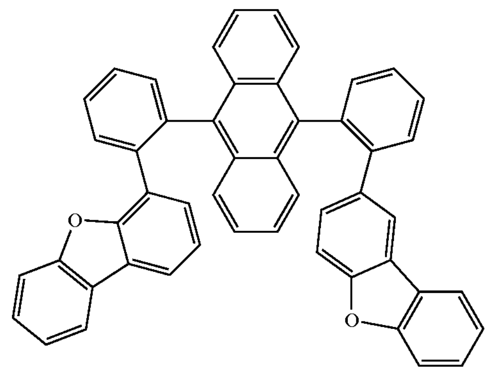
EM255
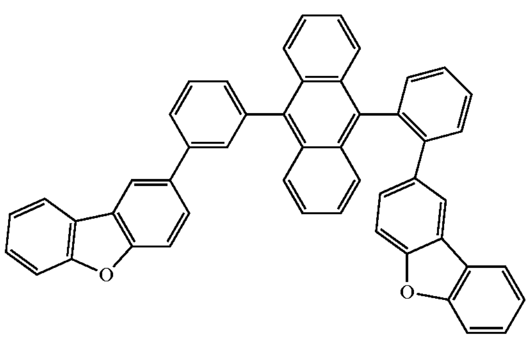
EM256
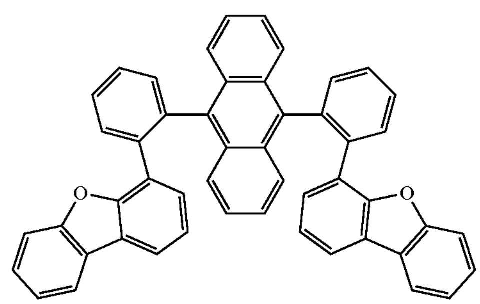
EM257
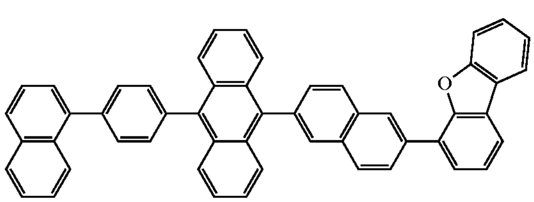
EM258
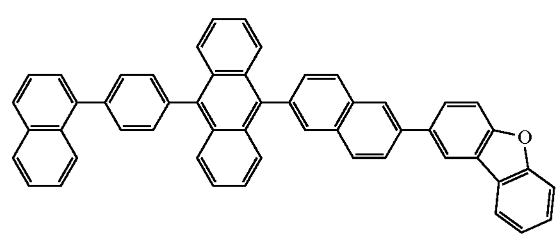
EM259
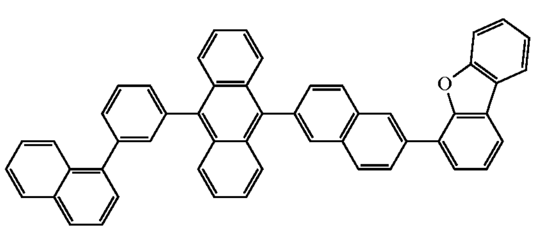
EM260
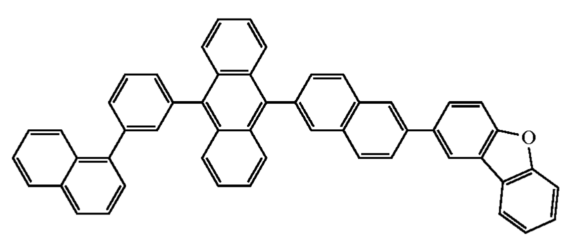

-continued
EM261
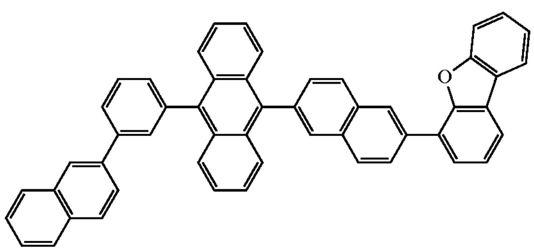
EM262
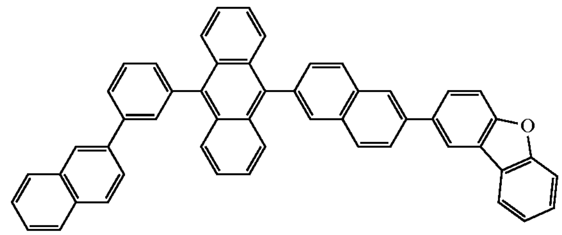
EM263
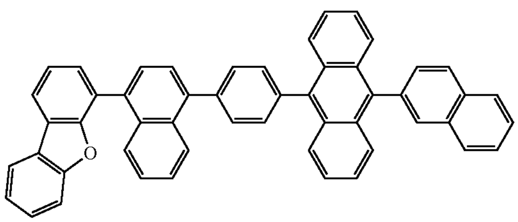
EM264
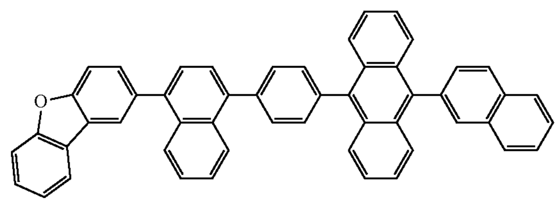
EM265
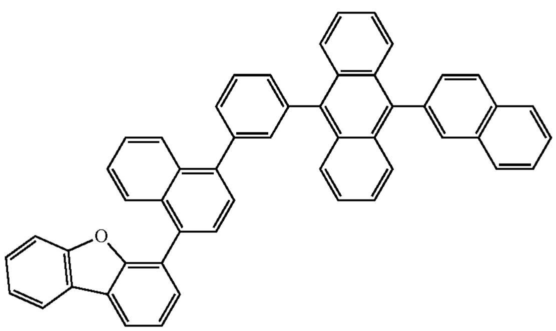
EM266
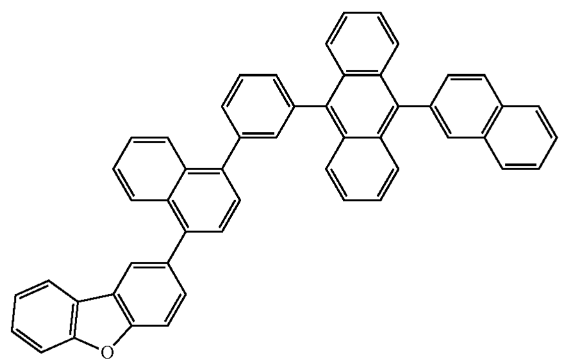
EM267
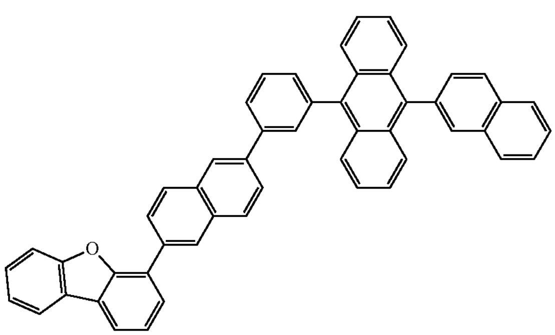
EM268
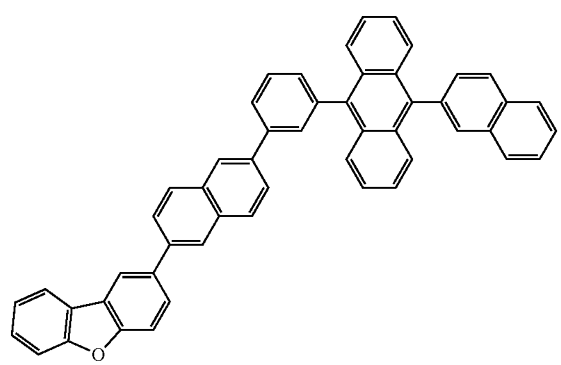
EM269
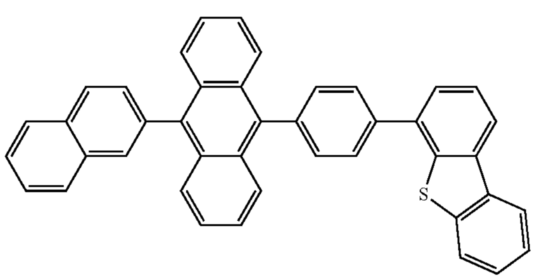
EM270
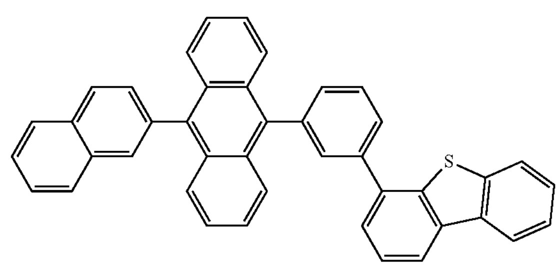

-continued
EM271
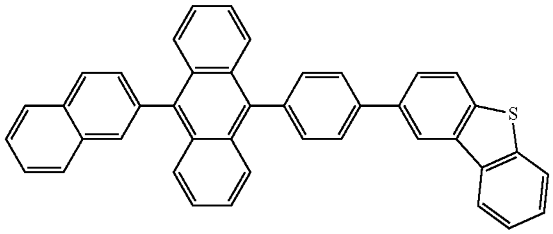
EM272
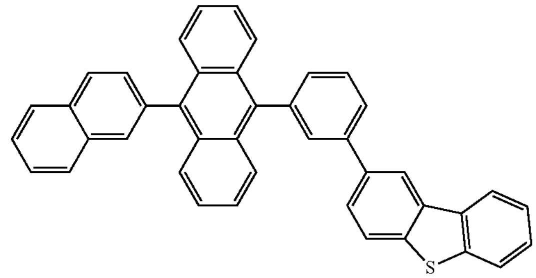
EM273
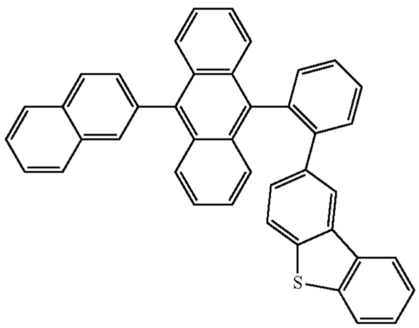
EM274
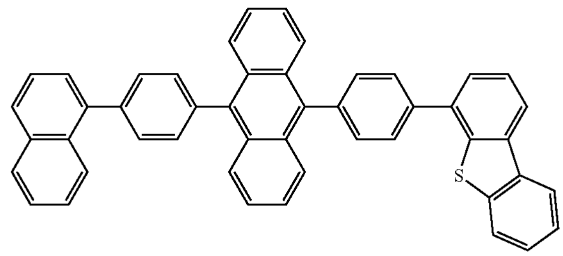
EM275
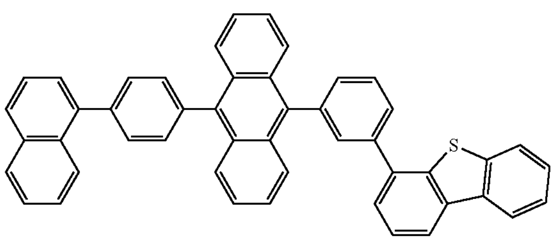
EM276
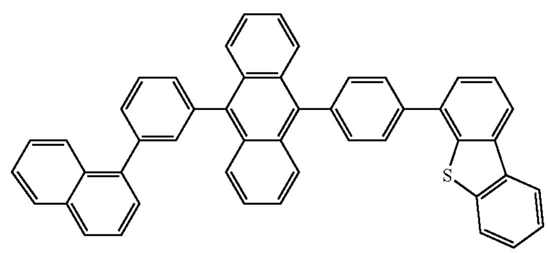
EM277
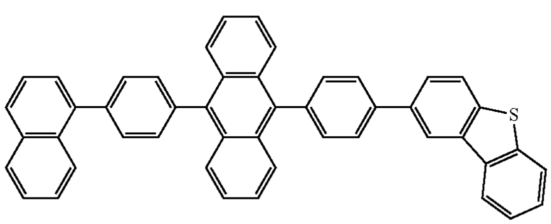
EM278
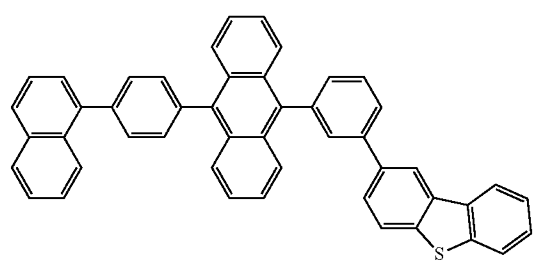
EM279
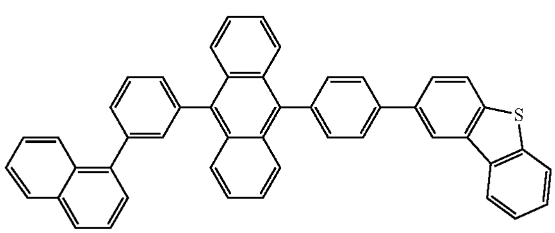
EM280
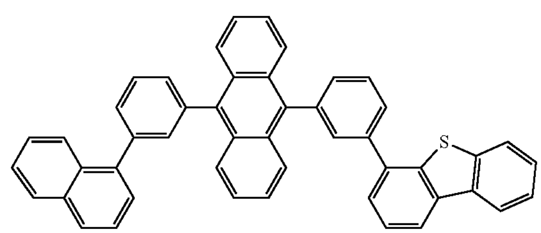

-continued
EM281
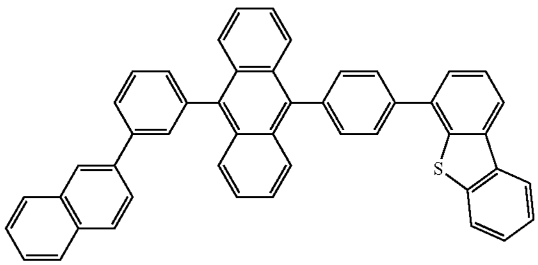
EM282
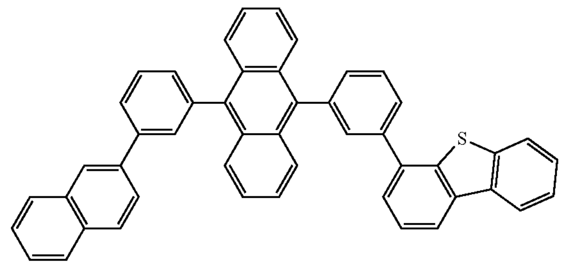
EM283
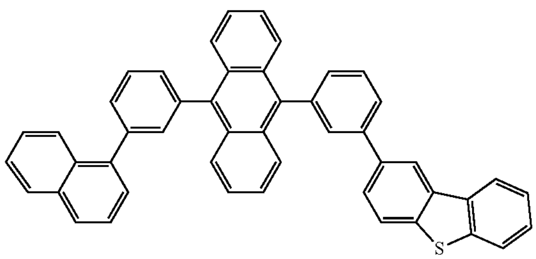
EM284
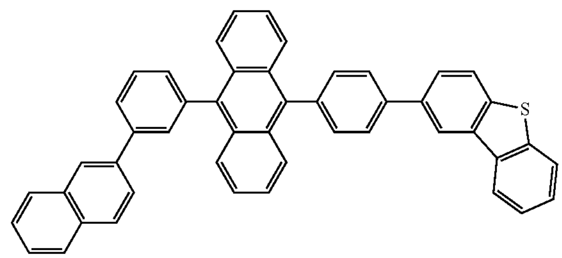
EM285
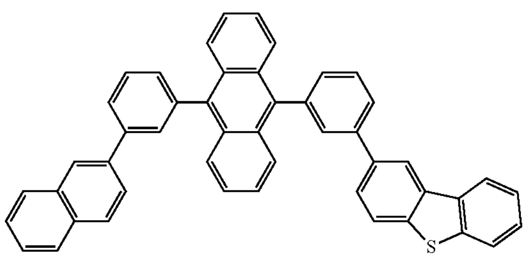
EM286
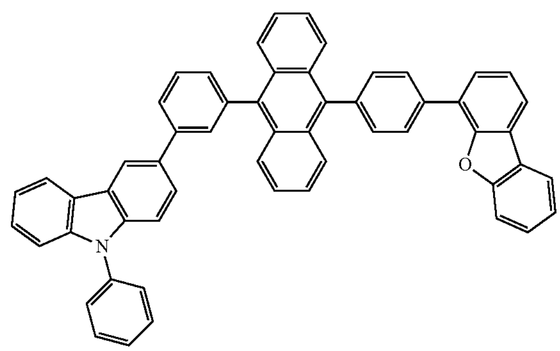
EM287
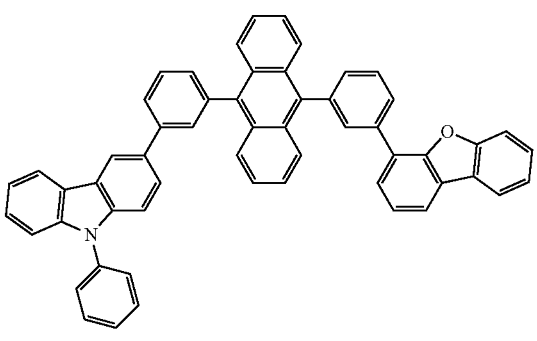
EM288
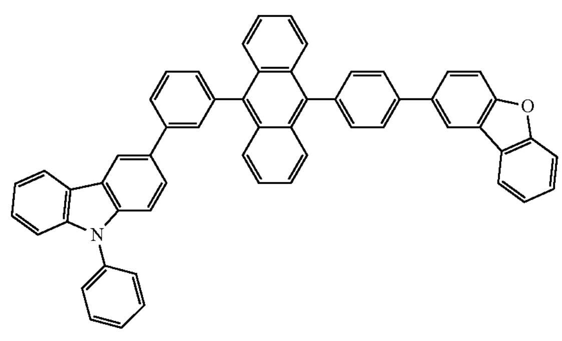
EM289
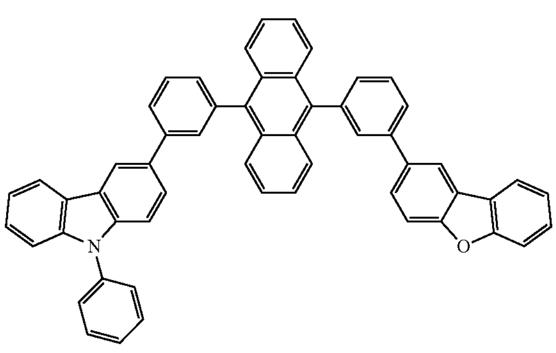
EM290
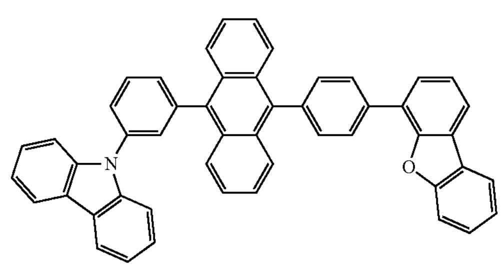

-continued
EM291
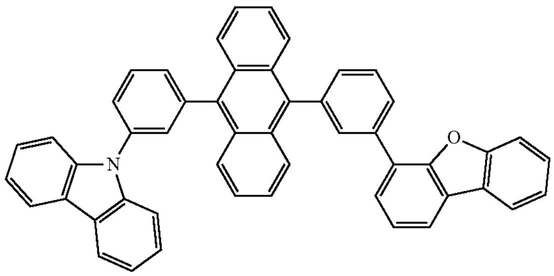
EM292
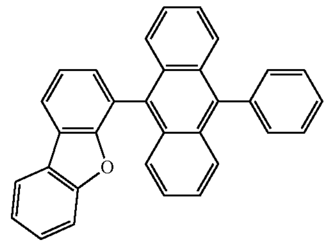
EM293
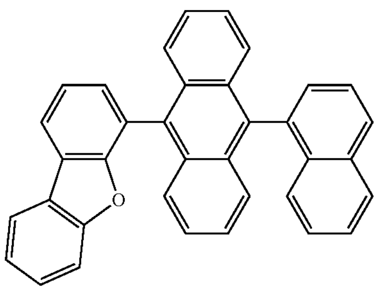
EM294
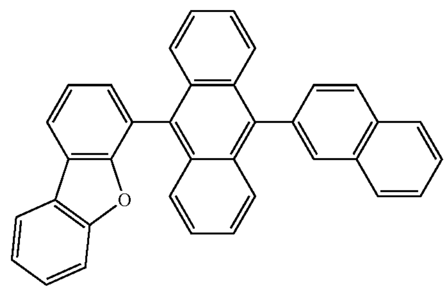
EM295
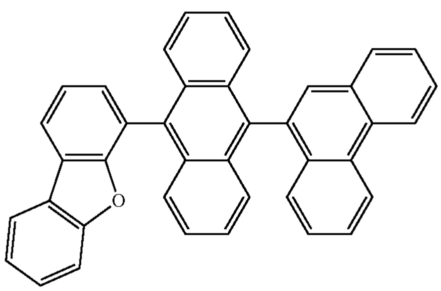
EM296
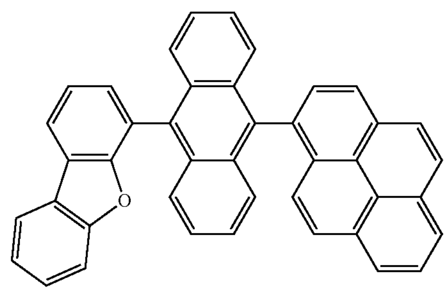
EM297
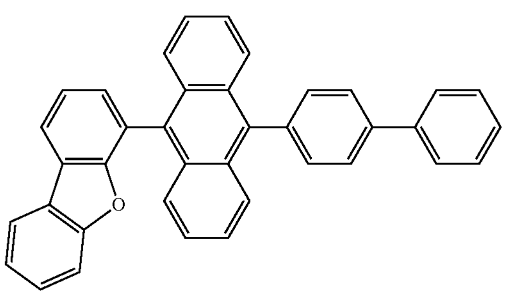
EM298
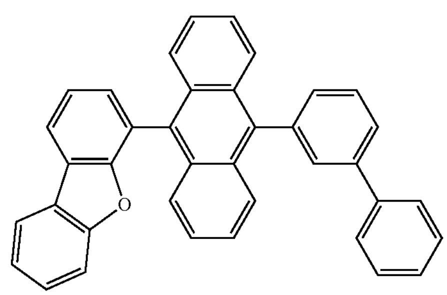
EM299
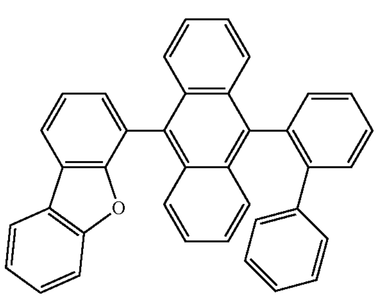
EM300
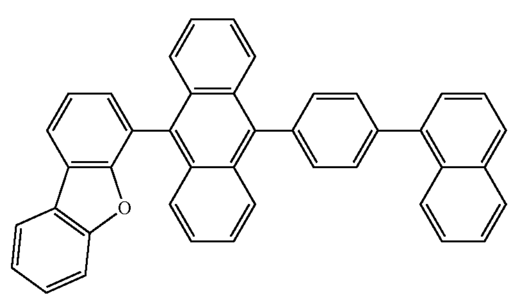

-continued
EM301
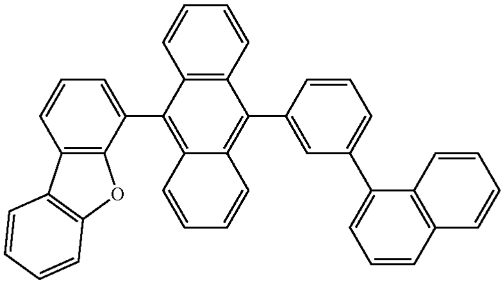
EM302
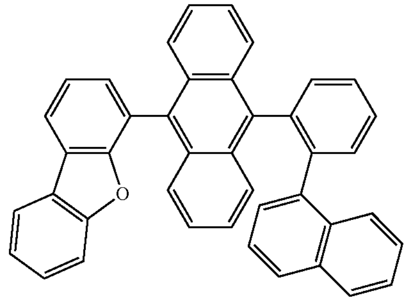
EM303
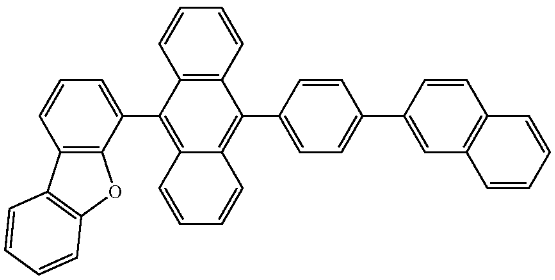
EM304
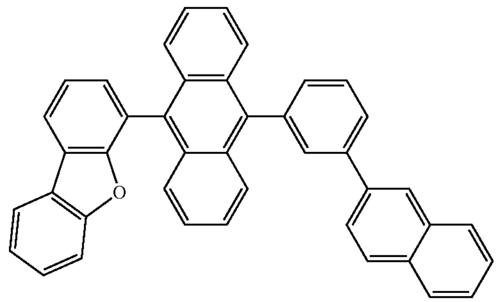
EM305
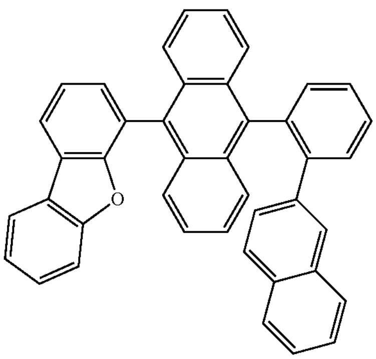
EM306
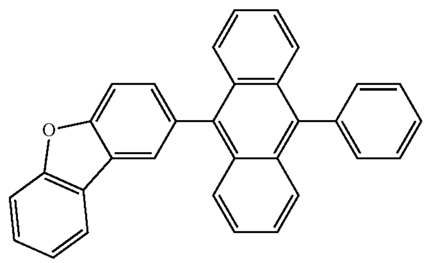
EM307
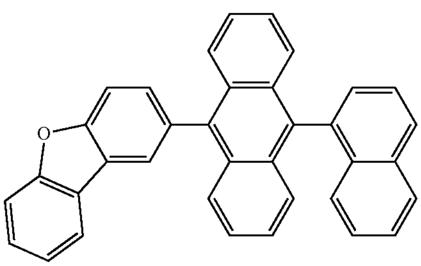
EM308
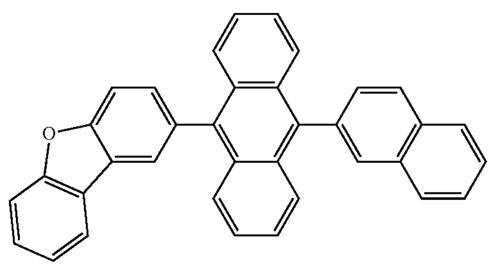
EM309
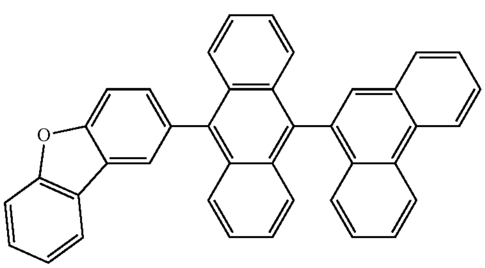
EM310
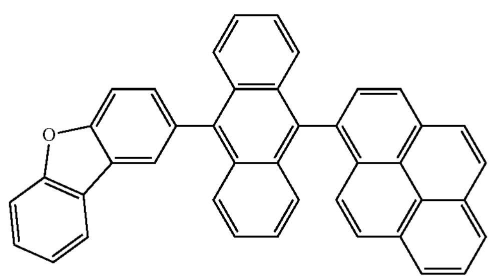

-continued
EM311
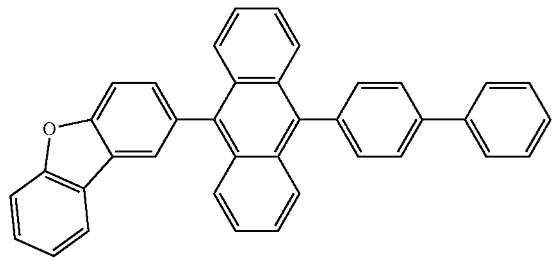
EM312
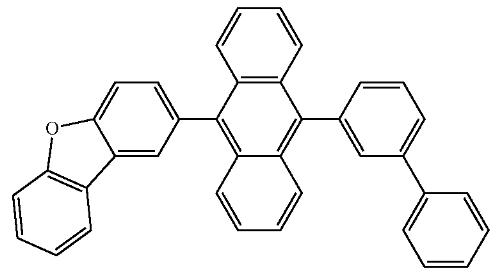
EM313
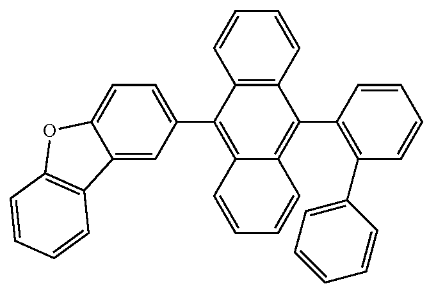
EM314
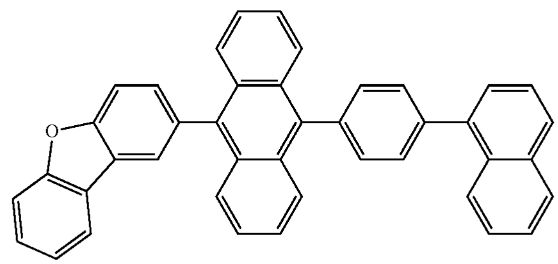
EM315
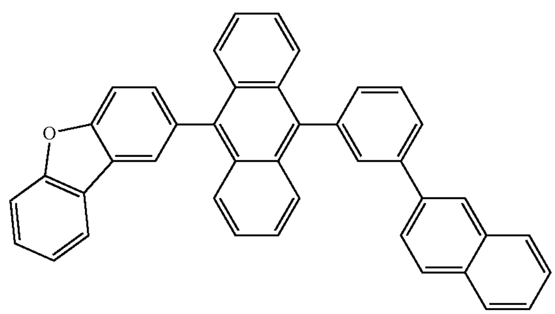
EM316
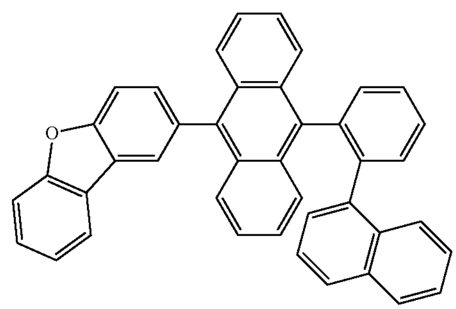
EM317
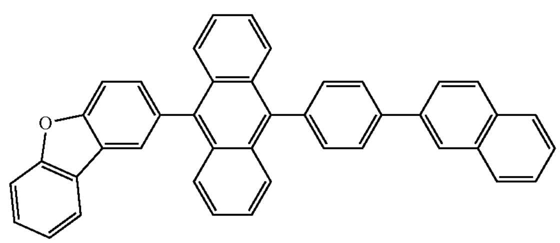
EM318
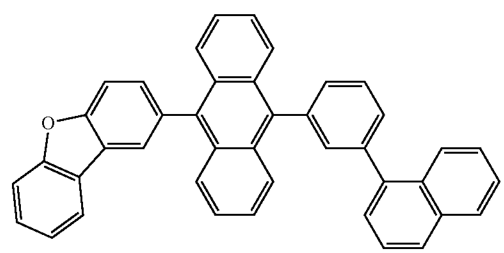
EM319
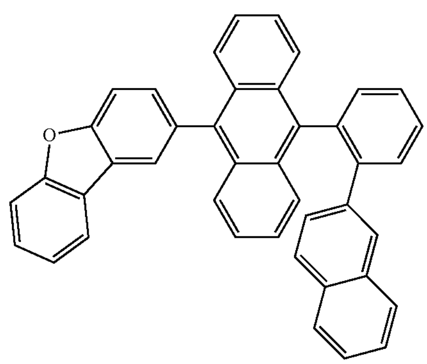
EM320
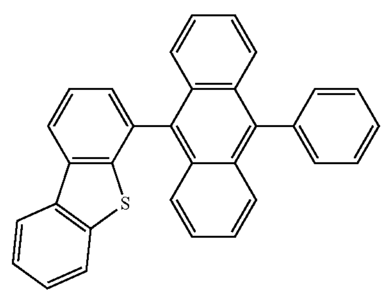

-continued
EM321
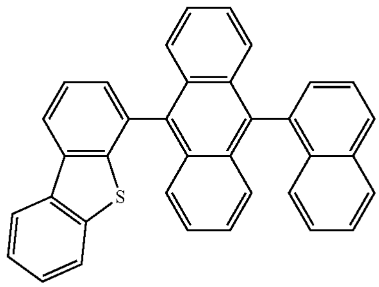
EM322
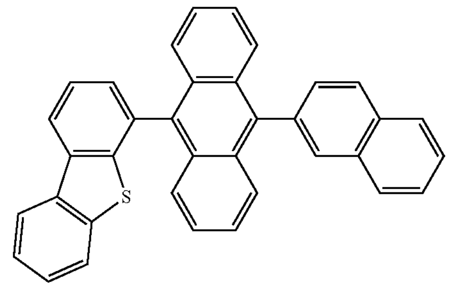
EM323
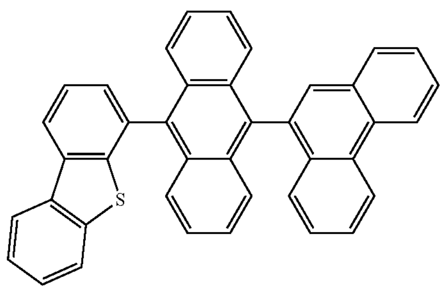
EM324
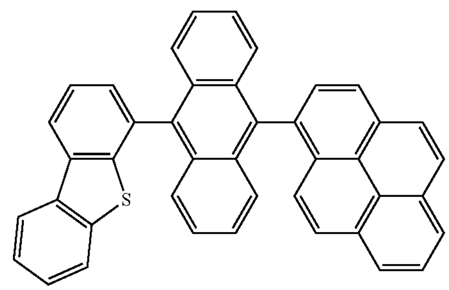
EM325
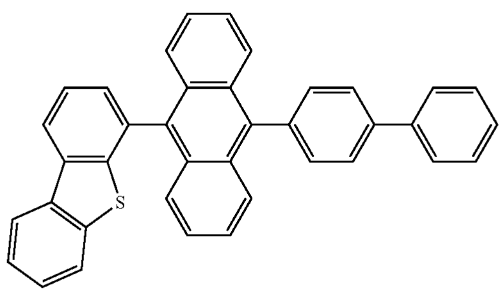
EM326
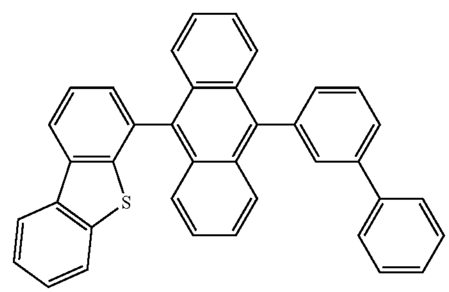
EM327
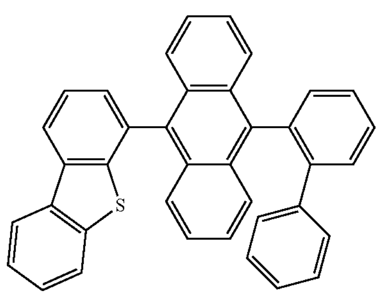
EM328
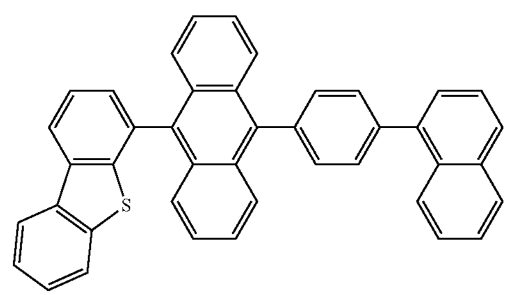
EM329
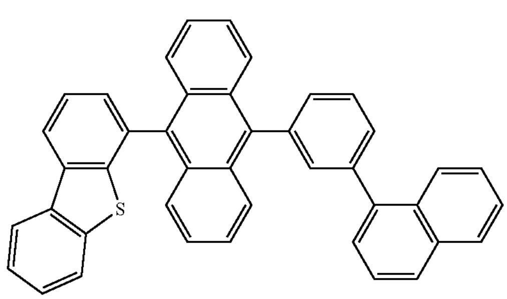
EM330
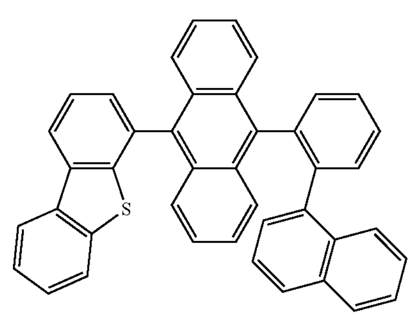

-continued
EM331
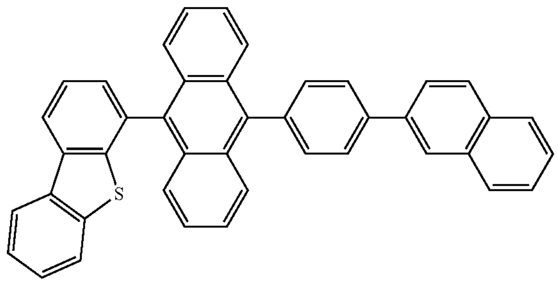
EM332
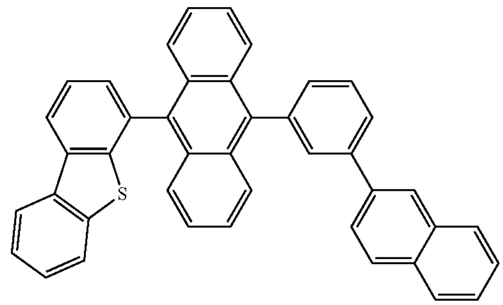
EM333
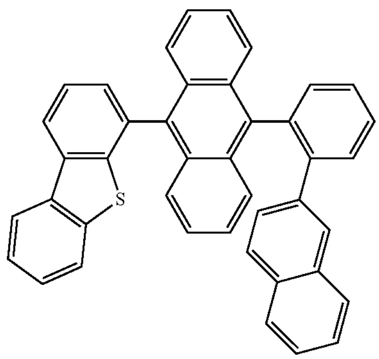
EM334
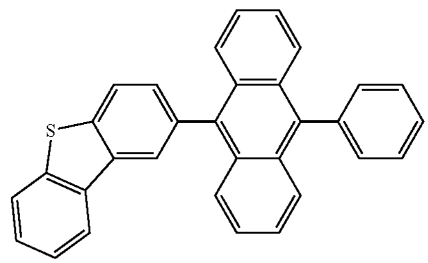
EM335
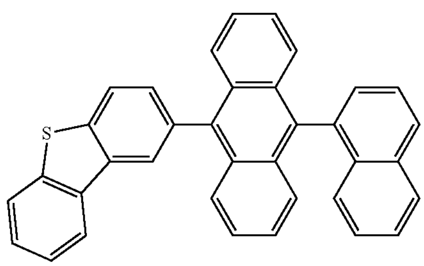
EM336
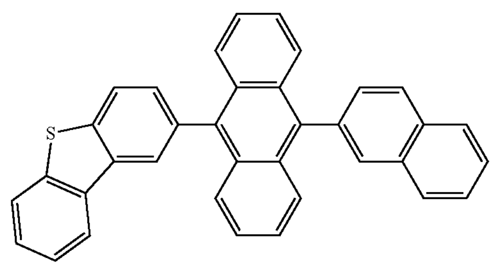
EM337
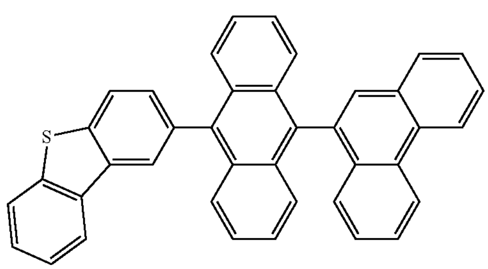
EM338
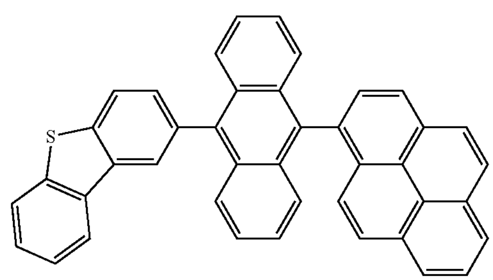
EM339
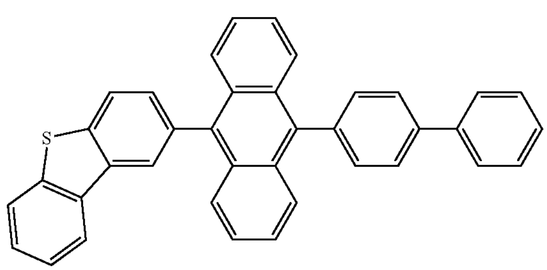
EM340
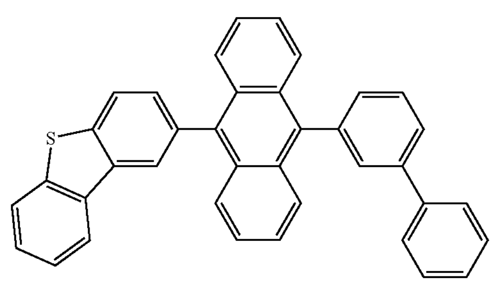

-continued
EM341
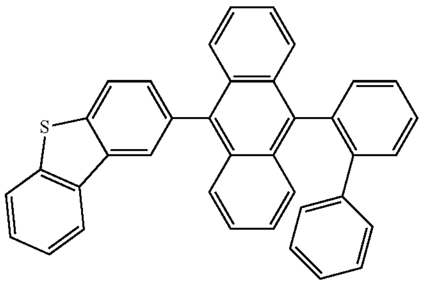
EM342
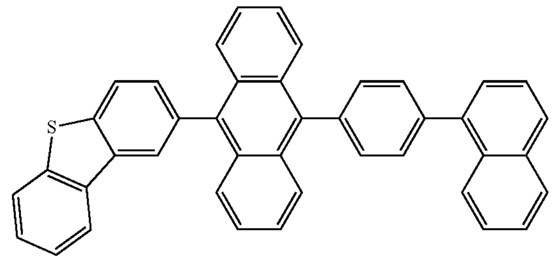
EM343
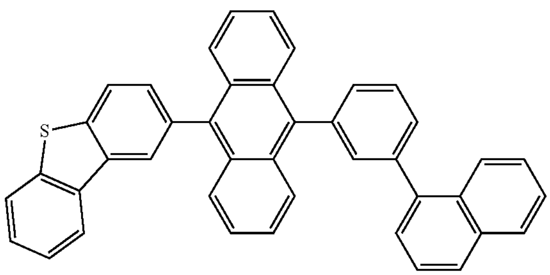
EM344
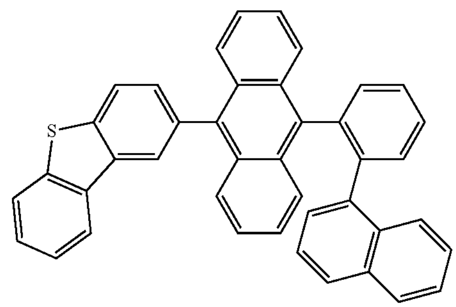
EM345
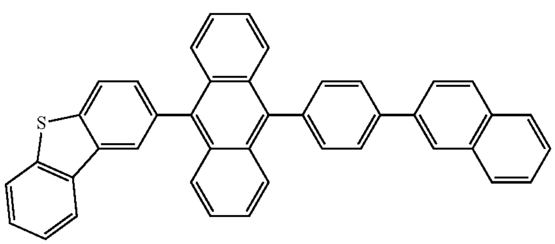
EM346
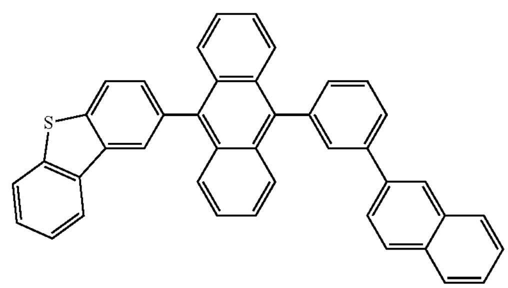
EM347
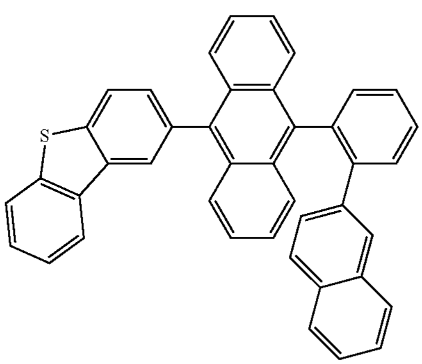
EM348
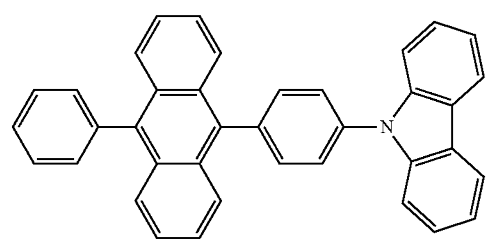
EM349
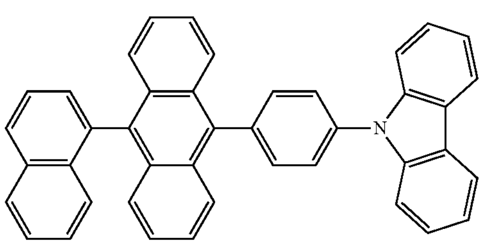
EM350
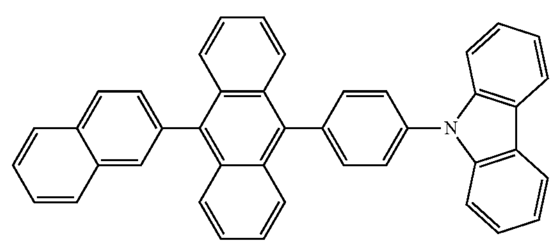

-continued
EM351
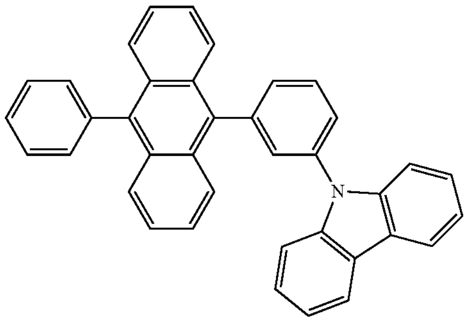
EM352
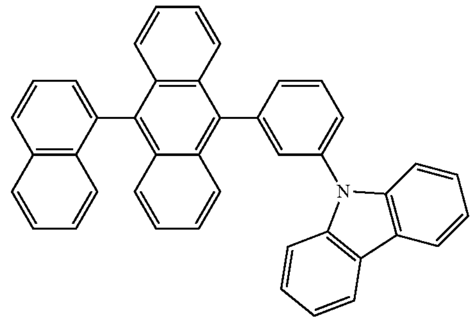
EM353
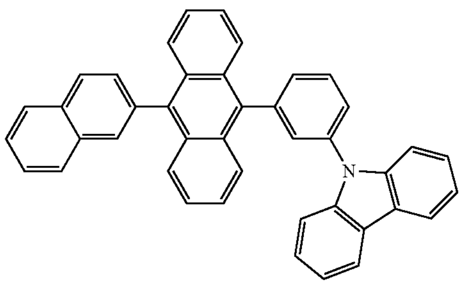
EM354
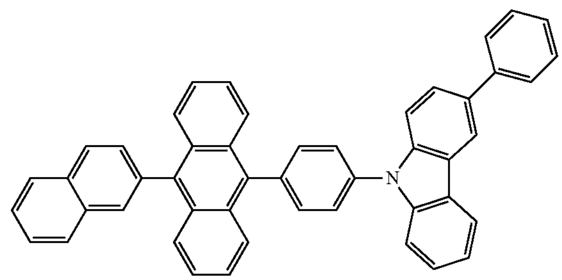
EM355
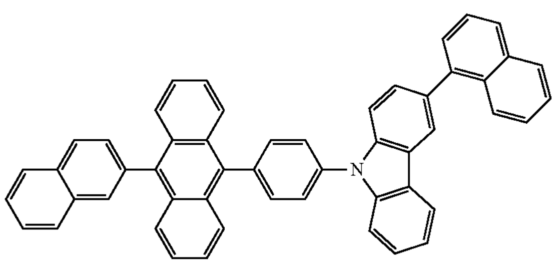
EM356
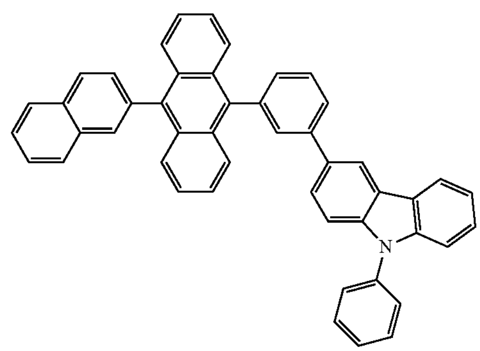
EM357
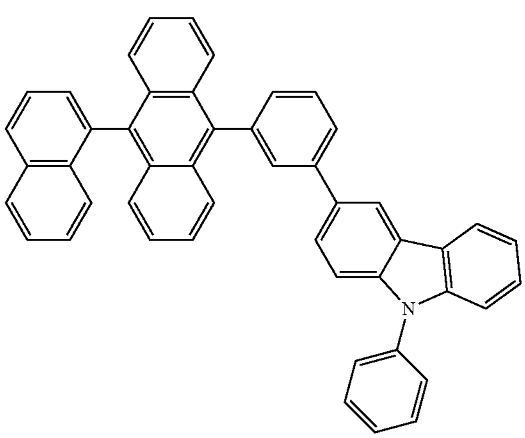
EM358
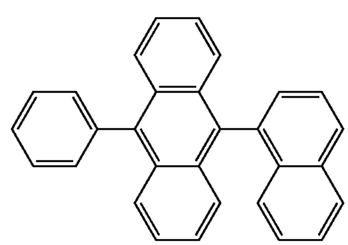

-continued
EM359
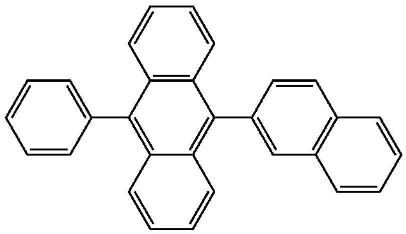
EM360
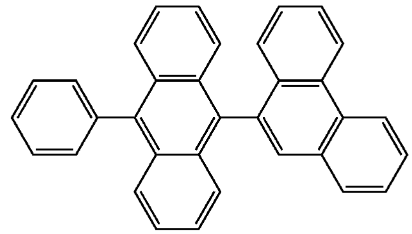
EM361
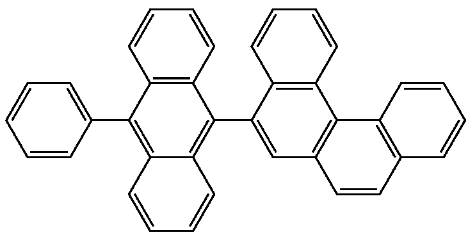
EM362
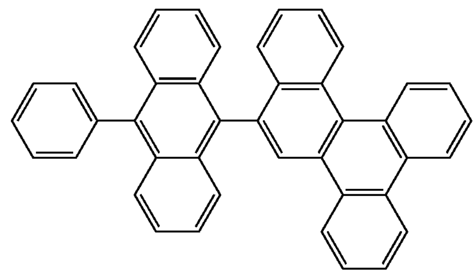
EM363
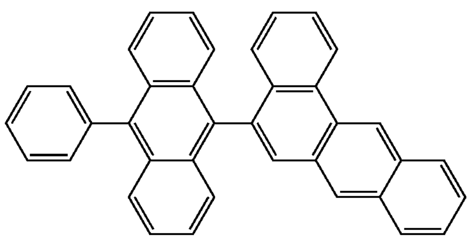
EM364
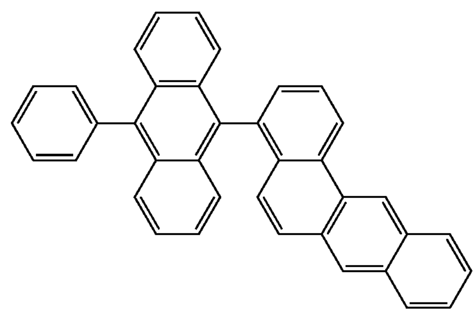
EM365
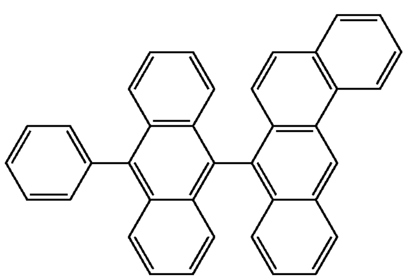
EM366
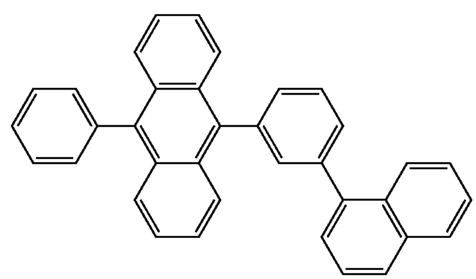
EM367
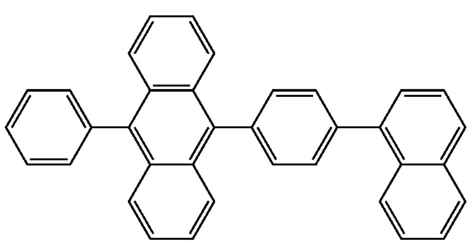
EM368
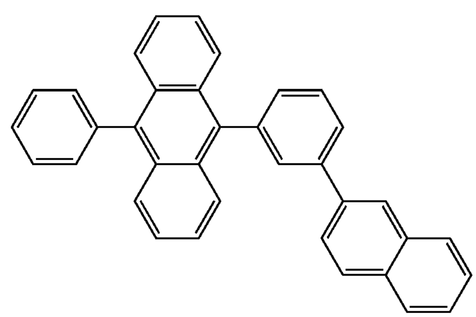

-continued
EM369
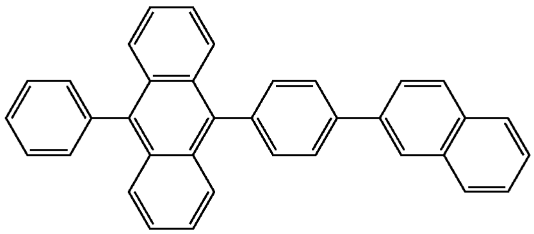
EM370
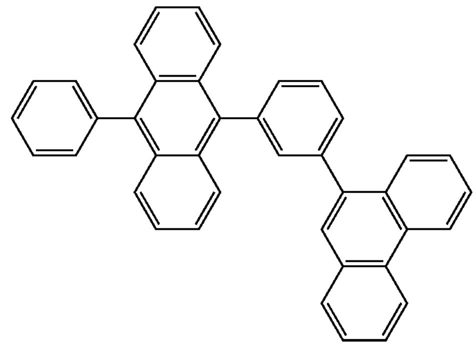
EM371
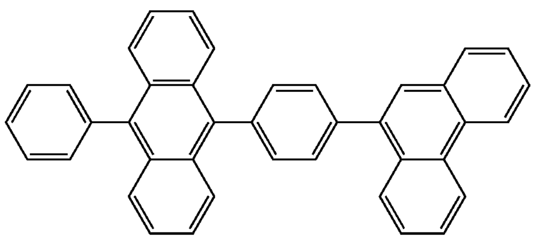
EM372
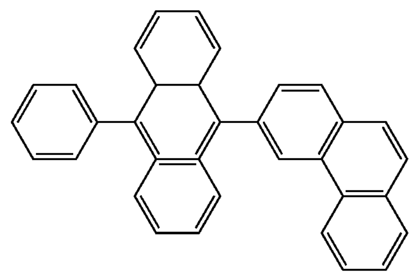
EM373
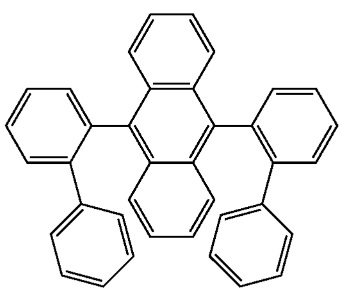
EM374
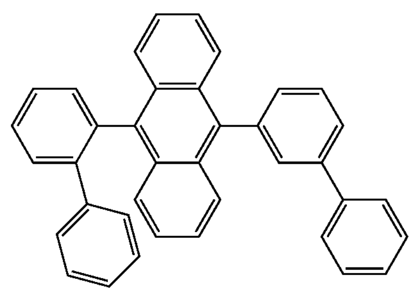
EM375
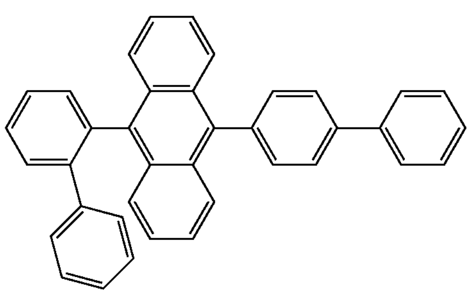
EM376
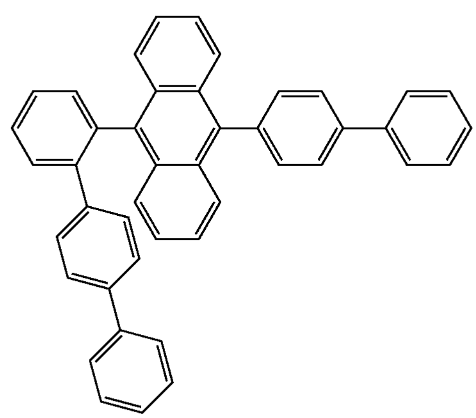

-continued
EM377
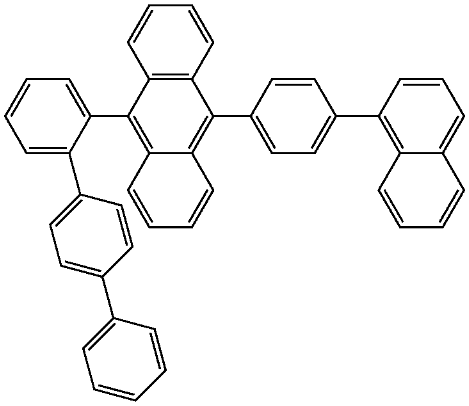
EM378
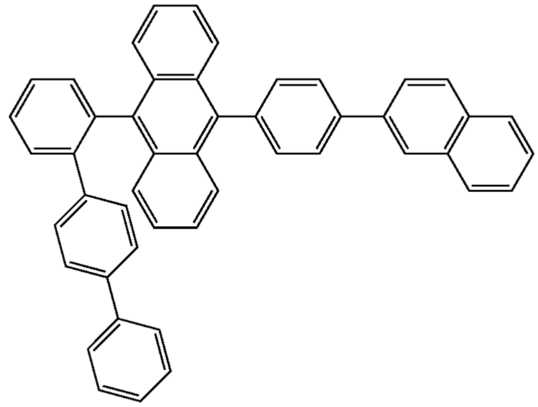
EM379
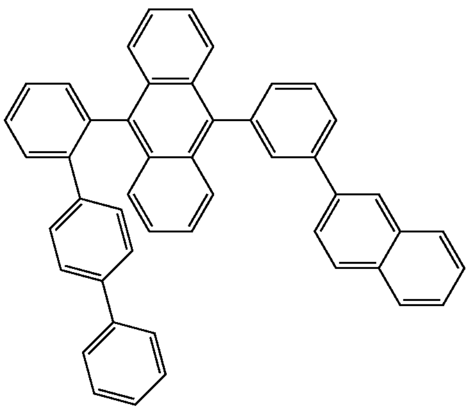
EM380
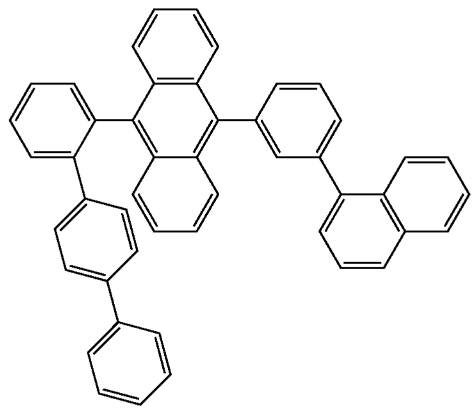
EM381
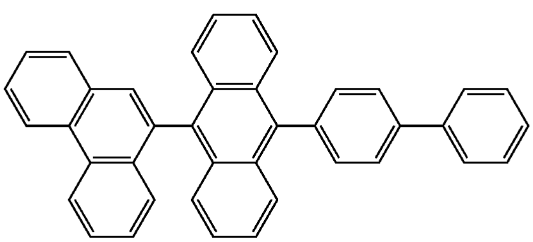
EM382
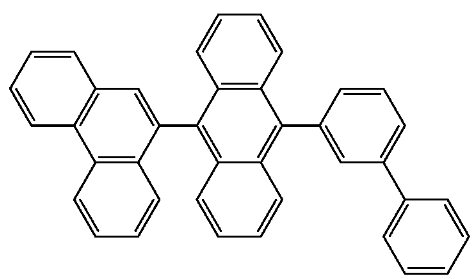
EM383
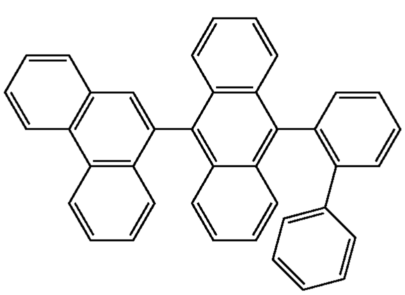
EM384
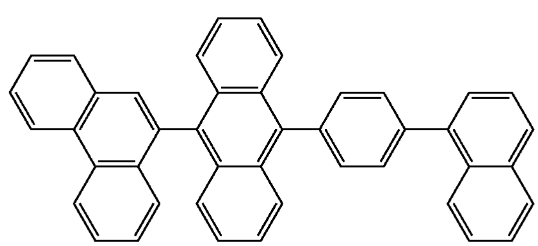

-continued
EM385
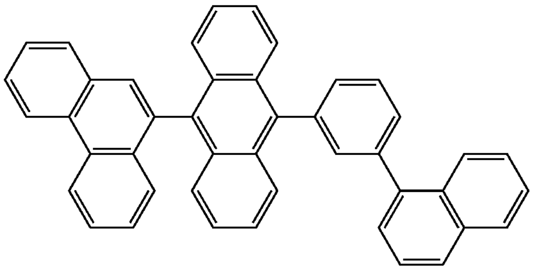
EM386
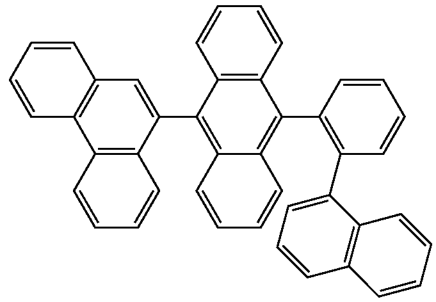
EM387
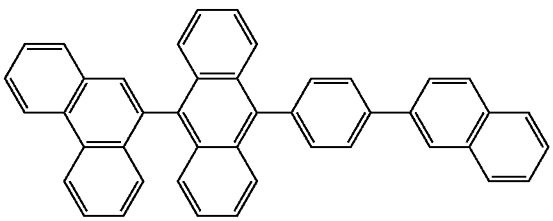
EM388
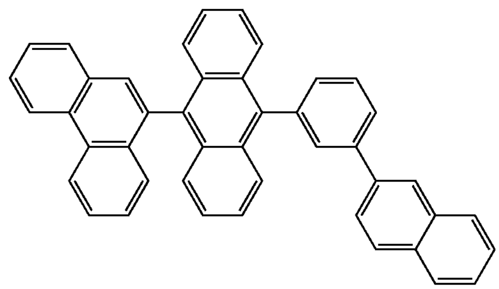
EM389
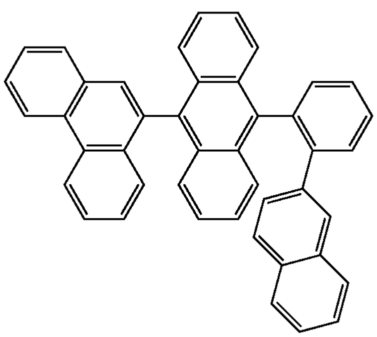
EM390
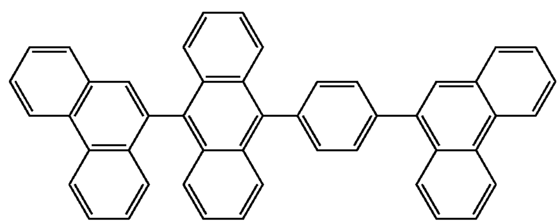
EM391
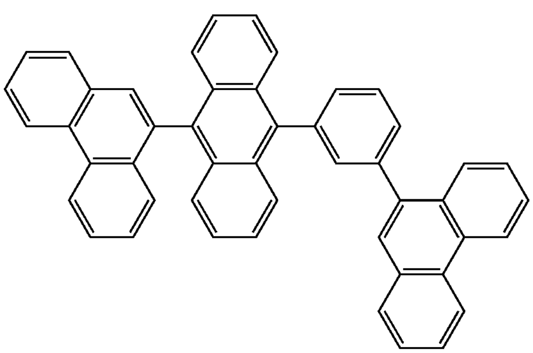
EM392
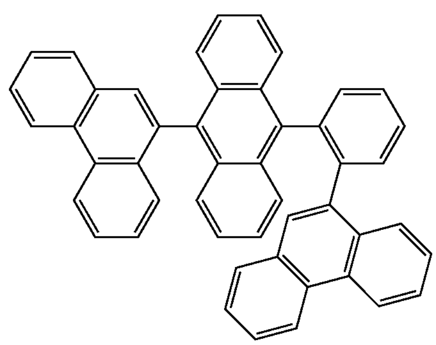
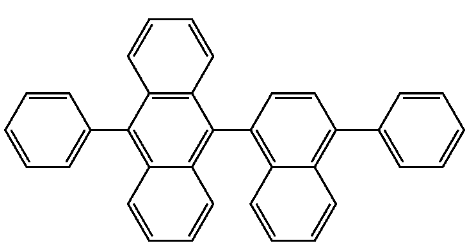
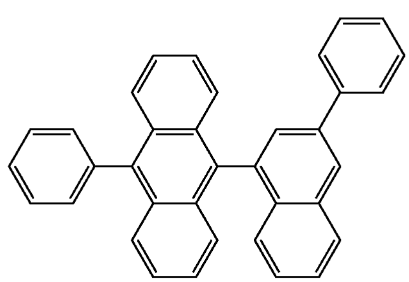

-continued
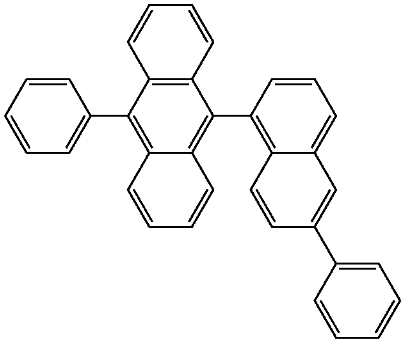
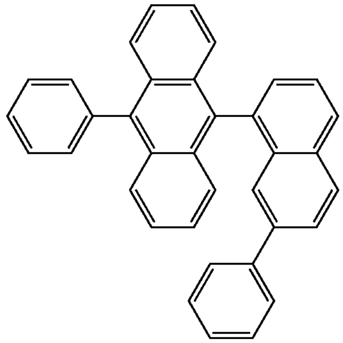
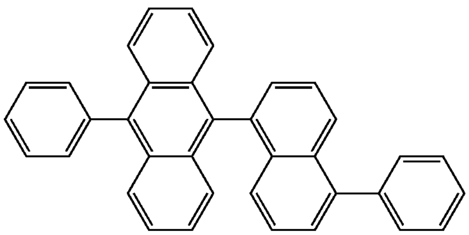
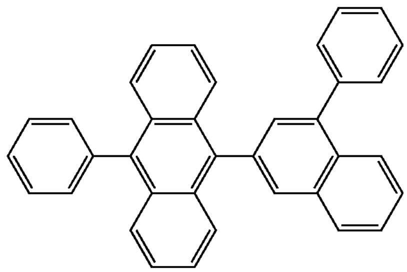
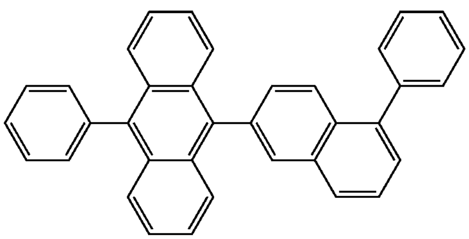
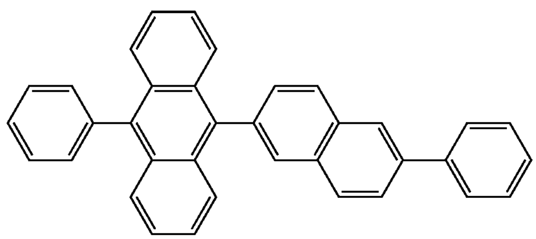
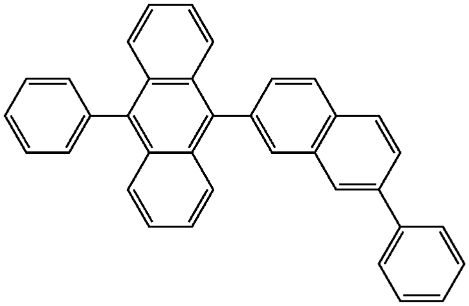
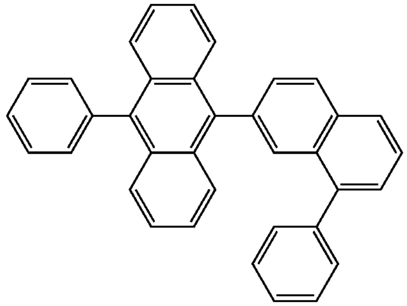
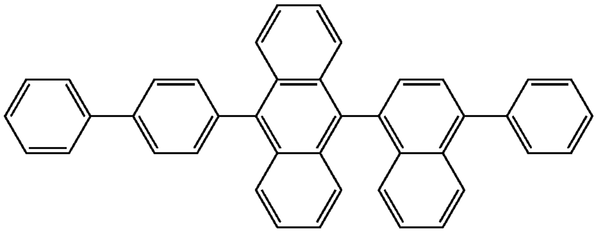

-continued

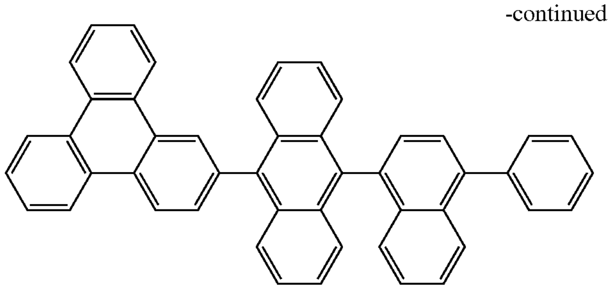

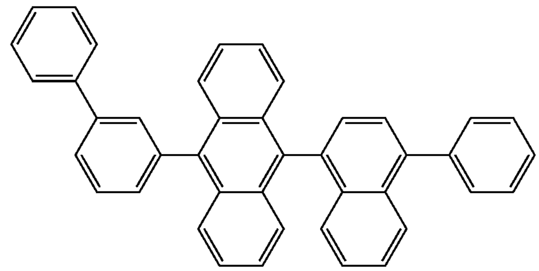

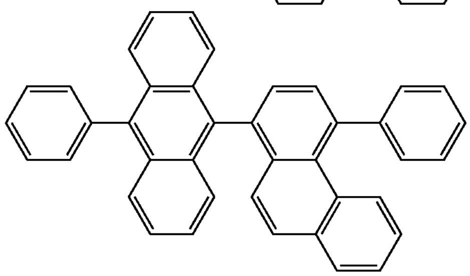

Electron-Donating Dopant

The organic EL device of the present invention preferably comprises an electron-donating dopant in the interface region between the cathode and the light emitting unit. According to the structure, the luminance of the organic EL device may be enhanced, and the service life time thereof may be prolonged. The electron-donating dopant herein means one comprising a metal having a work function of 3.8 eV or less, and specific examples thereof include at least one selected from an alkali metal, an alkali metal complex, an alkali metal compound, an alkaline earth metal, an alkaline earth metal complex, an alkaline earth metal compound, a rare earth metal, a rare earth metal complex and a rare earth metal compound.

Examples of the alkali metal include Na (work function: 2.36 eV), K (work function: 2.28 eV), Rb (work function: 2.16 eV) and Cs (work function: 1.95 eV), and those having a work function of 2.9 eV or less are preferred. Examples of the alkaline earth metal include Ca (work function: 2.9 eV), Sr (work function: 2.0 to 2.5 eV) and Ba (work function: 2.52 eV), and those having a work function of 2.9 eV or less are preferred. Examples of the rare earth metal include Sc, Y, Ce, Tb and Yb, and those having a work function of 2.9 eV or less are preferred.

Examples of the alkali metal compound include an alkali oxide, such as $Li_2O$, $Cs_2O$ and $K_2O$, and an alkali halide, such as LiF, NaF, CsF and KF, and LiF, $Li_2O$ and NaF are preferred. Examples of the alkaline earth metal compound include BaO, SrO and CaO, and $Ba_xSr_{1-x}O$ ($0<x<1$) and $Ba_xCa_{1-x}O$ ($0<x<1$), which are mixtures thereof, and BaO, SrO and CaO are preferred. Examples of the rare earth metal compound include $YbF_3$, $ScF_3$, $ScO_3$, $Y_2O_3$, $Ce_2O_3$, $GdF_3$ and $TbF_3$, and $YbF_3$, $ScF_3$ and $TbF_3$ are preferred.

The alkali metal complex, the alkaline earth metal complex and the rare earth metal complex are not particularly limited as far as they contain as their metal ion at least one of an alkali metal ion, an alkaline earth metal ion and a rare earth metal ion. Examples of the ligand include quinolinol, benzoquinolinol, acridinol, phenanthridinol, hydroxyphenyloxazole, hydroxyphenylthiazole, hydroxydiaryloxadiazole, hydroxydiarylthiadiazole, hydroxyphenylpyridine, hydroxyphenylbenzoimidazole, hydroxybenzotriazole, hydroxyflavone, bipyridyl, phenanthroline, phthalocyanine, porphyrin, cyclopentadiene, a β-diketone compound, an azomethine compound, and derivatives of these compounds.

The mode of addition of the electron-donating dopant is preferably such a mode that the electron donating dopant is in the form of a layer or islands in the interface region. The method of forming the layer or islands of the dopant is preferably such a manner that while the electron-donating dopant is vapor-deposited by a resistance heating vapor deposition method, the organic compound for forming the interface region (e.g., the emitting material and the electron injection material) is simultaneously vapor-deposited, thereby dispersing the electron-donating dopant in the organic compound. The dispersion concentration, (organic compound)/(electron-donating dopant), is preferably from 100/1 to 1/100 in terms of molar ratio.

In the case where the electron-donating dopant is formed into a layer, such a manner may be employed that the emitting material and the electron injection material are formed into a layer, which is the organic layer on the interface, and then the electron-donating dopant is solely vapor-deposited by a resistance heating vapor deposition method to a layer preferably having a thickness of from 0.1 to 15 nm. In the case where the electron-donating dopant is formed into islands, such a manner may be employed that the emitting material and the electron injection material are formed into islands, which are the organic layer on the interface, and then the electron-donating dopant is solely vapor-deposited by a resistance heating vapor deposition method to islands preferably having a thickness of from 0.05 to 1 nm.

In the organic EL device of the present invention, the ratio of the major components and the electron-donating dopant, (major components)/(electron donating dopant), is preferably from 5/1 to 1/5 in terms of molar ratio.

Electron Transporting Layer

The electron transporting layer is an organic layer formed between the emitting layer and the cathode, and has a function of transporting electrons from the cathode to the emitting layer. In the case where the electron transporting layer is constituted by plural layers, the organic layer close to the cathode may be determined as an electron injecting layer in some cases. The electron injecting layer has a function of injecting electrons efficiently from the cathode to the organic layer unit.

The electron transporting material used in the electron transporting layer is preferably an aromatic heterocyclic compound having one or more hetero atoms in the molecule thereof, and more preferably a nitrogen-containing ring derivative. The nitrogen-containing ring derivative is preferably an aromatic ring compound having a nitrogen-containing 6-membered or 5-membered ring skeleton, or a condensed aromatic ring compound having a nitrogen-containing 6-membered or 5-membered ring skeleton.

Preferred examples of the nitrogen-containing ring derivative include a nitrogen-containing ring metal chelate complex represented by the following formula (A).

(A)

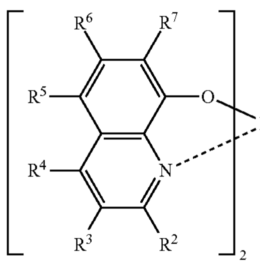

In the formula (A), $R^2$ to $R^7$ each independently represent a hydrogen atom, a deuterium atom, a halogen atom, a hydroxyl group, an amino group, a hydrocarbon group having from 1 to 40 carbon atoms, an alkoxy group having from 1 to 40 carbon atoms, an aryloxy group having from 6 to 50 carbon atoms, an alkoxycarbonyl group or an aromatic heterocyclic group having from 5 to 50 ring carbon atoms, and these groups may be substituted.

M represents aluminum (Al), gallium (Ga) or indium (In), and preferably indium.

L represents a group represented by the following formula (A') or (A").

(A')

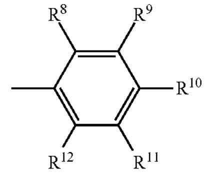

(A")

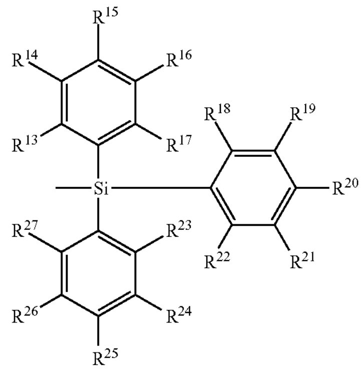

In the formula (A'), $R^8$ to $R^{12}$ each independently represent a hydrogen atom, a deuterium atom or a substituted or unsubstituted hydrocarbon group having from 1 to 40 carbon atoms, and the groups adjacent to each other may form a cyclic structure. In the formula (A"), $R^{13}$ to $R^{27}$ each independently represent a hydrogen atom, a deuterium atom or a substituted or unsubstituted hydrocarbon group having from 1 to 40 carbon atoms, and the groups adjacent to each other may form a cyclic structure.

Preferred examples of the electron transfer compound used in the electron transporting layer include a metal complex of 8-hydroxyquinoline or a derivative thereof, an oxadiazole derivative and a nitrogen-containing heterocyclic derivative.

The electron transfer compound used preferably has good thin film forming property. Specific examples of the electron transfer compound include the following compounds.

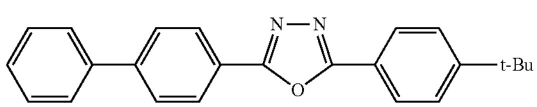

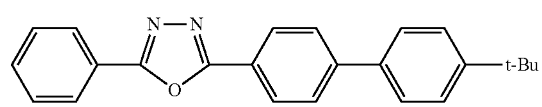

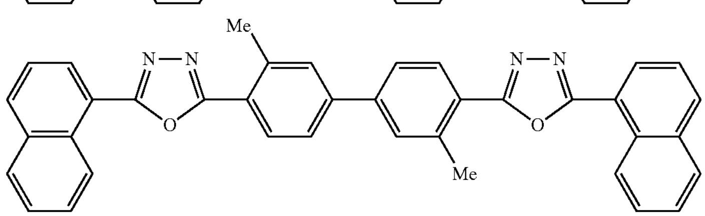

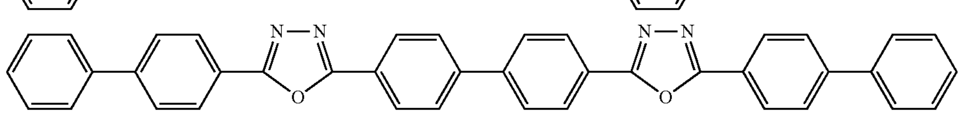

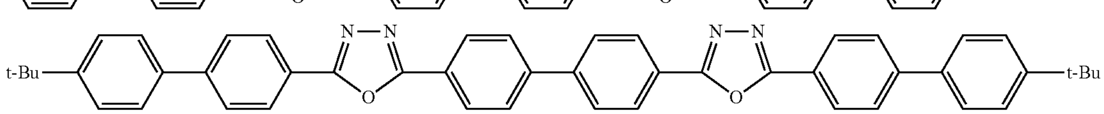

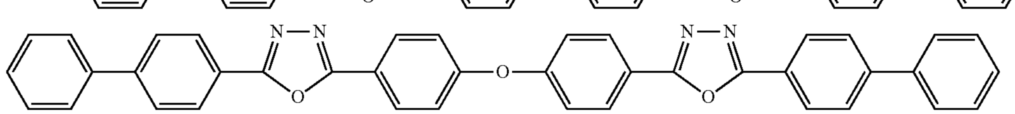

Examples of the nitrogen-containing heterocyclic derivative as the electron transfer compound include a nitrogen-containing compound that is a nitrogen-containing heterocyclic derivative containing an organic compound having a moiety represented by the following formula (D), and is not a metal complex.

(D)

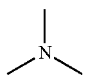

The electron transporting layer of the organic EL device of the present invention particularly preferably comprises at least one kind of a nitrogen-containing heterocyclic derivative represented by the following formulae (60) to (62).

(60)

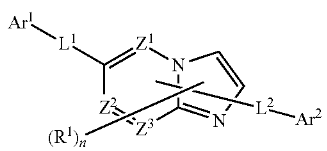

(61)

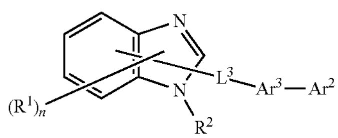

(62)

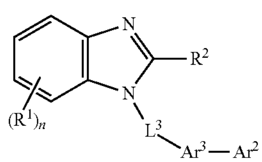

In the formulae (60) to (62), $Z^1$, $Z^2$ and $Z^3$ each independently represent a nitrogen atom or a carbon atom.

$R^1$ and $R^2$ each independently represent a substituted or unsubstituted aryl group having from 6 to 50 ring carbon atoms, a substituted or unsubstituted heteroaryl group having from 5 to 50 ring atoms, a substituted or unsubstituted alkyl group having from 1 to 20 carbon atoms, a substituted or unsubstituted haloalkyl group having from 1 to 20 carbon atoms or a substituted or unsubstituted alkoxy group having from 1 to 20 carbon atoms.

n represents an integer of from 0 to 5, provided that when n is an integer of 2 or more, plural groups represented by $R^1$ may be the same as or different from each other. Two adjacent groups represented by $R^1$ may be bonded to each other to form a substituted or unsubstituted hydrocarbon ring.

$Ar^1$ represents a substituted or unsubstituted aryl group having from 6 to 50 ring carbon atoms or a substituted or unsubstituted heteroaryl group having from 5 to 50 ring atoms.

$Ar^2$ represents a hydrogen atom, a substituted or unsubstituted alkyl group having from 1 to 20 carbon atoms, a substituted or unsubstituted haloalkyl group having from 1 to 20 carbon atoms, a substituted or unsubstituted alkoxy group having from 1 to 20 carbon atoms, a substituted or unsubstituted aryl group having from 6 to 50 ring carbon atoms or a substituted or unsubstituted heteroaryl group having from 5 to 50 ring atoms.

Any one of $Ar^1$ and $Ar^2$ represents a substituted or unsubstituted condensed aromatic hydrocarbon ring group having from 10 to 50 ring carbon atoms or a substituted or unsubstituted condensed aromatic heterocyclic group having from 9 to 50 ring atoms.

$Ar^3$ represents a substituted or unsubstituted arylene group having from 6 to 50 ring carbon atoms or a substituted or unsubstituted heteroarylene group having from 5 to 50 ring atoms.

$L^1$, $L^2$ and $L^3$ each independently represent a single bond, a substituted or unsubstituted arylene group having from 6 to 50 ring carbon atoms or a substituted or unsubstituted divalent condensed aromatic heterocyclic group having from 9 to 50 ring atoms.

Specific examples of the nitrogen-containing heterocyclic derivatives represented by the formulae (60) to (62) include the following compounds.

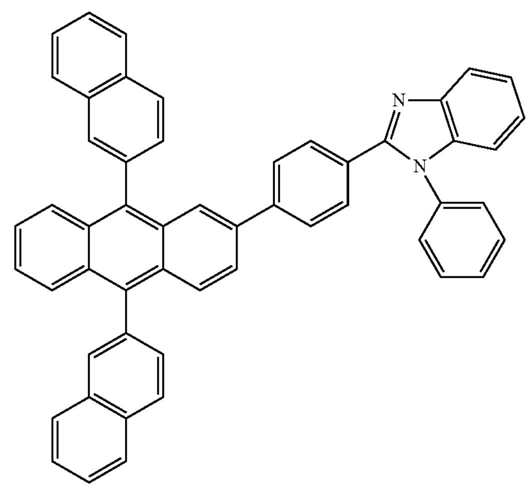

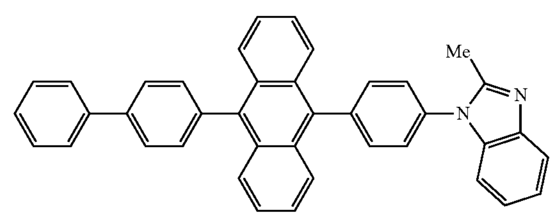

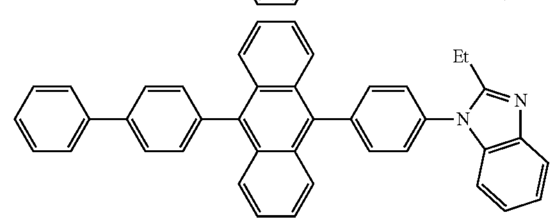

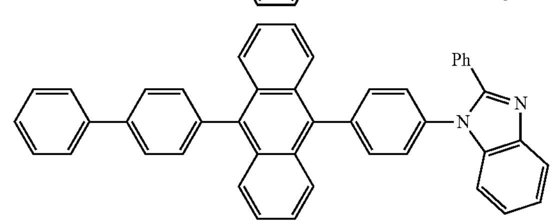

-continued

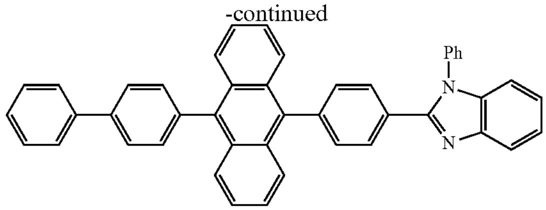

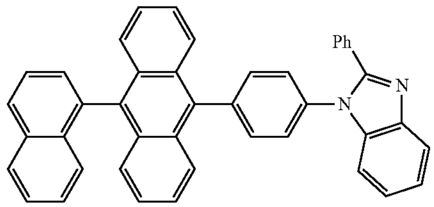 [SMILES: Cc1nc2ccccc2n1-c1ccc(-c2c3ccccc3c(-c3cccc4ccccc34)c3ccccc23)cc1]

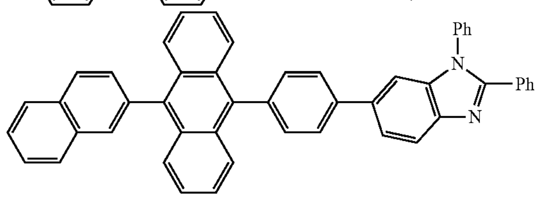

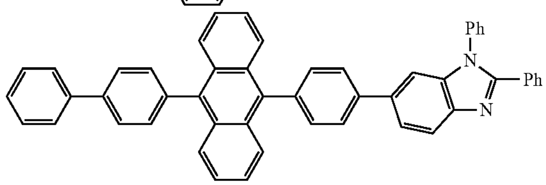

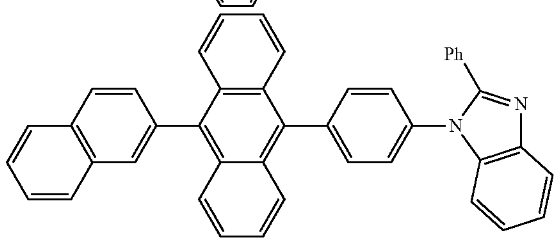

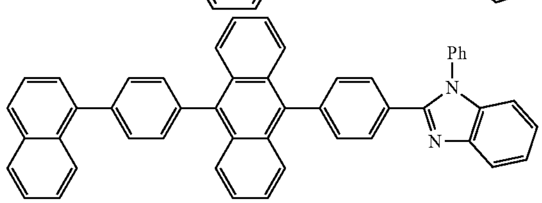

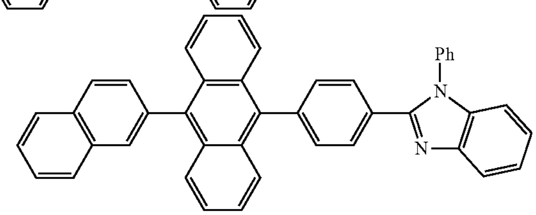

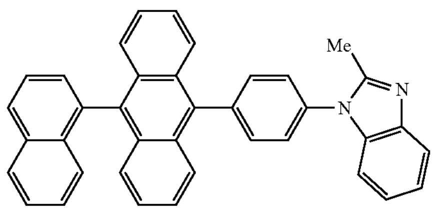

The thickness of the electron transporting layer is not particularly limited and is preferably from 1 to 100 nm.

As the constitutional component of the electron injecting layer, which is provided adjacent to the electron transporting layer, an insulating material or a semiconductor is preferably used as an inorganic material in addition to the nitrogen-containing derivative. The electron injecting layer that is constituted by an insulating material or a semiconductor may effectively prevent leakage of electric current, thereby enhancing the electron injection property.

The insulating material used is preferably at least one metal compound selected from the group consisting of an alkali metal chalcogenide, an alkaline earth metal chalcogenide, an alkali metal halide and an alkaline earth metal halide. When the electron injecting layer is formed of these compounds, such as an alkali metal chalcogenide, the electron injection property may further be enhanced advantageously. Specifically, preferred examples of the alkali metal chalcogenide include $Li_2O$, $K_2O$, $Na_2S$, $Na_2Se$ and $Na_2O$, and preferred examples of the alkaline earth metal chalcogenide include CaO, BaO, SrO, BeO, BaS and CaSe. Preferred examples of the alkali metal halide include LiF, NaF, KF, LiCl, KCl and NaCl, and preferred examples of the alkaline earth metal halide include a fluoride, such as $CaF_2$, $BaF_2$, $SrF_2$, $MgF_2$ and $BeF_2$, and a halide other than the fluoride.

Examples of the semiconductor include a single material or a combination of two kinds of an oxide, a nitride and an oxynitride containing at least one element of Ba, Ca, Sr, Yb, Al, Ga, In, Li, Na, Cd, Mg, Si, Ta, Sb and Zn. The inorganic material constituting the electron injecting layer is preferably in the form of a microcrystalline or amorphous insulating thin film. When the electron injecting layer is constituted by the insulating thin film, a uniform thin film may be formed to reduce image defects, such as dark sports. Examples of the inorganic material include an alkali metal chalcogenide, an alkaline earth metal chalcogenide, an alkali metal halide and an alkaline earth metal halide.

In the case where the insulating material or the semiconductor is used, the thickness of the layer thereof is preferably approximately from 0.1 to 15 nm. The electron injecting layer in the present invention may preferably comprises the electron-donating dopant described above.

Hole Transporting Layer

The hole transporting layer is an organic layer formed between the emitting layer and the anode, and has a function of transporting holes from the anode to the emitting layer. In the case where the hole transporting layer is constituted by plural layers, the organic layer close to the anode may be determined as a hole injecting layer in some cases. The hole injecting layer has a function of injecting holes efficiently from the anode to the organic layer unit.

Preferred examples of the other materials constituting the hole transporting layer include an aromatic amine compound, such as an aromatic amine derivative represented by the following formula (I).

(I)

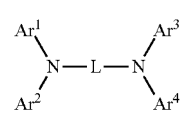

In the formula (I), $Ar^1$ to $Ar^4$ each independently represent a substituted or unsubstituted aromatic hydrocarbon or condensed aromatic hydrocarbon group having from 6 to 50 ring carbon atoms, a substituted or unsubstituted aromatic heterocyclic or condensed aromatic heterocyclic group having from 5 to 50 ring atoms, or a group comprising the aromatic hydrocarbon or condensed aromatic hydrocarbon group and the aromatic heterocyclic or condensed aromatic heterocyclic group bonded to each other. $Ar^1$ and $Ar^2$, and $Ar^3$ and $Ar^4$ each may form a ring.

In the formula (I), L represents a substituted or unsubstituted aromatic hydrocarbon or condensed aromatic hydrocarbon group having from 6 to 50 ring carbon atoms, or a substituted or unsubstituted aromatic heterocyclic or condensed aromatic heterocyclic group having from 5 to 50 ring atoms.

Specific examples of the compound represented by the formula (I) are shown below.

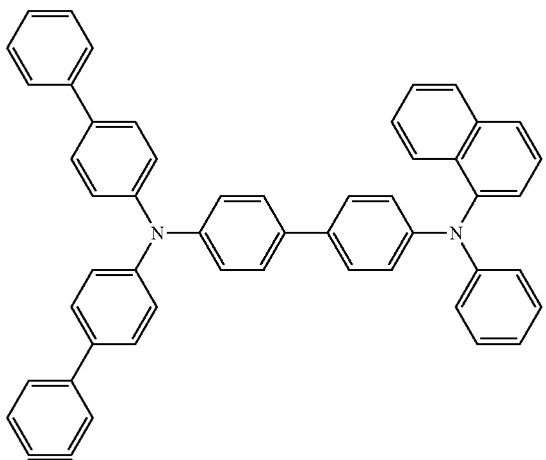

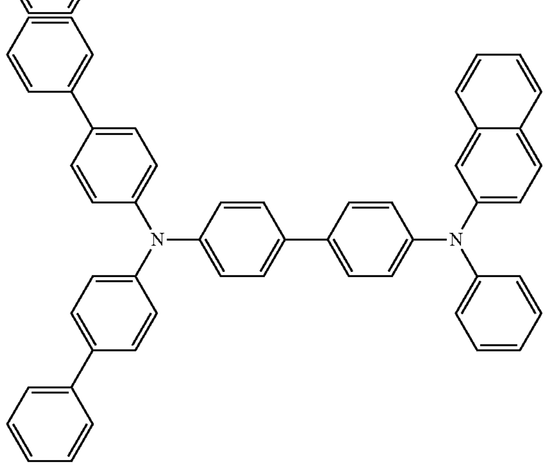

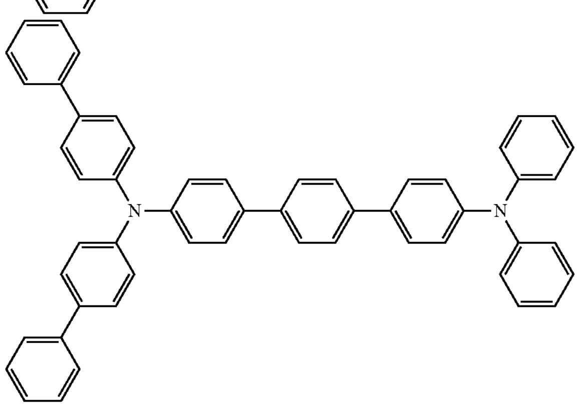

-continued

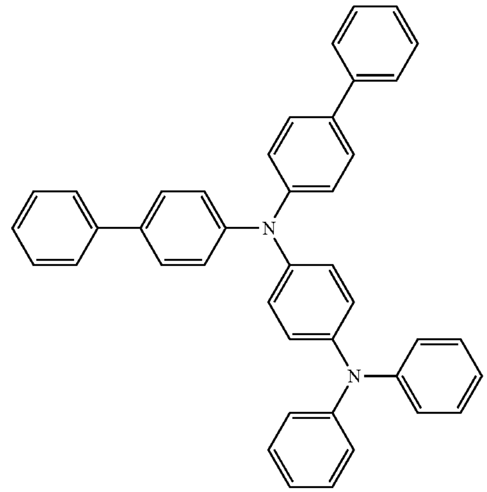

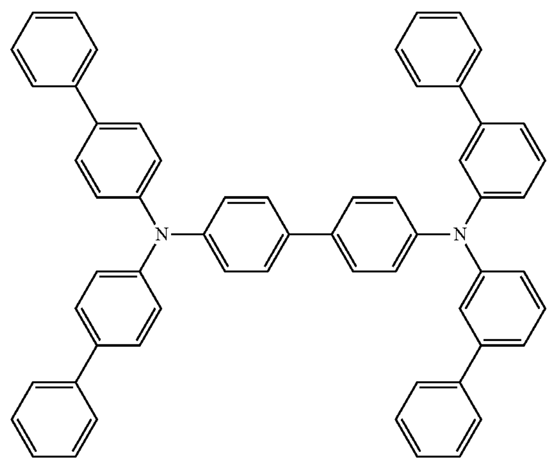

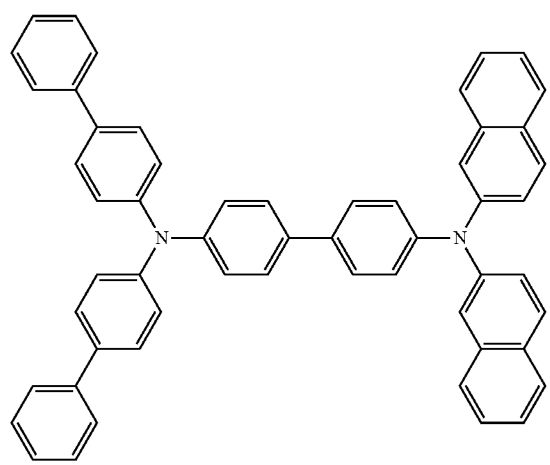

-continued
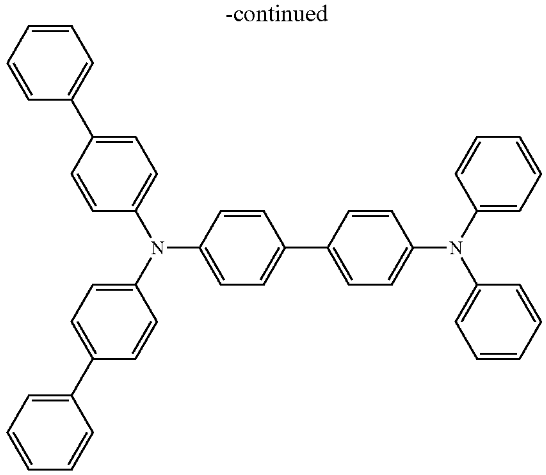
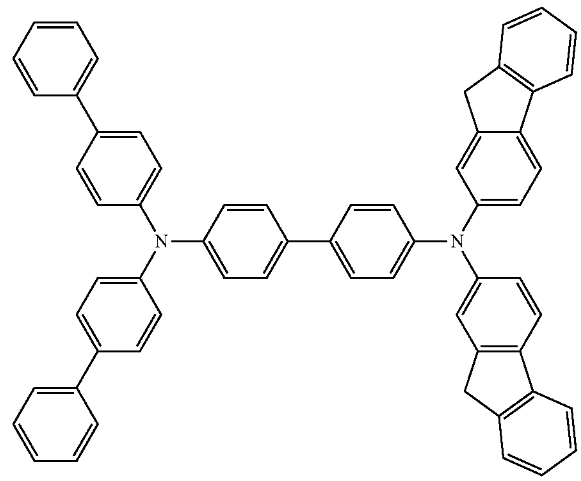
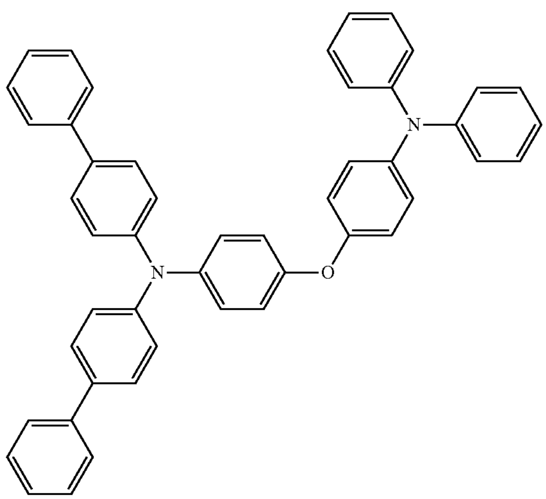
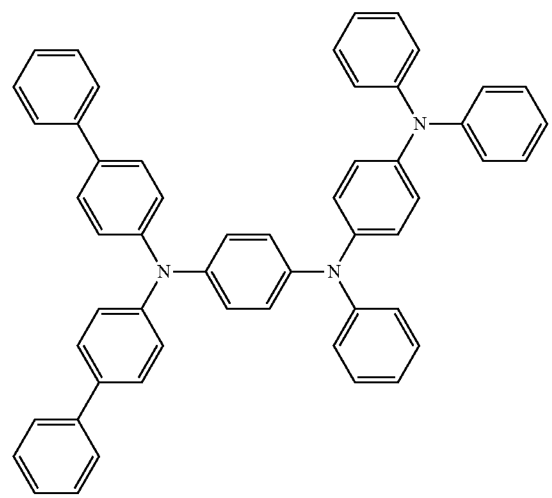
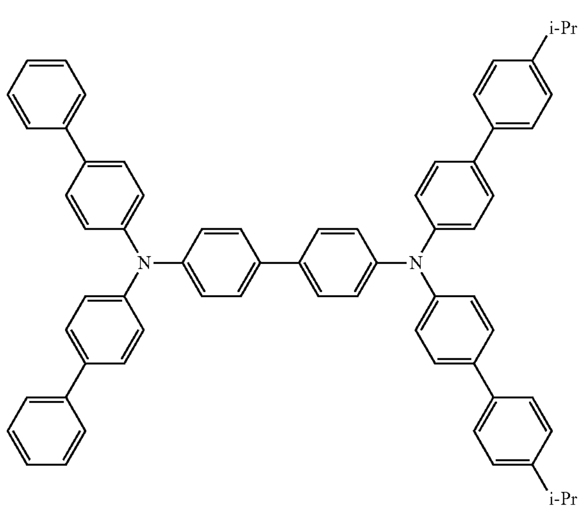
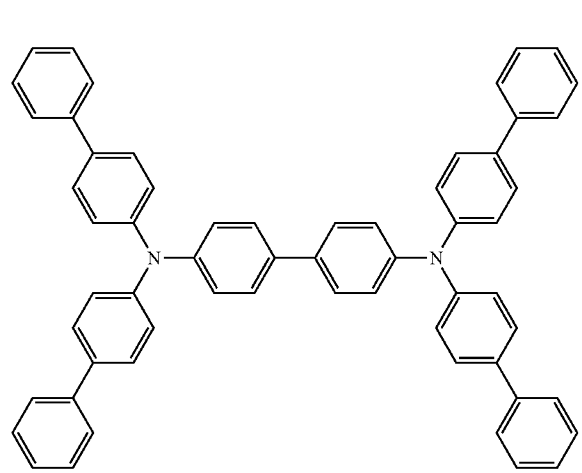

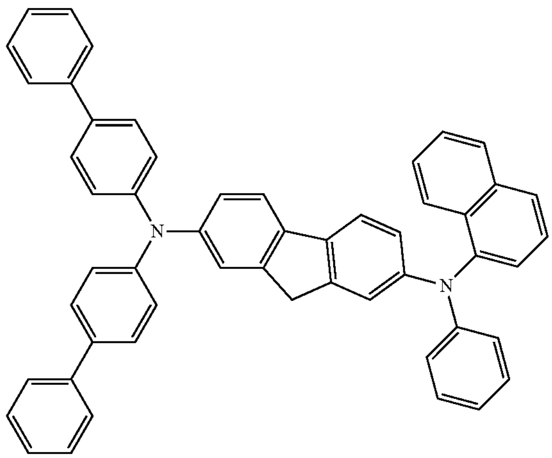
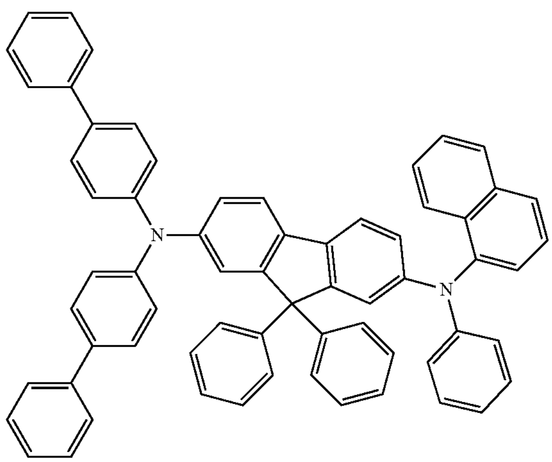
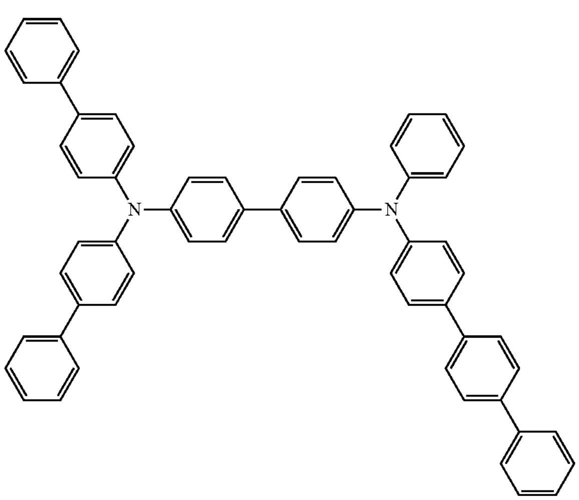
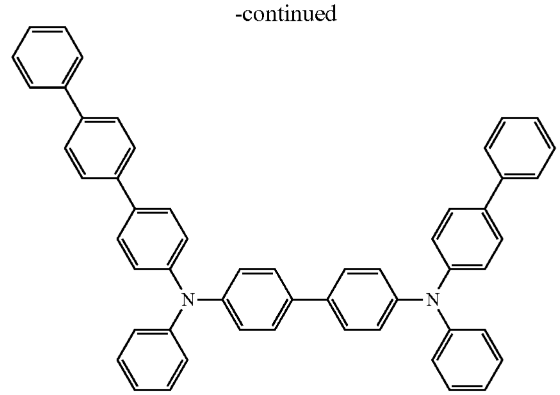
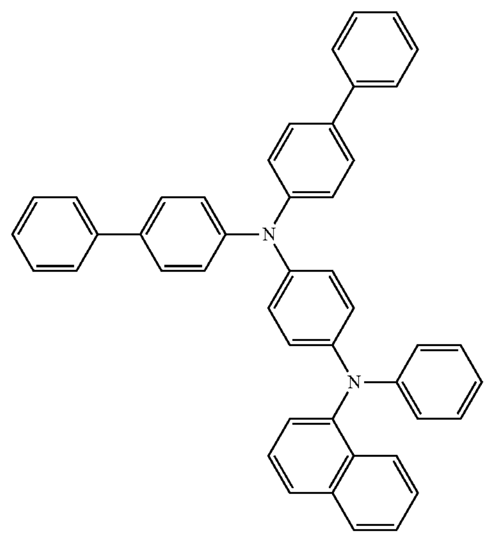
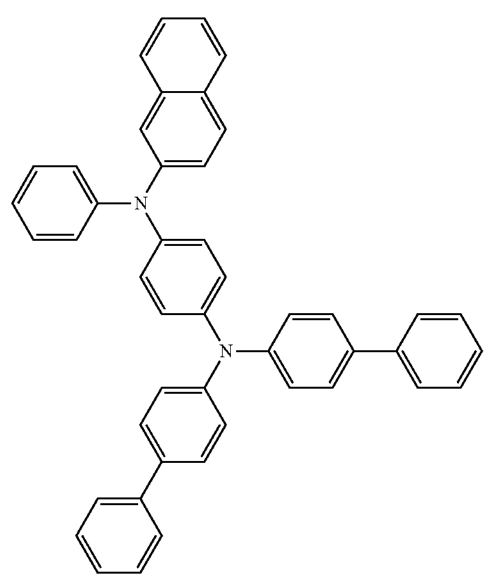

-continued
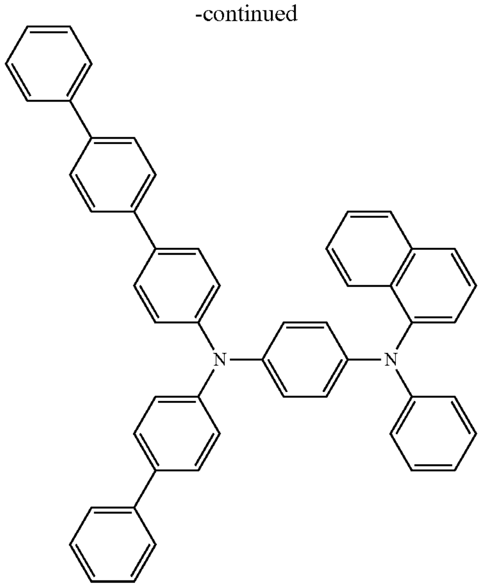
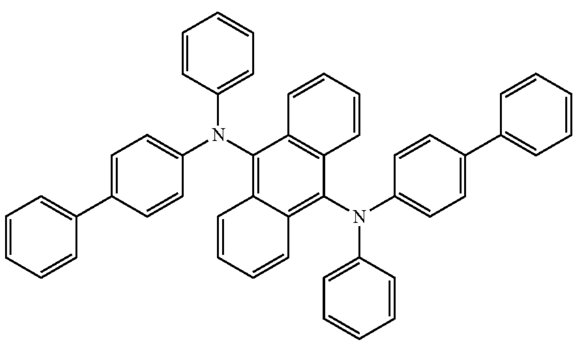
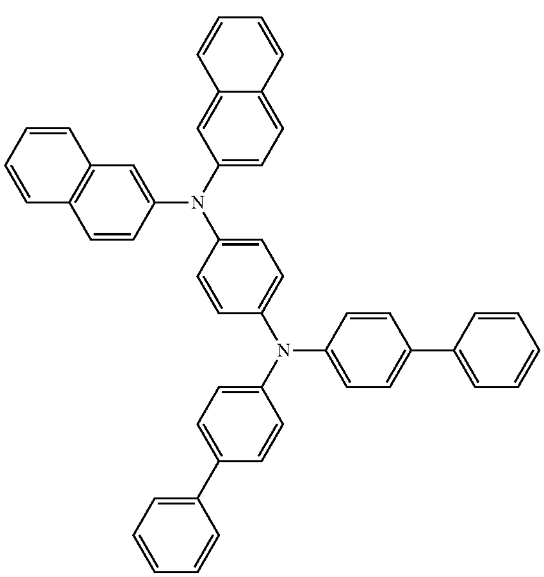
-continued
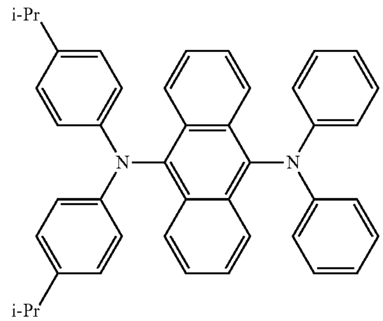
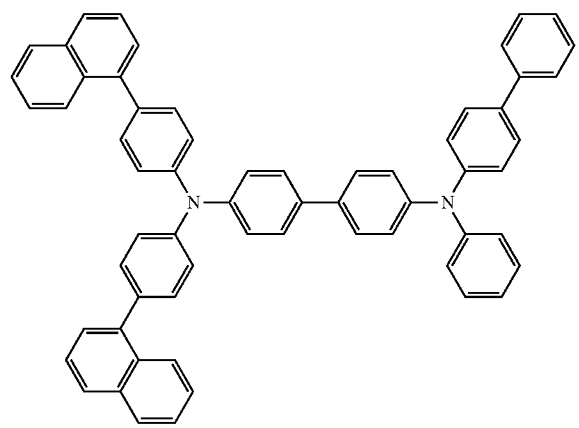
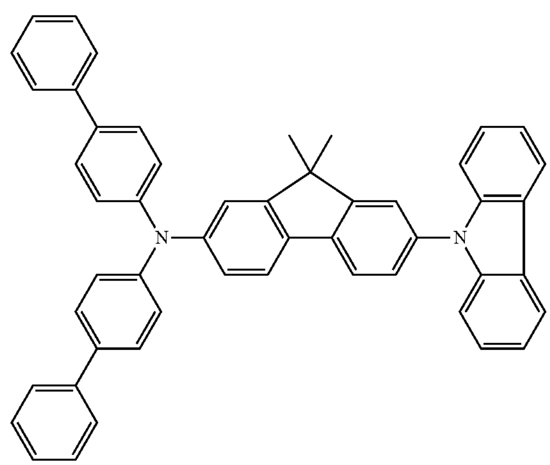
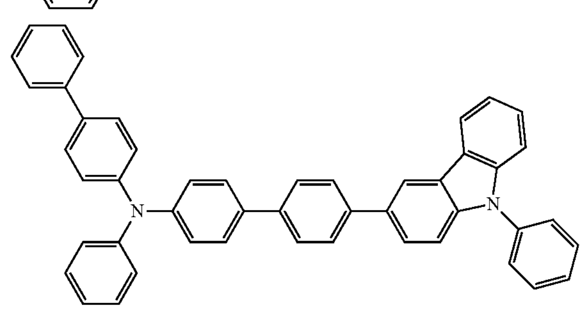

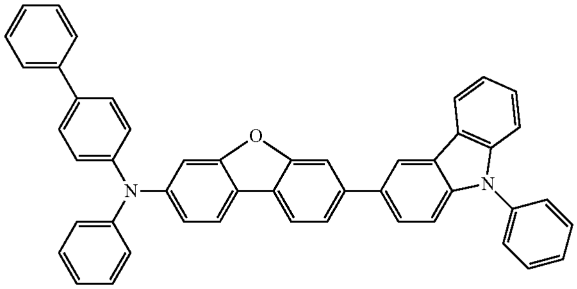
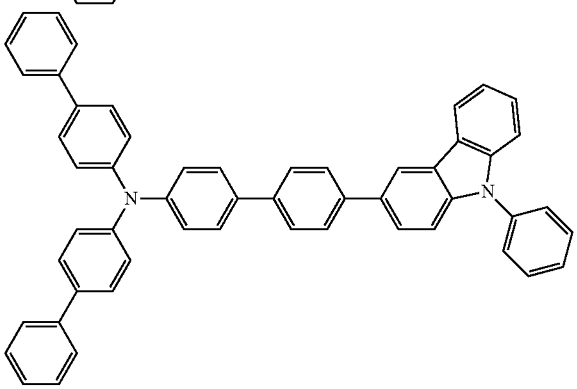
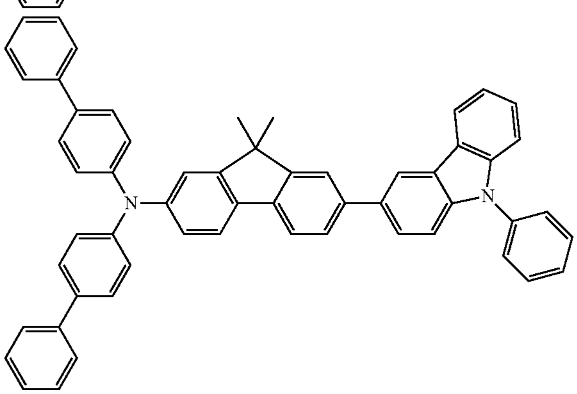
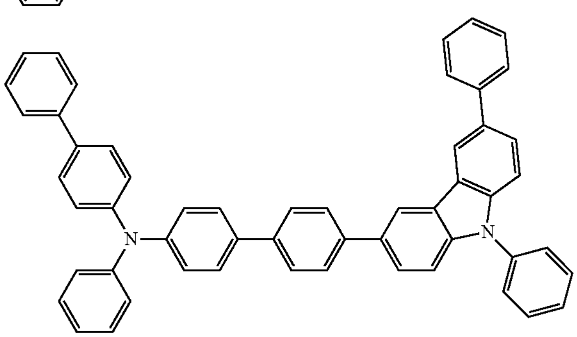
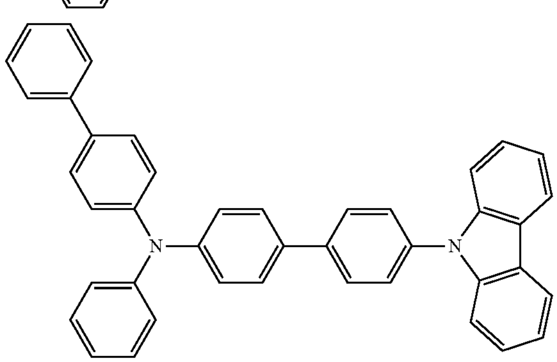
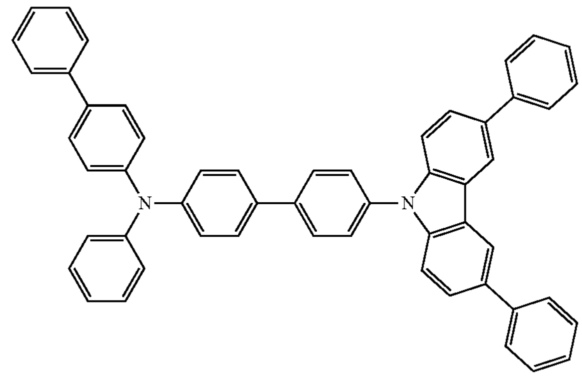
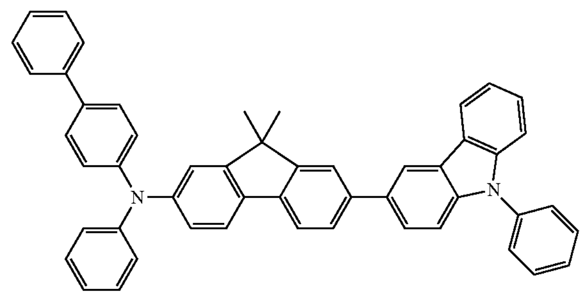
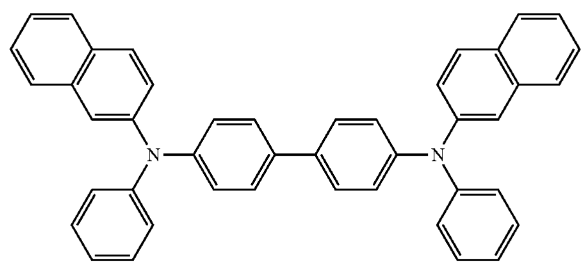
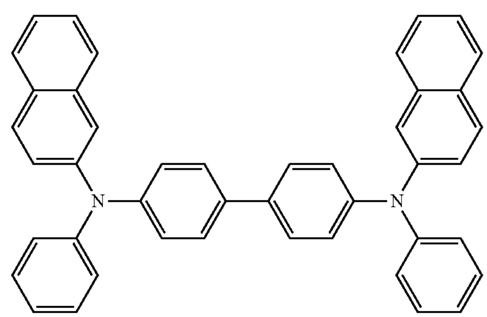
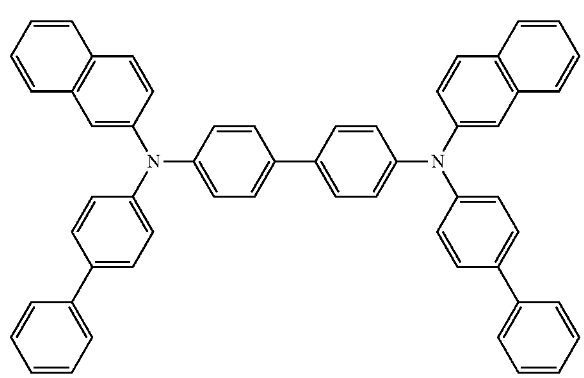

-continued
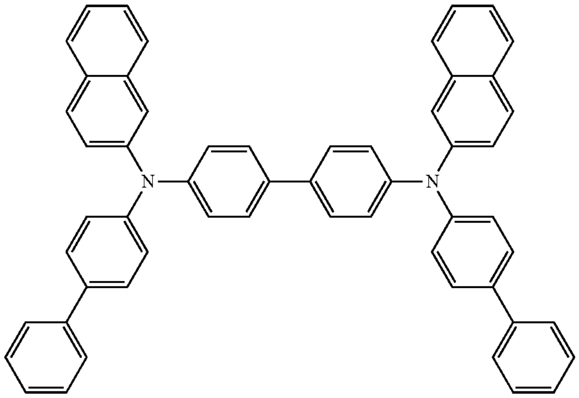
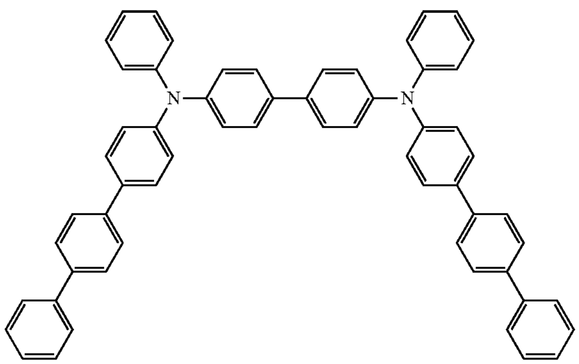
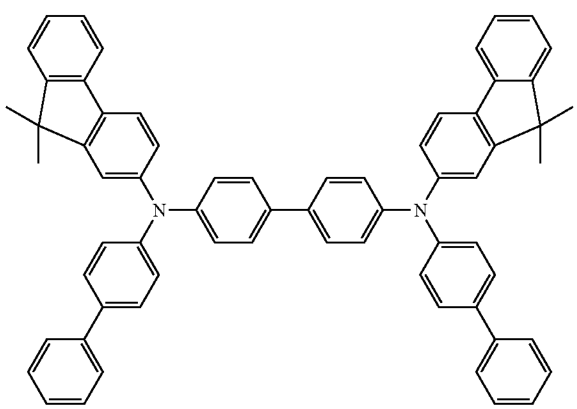
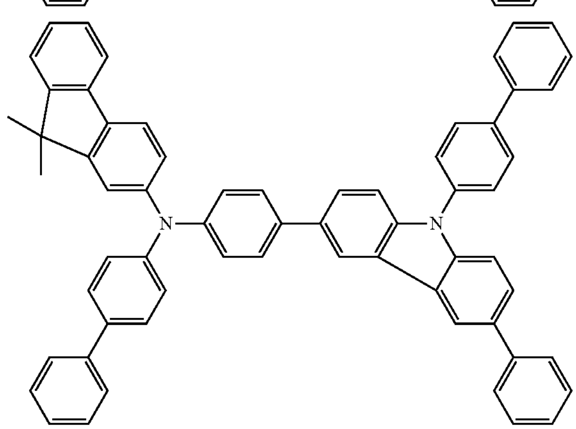
-continued
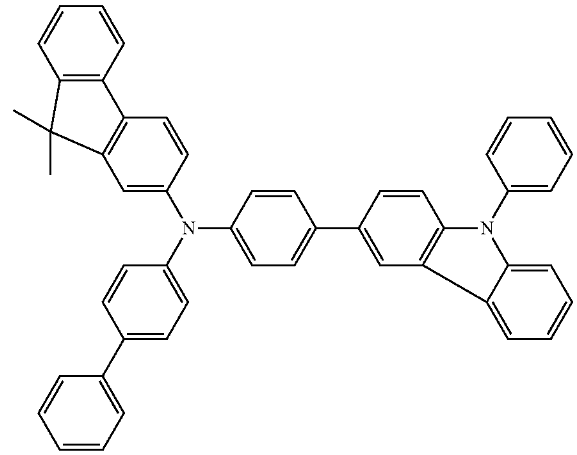
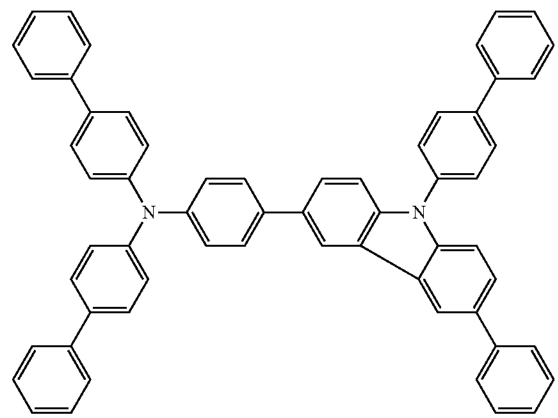
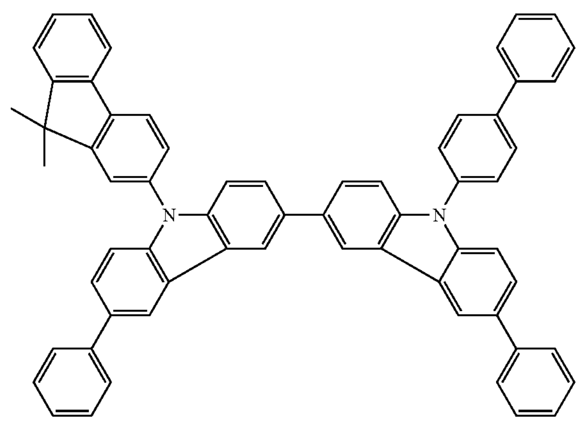
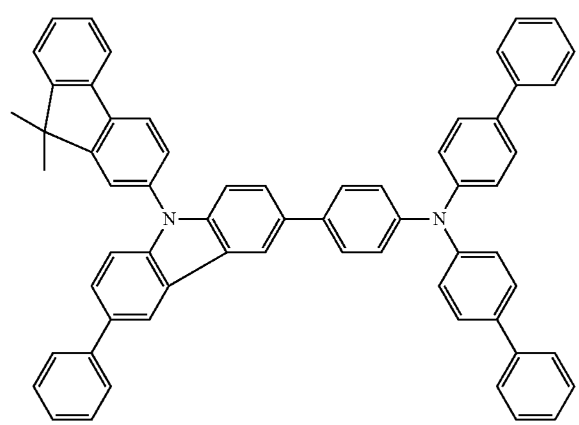

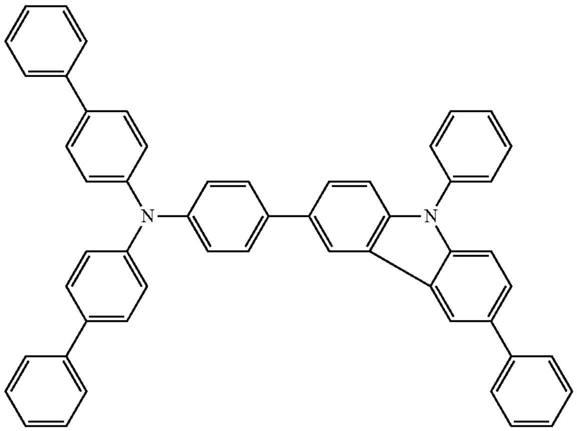
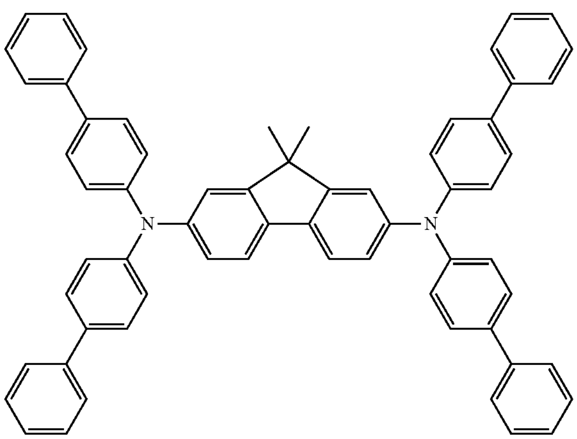
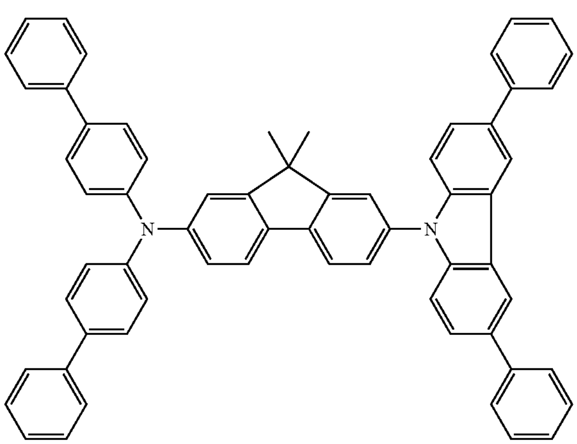
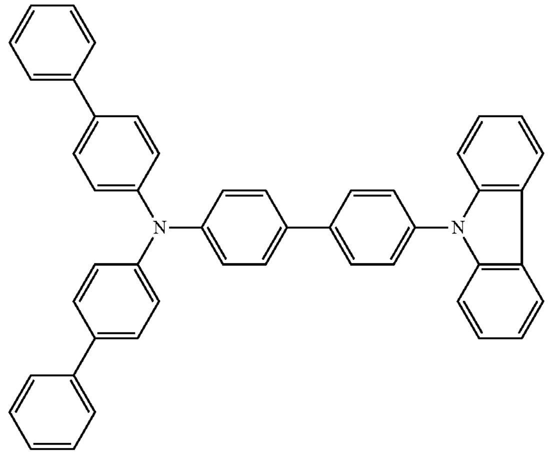
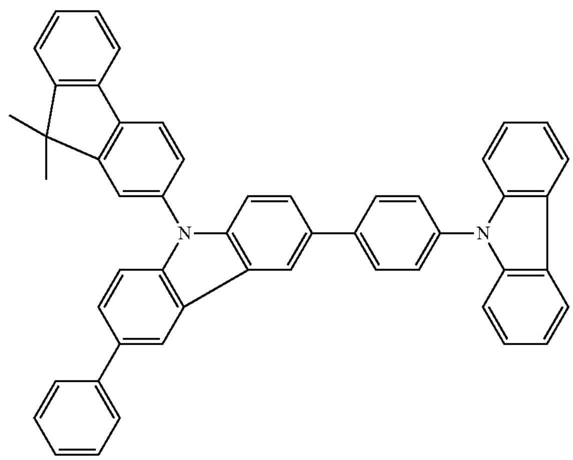
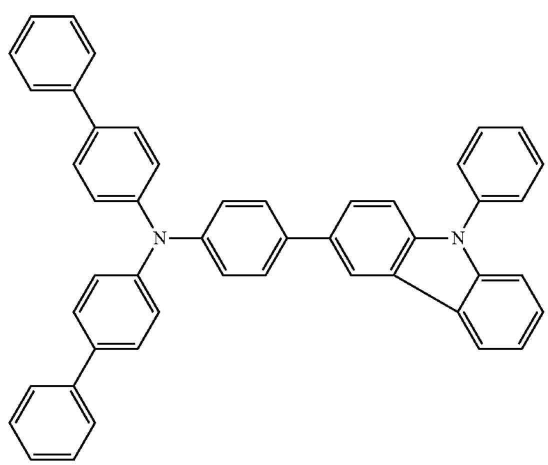

-continued

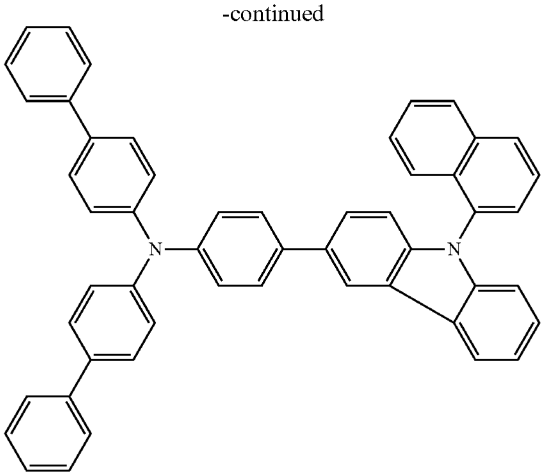

An aromatic amine compound represented by the following formula (II) may also be preferably used for forming the hole transporting layer.

(II)

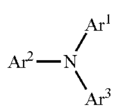

In the formula (II), $Ar^1$ to $Ar^3$ have the same meanings as $Ar^1$ to $Ar^4$ in the formula (I), respectively. Specific examples of the compound represented by the formula (II) are shown below, but the compound is not limited thereto.

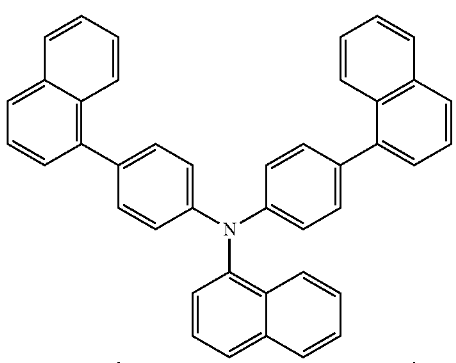

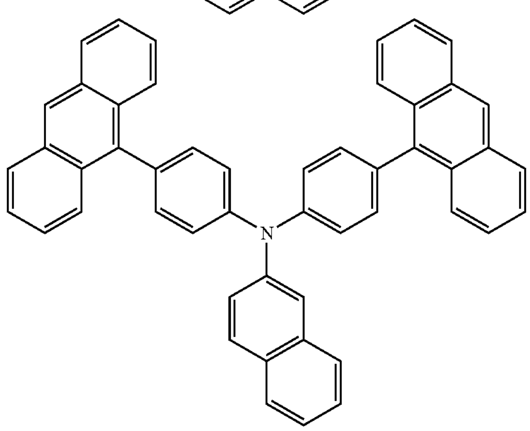

-continued

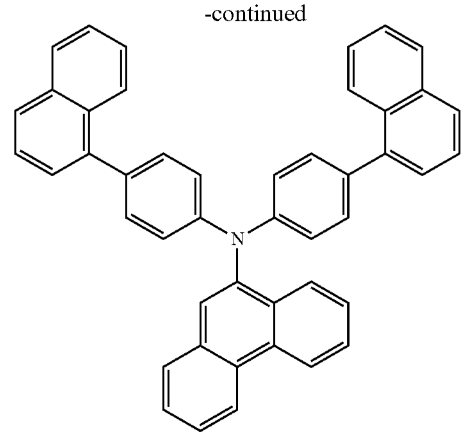

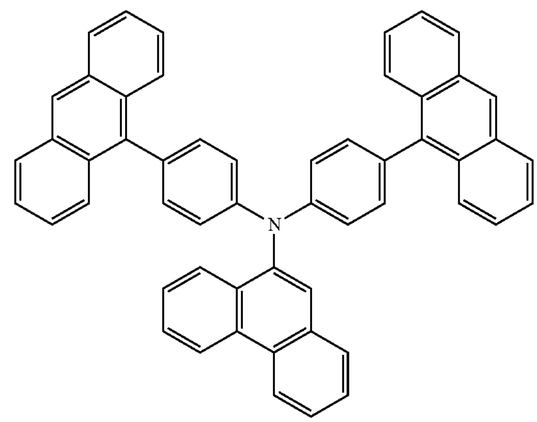

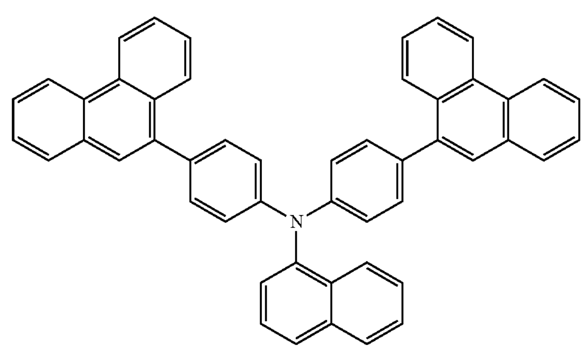

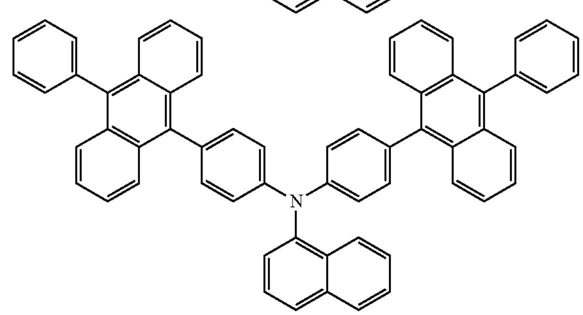

-continued
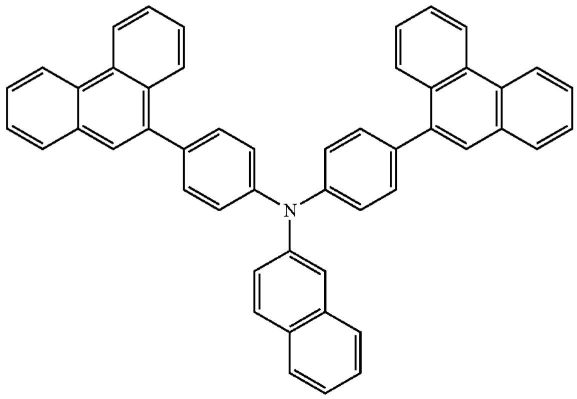
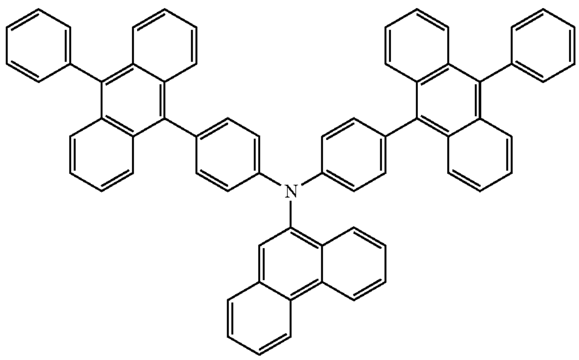
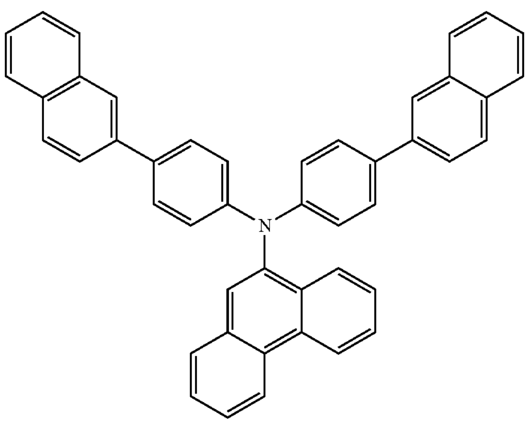
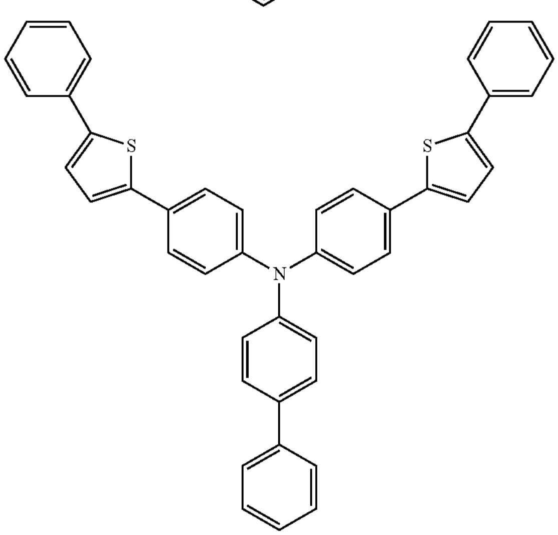
-continued
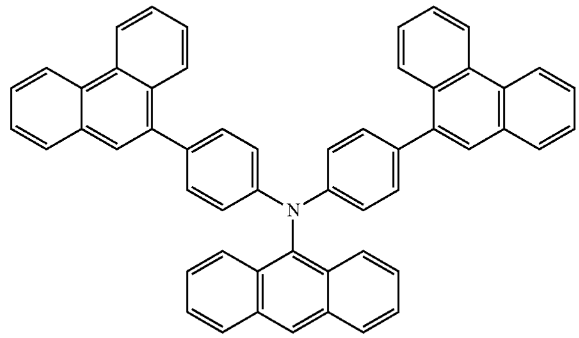
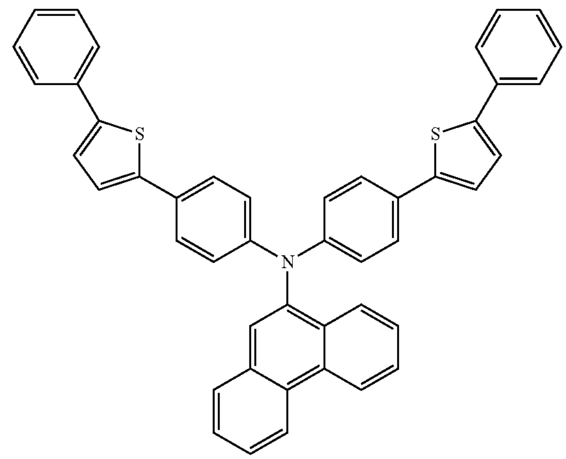
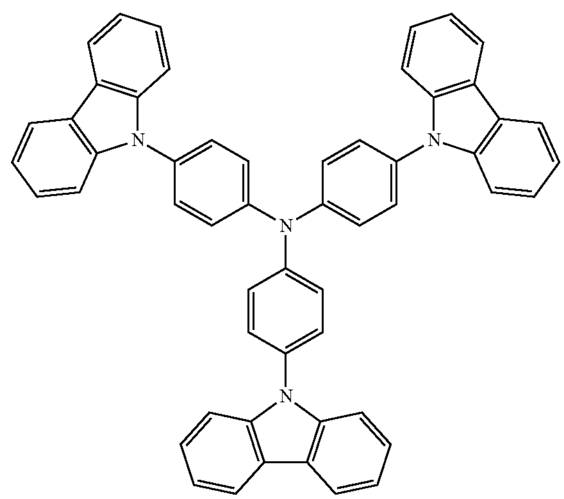
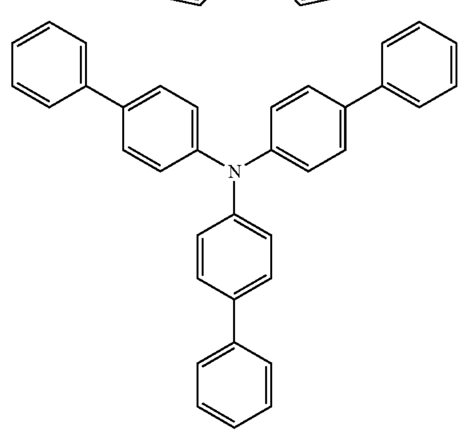

-continued
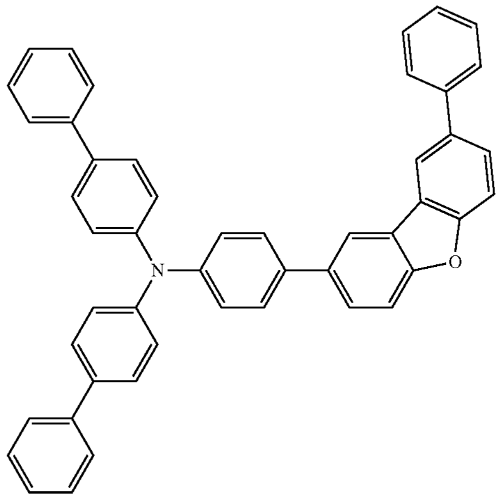
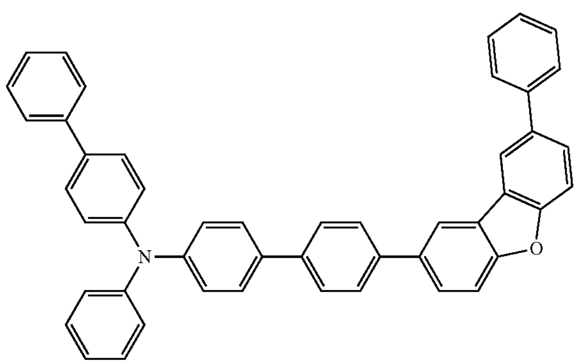
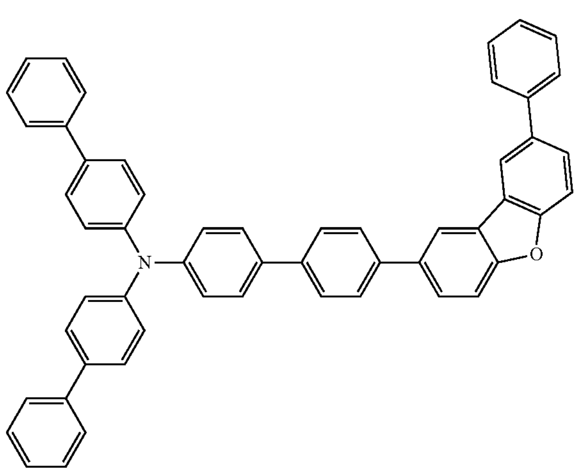
-continued
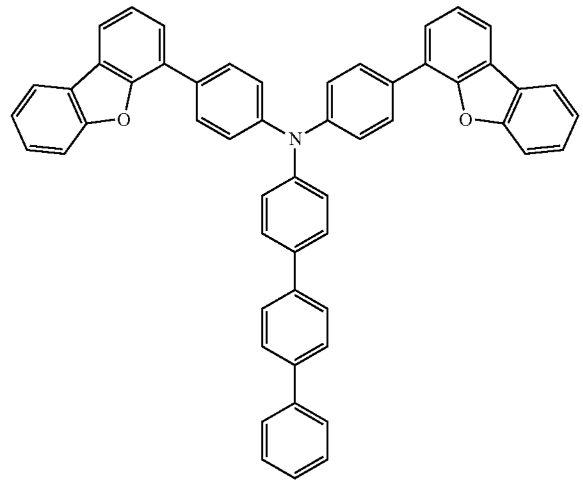
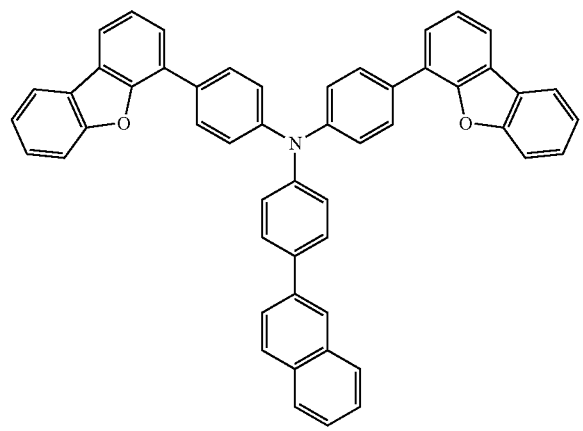
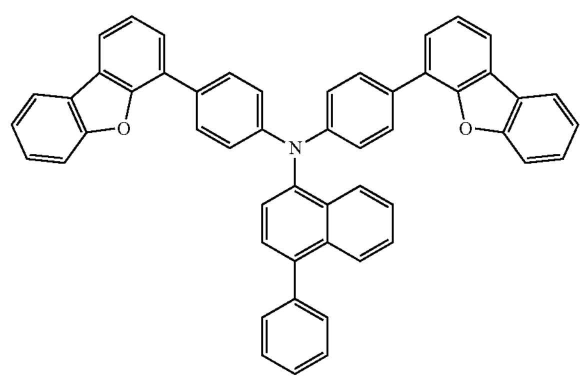
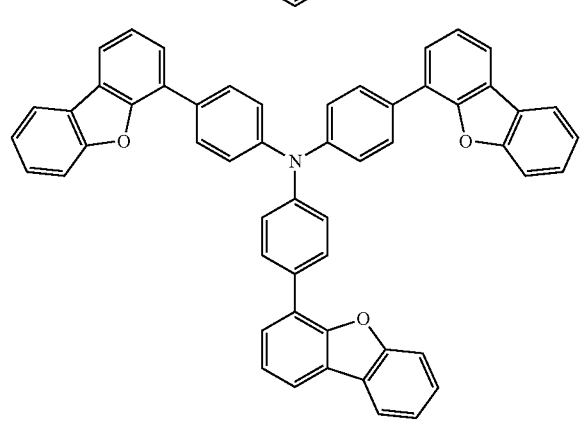

-continued

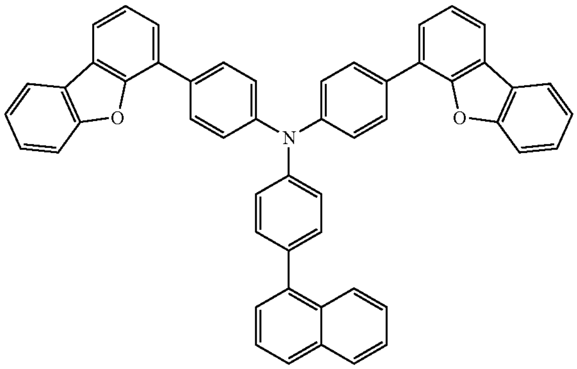

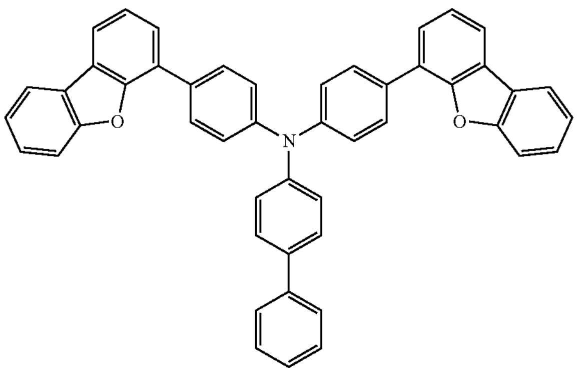

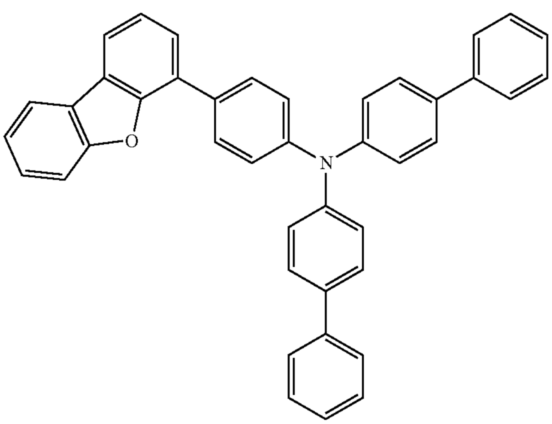

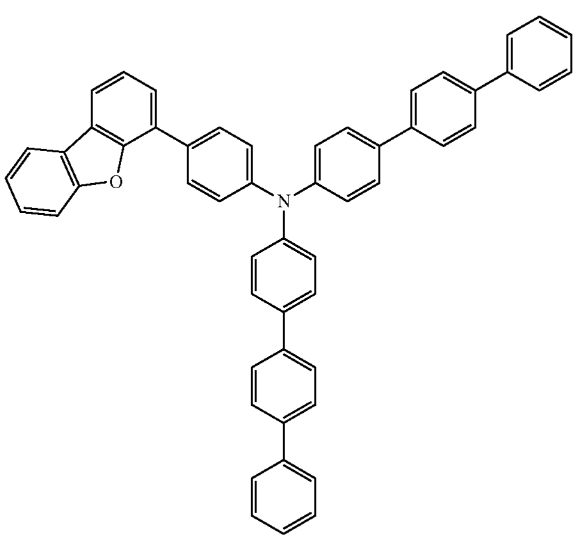

-continued

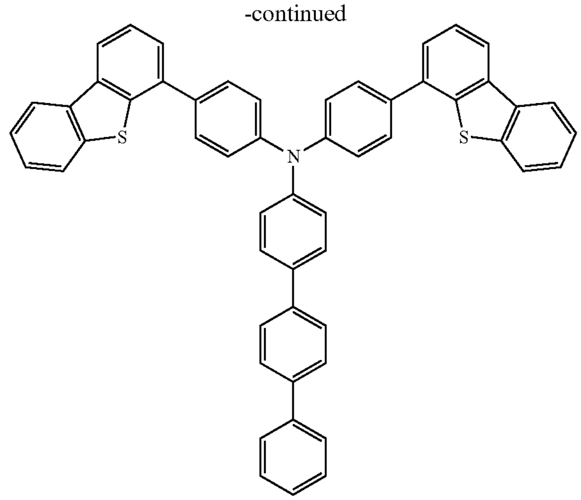

The hole transporting layer of the organic EL device of the present invention may have a two-layer structure containing the first hole transporting layer (on the side of the anode) and the second hole transporting layer (on the side of the cathode).

The thickness of the hole transporting layer is not particularly limited and is preferably from 10 to 200 nm.

In the organic EL device of the present invention, a layer comprising an acceptor material may be coupled to the side of the anode of the hole transporting layer or the first hole transporting layer. According to the structure, reduction of the driving voltage and reduction of the production cost may be expected.

Preferred examples of the acceptor material include a compound represented by the following formula.

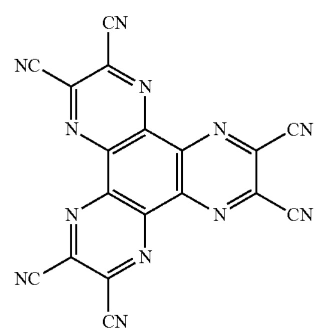 [SMILES: N#Cc1nc2c3nc(C#N)c(C#N)nc3c3nc(C#N)c(C#N)nc3c2nc1C#N]

The thickness of the layer comprising an acceptor material is not particularly limited and is preferably from 5 to 20 nm.

n/p Doping

The hole transporting layer and the electron transporting layer may be controlled in the carrier injection capability by doping with a donor material (n-doping) or an acceptor material (p-doping) as described in Japanese Patent No. 3,695,714.

Representative examples of the n-doping include a method of doping an electron transporting material with a metal, such as Li and Cs, and representative examples of the p-doping include a method of doping a hole transporting material with an acceptor material, such as $F_4TCNQ$.

Space Layer

The space layer is a layer that is provided, for example, in the case where a fluorescent layer and a phosphorescent layer are laminated, between the fluorescent layer and the phosphorescent layer, for preventing excitons formed in the phosphorescent layer from being diffused to the fluorescent layer, or for controlling the carrier balance. The space layer may be formed between the plural phosphorescent layers.

The space layer is provided between the emitting layers, and therefore is preferably formed with a material having both electron transporting property and hole transporting property. The material preferably has triplet energy of 2.6 eV or more for preventing diffusion of the triplet energy in the adjacent phosphorescent layer. Examples of the material used in the space layer include those described for the hole transporting layer.

Barrier Layer

The organic EL device of the present invention preferably has a barrier layer, such as an electron barrier layer, a hole barrier layer and a triplet barrier layer, at the position adjacent to the emitting layer. The electron barrier layer is a layer for preventing electrons from leaking from the emitting layer to the hole transporting layer, and the hole barrier layer is a layer for preventing holes from leaking from the emitting layer to the electron transporting layer.

The triplet barrier layer has a function of preventing triplet excitons formed in the emitting layer from being diffused to the neighboring layers to confine the triplet excitons in the emitting layer, by which the triplet excitons are suppressed from undergoing energy deactivation on the other molecules than the emitting dopant in the electron transporting layer.

The electron injecting layer preferably has an electron mobility of $10^{-6}$ $cm^2/Vs$ or more under an electric field intensity in a range of from 0.04 to 0.5 MV/cm. According to the configuration, electron injection from the cathode to the electron transporting layer is facilitated, and thus electron injection to the barrier layer and the emitting layer adjacent thereto is facilitated, thereby enabling low-voltage driving.

EXAMPLE

The present invention will be described in more detail with reference to examples below, but the present invention is not limited to the examples.

Synthesis Example 1

Synthesis of Compound 1

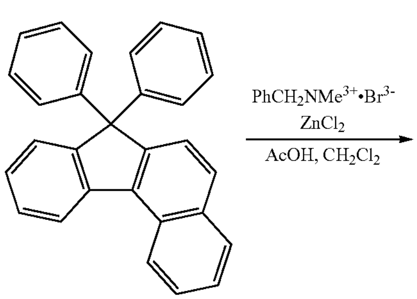

-continued

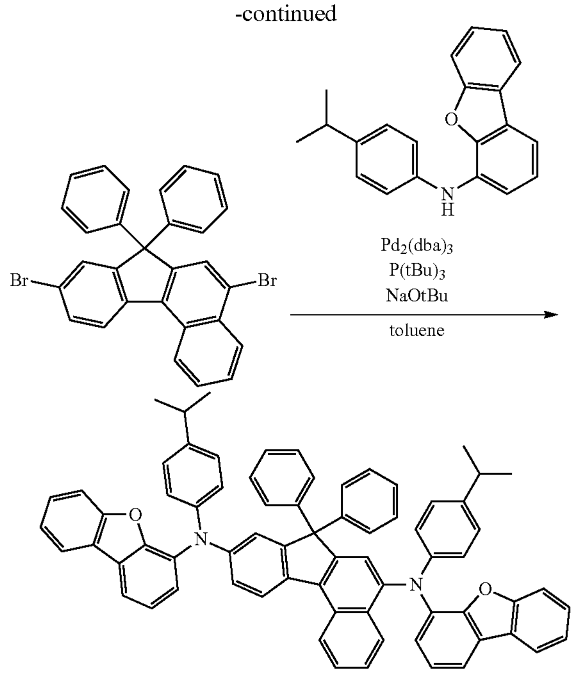

Compound 1

(1-1) Synthesis of 5,9-dibromo-7,7-diphenylbenzo[c]fluorene 85 mL of acetic acid and 85 mL of dichloromethane were added to 10 g of 7,7-diphenylbenzo[c]fluorene synthesized in the similar manner as described in WO 07/119,800 to form a mixed solution, to which 23.3 g of benzyltrimethylammonium bromide was added. Zinc chloride was then added thereto until benzyltrimethylammonium bromide was completely dissolved, and the mixture was reacted at room temperature for 8 hours. A 5% sodium bisulfite aqueous solution was added to the reaction mixture, which was then extracted with dichloromethane, and the dichloromethane layer was rinsed with a potassium carbonate aqueous solution and a saturated sodium chloride aqueous solution, and then dried over anhydrous sodium sulfate, followed by distilling off the solvent. The resulting residue was purified by silica gel chromatography and recrystallization to provide 9.72 g of 5,9-dibromo-7,7-diphenylbenzo[c]fluorene in the form of white solid (yield: 68%).

(1-2) Synthesis of Compound 1

Under an argon atmosphere, 2.5 g of 5,9-dibromo-7,7-diphenylbenzo[c]fluorene synthesized in the section (1-1), 3.6 g of 4-(4-isopropylphenylamino)dibenzofuran synthesized in the similar manner as described in WO 10/122,810, 0.13 g of trisdibenzylidene acetone dipalladium(0) and 0.91 g of sodium t-butoxide were dissolved in 24 mL of toluene, to which a solution obtained by dissolving 96 mg of tri-t-butylphosphine in 0.17 mL of toluene was added, and the mixture was stirred at 85° C. for 8 hours. The reaction mixture was cooled to room temperature, from which the solvent was removed by filtration with celite, and the resulting residue was purified by silica gel column chromatography and recrystallization to provide 1.92 g of Compound 1 in the form of yellow solid (yield: 41%). The resulting compound was determined as Compound 1 by mass spectrometry, in which m/e was 966 for the molecular weight of the compound, 966.42.

Example 1

A glass substrate with ITO transparent electrode lines having a dimension of 25 mm×75 mm×1.1 mm in thickness (produced by Geomatec Co., Ltd.) was rinsed with isopropyl alcohol under application of ultrasonic wave for 5 minutes and then subjected to UV ozone cleaning for 30 minutes. The thickness of the ITO transparent electrode lines was 130 nm.

The glass substrate with ITO transparent electrode lines thus cleaned was mounted on a substrate holder of a vacuum deposition equipment, and the compound HI-1 shown below was vapor-deposited on the surface of the substrate on the side where the ITO transparent electrode lines were formed, so as to form an HI-1 film having a thickness of 5 nm covering the transparent electrode, i.e., a hole injecting layer.

On the hole injecting layer, the compound HT-1 shown below as a first hole transporting material was then vapor-deposited to form an HT-1 film having a thickness of 110 nm, i.e., a first hole transporting layer.

On the first hole transporting layer, the compound HT-2 shown below (Compound 1 obtained in Synthesis Example 1) was then vapor-deposited to form an HT-2 film having a thickness of 15 nm, i.e., a second hole transporting layer.

On the second hole transporting layer, the compound BH-1 (host material) and Compound 1 (dopant material) were then vapor-deposited simultaneously to form a co-deposition film having a thickness of 25 nm. The concentration of Compound 1 was 5.0% by mass. The co-deposition film functions as an emitting layer.

On the emitting layer, the compound ET-1 shown below was then vapor-deposited to form an ET-1 film having a thickness of 10 nm, i.e., a first electron transporting layer.

On the first electron transporting layer, the compound ET-2 shown below was then vapor-deposited to form an ET-2 film having a thickness of 15 nm, i.e., a second electron transporting layer.

On the second electron transporting layer, LiF was then vapor-deposited at a film-forming rate of 0.1 Å/min to form an LiF film having a thickness of 1 nm, i.e., an electron injecting electrode (cathode).

On the LiF film, metallic Al was then vapor-deposited to form a metallic Al film having a thickness of 80 nm, i.e., a metallic Al cathode.

HI-1

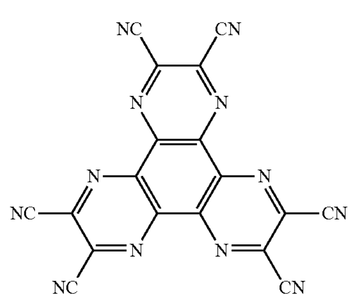

-continued

HT-1

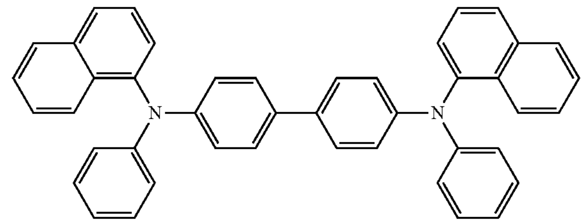

HT-2

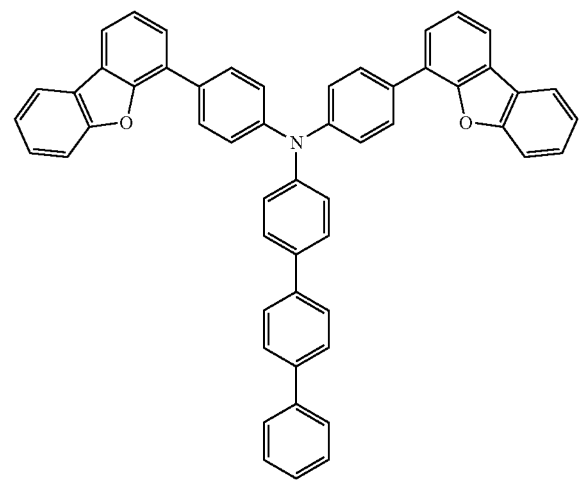

BH-1

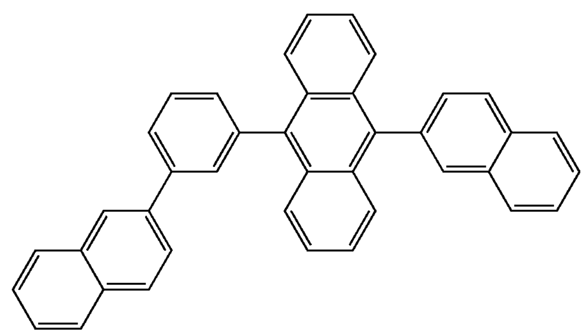

ET-1

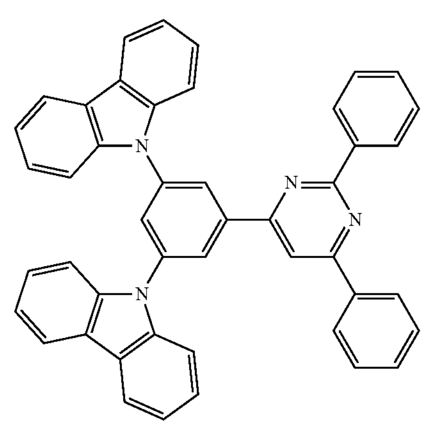

-continued

ET-2

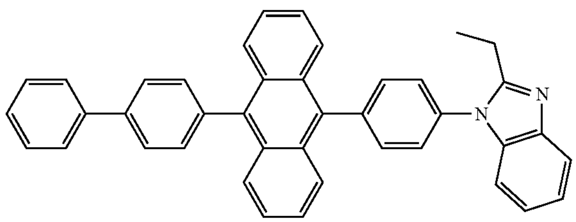

Compound 1

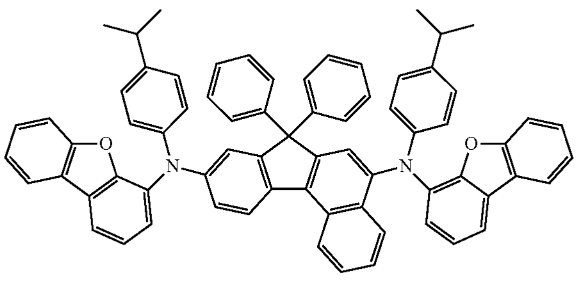

Comparative Example 1

An organic EL device was produced in the same manner as in Example 1 except that Comparative Compound shown below was used instead of Compound 1.

Comparative Compound

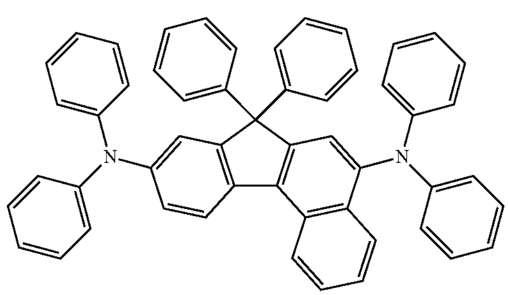

TABLE 1

| | Dopant material | Driving voltage (V) | Light emission peak wave-length (nm) | External quantum efficiency (%) | 90% lu-minance life time (hr) |
|---|---|---|---|---|---|
| Example 1 | Compound 1 | 4.3 | 462 | 10.0 | 1,100 |
| Comparative Example 1 | Comparative Compound | 4.2 | 463 | 9.8 | 410 |

The amine compound of the present invention has a long life time and is useful as a material for achieving an organic EL device capable of being driven with high efficiency.

INDUSTRIAL APPLICABILITY

An organic EL device capable of being driven at a low voltage with high efficiency for a prolonged service life time is achieved by combining the materials of the present invention.

What is claimed is:

1. An amine compound represented by the following formula (1):

$$B\text{-}(A)_n \qquad (1)$$

wherein in the formula (1), n represents an integer of from 2 to 4;

B represents a structure represented by the following formula (2); and

A represents an amine moiety represented by the following formula (4), plural moieties represented by A may be the same as or different from each other, (2)

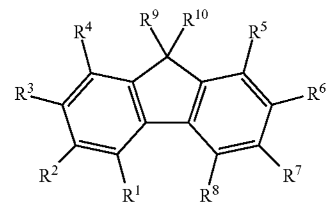

wherein in the formula (2), at least one combination among combinations of $R^1$ and $R^2$, $R^2$ and $R^3$, $R^3$ and $R^4$, $R^5$ and $R^6$, $R^6$ and $R^7$, and $R^7$ and $R^8$ represents a bond to a divalent group represented by the following formula (3); and $R^9$ and $R^{10}$ each independently represent a hydrogen atom, a substituted or unsubstituted alkyl group having from 1 to 20 carbon atoms, a substituted or unsubstituted alkylsilyl group having from 3 to 50 carbon atoms, a substituted or unsubstituted arylsilyl group having from 6 to 50 ring carbon atoms, a substituted or unsubstituted aryl group having from 6 to 30 ring carbon atoms or a substituted or unsubstituted heteroaryl group having from 5 to 30 ring atoms, (3)

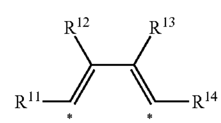

wherein in the formula (3),

* represents a bonding position to one combination in the formula (2), which shows a bond to the divalent group represented by the formula (3), in the formulae (2) and (3), n group(s) among $R^1$ to $R^8$ and $R^{11}$ to $R^{14}$ each represent a bond to the moiety represented by A; and the others of $R^1$ to $R^8$ and $R^{11}$ to $R^{14}$ than as described above each independently represent a hydrogen atom, a fluorine atom, a cyano group, a substituted or unsubstituted alkyl group having from 1 to 20 carbon atoms, a substituted or unsubstituted cycloalkyl group having from 3 to 20 ring carbon atoms, a substituted or unsubstituted alkoxy group having from 1 to 20 carbon atoms, a substituted or unsubstituted aryloxy group having from 6 to 30 ring carbon atoms, a substituted or unsubstituted alkylthio group having from 1 to 20 carbon atoms, a substituted or unsubstituted arylthio group having from 6 to 30 ring carbon atoms, a substituted or unsubstituted alkylsilyl group having from 3 to 50 carbon atoms, a substituted or unsubstituted arylsilyl group having from 6 to 50 ring carbon atoms, a substituted or unsubstituted aryl group having from 6 to 30 ring carbon atoms or a substituted or unsubstituted heteroaryl group having from 5 to 30 ring atoms, (4)

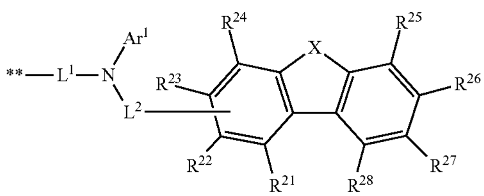

wherein in the formula (4), $Ar^1$ represents a substituted or unsubstituted aryl group having from 6 to 30 ring carbon atoms or a substituted or unsubstituted heteroaryl group having from 5 to 30 ring carbon atoms;

$L^1$ and $L^2$ each independently represent a single bond, an arylene group having from 6 to 30 ring carbon atoms, a heteroarylene group having from 5 to 30 ring atoms or a divalent linking group formed by bonding 2 to 4 of these groups;

any one among $R^{21}$ to $R^{28}$ represents a bond to the group represented by $L^2$, and the others thereof each independently represent a hydrogen atom, a fluorine atom, a cyano group, a substituted or unsubstituted alkyl group having from 1 to 20 carbon atoms, a substituted or unsubstituted cycloalkyl group having from 3 to 20 ring carbon atoms, a substituted or unsubstituted alkoxy group having from 1 to 20 carbon atoms, a substituted or unsubstituted aryloxy group having from 6 to 30 ring carbon atoms, a substituted or unsubstituted alkylthio group having from 1 to 20 carbon atoms, a substituted or unsubstituted arylthio group having from 6 to 30 ring carbon atoms, a substituted or unsubstituted alkylsilyl group having from 3 to 50 carbon atoms, a substituted or unsubstituted arylsilyl group having from 6 to 50 ring carbon atoms, a substituted or unsubstituted aryl group having from 6 to 30 ring carbon atoms or a substituted or unsubstituted heteroaryl group having from 5 to 30 ring atoms, or members of one or more combinations selected among combinations of $R^{21}$ and $R^{22}$, $R^{22}$ and $R^{23}$, $R^{23}$ and $R^{24}$, $R^{25}$ and $R^{26}$, $R^{26}$ and $R^{27}$, and $R^{27}$ and $R^{28}$ are bonded to each other to form a saturated or unsaturated ring structure;

X represents an oxygen atom or a sulfur atom; and

** represents a bonding position to the structure represented by B.

2. The amine compound according to claim 1, wherein in the formula (1), B represents any one of the following formulae (11) to (13):

(11)

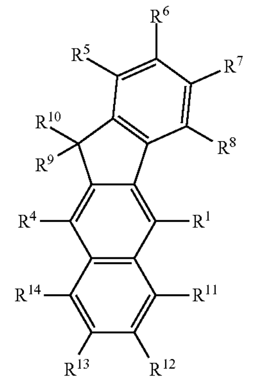

(12)

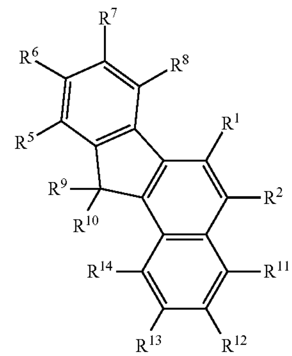

(13)

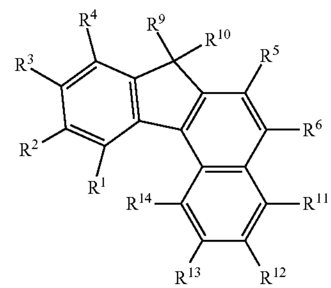

wherein $R^1$ to $R^{14}$ are the same as in the formulae (2) and (3).

3. The amine compound according to claim 1, wherein in the formula (2), two combinations among combinations of $R^1$ and $R^2$, $R^2$ and $R^3$, $R^3$ and $R^4$, $R^5$ and $R^6$, $R^6$ and $R^7$, and $R^7$ and $R^8$ each represent a bond to a divalent group represented by the formula (3).

4. The amine compound according to claim 1, wherein in the formula (1), B represents any one of the following formulae (14) to (19):

(14)

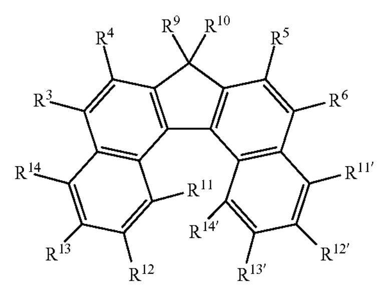

-continued (15)

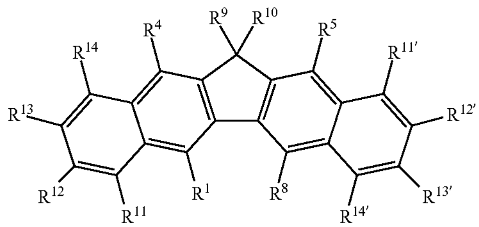

(16)

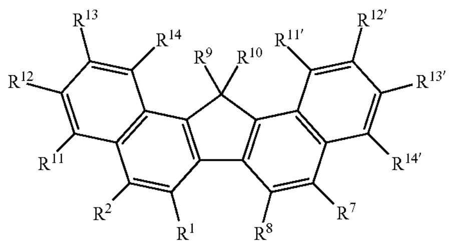

(17)

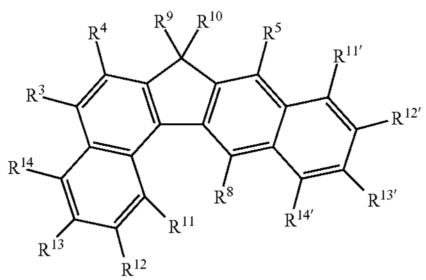

(18)

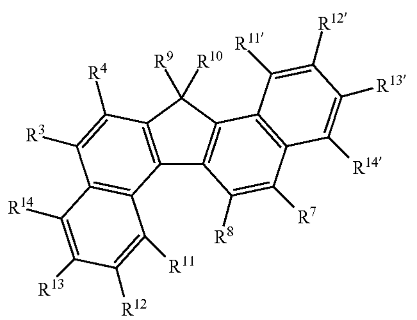

(19)

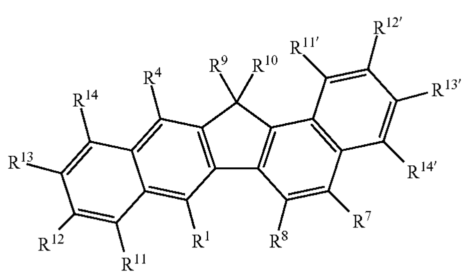

wherein $R^1$ to $R^{14}$ are the same as in the formulae (2) and (3), and $R^{11'}$ to $R^{14'}$ have the same meanings as $R^{11}$ to $R^{14}$, respectively.

5. The amine compound according to claim 4, wherein in the formula (1), B represents any one of the formulae (14) to (16).

6. The amine compound according to claim 1, wherein in the formula (1), X represents an oxygen atom.

7. The amine compound according to claim 1, wherein in the formula (4), $L^1$ represents a single bond.

8. The amine compound according to claim 1, wherein in the formula (4), $L^2$ represents a single bond.

9. The amine compound according to claim 1, wherein in the formula (4), $R^{24}$ or $R^{25}$ represents a bond to the group represented by $L^2$.

10. The amine compound according to claim 1, wherein in the formula (1), n represents 2.

11. The amine compound according to claim 1, wherein in the formula (4), $Ar^1$ represents a substituted or unsubstituted phenyl, naphthyl or biphenylyl group.

12. An organic electroluminescent device comprising a cathode, an anode and an organic thin film layer intervening between the cathode and anode, the organic thin film layer containing one layer or plural layers containing at least an emitting layer, at least one layer of the organic thin film layer containing the amine compound according to claim 1 solely or as a component of a mixture.

13. The organic electroluminescent device according to claim 12, wherein the emitting layer comprises the amine compound.

14. The organic electroluminescent device according to claim 12, wherein the at least one layer of the organic thin film layer contains the amine compound according to claim 1 and an anthracene derivative represented by the following formula (5):

(5)

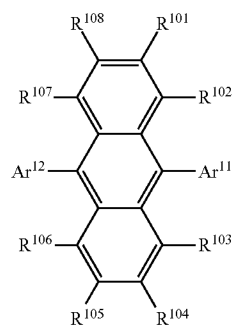

wherein in the formula (5), $Ar^{11}$ and $Ar^{12}$ each independently represent a substituted or unsubstituted monocyclic group having from 5 to 50 ring atoms or a substituted or unsubstituted condensed ring group having from 8 to 50 ring atoms; and $R^{101}$ to $R^{108}$ each independently represent a group selected from a hydrogen atom, a substituted or unsubstituted monocyclic group having from 5 to 50 ring atoms, a substituted or unsubstituted condensed ring group having from 8 to 50 ring atoms, a group constituted by the monocyclic group and the condensed ring group, a substituted or unsubstituted alkyl group having from 1 to 50 carbon atoms, a substituted or unsubstituted cycloalkyl group having from 3 to 50 ring carbon atoms, a substituted or unsubstituted alkoxy group having from 1 to 50 carbon atoms, a substituted or unsubstituted aralkyl group having from 7 to 50 carbon atoms, a substituted or unsubstituted aryloxy group having from 6 to 50 ring carbon atoms, a substituted or unsubstituted silyl group, a halogen atom and a cyano group.

15. The organic electroluminescent device according to claim 14, wherein in the formula (5), $Ar^{11}$ and $Ar^{12}$ each independently represent a substituted or unsubstituted condensed ring group having from 10 to 50 ring carbon atoms.

16. The organic electroluminescent device according to claim 14, wherein in the formula (5), one of $Ar^{11}$ and $Ar^{12}$ represents a substituted or unsubstituted monocyclic group having from 5 to 50 ring atoms, and the other thereof represents a substituted or unsubstituted condensed ring group having from 10 to 50 ring atoms.

17. The organic electroluminescent device according to claim 14, wherein in the formula (5), $Ar^{12}$ represents a naphthyl group, a phenanthryl group, a benzoanthryl group or a dibenzofuranyl group, and $Ar^{11}$ represents an unsubstituted phenyl group or a phenyl group having a monocyclic group or a condensed ring group substituted thereon.

18. The organic electroluminescent device according to claim 14, wherein in the formula (5), $Ar^{12}$ represents a substituted or unsubstituted condensed ring group having from 8 to 50 ring atoms, and $Ar^{11}$ represents an unsubstituted phenyl group.

19. The organic electroluminescent device according to claim 14, wherein in the formula (5), $Ar^{11}$ and $Ar^{12}$ each independently represent a substituted or unsubstituted monocyclic group having from 5 to 50 ring atoms.

20. The organic electroluminescent device according to claim 14, wherein in the formula (5), $Ar^{11}$ and $Ar^{12}$ each independently represent a substituted or unsubstituted phenyl group.

21. The organic electroluminescent device according to claim 14, wherein in the formula (5), $Ar^{11}$ represents an unsubstituted phenyl group, and $Ar^{12}$ represents a phenyl group having a monocyclic group or a condensed ring group substituted thereon.

22. The organic electroluminescent device according to claim 14, wherein in the formula (5), $Ar^{11}$ and $Ar^{12}$ each independently represent a phenyl group having a monocyclic group or a condensed ring group substituted thereon.

23. The amine compound according to claim 1, wherein in formula (1), n is 2, in formula (2), $R^9$ and $R^{10}$ each independently represent a hydrogen atom, a substituted or unsubstituted alkyl group having from 1 to 20 carbon atoms, or a substituted or unsubstituted aryl group having from 6 to 30 ring carbon atoms, in formulae (2) and (3), the others of $R^1$ to $R^8$ and $R^{11}$ to $R^{14}$ than as described above each independently represent a hydrogen atom, a substituted or unsubstituted alkyl group having 1 to 20 carbon atoms, or a substituted or unsubstituted aryl group having 6 to 30 ring carbon atoms, in formula (4), $L^1$ and $L^2$ each independently represent a single bond, an arylene group having 6 to 30 ring carbon atoms, or a divalent linking group formed by bonding 2 to 4 or these groups, and any one of $R^{21}$ to $R^{28}$ represents a bond to a group represented by $L^2$ and the other groups thereof each independently represent a hydrogen atom, a substituted or unsubstituted alkyl group having from 1 to 20 carbon atoms, a substituted or unsubstituted aryl group having from 6 to 30 carbon atoms.

* * * * *